US012657134B2

(12) United States Patent
Bhoria et al.

(10) Patent No.:  US 12,657,134 B2
(45) **Date of Patent:  \*Jun. 16, 2026**

(54) METHODS AND APPARATUS FOR EVICTION IN DUAL DATAPATH VICTIM CACHE SYSTEM

(71) Applicant: Texas Instruments Incorporated, Dallas, TX (US)

(72) Inventors: Naveen Bhoria, Plano, TX (US); Timothy David Anderson, University Park, TX (US); Pete Michael Hippleheuser, Murphy, TX (US)

(73) Assignee: Texas Instruments Incorporated, Dallas, TX (US)

( \* ) Notice: Subject to any disclaimer, the term of this patent is extended or adjusted under 35 U.S.C. 154(b) by 0 days.

This patent is subject to a terminal disclaimer.

(21) Appl. No.: 18/818,738

(22) Filed: Aug. 29, 2024

(65) Prior Publication Data

US 2024/0419607 A1     Dec. 19, 2024

Related U.S. Application Data

(63) Continuation of application No. 17/945,242, filed on Sep. 15, 2022, now Pat. No. 12,105,640, which is a
(Continued)

(51) Int. Cl.
G06F 12/00          (2006.01)
G06F 9/30           (2018.01)
(Continued)

(52) U.S. Cl.
CPC .......... G06F 12/128 (2013.01); G06F 9/3001 (2013.01); G06F 9/30043 (2013.01);
(Continued)

(58) Field of Classification Search
CPC .. G06F 12/128; G06F 9/3001; G06F 9/30043; G06F 9/30047; G06F 9/546;
(Continued)

(56) References Cited

U.S. PATENT DOCUMENTS 4,577,293 A      3/1986  Matick et al.
5,418,973 A  *  5/1995  Ellis .................... G06F 9/30036
                                                      711/3

(Continued)

OTHER PUBLICATIONS

International Search Report for PCT/US2020/034560 mailed Aug. 20, 2020.

(Continued)

*Primary Examiner* — Shawn X Gu
*Assistant Examiner* — Mohammad S Hasan
(74) *Attorney, Agent, or Firm* — Michelle F. Murray; Frank D. Cimino

(57)          ABSTRACT

Methods, apparatus, systems and articles of manufacture are disclosed to evict in a dual datapath victim cache system. An example apparatus includes a cache storage, a cache controller operable to receive a first memory operation and a second memory operation concurrently, comparison logic operable to identify if the first and second memory operations missed in the cache storage, and a replacement policy component operable to, when at least one of the first and second memory operations corresponds to a miss in the cache storage, reserve an entry in the cache storage to evict based on the first and second memory operations.

20 Claims, 51 Drawing Sheets

Related U.S. Application Data continuation of application No. 16/882,249, filed on May 22, 2020, now Pat. No. 11,449,432.

(60) Provisional application No. 62/852,494, filed on May 24, 2019.

(51) Int. Cl.

| | |
|---|---|
| *G06F 9/54* | (2006.01) |
| *G06F 11/10* | (2006.01) |
| *G06F 12/02* | (2006.01) |
| *G06F 12/0802* | (2016.01) |
| *G06F 12/0804* | (2016.01) |
| *G06F 12/0806* | (2016.01) |
| *G06F 12/0811* | (2016.01) |
| *G06F 12/0815* | (2016.01) |
| *G06F 12/0817* | (2016.01) |
| *G06F 12/0853* | (2016.01) |
| *G06F 12/0855* | (2016.01) |
| *G06F 12/0864* | (2016.01) |
| *G06F 12/0884* | (2016.01) |
| *G06F 12/0888* | (2016.01) |
| *G06F 12/0891* | (2016.01) |
| *G06F 12/0895* | (2016.01) |
| *G06F 12/0897* | (2016.01) |
| *G06F 12/1027* | (2016.01) |
| *G06F 12/12* | (2016.01) |
| *G06F 12/121* | (2016.01) |
| *G06F 12/126* | (2016.01) |
| *G06F 12/127* | (2016.01) |
| *G06F 12/128* | (2016.01) |
| *G06F 13/16* | (2006.01) |
| *G06F 15/80* | (2006.01) |
| *G11C 5/06* | (2006.01) |
| *G11C 7/10* | (2006.01) |
| *G11C 7/22* | (2006.01) |
| *G11C 29/42* | (2006.01) |
| *G11C 29/44* | (2006.01) |

(52) U.S. Cl.

CPC .......... *G06F 9/30047* (2013.01); *G06F 9/546* (2013.01); *G06F 11/1064* (2013.01); *G06F 12/0215* (2013.01); *G06F 12/0238* (2013.01); *G06F 12/0292* (2013.01); *G06F 12/0802* (2013.01); *G06F 12/0804* (2013.01); *G06F 12/0806* (2013.01); *G06F 12/0811* (2013.01); *G06F 12/0815* (2013.01); *G06F 12/082* (2013.01); *G06F 12/0853* (2013.01); *G06F 12/0855* (2013.01); *G06F 12/0864* (2013.01); *G06F 12/0884* (2013.01); *G06F 12/0888* (2013.01); *G06F 12/0891* (2013.01); *G06F 12/0895* (2013.01); *G06F 12/0897* (2013.01); *G06F 12/1027* (2013.01); *G06F 12/12* (2013.01); *G06F 12/121* (2013.01); *G06F 12/126* (2013.01); *G06F 12/127* (2013.01); *G06F 13/1605* (2013.01); *G06F 13/1642* (2013.01); *G06F 13/1673* (2013.01); *G06F 13/1689* (2013.01); *G06F 15/8069* (2013.01); *G11C 5/066* (2013.01); *G11C 7/10* (2013.01); *G11C 7/1015* (2013.01); *G11C 7/106* (2013.01); *G11C 7/1075* (2013.01); *G11C 7/1078* (2013.01); *G11C 7/1087* (2013.01); *G11C 7/222* (2013.01); *G11C 29/42* (2013.01); *G11C 29/44* (2013.01); *G06F 2212/1016* (2013.01); *G06F 2212/1021* (2013.01); *G06F 2212/1024* (2013.01); *G06F 2212/1041* (2013.01); *G06F 2212/1044* (2013.01); *G06F 2212/301* (2013.01); *G06F 2212/454* (2013.01); *G06F 2212/603* (2013.01); *G06F 2212/6032* (2013.04); *G06F 2212/6042* (2013.01); *G06F 2212/608* (2013.01); *G06F 2212/62* (2013.01)

(58) Field of Classification Search

CPC ............ G06F 11/1064; G06F 12/0215; G06F 12/0238; G06F 12/0292; G06F 12/0802; G06F 12/0804; G06F 12/0806; G06F 12/0811; G06F 12/0815; G06F 12/082; G06F 12/0853; G06F 12/0855; G06F 12/0864; G06F 12/0884; G06F 12/0888; G06F 12/0891; G06F 12/0895; G06F 12/0897; G06F 12/1027; G06F 12/12; G06F 12/121; G06F 12/126; G06F 12/127; G06F 13/1605; G06F 13/1642; G06F 13/1673; G06F 13/1689; G06F 15/8069; G06F 2212/1016; G06F 2212/1021; G06F 2212/1024; G06F 2212/1041; G06F 2212/1044; G06F 2212/301; G06F 2212/454; G06F 2212/603; G06F 2212/6032; G06F 2212/6042; G06F 2212/608; G06F 2212/62; G11C 5/066; G11C 7/10; G11C 7/1015; G11C 7/106; G11C 7/1075; G11C 7/1078; G11C 7/1087; G11C 7/222; G11C 29/42; G11C 29/44; G11C 29/52; G11C 29/4401; G11C 2029/0409; G11C 2029/0411; G11C 29/72; G11C 29/76; Y02D 10/00

See application file for complete search history.

(56) References Cited

U.S. PATENT DOCUMENTS

| | | | | |
|---|---|---|---|---|
| 5,706,467 | A * | 1/1998 | Vishlitzky | G06F 12/123 |
| | | | | 711/E12.072 |
| 5,758,056 | A | 5/1998 | Barr | |
| 5,822,755 | A | 10/1998 | Shippy | |
| 6,215,497 | B1 * | 4/2001 | Leung | G06T 1/60 |
| | | | | 711/100 |
| 6,775,750 | B2 | 8/2004 | Krueger | |
| 7,970,998 | B2 | 6/2011 | Yamamoto et al. | |
| 8,103,749 | B2 | 1/2012 | Dolev et al. | |
| 8,181,005 | B2 | 5/2012 | Zuraski, Jr. et al. | |
| 9,170,955 | B2 | 10/2015 | Forsyth et al. | |
| 9,691,452 | B2 | 6/2017 | Pekny et al. | |
| 9,696,934 | B2 * | 7/2017 | Rothberg | G06F 3/0604 |
| 2008/0232148 | A1 | 9/2008 | Yabe | |
| 2009/0231918 | A1 | 9/2009 | Doyle | |
| 2010/0232240 | A1 | 9/2010 | Norman | |
| 2011/0010503 | A1 | 1/2011 | Yamamura et al. | |
| 2011/0185114 | A1 | 7/2011 | Bolanowski | |
| 2011/0283041 | A1 | 11/2011 | Kanoh | |
| 2012/0042126 | A1 | 2/2012 | Krick et al. | |
| 2012/0221774 | A1 | 8/2012 | Atkisson et al. | |
| 2013/0125097 | A1 * | 5/2013 | Ebcioglu | G06F 8/4452 |
| | | | | 717/136 |
| 2013/0191601 | A1 | 7/2013 | Peterson et al. | |
| 2013/0268727 | A1 | 10/2013 | Sohn et al. | |
| 2014/0189245 | A1 | 7/2014 | Rupley et al. | |
| 2014/0195715 | A1 | 7/2014 | Kim et al. | |
| 2015/0006820 | A1 | 1/2015 | Bhoria et al. | |
| 2015/0127912 | A1 | 5/2015 | Solihin | |
| 2015/0302904 | A1 | 10/2015 | Yoon et al. | |
| 2017/0091096 | A1 * | 3/2017 | Mccarthy | G06F 12/128 |
| 2017/0153959 | A1 | 6/2017 | Zbiciak | |
| 2017/0337142 | A1 | 11/2017 | Arbone et al. | |

(56) References Cited

U.S. PATENT DOCUMENTS

| 2017/0357588 | A1 | 12/2017 | Moyer |
| 2018/0336143 | A1 | 11/2018 | Lai et al. |
| 2019/0042150 | A1 | 2/2019 | Wells et al. |

OTHER PUBLICATIONS

International Search Report for PCT/US2020/034557 mailed Sep. 10, 2020.

* cited by examiner

TABLE 1 - LEAST RECENTLY USED VALUE INCREMENTING

TABLE 2 - ALLOCATING VERSUS NOT ALLOCATING

FIG. 7C

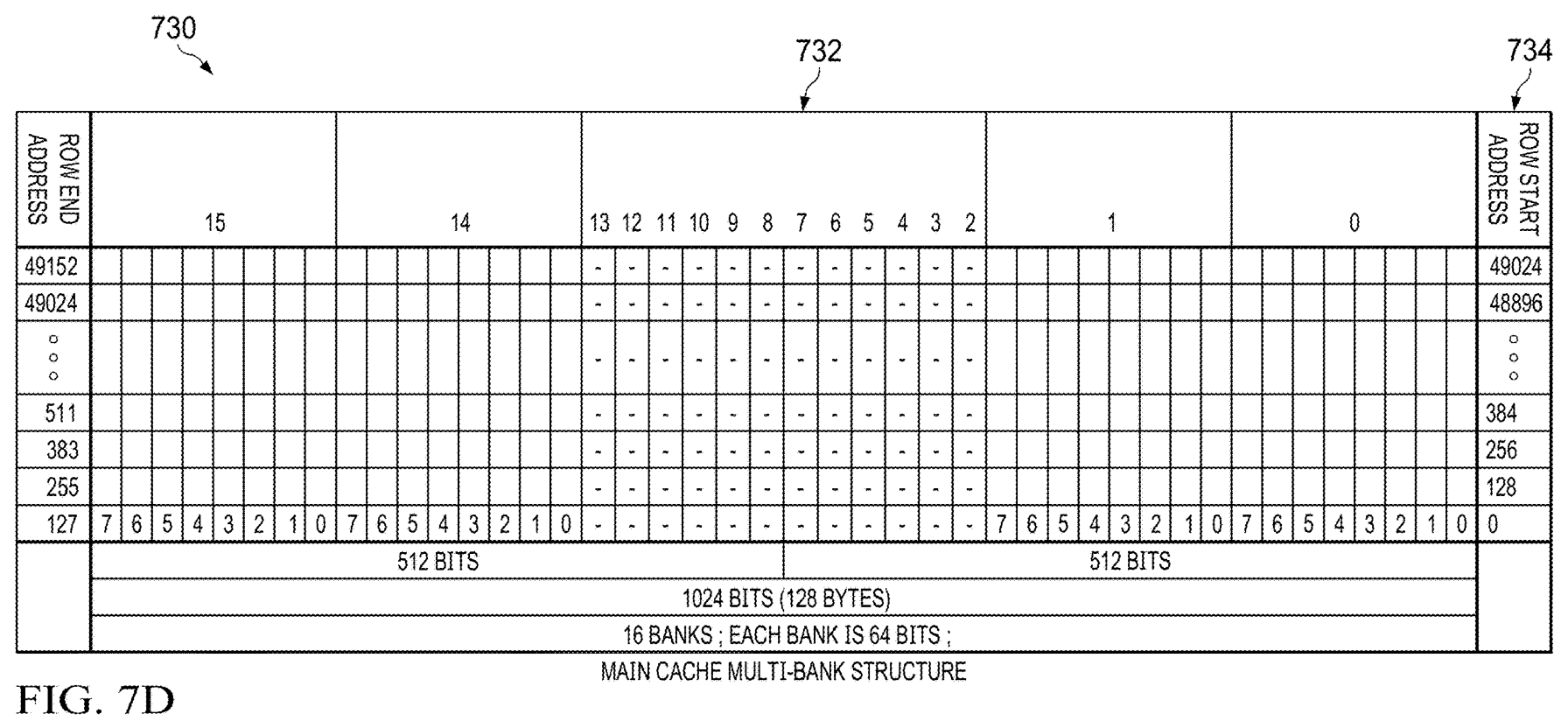

734 — ROW START ADDRESS: 49024, 48896, o o o, 384, 256, 128, 0

732

730

Bank 0 — bits: 1 0, 2, 3, 4, 5, 6, 7, 7 6 5 4 3 2 1 0

Bank 1 — bits: 2 1 0, 3, 4, 5, 6, 7, 7 6 5 4 3 2

Bank 2 ... 13 12 11 10 9 8 7 6 5 4 3 2

Bank 14 — bits: 1 0, 2, 3, 4, 5, 6, 7, 7 6 5 4 3 2 1 0

Bank 15 — bits: 1 0, 2, 3, 4, 5, 6, 7, 7 6 5 4 3 2 1 0

ROW END ADDRESS: 49152, 49024, o o o, 511, 383, 255, 127

512 BITS    512 BITS

1024 BITS (128 BYTES)

16 BANKS; EACH BANK IS 64 BITS;

MAIN CACHE MULTI-BANK STRUCTURE

FIG. 7D

| | | | | | | | |
|---|---|---|---|---|---|---|---|
| CPU WRITE | Addr=0 | 64 BYTES | | | | | B63 |
| FOR RMW | | | | | | | B63 |
| NO OF BANKS READ | 0x00FF | | | | | | 7 |
| NO OF BANKS WRITE | 0x00FF | | | | | | 7 |
| | | | | | | | |
| WITH PARTIAL BANK DETECT | | | | | | | |
| CPU WRITE | Addr=0 | 64 BYTES | | | | | B63 |
| FOR RMW | | | | | | | B63 |
| NO OF BANKS READ | 0x0000 | | | | | | 7 |
| NO OF BANKS WRITE | 0x00FF | | | | | | 7 |
| CPU WRITE | Addr=3 | 64 BYTES | | | | | B63 |
| FOR RMW | | | | | B63 | | |
| NO OF BANKS READ | 0x01FF | | | | 8 | 7 | |
| NO OF BANKS WRITE | 0x01FF | | | | 8 | 7 | |
| WITH PARTIAL BANK DETECT | | | | | | | |
| CPU WRITE | Addr=3 | 64 BYTES | | | | | B63 |
| FOR RMW | | | | | B63 | | |
| NO OF BANKS READ | 0x0101 | | | | 8 | 7 | |
| NO OF BANKS WRITE | 0x01FF | | | | 8 | 7 | |
| CPU WRITE | Addr=113 | 64 BYTES | | | | | B63 |
| FOR RMW | | | B13 | B0 | | | |
| NO OF BANKS READ | 0xC07F | | 15 | 14 | | | |
| NO OF BANKS WRITE | 0xC07F | | 15 | 14 | | | |
| | | | | | | | |
| WITH PARTIAL BANK DETECT | | | | | | | |
| CPU WRITE | Addr=113 | 64 BYTES | | | | | B63 |
| FOR RMW | | | B13 | B0 | | | |
| NO OF BANKS READ | 0xC080 | | 15 | 14 | | | |
| NO OF BANKS WRITE | 0xC07F | | 15 | 14 | | | |

FROM FIG. 9A

| | | | | | | | | |
|---|---|---|---|---|---|---|---|---|
| 902 | | | | | | | B0 | CPU-WRITE DATA |
| 904 | | | | | | | B0 | WRITE-DATA ALIGNED |
| 6 | 5 | 4 | 3 | 2 | 1 | 0 | | |
| 6 | 5 | 4 | 3 | 2 | 1 | 0 | | |
| | | | | | | | | |
| | | | | | | | | |
| | | | | | | | B0 | CPU-WRITE DATA |
| | | | | | | | B0 | WRITE-DATA ALIGNED |
| 6 | 5 | 4 | 3 | 2 | 1 | 0 | | |
| 6 | 5 | 4 | 3 | 2 | 1 | 0 | | |

900

| | | | | | | | | |
|---|---|---|---|---|---|---|---|---|
| 912 | | | | | | | B0 | CPU-WRITE DATA |
| 914 | | | | | | | B0 | WRITE-DATA ALIGNED |
| 6 | 5 | 4 | 3 | 2 | 1 | 0 | | ReadBanks |
| 6 | 5 | 4 | 3 | 2 | 1 | 0 | | WriteBanks |
| | | | | | | | | |
| | | | | | | | B0 | CPU-WRITE DATA |
| | | | | | | | B0 | WRITE-DATA ALIGNED |
| 6 | 5 | 4 | 3 | 2 | 1 | 0 | | ReadBanks |
| 6 | 5 | 4 | 3 | 2 | 1 | 0 | | WriteBanks |

910

| | | | | | | | | |
|---|---|---|---|---|---|---|---|---|
| 922 | | | | | | | B0 | CPU-WRITE DATA |
| B63 924 | | | | | | | B14 | WRITE-DATA ALIGNED |
| 6 | 5 | 4 | 3 | 2 | 1 | 0 | | ReadBanks |
| 6 | 5 | 4 | 3 | 2 | 1 | 0 | | WriteBanks |
| | | | | | | | | |
| | | | | | | | | |
| | | | | | | | B0 | CPU-WRITE DATA |
| B63 | | | | | | | B14 | WRITE-DATA ALIGNED |
| 6 | 5 | 4 | 3 | 2 | 1 | 0 | | ReadBanks |
| 6 | 5 | 4 | 3 | 2 | 1 | 0 | | WriteBanks |

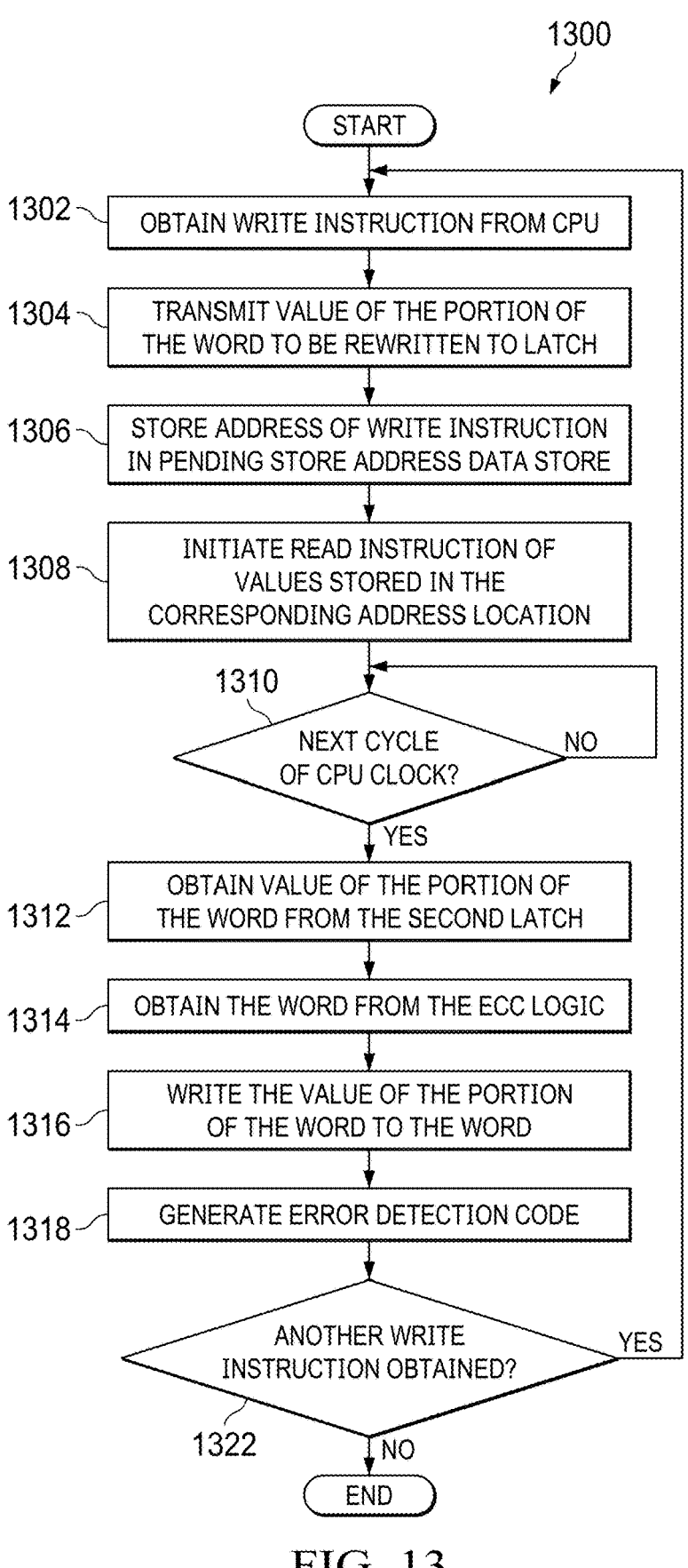

START

1302 — OBTAIN WRITE INSTRUCTION FROM CPU

1304 — TRANSMIT VALUE OF THE PORTION OF THE WORD TO BE REWRITTEN TO LATCH

1306 — STORE ADDRESS OF WRITE INSTRUCTION IN PENDING STORE ADDRESS DATA STORE

1308 — INITIATE READ INSTRUCTION OF VALUES STORED IN THE CORRESPONDING ADDRESS LOCATION

1310 — NEXT CYCLE OF CPU CLOCK?   NO

YES

1312 — OBTAIN VALUE OF THE PORTION OF THE WORD FROM THE SECOND LATCH

1314 — OBTAIN THE WORD FROM THE ECC LOGIC

1316 — WRITE THE VALUE OF THE PORTION OF THE WORD TO THE WORD

1318 — GENERATE ERROR DETECTION CODE

ANOTHER WRITE INSTRUCTION OBTAINED?   YES

1322

NO

END

FIG. 13

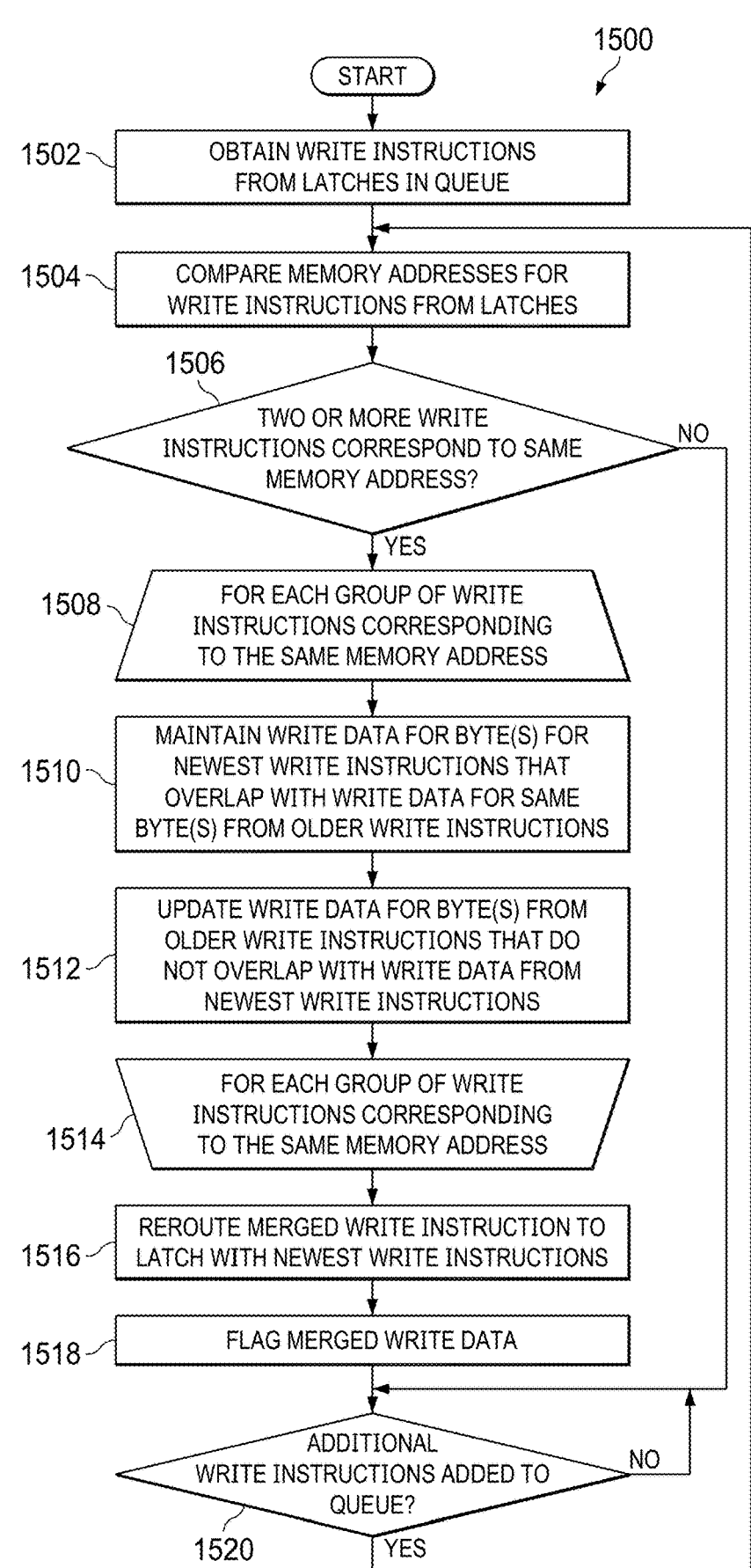

1500

START

1502 — OBTAIN WRITE INSTRUCTIONS FROM LATCHES IN QUEUE

1504 — COMPARE MEMORY ADDRESSES FOR WRITE INSTRUCTIONS FROM LATCHES

1506 — TWO OR MORE WRITE INSTRUCTIONS CORRESPOND TO SAME MEMORY ADDRESS?          NO

YES

1508 — FOR EACH GROUP OF WRITE INSTRUCTIONS CORRESPONDING TO THE SAME MEMORY ADDRESS

1510 — MAINTAIN WRITE DATA FOR BYTE(S) FOR NEWEST WRITE INSTRUCTIONS THAT OVERLAP WITH WRITE DATA FOR SAME BYTE(S) FROM OLDER WRITE INSTRUCTIONS

1512 — UPDATE WRITE DATA FOR BYTE(S) FROM OLDER WRITE INSTRUCTIONS THAT DO NOT OVERLAP WITH WRITE DATA FROM NEWEST WRITE INSTRUCTIONS

1514 — FOR EACH GROUP OF WRITE INSTRUCTIONS CORRESPONDING TO THE SAME MEMORY ADDRESS

1516 — REROUTE MERGED WRITE INSTRUCTION TO LATCH WITH NEWEST WRITE INSTRUCTIONS

1518 — FLAG MERGED WRITE DATA

ADDITIONAL WRITE INSTRUCTIONS ADDED TO QUEUE?          NO

1520          YES

FIG. 15

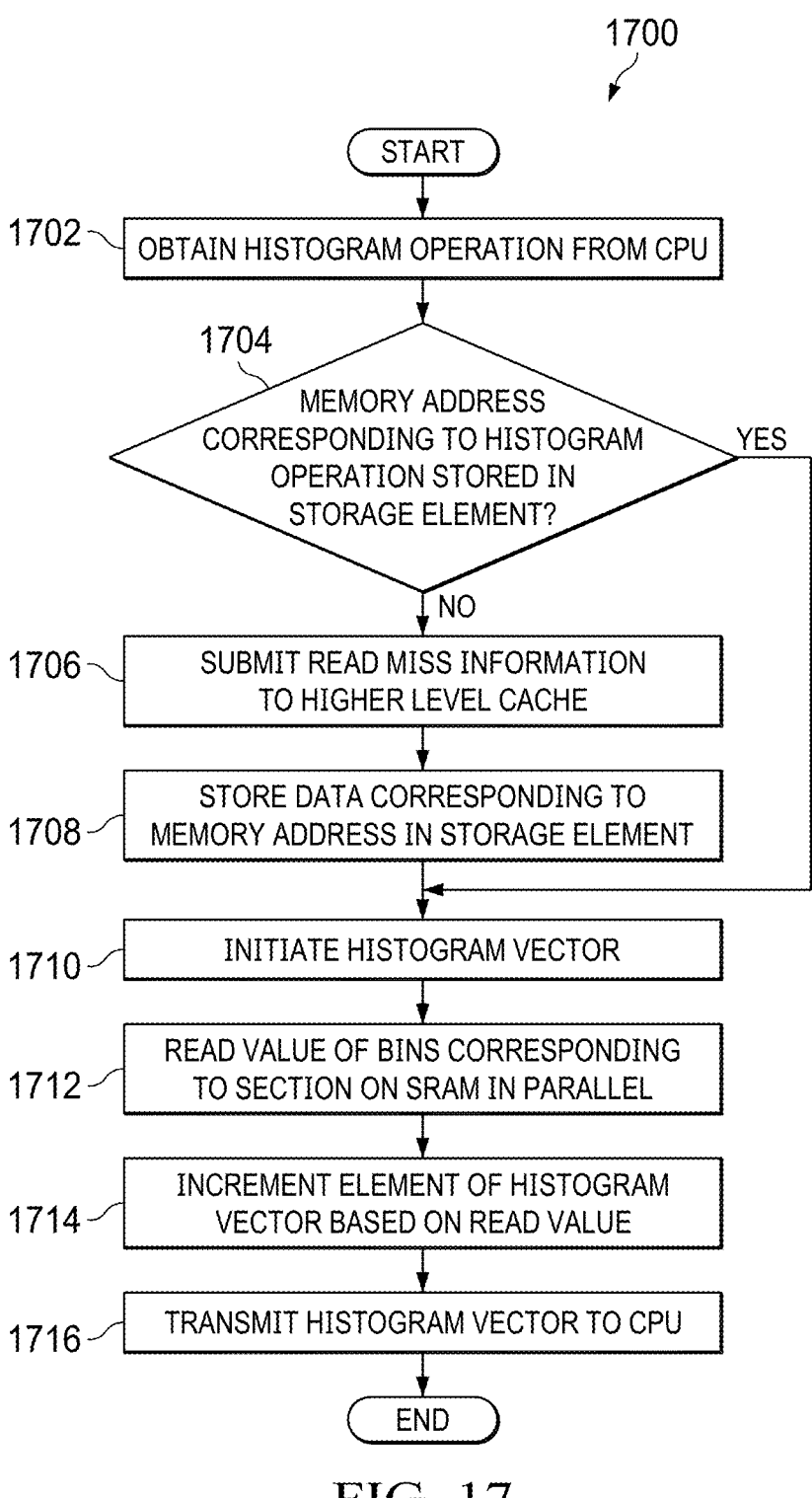

1700

START

1702 — OBTAIN HISTOGRAM OPERATION FROM CPU

1704 — MEMORY ADDRESS CORRESPONDING TO HISTOGRAM OPERATION STORED IN STORAGE ELEMENT?

YES

NO

1706 — SUBMIT READ MISS INFORMATION TO HIGHER LEVEL CACHE

1708 — STORE DATA CORRESPONDING TO MEMORY ADDRESS IN STORAGE ELEMENT

1710 — INITIATE HISTOGRAM VECTOR

1712 — READ VALUE OF BINS CORRESPONDING TO SECTION ON SRAM IN PARALLEL

1714 — INCREMENT ELEMENT OF HISTOGRAM VECTOR BASED ON READ VALUE

1716 — TRANSMIT HISTOGRAM VECTOR TO CPU

END

FIG. 17

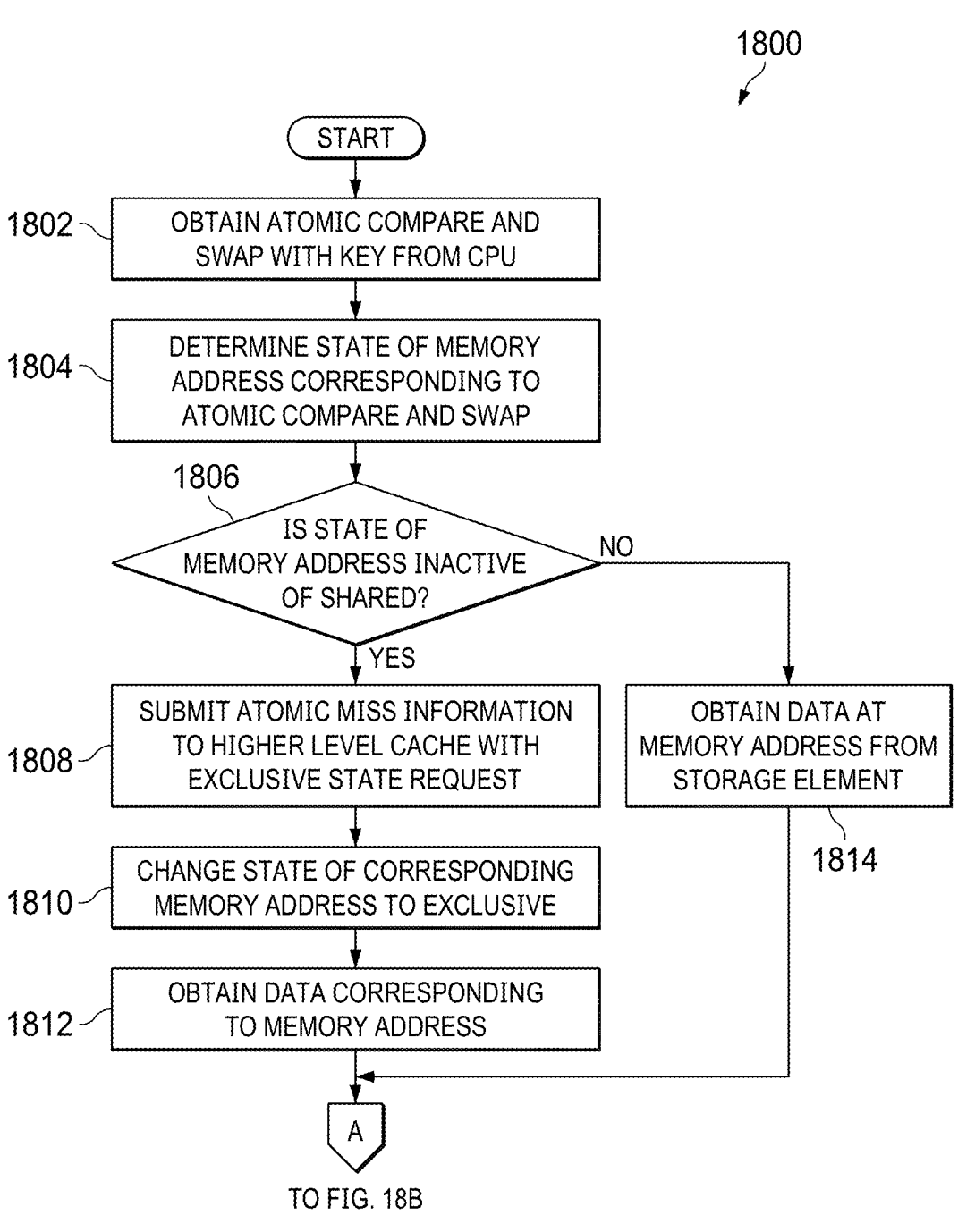

1800

START

1802 — OBTAIN ATOMIC COMPARE AND SWAP WITH KEY FROM CPU

1804 — DETERMINE STATE OF MEMORY ADDRESS CORRESPONDING TO ATOMIC COMPARE AND SWAP

1806

IS STATE OF MEMORY ADDRESS INACTIVE OF SHARED?

NO

YES

1808 — SUBMIT ATOMIC MISS INFORMATION TO HIGHER LEVEL CACHE WITH EXCLUSIVE STATE REQUEST

OBTAIN DATA AT MEMORY ADDRESS FROM STORAGE ELEMENT

1814

1810 — CHANGE STATE OF CORRESPONDING MEMORY ADDRESS TO EXCLUSIVE

1812 — OBTAIN DATA CORRESPONDING TO MEMORY ADDRESS

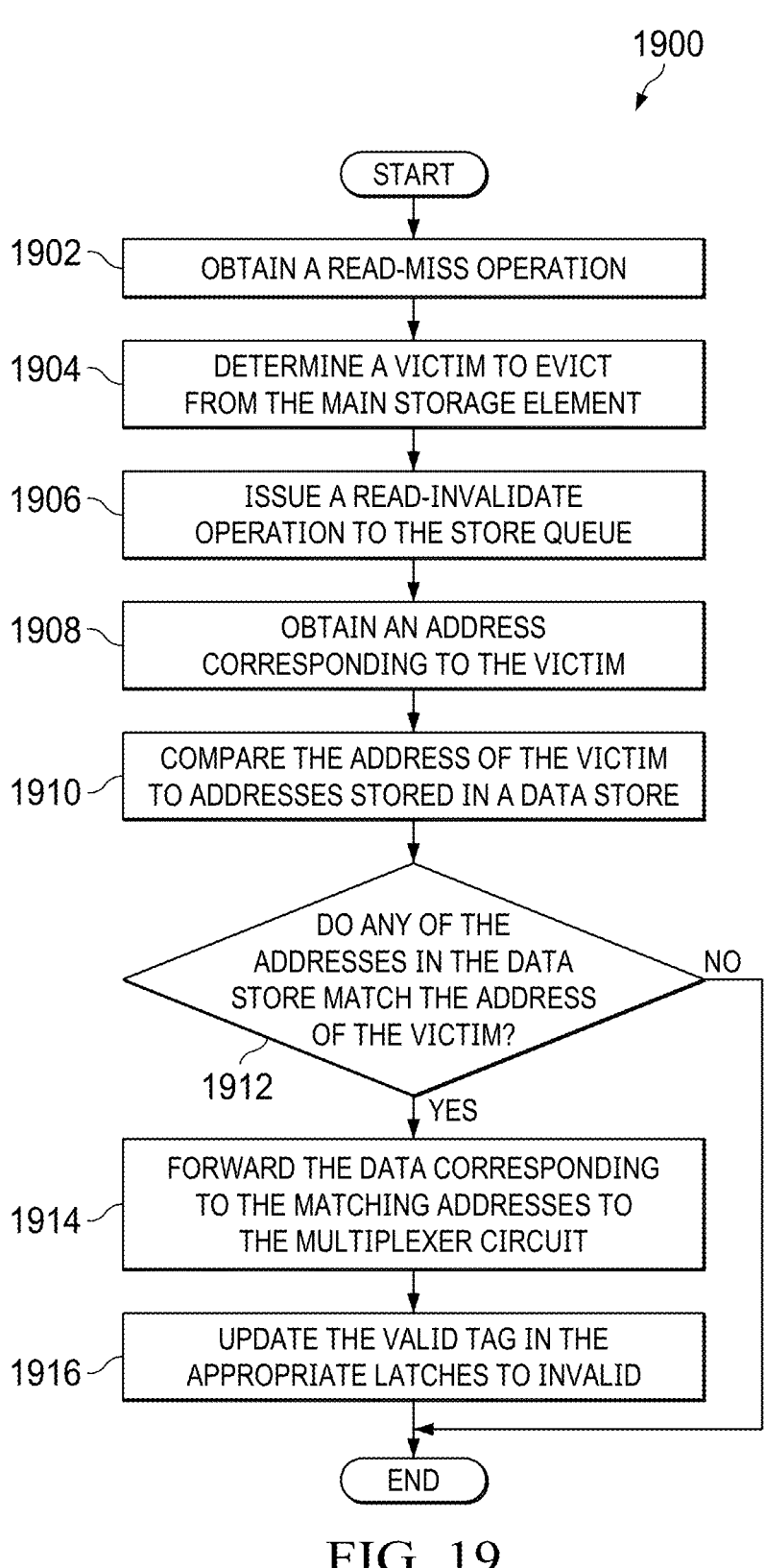

1900

START

1902 — OBTAIN A READ-MISS OPERATION

1904 — DETERMINE A VICTIM TO EVICT
FROM THE MAIN STORAGE ELEMENT

1906 — ISSUE A READ-INVALIDATE
OPERATION TO THE STORE QUEUE

1908 — OBTAIN AN ADDRESS
CORRESPONDING TO THE VICTIM

1910 — COMPARE THE ADDRESS OF THE VICTIM
TO ADDRESSES STORED IN A DATA STORE

DO ANY OF THE
ADDRESSES IN THE DATA
STORE MATCH THE ADDRESS
OF THE VICTIM?    NO

1912    YES

1914 — FORWARD THE DATA CORRESPONDING
TO THE MATCHING ADDRESSES TO
THE MULTIPLEXER CIRCUIT

1916 — UPDATE THE VALID TAG IN THE
APPROPRIATE LATCHES TO INVALID

END

FIG. 19

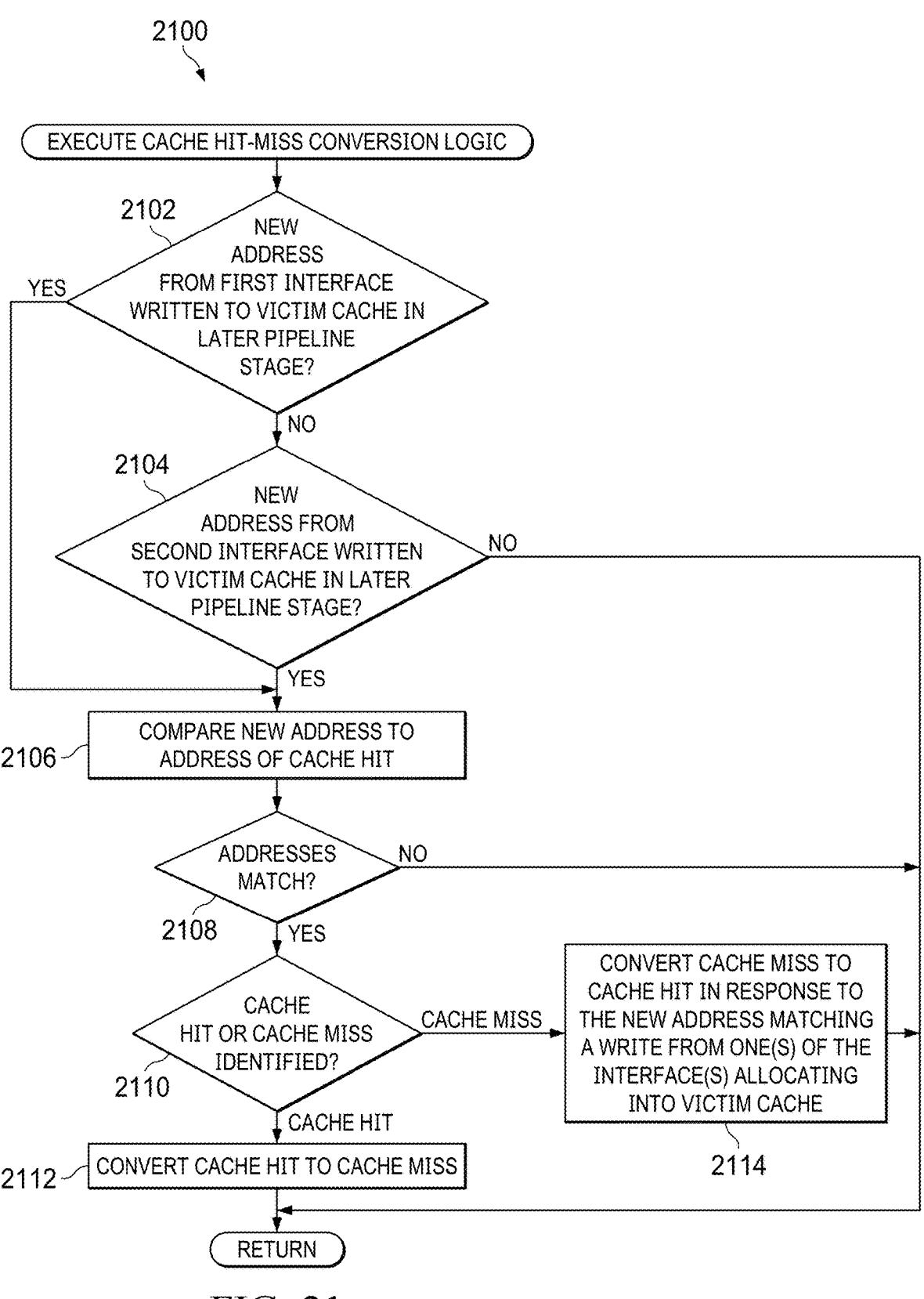

2100

EXECUTE CACHE HIT-MISS CONVERSION LOGIC

2102

NEW ADDRESS FROM FIRST INTERFACE WRITTEN TO VICTIM CACHE IN LATER PIPELINE STAGE?

YES

NO

2104

NEW ADDRESS FROM SECOND INTERFACE WRITTEN TO VICTIM CACHE IN LATER PIPELINE STAGE?

NO

YES

2106    COMPARE NEW ADDRESS TO ADDRESS OF CACHE HIT

ADDRESSES MATCH?

NO

2108    YES

CACHE HIT OR CACHE MISS IDENTIFIED?

CACHE MISS

2110

CACHE HIT

CONVERT CACHE MISS TO CACHE HIT IN RESPONSE TO THE NEW ADDRESS MATCHING A WRITE FROM ONE(S) OF THE INTERFACE(S) ALLOCATING INTO VICTIM CACHE

2114

2112    CONVERT CACHE HIT TO CACHE MISS

RETURN

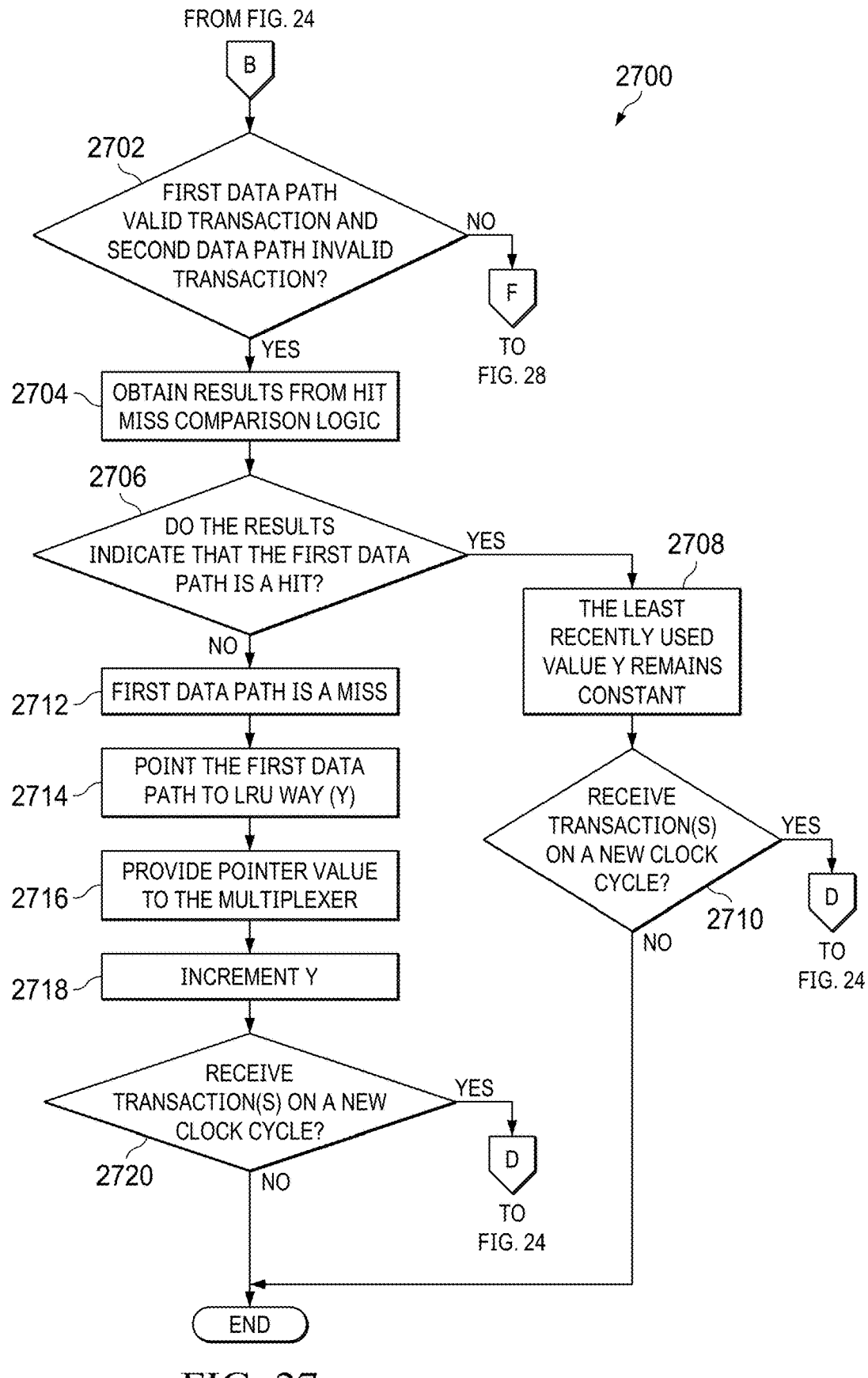

FROM FIG. 24

B

2700

2702

FIRST DATA PATH VALID TRANSACTION AND SECOND DATA PATH INVALID TRANSACTION?

YES

2704 — OBTAIN RESULTS FROM HIT MISS COMPARISON LOGIC

2706

DO THE RESULTS INDICATE THAT THE FIRST DATA PATH IS A HIT?

YES

2708

THE LEAST RECENTLY USED VALUE Y REMAINS CONSTANT

NO

2712 — FIRST DATA PATH IS A MISS

2714 — POINT THE FIRST DATA PATH TO LRU WAY (Y)

2716 — PROVIDE POINTER VALUE TO THE MULTIPLEXER

2718 — INCREMENT Y

RECEIVE TRANSACTION(S) ON A NEW CLOCK CYCLE?

YES

RECEIVE TRANSACTION(S) ON A NEW CLOCK CYCLE?

YES

END

FIG. 27

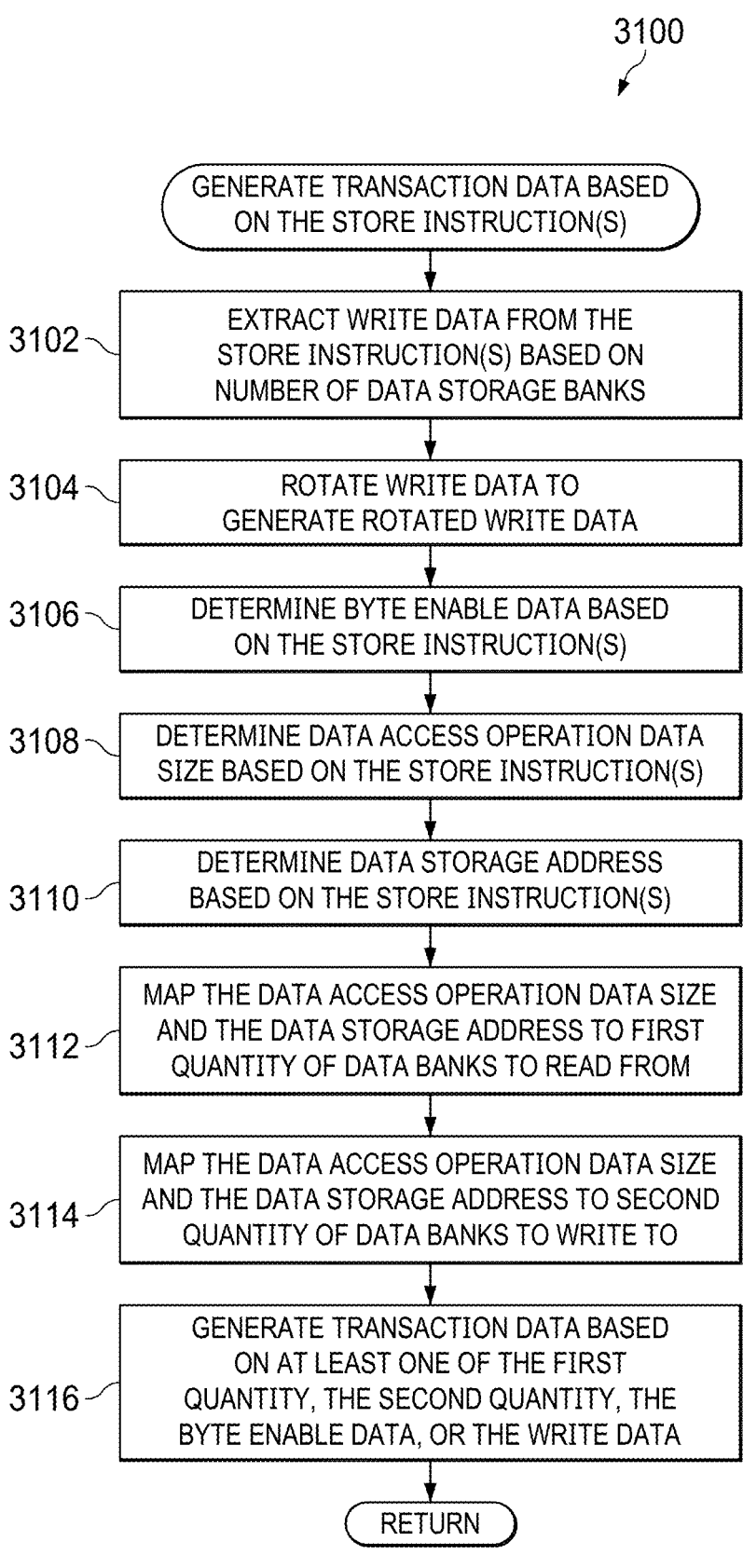

3100

GENERATE TRANSACTION DATA BASED
ON THE STORE INSTRUCTION(S)

3102 — EXTRACT WRITE DATA FROM THE
STORE INSTRUCTION(S) BASED ON
NUMBER OF DATA STORAGE BANKS

3104 — ROTATE WRITE DATA TO
GENERATE ROTATED WRITE DATA

3106 — DETERMINE BYTE ENABLE DATA BASED
ON THE STORE INSTRUCTION(S)

3108 — DETERMINE DATA ACCESS OPERATION DATA
SIZE BASED ON THE STORE INSTRUCTION(S)

3110 — DETERMINE DATA STORAGE ADDRESS
BASED ON THE STORE INSTRUCTION(S)

3112 — MAP THE DATA ACCESS OPERATION DATA SIZE
AND THE DATA STORAGE ADDRESS TO FIRST
QUANTITY OF DATA BANKS TO READ FROM

3114 — MAP THE DATA ACCESS OPERATION DATA SIZE
AND THE DATA STORAGE ADDRESS TO SECOND
QUANTITY OF DATA BANKS TO WRITE TO

3116 — GENERATE TRANSACTION DATA BASED
ON AT LEAST ONE OF THE FIRST
QUANTITY, THE SECOND QUANTITY, THE
BYTE ENABLE DATA, OR THE WRITE DATA

RETURN

FIG. 31

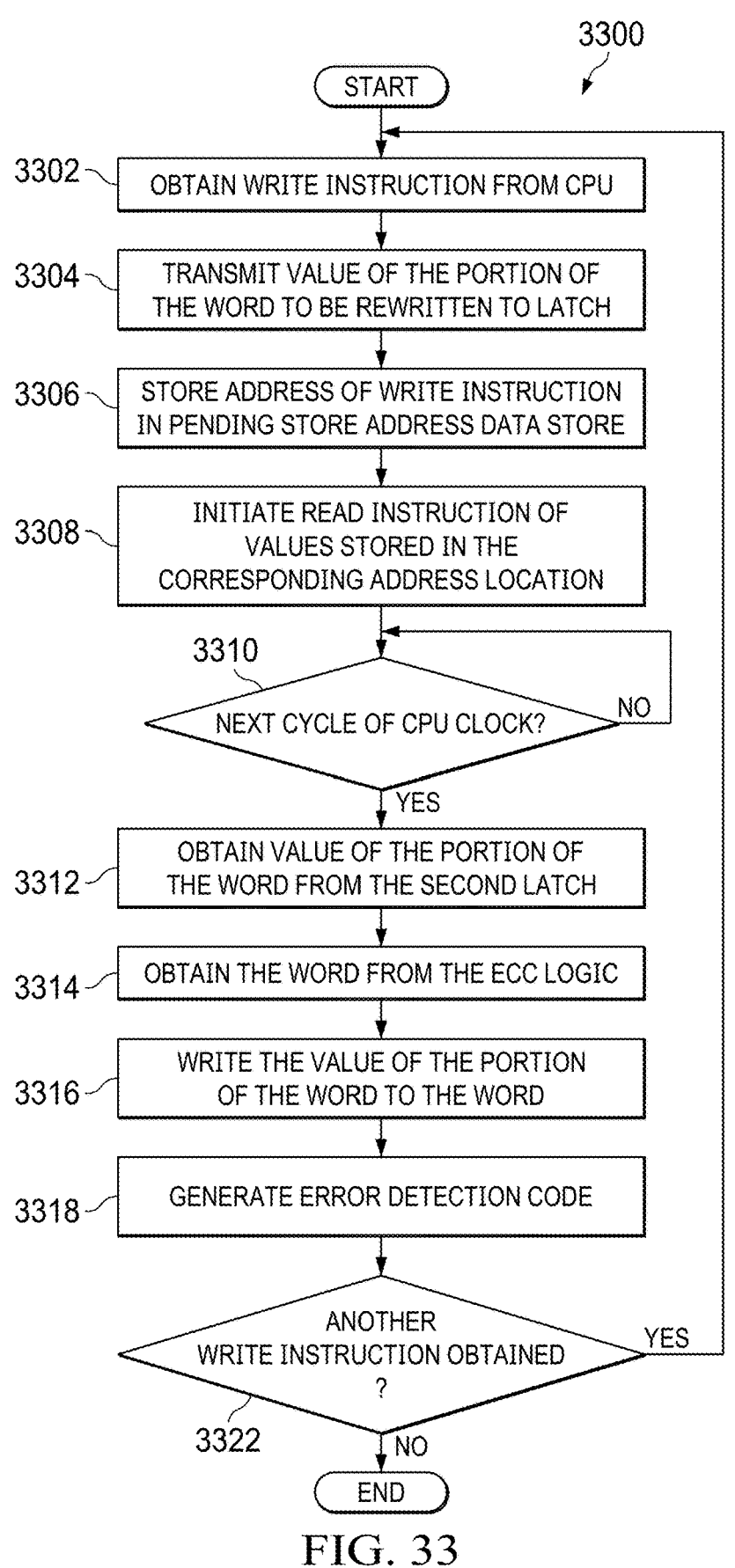

3300

START

3302 — OBTAIN WRITE INSTRUCTION FROM CPU

3304 — TRANSMIT VALUE OF THE PORTION OF THE WORD TO BE REWRITTEN TO LATCH

3306 — STORE ADDRESS OF WRITE INSTRUCTION IN PENDING STORE ADDRESS DATA STORE

3308 — INITIATE READ INSTRUCTION OF VALUES STORED IN THE CORRESPONDING ADDRESS LOCATION

3310 — NEXT CYCLE OF CPU CLOCK? — NO

YES

3312 — OBTAIN VALUE OF THE PORTION OF THE WORD FROM THE SECOND LATCH

3314 — OBTAIN THE WORD FROM THE ECC LOGIC

3316 — WRITE THE VALUE OF THE PORTION OF THE WORD TO THE WORD

3318 — GENERATE ERROR DETECTION CODE

ANOTHER WRITE INSTRUCTION OBTAINED ? — YES

3322

NO

END

FIG. 33

METHODS AND APPARATUS FOR EVICTION IN DUAL DATAPATH VICTIM CACHE SYSTEM

RELATED APPLICATIONS

This application is a continuation of U.S. patent application Ser. No. 17/945,242, filed Sep. 15, 2022, which is a continuation of U.S. patent application Ser. No. 16/882,249, filed May 5, 2020, now U.S. Pat. No. 11,449,432, issued September 20, 22, which claims the benefit of and priority to U.S. Provisional Patent Application Ser. No. 62/852,494, filed May 24, 2019, titled "Data Caches and Related Systems and Methods," all of which are hereby incorporated herein by reference in their entireties.

FIELD OF THE DISCLOSURE

This disclosure relates generally to computer architecture, and, more particularly, to methods and apparatus to implement a data cache.

BACKGROUND

Computing systems include one or more processing cores to execute instructions by accessing data stored in memory. However, the amount of time it takes for the processing core to access data from the memory can be significant. Accordingly, most computing systems include a cache which stores an amount of data from the memory (e.g., typically smaller than the total amount of data in the memory) that has a high probability of being accessed by the processing core in the future. Accordingly, when the processing core calls for data, the cache can provide the data to the processing core faster than the processing core retrieving the data from the memory, thereby increasing the speed and efficiency of the computing system.

BRIEF DESCRIPTION OF THE DRAWINGS

FIG. 7C illustrates an example victim cache bank structure.

FIG. 7D illustrates an example main cache bank structure.

FIGS. 9A and 9B (collectively FIG. 9) illustrate example instruction servicing workflows.

FIGS. 10A-1 and 10A-2 (collectively FIG. 10A) illustrate an example data cache system.

FIGS. 10B-1 and 10B-2 (collectively FIG. 10B) illustrate a second example data cache system.

FIGS. 11B-1 and 11B-2 illustrate an example circuit implementation of an example unified cache store queue.

FIG. 12-33 are flowcharts representative of machine readable instructions which may be executed to implement the level one cache of FIGS. 1-3D.

DETAILED DESCRIPTION

Figure 1:
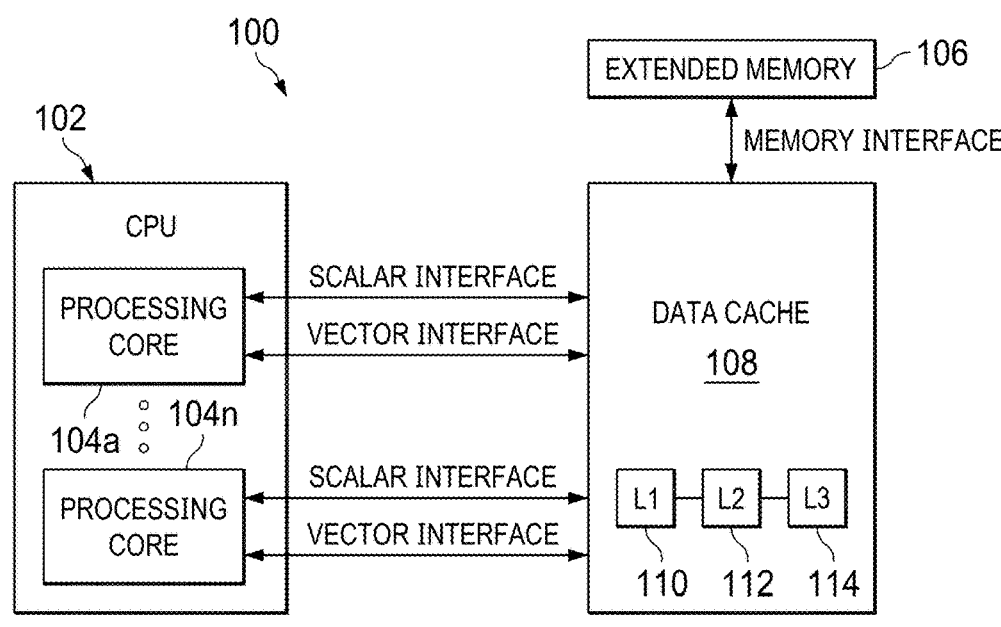
FIG. 1 is an example computing system described in conjunction with examples disclosed herein.

The figures are not to scale. Instead, the thickness of the layers or regions may be enlarged in the drawings. In general, the same reference numbers will be used throughout the drawing(s) and accompanying written description to refer to the same or like parts. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other. Stating that any part is in "contact" with another part means that there is no intermediate part between the two parts. Although the figures show layers and regions with clean lines and boundaries, some or all of these lines and/or boundaries may be idealized. In reality, the boundaries and/or lines may be unobservable, blended, and/or irregular.

Various forms of the term "couple" are used throughout the specification. These terms may cover connections, communications, or signal paths that enable a functional relationship consistent with the description of the present disclosure. For example, if device A generates a signal to control device B to perform an action, in a first example device, A is coupled to device B by direct connection, or in a second example device, A is coupled to device B through intervening component C if intervening component C does not alter the functional relationship between device A and device B such that device B is controlled by device A via the control signal generated by device A.

Consistent with the present disclosure, the term "config-ured to" describes the structural and functional characteris-tics of one or more tangible non-transitory components. For example, a device that is "configured to" perform a function mean that the device has a particular configuration that is designed or dedicated for performing a certain function. A device is "configured to" perform a certain function if such a device includes tangible non-transitory components that can be enabled, activated, or powered to perform that certain function. While the term "configured to" may encompass being configurable, this term is not limited to such a narrow definition. Thus, when used for describing a device, the term "configured to" does not require the described device to be configurable at any given point of time.

Moreover, the term "example" is used herein to mean serving as an instance, illustration, etc., and not necessarily as advantageous. Also, although the disclosure has been shown and described with respect to one or more imple-mentations, equivalent alterations and modifications will be apparent upon a reading and understanding of this specifi-cation and the annexed drawings. All such modifications and alterations are fully supported by the disclosure and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

While this specification contains many specifics, these should not be construed as limitations on the scope of what may be claimed, but rather as descriptions of features that may be specific to particular embodiments. Certain features that are described in this specification in the context of separate embodiments can also be implemented in combi-nation in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombina-tion.

Similarly, while operations are depicted in the drawings in an example particular order, this does not require that such operations be performed in the example particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above does not require such separation in all embodiments.

Descriptors "first," "second," "third," etc. are used herein when identifying multiple elements or components which may be referred to separately. Unless otherwise specified or understood based on their context of use, such descriptors do not impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

A central processing unit (CPU) is electronic circuitry that executes instructions making up a program or workload. A CPU may include one or more processor cores to execute the instructions by accessing data from main memory (e.g., extended memory). Because it takes time to access data from main memory, the one or more processor cores may obtain data from the memory and store it locally in local memory (e.g., a data cache). The local memory is smaller and faster than the main memory. In this manner, the processor cores can use and/or manipulate the data locally rather than interfacing with the main memory. Because the latency (e.g., the amount of time needed to read and/or write data to/from memory) for reading and/or righting data is smaller when accessing the cache, storing data from the extended memory in the cache increases the speed and efficiency of a com-puting system.

Some local memory devices (e.g., caches) include one or more victim caches. A victim cache is an additional storage included in or connected to a cache. Victim caches improve (e.g., reduce) the cache miss rate, and particularly reduce conflict misses, by storing data recently evicted from the corresponding cache. The addition of a victim cache can have a similar impact on cache performance. The benefit is most evident in cases when a victim cache is added to a direct mapped cache, because a direct mapped cache has a relatively high rate of conflict misses.

Some examples disclosed herein include an improved data cache and victim cache architecture that reduces overall cache latency. In some alternative cache designs, a victim cache typically resides at the end of a cache controller. When a line is evicted out of the cache controller (e.g., removed to make room for additional data), instead of removing the data line and sending the evicted data line all the way to the next level cache (e.g., L2) to be stored, the victim cache holds the evicted data line (e.g., victim data) until there is a reason to evict it out due to capacity or other reasons. In such a system, when a subsequent miss in the corresponding cache (e.g., L1 cache) occurs, the victim cache can service the miss and return the line to the corresponding cache, and thereby to a requesting processor core, so that the latency of read-miss is reduced. However, because some example systems include a victim cache in series with a main cache, the victim cache has to wait for the main cache to determine that the main cache does not have a data corresponding to a memory operation (also referred to herein as a memory instruction, memory request, and/or memory transaction) from a CPU (e.g., a read operation, instruction, request, and/or transac-tion, a write operation, instruction, request, and/or transac-tion, a read-modify-write operation, instruction, request, and/or transaction, an atomic operation, instruction, and/or transaction, a histogram operation, instruction, request, and/or transaction, etc.) before a victim cache can determine whether the memory address is stored in the victim cache. Examples disclosed herein include a cache system that decreases latency (e.g., increases speed), reduces the number of cycles to perform write operations, atomic operations (e.g., manipulating data stored in a location to increment, decrement, swap with other data, etc.), and/or histogram operations (e.g., determine a total number of each value in a cache line), and/or increases efficiency of a computing system that includes a cache.

FIG. 1 illustrates an example computing system 100. The example computing system 100 includes an example CPU 102, example processing cores 104a-104n, an example extended memory 106, and an example data cache 108. The example data cache 108 includes an example level one (L1) cache 110, an example level two (L2) cache 112, and an example level three (L3) cache 114. Although the example computing system 100 of FIG. 1 includes N processing cores and three levels of cache. The example computing system 100 may include any number of processing cores and/or levels of cache. Additionally, one or more of the example components of the computing system 100 may be implemented on the same die and/or different dies in the same chip and/or different chips.

The example CPU 102 of FIG. 1 includes the example processing cores 104a-104n. The processing cores 104a-104n may be incorporated in the same die or in separate dies (e.g., connected via one or more interfaces). The CPU 102 connects to the example data cache 108 via one or more interfaces. For example, the example core 104a of the example CPU 102 may be connected to the data cache 108 via a scalar interface (e.g., a 64-bit wide bidirectional and/or unidirectional interface) and/or a vector interface (e.g., a 512-bit wide interface). The use of the scalar interface and the vector interface may be based on interface utilization, data size, and/or other considerations. For example, a scalar read operation may be transmitted via the scalar data while the data corresponding to the scalar read may be transmitted over the vector interface. Additionally, either the scalar interface and/or the vector interface may be used if the other interface is busy. In some examples, the CPU 102 may be connected to the data cache 108 using a different number and/or different types of interfaces.

The processing cores 104a-104n of FIG. 1 access data from the example extended memory 106 and/or the example cache 108 to execute instructions stored in the example extended memory 106 and/or the example data cache 108. The example cores 104a-104n can execute different processes at the same time to speed up the execution of tasks (e.g., instructions) of the computing system 100. For example, the cores 104a-104n may execute instructions from a workload of an application by writing and/or reading data to/from the extended memory 106 and/or the data cache 108. Because the data cache 108 includes a copy of some of the data stored in the example extended memory 106, when one of the example cores 104a needs to access (e.g., read and/or write) data from the extended memory 106, the example core 104a transmits the read and/or write instructions to the example data cache 108. As further described below, if the data cache 108 includes the data corresponding to the instructions from the core 104a (e.g., corresponding to a cache hit), the data cache 108 fulfills the request and/or instructions from the processing core 104a. If the data cache 108 does not include the data corresponding to the instructions from the cores 104a (e.g., corresponding to a cache miss), the data cache 108 interfaces with the example extended memory 106 to perform the transaction from the core 104a.

The example extended memory 106 of FIG. 1 is connected to the example data cache 108 via an interface (e.g., a 1024-bit wide extended memory interface). However, a different number and/or a different type of interface may be additionally or alternatively used. The example extended memory 106 stores all the data that can be accessed for the computing system 100. The example extended memory 106 can be incorporate into the computing system 100 and/or may be memory external to the computing system 100 (e.g., off-chip memory). In some examples, extended memory 108 interacts with a controller of the highest cache (e.g., the example L3 cache 114), and the highest cache (e.g., L3 cache 114) interacts with the next highest cache (e.g., the example L2 cache 112), and so on. In such examples, the CPU 102 transmits memory operations to the example L1 cache 110 and if the memory operation cannot be served by the L1 cache 110, the L1 cache 110 transmits the memory operation to L2 cache 112, and so on. In the example of FIG. 1, if the L3 cache 114 (e.g., the highest level cache) cannot perform a read or write transaction (e.g., because the memory address is not located in the local storage of the L3 cache 114), the L3 cache 114 interacts with the extended memory 106 to read or write the corresponding data to the memory address. The extended memory 106 may be on chip or off chip memory (e.g., DDR) and the interface to the extended memory may be $2^N$ bits, where N depends on the type of extended memory used. In some examples, there can be a prefetcher and/or preload mechanism in any of the data caches which can pull data from the example extended memory 106 prior to execution of a problem to be stored locally at the cache before the CPU 102 executes any instructions, the memory 106 provides copies of the data stored in the memory to the example data cache 108. The data cache 108 may request additional information and/or instruct the extended memory 106 to adjust the stored data in the extended memory 106 periodically, aperiodically, and/or based on a trigger, based on instructions from the CPU 102.

The example data cache 108 of FIG. 1 stores blocks of data (e.g., a cached subset of the data stored in the extended memory 106) from the example extended memory 106 to reduce the time needed for the example CPU 102 to access the cached subset, thereby improving system performance. For best performance, attempts are made so that the data in the data cache 108 corresponds to the data most likely to be used by the CPU 102. The data cache 108 provides access to the cached data when called upon by the CPU 102 during a cache hit (e.g., when the requested data is stored in the data cache 108). If the CPU 102 requests data that is not included in the data cache 108 (e.g., a cache miss), the data cache 108 retrieves the corresponding data from the extended memory 106. For example, if the CPU 102 transmits a read operation for corresponding to a particular address of the extended memory 106, the data cache 108 determines whether the data corresponding to the particular address of the extended memory 106 is cached in the data cache 108. If the data cache 108 determines that the data is cached, the data cache 108 provides the data to the CPU 102 to be read. If the data cache 108 determines that the data is not cached, the data cache 108 obtains the data from the extended memory 106 and returns the data to the CPU 102. Additionally, the example data cache 108 may update the cached data based on the cache misses (e.g., to mitigate against future cache misses). For write transactions from the CPU 102, the example data cache 108 may temporarily store the corresponding data before providing it to update older data stored in the extended memory 106.

The example data cache 108 includes the example L1 cache 110, the example L2 cache 112, and the example L3 cache 114. The levels of the cache may be based on speed and/or size. For example, the example L1 cache 110 may be the fastest cache and smallest, followed by L2 112 (e.g., slower than L1 110 but larger) and L3 114 (e.g., slower than L2 112 but larger). Typically, the most commonly used data is stored in the L1 110 followed by the L2 112 and the L3 114. Accordingly, when the CPU 102 calls for an address to be written to or read from, the instruction from the CPU 102 is first sent to the L1 cache 110 and, if the corresponding data is not stored in the L1 cache 110, then the instruction is sent to the L2 cache 112. If the corresponding data is not stored in the L2 cache 112, the instruction is sent to the L3 cache 114. If the corresponding data is not stored in the L3 cache 114, the example data cache 108 accesses the data from the extended memory 106.

As further described below, the example L1 cache 110 of FIG. 1 includes a main cache and victim cache to execute instructions form the CPU 102 in parallel. A victim cache stores victim data (e.g., data that was evicted from the main cache to make room for new data corresponding to other address locations of the extended memory 106). In this manner, when there is a cache miss at the L1 level, the main L1 cache evicts a first set of data (e.g., the victim data) to make room for a second set of data that corresponds to the transaction that caused the cache miss. The victim cache then stores the first set of data that was removed from the main cache to make room for the second set of data in the main cache.

Figure 2:
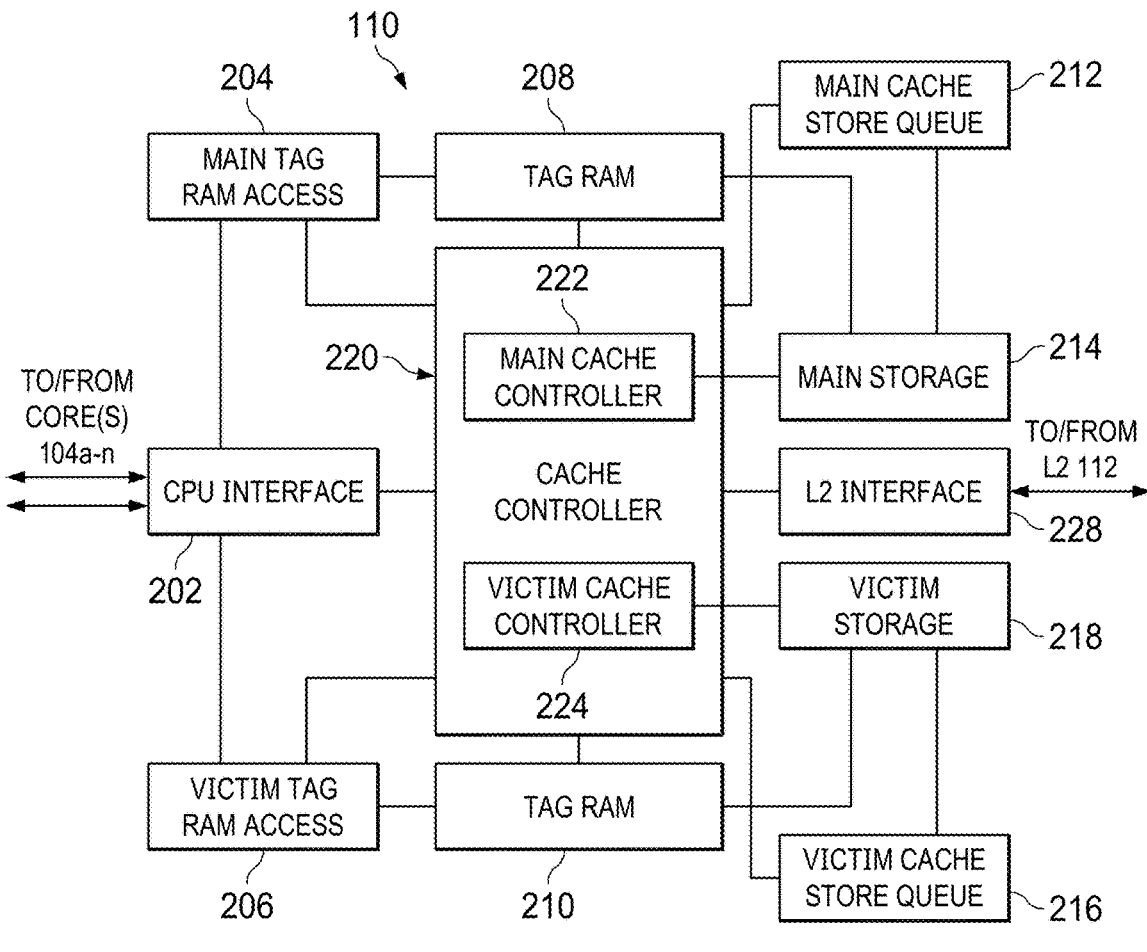
FIG. 2 is a block diagram of an example level one cache of the example computing system of FIG. 1.

FIG. 2 is an example block diagram of the L1 cache 110 of FIG. 1. The example L1 cache 110 includes an example CPU interface 202, example tag random access memory (RAM) accesses 204, 206, example tag RAM 208, 210, an example main cache store queue 212, an example main storage 214 (also referred to as main cache storage or main cache), an example victim cache store queue 216, an example victim storage 218 (also referred to as victim cache storage or victim cache), an example cache controller 220, an example main cache controller 222, an example victim cache controller 224, and an example L2 interface 228.

The example CPU interface 202 connects the CPU 102 (e.g., the core(s) 104a-104n of the CPU 102) to the components of the L1 cache 110. The CPU interface 202 is connected to the tag RAM accesses 204, 206 and the cache controller 220. The example CPU interface 202 receives instructions from the example core(s) 104a-104n of the example CPU 102. The instructions may include, read instructions, write instructions, read-modify-write instructions, atomic instructions, etc. When the CPU interface 202 obtains instructions corresponding to particular data stored at a particular address, the CPU interface 202 interfaces with the cache controller 220 and the main tag RAM access 204 to determine whether the corresponding data is stored in the main storage 214 and/or the victim storage 218 to perform the transaction. Additionally, for some types of transactions (e.g., read transactions) the example CPU interface 202 returns corresponding data to the example CPU 102. Furthermore, when the CPU interface 202 obtains instructions corresponding to data at a particular address, the main components (e.g., the example main tag RAM access 204, the example tag RAM 208, the example main cache store queue 212, the example main storage 214, and the example main cache controller 222) and the victim components (e.g., the example tag RAM access 206, the example tag RAM 210, the example victim cache store queue 216, the example victim storage 218, and the example victim cache controller 224) operate in parallel (e.g., at the same time) to determine whether data from the corresponding address is stored in the main storage 214 and/or the victim storage 218.

The example main tag RAM access 204 of FIG. 1 is coupled to the tag RAM 208 and the cache controller 220. The victim tag RAM access 206 is coupled to the tag RAM 210 and the cache controller 220. The main tag RAM access 204 accesses the tag RAM 208 to determine whether the data from a memory address corresponding to the instructions from the CPU 102 is present in the main storage 214. The example victim tag RAM access 206 accesses the tag RAM 210 to determine whether the data from a memory address corresponding to the instructions from the CPU 102 is present in the victim storage 218 in parallel with the main tag RAM access 204. In some examples, the main tag RAM access 204 is implemented in the tag RAM 208 and the victim tag RAM access 206 is implemented in the tag RAM 210. When the main tag RAM access 204 and/or the victim tag RAM access 206 determines address(es) corresponding to the instructions from the CPU 102 is/are present in the respective tag RAM 208, 210, the main tag RAM access 204 and/or the victim tag RAM access 206 transmits the results (e.g., the determination and/or any corresponding data) to the example cache controller 220.

In some examples, the main storage is directly mapped. Accordingly, in such examples, a particular CPU memory address can only be stored at a particular location of the main storage 214. Thus, the example tag RAM 208 can potentially have a fixed memory address for the CPU instruction. In a directly mapped cache, a given address is stored at a particular location of the tag RAM 208.

The example tag RAM 208 of FIG. 2 is coupled to the example cache controller 220 and the example main storage 214. The example tag RAM 208 stores a table that records the entries in the example main storage 214 that correspond to memory addresses in the extended memory 106. In this manner, the example main tag RAM access 204 can review the table to determine if data corresponding to instructions from the CPU 102 is available in the main storage 214. The example tag RAM 210 is coupled to the example cache controller 220 and the example victim storage 218. The example tag RAM 210 stores a table that records the entries in the example victim storage 218. In this manner, the example victim tag RAM access 206 can review the table to determine if data corresponding to instructions from the CPU 102 is available in the victim storage 218. When the data of the main storage 214 is updated, the example tag RAM 208 may update the table to reflect any changes to the entries. For example, if the main storage 214 removes a first set of data corresponding to a first memory address in the extended memory 106 and replaces it with a second set of data corresponding to a second memory address in the extended memory 106, the example tag RAM 208 updates the table to reflect that the first set of data of the first memory address is no longer stored in the main storage 214 and the second set of data of the second memory address is now stored in the main storage 214. Likewise, when data from a first address location of the victim storage 218 is changed to data from a second address location, the example tag RAM 210 may update the table to reflect any changes to the entries.

The example victim-side tag RAM 210 may be a content addressable memory (CAM). In some examples, the victim storage 218 is fully-associative (e.g., any location of the victim storage 218 can be used to store data from any CPU address). Thus, when the example CPU 102 provides a memory address to the example L1 cache 110, the example victim tag RAM 210 compares the provided memory address to all the entries of the tag RAM 210. If there is a match between the provided address and the entries stored in the tag RAM 210, then the address of the corresponding location in the victim storage 218 is output by the tag RAM 210. The address is used to obtain the data from the victim storage 218 that corresponds to the CPU instruction.

The example main cache store queue 212 of FIG. 2 is coupled to the example main storage 214 and the example cache controller 220. The example main cache store queue 212 is used when the CPU 104 issues a store operation (e.g., write operation, atomic compare and swap, atomic operation, etc.). The example main cache store queue 212 can implement read-modify-write functionality. Read-modify-write functionality includes storing data in the local storages where there is a need to first read an older version of the data being written that is already present in the main storage 214 for reasons including updating error correction code data. In this manner, while the read operation is being performed to get a copy of the older data from the main storage 214, the new bit(s) included in the write portion of the read-modify-write transaction from CPU 102 is/are buffered in the main cache store queue 212. When the older data is available then only the new bit(s) which the CPU 102 is/are overwriting are updated in the store queue buffer and the updated (e.g., merged) data is written back to the main storage 214. For example, the new bit(s) which the CPU 102 is/are overwriting from the write portion of the read-modify-write transaction (e.g., from the CPU 102) including the corresponding memory address are buffered in the main cache store queue 212 until the old data of the corresponding write (e.g., store) instruction is read from the main storage 214. When the new bit(s) included in the write portion of the read-modify-write transaction are merged with the old data from the main storage 214, the updated (e.g., merged) data is written back into the main storage 214. The extra pipelining for the store instructions provided by the main cache store queue 212 enables the instructions from the CPU 104 to continue execution when prior store instructions are waiting for load data from the main storage 214 to be available. In some examples, a main storage 214 includes SRAM, as further described below in conjunction with Sections 5 and 16. The example main cache store queue 212 is further described below in conjunction with FIGS. 3A, 3B, 3C, 3D and 4.

The example victim cache store queue 216 of FIG. 2 is coupled to the example victim storage 218 and the example cache controller 220. The example victim cache store queue 216 buffers data that is to be stored in the example victim storage 218. For example, victim values from store instructions (e.g., from the cache controller 220) including the corresponding memory address and/or store data are buffered in the victim cache store queue 216 until a prior or old value of the corresponding store instruction is read from the victim storage 218. When stored bytes are merged with the prior/old data from the victim storage 218, the value is written back into the victim storage 218. While the victim cache store queue 216 may process read, modify, and/or write operations from the cache controller 220 that were transmitted in response to a retirement point met (e.g., when one or more cache lines is removed from the L1 cache 110 to the L2 cache 112), in other examples disclosed herein, the victim cache store queue 216 may process read, modify, and/or write operations from the cache controller 220 that were transmitted directly from the CPU 102. The example victim cache store queue 216 is further described below.

The example main storage 214 of FIG. 2 is coupled to the example tag RAM 208, the example main cache store queue 212, and the example cache controller 220. The example main storage 214 stores data (e.g., entries) that correspond to data in memory address locations in the extended memory 106. The main storage 214 stores that data that has a high probability of being called upon by the example CPU 102.

The stored data may be updated when, for example, the CPU 102 attempts to access (e.g., read, write, etc.) data that is not cached in the example main storage 214. The example main storage 214 may be or include static RAM (SRAM) and/or any other type of storage which provides a single cycle access to stored data.

The example victim storage 218 of FIG. 2 is coupled to the example the example tag RAM 210, the example victim cache store queue 216 and the example cache controller 220. The example victim storage 218 stores data (e.g., entries) corresponding to memory address locations that have been removed from the example main storage 214 to make room for data from other address locations that the CPU 102 more recently accessed or is more likely to access. The example victim storage 218 may be or include a register file, static RAM (SRAM), and/or any other type of storage.

In operation, initially, the example main storage 214 stores data from different addresses in the example extended memory 106 based on likelihood of use. If the example CPU 102 sends an instruction corresponding to a memory address that is stored in the main storage 214, the example cache controller 220 controls the components to perform the transaction. For example, the cache controller 220 may transmit an instruction to the main cache store queue 212 for subsequent processing and storage in the main storage 214. If the example CPU 102 sends an instruction corresponding to a memory address that is not stored in the main storage (e.g., stored in the victim storage 218), the example main storage 214 may store the data at the corresponding memory address after the data is retrieved from another storage. To make room for the data, the main storage 214 removes some data corresponding to one or more memory address locations. The removed data and corresponding memory address locations are called victims or evicted lines. The selection of which data is to be a victim is based on various parameters according to a replacement policy. After being removed from the main storage 214, the victim is stored in the example victim storage 218. If the victim storage 218 is full, the victim storage 218 removes data (e.g., a second victim) to make room to store the victim from the main storage 214. After the second victim is removed from the victim storage 218, the second victim is transmitted to L2 cache 112 for storage.

Although the example L1 cache 110 of FIG. 1 includes one main cache store queue 212 with corresponding main storage 214 and one example victim cache store queue 216 with corresponding victim storage 218, the example main cache store queue 212 and/or the example victim cache store queue 216 may include multiple store queues corresponding to multiple storages. For example, the main storage 214 and/or the victim storage 218 may be divided into a plurality of independently addressable banks (e.g., into any number of storage devices with any number of line widths, rows, etc.), where individual banks may have its own corresponding store queue. For example, a main storage 214 made up of 256 rows with each row having a line width of 1024 bits may be divided into 16 main storages (e.g., banks) with 64 bits per row in a particular bank, where each bank may have their own main store queue. In such an example, if vector data for a read and/or write request that hits the L1 cache 110 is 512 bits wide, the cache controller 220 may process the request as 8 parallel writes and/or reads to the 8 banks. In such a multi-bank set up, the read and/or write operations may be sent to the banks in parallel and the banks arbitrate their own process in response to the read and/or write operations. By operating independently, operation of the multi-bank approach is more efficient than a single main storage (e.g., because the entire cache line is not locked up when a request is received and only a portion of the cache line allocated to the bank that received such a request would be locked), at the expense of complication and/or parts.

The example cache controller 220 of FIG. 2 is coupled to the components of the L1 to control how data is read and/or written in the example storages 214, 216, and/or how data is updated in the example storages 214, 218. For example, when a read request, a write request, an atomic request, a read-modify-write request, etc. is received at the example CPU interface 202, the cache controller 220 obtains the request and instructs the other components accordingly. For example, during a read request for data at a particular location of the extended memory 106, the example cache controller 220 instructs the main tag RAM access 204 to access the tag RAM 208 to determine if the main storage 214 is storing the data corresponding to the location of the extended memory 106 from the read request. If the main tag RAM access 204 determines that the entry is located in the main storage 214 (e.g., a cache hit), the cache controller 220 determines the location of the particular entry based on the data in the tag RAM 208 and interfaces with the main cache store queue 212 to read the value from the example main storage 214 and returns the value to the CPU 102 via the CPU interface 202. The example cache controller 220 includes the main cache controller 222 to control the main cache components (e.g., the example main tag RAM access 204, the example tag RAM 208, the example main cache store queue 212, and the example main storage 214) and the example victim cache controller 224 to control the victim cache components (e.g., the example victim tag RAM access 206, the example tag RAM 210, the example victim cache store queue 216, and the example victim storage 218) in parallel with the main cache controllers 222 control of the main cache components. In some examples, the cache controllers 222, 224 may be separate controllers and/or combined to operate in a single controller.

The example cache controller 220 of FIG. 2 interfaces with the example L2 interface 228 to obtain data to be stored in the example main storage 214 (e.g., initially, after a cache miss, etc.). Additionally, the example cache controller 220 may transmit updates to the data of the main storage 214 and/or the victim storage 218 to the L2 cache 112 when new data is written (e.g., when old data is written over), so that read instructions from the CPU 102 are propagated to the L2 cache 112 via the L2 interface 228. The example cache controller 220 interfaces with the example L2 interface 228 to transmit and/or receive data from the L2 cache 112 and/or the L3 cache 114 (e.g., directly or via the L2 cache 112). For example, when the main storage 214 and the victim storage 218 do not include a memory address location for data corresponding to instructions from the CPU 102 (e.g., corresponding to a cache miss), the example cache controller 220 transmits the instruction to the example L2 cache 112 via the L2 interface 228. The cache controller 220 may receive the corresponding data from the L2 cache 112 via the L2 interface 228 if the data is stored in the L2 cache 112 or the L3 cache 114. In such an example, the cache controller 220 may store the corresponding information from the L2 cache 112 in the main storage 214. In some examples, when the victim storage 218 has to remove data for a particular location (e.g., an old victim) to make room for a new victim from the main storage 214, the example cache controller 220 may transmit the old victim to the L2 cache 112 via the L2 interface 228 to be stored in the L2 cache.

FIGS. 3A-3D illustrate an example circuit implementation of the L1 cache 110 of the example computing system 100 of FIG. 1. The example implementation of FIGS. 3A-3D includes the example CPU interface 202, the example tag RAMs 208, 210, the example main cache store queue 212, the example main storage 214, the example victim cache store queue 216, the example victim storage 218, and the example cache controller 220 of FIG. 2. The example implementation of FIGS. 3A-3D further includes an example modify, exclusive, shared, invalid (MESI) RAM 300, example address processing components 302a-c, example bank processing logic 303, example hit/miss comparison logic 304, 306, an example replacement policy component 308, an example flush engine 309, an example error correcting code (ECC) logic 310, 312, example data multiplexer (MUX) circuits 314, 316, an example MUXs 318, 320, and example latches 322.

In the example implementation of FIGS. 3A-3D, the example CPU interface 202 includes two interfaces (e.g., one scalar and one vector interface, both interfaces having two parts, one for input data from the CPU 102 and one for output data to the CPU 102). The input CPU interface 202 of FIGS. 3A-3D includes an elastic buffer to buffer incoming data from the CPU 102, a multiplexer to select between the buffered data from an elastic buffer in case there are pending CPU instructions in the elastic buffer and instructions coming directing from the CPU 102 in case the elastic buffer queue is empty, and breaks the incoming instructions into the corresponding address, operation (e.g., read, write, etc.) and write data (e.g., if the instructions correspond to a write operation). The output CPU interface 202 of FIGS. 3A-3D transmits data back to the CPU 102.

The example main cache store queue 212 of FIGS. 3A-3D includes blocks that correspond to operations of the main cache store queue 212. For example, the main cache store queue 212 includes blocks to implement a read-modify-write operation, write merging, write data forwarding, writing operation, complete parity block write data, weighted histogram operations, load and increment operations, and compare and swap operations. The example main cache store queue 212 is further described below in conjunction with FIG. 4A. The example main cache store queue 212 operates in conjunction with the example main storage 214. In the example of FIGS. 3A-3D, the main storage 214 is data RAM (DRAM).

The example victim cache store queue 216 of FIGS. 3A-3D includes blocks that correspond to operations of the victim cache store queue 216. For example, the victim cache store queue 216 includes blocks to implement a read-modify-write operation, write merging, write data forwarding, writing operation, complete parity block write data, load and increment operations, and compare and swap operations. The example victim cache store queue 216 is further described below in conjunction with FIG. 5. The example victim cache store queue 216 operates in conjunction with the example victim storage 218. In the example of FIGS. 3A-3D, the main storage 214 is a register file.

The example MESI RAM 300 of FIGS. 3A-3D is connected to the command line of the example CPU interface 202 and the example DRAM 214. The example MESI RAM 300 tracks the state of the data in the example main storage 214 based on the command from the CPU 102. For example, the MESI RAM 300 tracks the states of a cache line by marking the cache line as modified, exclusive, shared, or invalid. Modified, or dirty, corresponds to when the cache line contains data that is not stored in any other similar-level cache and the data has been modified from the value in main memory (e.g., so that a read of the data in extended memory 106 is flagged or permitted because it is not up-to-date or valid). Exclusive is when the cache line contains data that is not stored in any other similar-level cache and the data is clean (e.g., matches the data in the extended memory 106). Shared indicates that the cache line contains data that may be stored in other caches and is clean (e.g., the line may be discarded because it is present in another cache). Invalid indicates that the cache line is invalid or unused. The MESI RAM 300 may be called upon when updates to the main storage 214 and/or the extended memory 106. The example MESI RAM 300 for victim cache is implemented in conjunction with the example tag RAM 210.

The example MESI RAM 300 of FIGS. 3A-3D adds coherency to the system by tracking, labelling, marking, etc. The status of a memory address may prevent data writes at particular times so that data mismatches do not occur at different levels of cache. The state tracked by the MESI RAM 300 may be transmitted with cache misses so that the higher level cache understands what the data at the memory address will be used for. For example, if the L1 cache sends out a cache miss for a read operation, the cache miss includes the shared state to let the high level cache know that the data will be read but not manipulated. If the L1 cache 110 sends out a cache miss for a write operation, the cache miss includes an exclusive state to let the higher level cache know that the data will be modified. When the example main storage 214 and/or the victim storage 218 evicts a victim, the status from the example MESI RAM 300 may be used to figure out how to evict. For example, if the data is shared, the main storage 214 and/or victim storage 218 can simply discard (e.g., because the data at memory address already located in a high cache). If the data is exclusive or modified, the cache controller 220 instructs the interface 228 to transmit the victim to the higher level cache (e.g., because the data for the memory address is not located in higher level cache or is located in higher level cache but is outdated).

The example address processing components 302*a-c* of FIGS. 3A-3D are connected to the CPU interface 202, the example main storage 214, the example main cache store queue 212 (e.g., via the MUX 318), the example victim storage 218 (e.g., via the example MUX 320) and each other. The example address processing components 302*a-c* include an example first address processing component 302*a*, a second address processing component 302*b*, and a third address processing component 302*c*. The first address processing component 302*a* performs address translation, the second address processing component 302*b* performs data rotation, and the third address processing component 302*c* facilitates bank organization. Alternatively, one or more of the first address processing component 302*a*, the second address processing component 302*b*, and the third address processing component 302*c* can be included in the same hardware, logic circuit, integrated chip, etc. The example address processing components 302*a-c* organizes data to be written into the example main storage 214 and the victim storage 218 according to a particular storage protocol to ensure that the data is stored correctly. For example, in a multi-bank example (e.g., where the main cache store queue 212, the main storage 214, the victim cache store queue 216, and the victim storage 218 are broken up into multiple banks), the address processing components 302*a-c* may use a memory address from a CPU operation to determine which banks of the main cache store queue 212, the main storage 214, the victim cache store queue 216, and the victim storage 218 is broken up into multiple banks would be needed for the given CPU operation.

The example bank processing logic 303 is coupled to the CPU interface 202, the example main storage 214, the example main cache store queue 212 (e.g., via the MUX 318), and the example victim storage 218 (e.g., via the example MUX 320). In operation, the bank processing logic 303 is configured to analyze read, modify, and/or write instructions from the CPU interface 202. In this manner, the bank processing logic 303 is configured to determine the nature of the read, modify, and/or write instructions to facilitate efficient partial bank read, modify, and/or write instructions. In examples disclosed herein, the bank processing logic 303 detects whether incoming write instructions indicate a write of an entire bank, or a write of a partial bank. In this manner, the bank processing logic 303 can indicate whether to operate a read-modify-write operation, while negating to transmit the read instruction. Example description of bank processing logic 303 operation is described below.

The example hit/miss comparison logic 304 of FIGS. 3A-3D is connected to the input CPU interface 202, the tag RAM 208, the main storage 214, the main cache store queue 212, the cache controller 220, and/or the example MUX circuit 314 (e.g., via a data forward latch). The hit/miss comparison logic 304 obtains the address from the tag RAM 208 and an address of the instruction from the CPU 102 and compares the two (e.g., using exclusive nor (XNOR) logic) to determine whether the address from the instruction hit or missed (e.g., the data corresponding to the address is stored in the example DRAM 214 or not). The example hit-miss comparison logic 304 includes TAG compare logic to output the result of the comparison to the example main cache store queue 212, the example cache controller 220, and/or to the example MUX circuit 314.

The example hit/miss comparison logic 306 of FIGS. 3A-3D is connected to the input CPU interface 202, the tag RAM 210, the victim cache store queue 216, and/or the example replacement policy component 308. The hit/miss comparison logic 306 obtains the entry number of the victim cache (e.g., location) from the tag RAM 210 and an address from the instruction from the CPU interface 202 and compares the two to determine if the access (e.g., the instruction from the CPU interface 202) is a hit or miss (e.g., the data corresponding to the address is stored in the example victim storage 218 or not). The example hit-miss comparison logic 306 outputs the result to the replacement policy component 308, the address encoder 326, the multiplexer 330, and/or the victim cache store queue 216.

The address encoder 326 of FIGS. 3A-3D is connected to the tag RAM 210 (via the hit/miss comparison logic 306) and a multiplexer 330. The address encoder 326 encodes an address of the tag RAM 210 to a form that is interpretable by the victim storage 218. For example, the tag RAM 210 may store 16-bit memory addresses while the victim storage 218 stores 4-bit memory addresses corresponding to the 16-bit memory addresses. Thus, the address encoder 326 may transform the 16-bit memory address into a 4-bit memory address to locate and/or enter the corresponding memory address in the victim storage 218. Additionally and/or alternatively, the address encoder 326 encodes the memory address into any bit value. The address encoder 326 is coupled to an example multiplexer 330, such that the address encoder 326 provides the encoded address to the multiplexer 330.

The example replacement policy component 308 of FIGS. 3A-3D is connected to the hit-miss comparison logic 306 and a replacement address encoder 328. In some examples, the replacement policy component 308 is connected to the tag RAM 210. The example replacement policy component 308 controls the replacement policy of data stored in the example victim storage 218 (e.g., which data to move out of the victim cache in the event that a new victim is to be stored in the victim storage 218). In some examples, there may be a replacement policy component for the example main storage 214. However, a replacement policy is not required for a direct mapped cached (e.g., if the example main storage 214 is directly mapped because a particular address will only go in one location). The example flush engine (e.g., the flush engine component) 309 is coupled to the replacement policy 308. In some examples, the flush engine 309 is used and/or otherwise invoked to flush out write misses stored inside the victim storage 218 at a pre-defined periodicity.

The replacement address encoder 328 of FIGS. 3A-3D is coupled to the multiplexer 330, such that the replacement address encoder 328 provides the encoded replacement address to the multiplexer 330. The replacement address encoder 328 encodes an address selected by the replacement policy component 308. For example, the replacement policy component 308 outputs a 16-bit replacement memory address to the replacement address encoder 328, and the replacement address encoder 328 transforms the 16-bit replacement memory address to a 4-bit replacement memory address. Additionally and/or alternatively, the replacement address encoder 328 encodes the replacement memory address into any bit value.

The multiplexer 330 of FIGS. 3A-3D is connected to the hit/miss comparison logic 306, the address encoder 326, the replacement address encoder 328, and an address read 332. The multiplexer 330 selects an encoded address based on the result of the hit/miss comparison logic 306 (e.g., based on whether the access was a hit or miss). The multiplexer 330 provides the selected memory address to the address read 332 to be read into the victim storage 218. For example, the multiplexer 330 outputs the location of the victim storage 218 which the CPU instruction may use to either read the data from or store the data in case of a write instruction.

The example error correcting code (ECC) logic 310 of FIGS. 3A-3D is connected to the example main storage 214 via the latch 322, and the MUXing circuit 314. If the example L1 cache 110 supports ECC memory, the example main storage 214 stores data in blocks along with a set of ECC syndrome bits that correspond to the blocks. When a read operation is received, the example main storage 214 may provide the stored data block and the corresponding ECC syndrome bits to the ECC logic 310. The example ECC logic 310 may regenerate the ECC syndrome bits based on the data block as read from the main storage 214 and compare the regenerated ECC syndrome bits with the previously stored bits. The example ECC logic 310 may determine that a data block has been incorrectly read when there is a discrepancy and may correct the error in the data block.

The example error correcting code (ECC) logic 312 of FIGS. 3A-3D is connected to the example victim storage 218 via the latch 324, and the MUX circuit 316. The example ECC logic 312 performs ECC correction logic in a similar manner as the example ECC logic 310. However, the example ECC logic 312 performs the ECC syndrome bit comparison with respect to the example victim storage 218.

The example main data MUX circuit 314 of FIGS. 3A-3D is connected to the main cache store queue 212, the ECC logic 310, the output of the hit/miss comparison logic 304 (e.g., via a latch), the example output CPU interface 202 (e.g., via the example latch 322), the example victim data MUX 316, and the example cache controller 220. The example main data MUX circuit 314 has the reverse operation of the example address processing components 302*a-c* to convert the data in the data address to be transmitted to the example CPU 102. The MUXs within the example MUX circuit 314 are controlled by the cache controller 220 via the respective select inputs.

The example victim data MUX circuit 316 of FIGS. 3A-3D is connected to the victim cache store queue 216, the ECC logic 312, the example main data MUX circuit 314, the L2 cache 112 (e.g., via a latch), and the example cache controller 220. The example main data MUX circuit 314 has the reverse operation of the example address processing components 302*a-c* to convert the data in the data address to be transmitted to the example CPU 102. The MUXs within the example MUX circuit 316 are controlled by the cache controller 220 via the respective select inputs.

The example MUX 318 of FIGS. 3A-3D is connected to the L2 cache 112, the example CPU interface 202 via a latch, the address processing components 302*a-c*, the main cache store queue 212, the main storage 214, and the cache controller 220. The example cache controller 220 controls the MUX 318 to control all the ways that data could be written into or read from the example main storage 214 (e.g., via direct memory access (DMA), a snoop transaction (e.g., when the L2 cache 112 wants data from the L1 cache 110), the main cache store queue 212, the read hit buffer, etc.). The example MUX 320 is connected to the example main storage 214 (e.g., via the eviction line for storing victims), the address processing components 302*a-c* (e.g., via the write-stream and/or CPU load), the example L2 cache 112 (e.g., via the L2 W and/or snoop lines), the victim storage 218, and/or the cache controller 220. The example cache controller 220 controls the MUX 320 to control all the ways that data could be written into or read from the example victim storage 218 (e.g., via direct memory access (DMA), a snoop transaction, the victim cache store queue 216, an eviction from the example main storage 214, via L2 cache 112, etc.). The example MUXs 318, 320 are controlled by the example cache controller 220 via the respective select inputs.

Figure 3A:
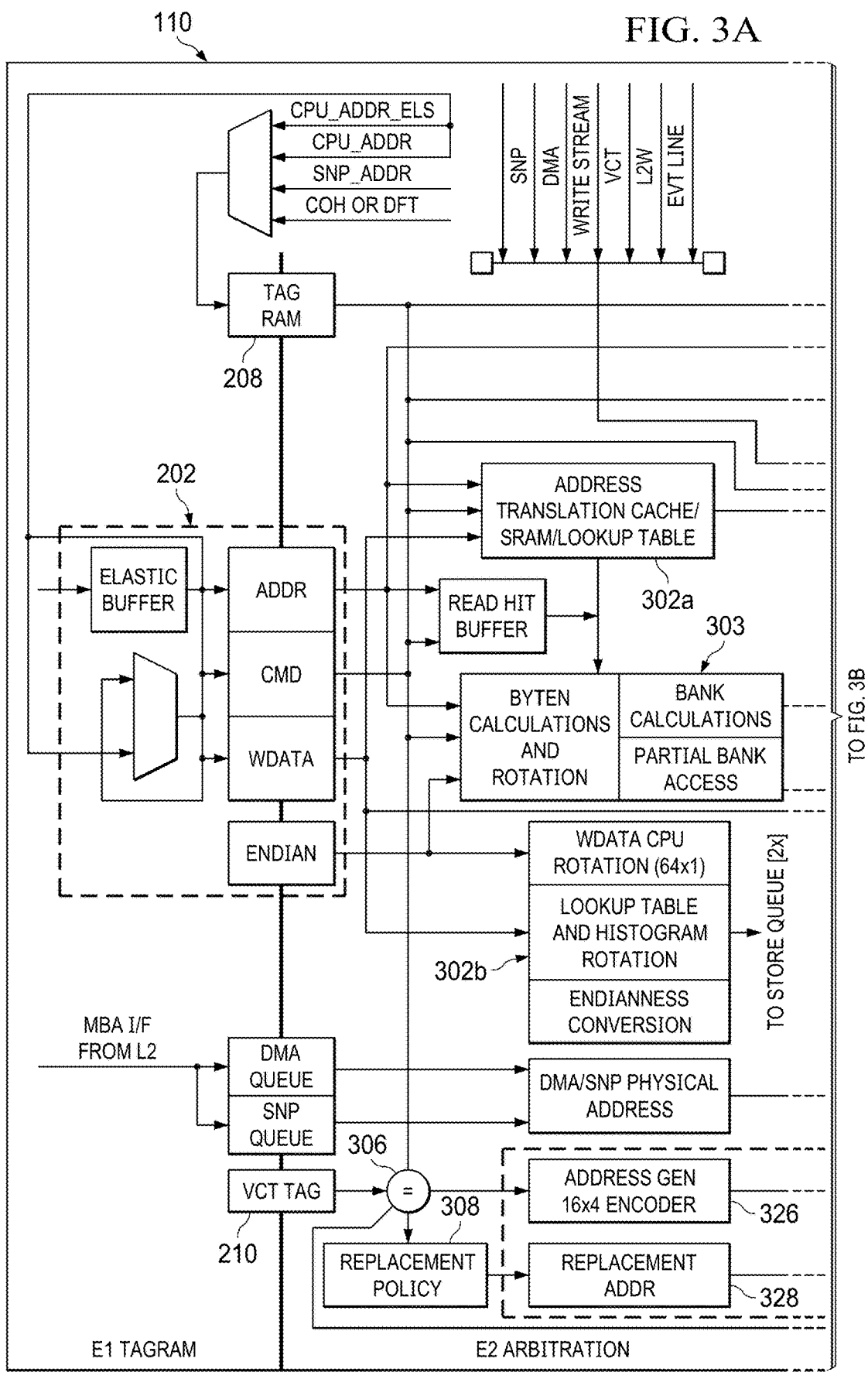
FIGS. 3A-3D illustrate an example circuit implementation of the level one cache of the example computing system of FIG. 1.
Figure 3B:
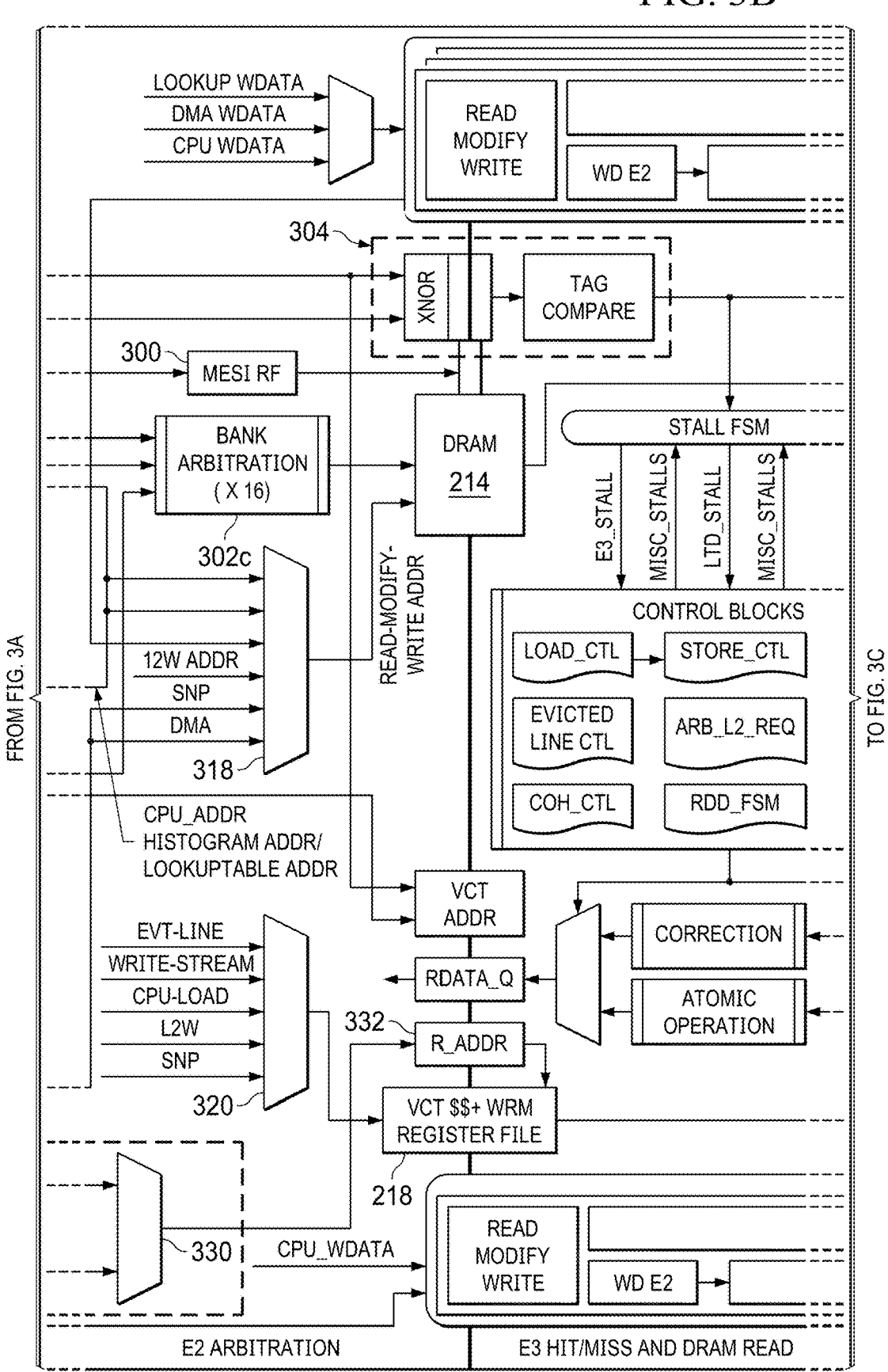
Figure 3C:
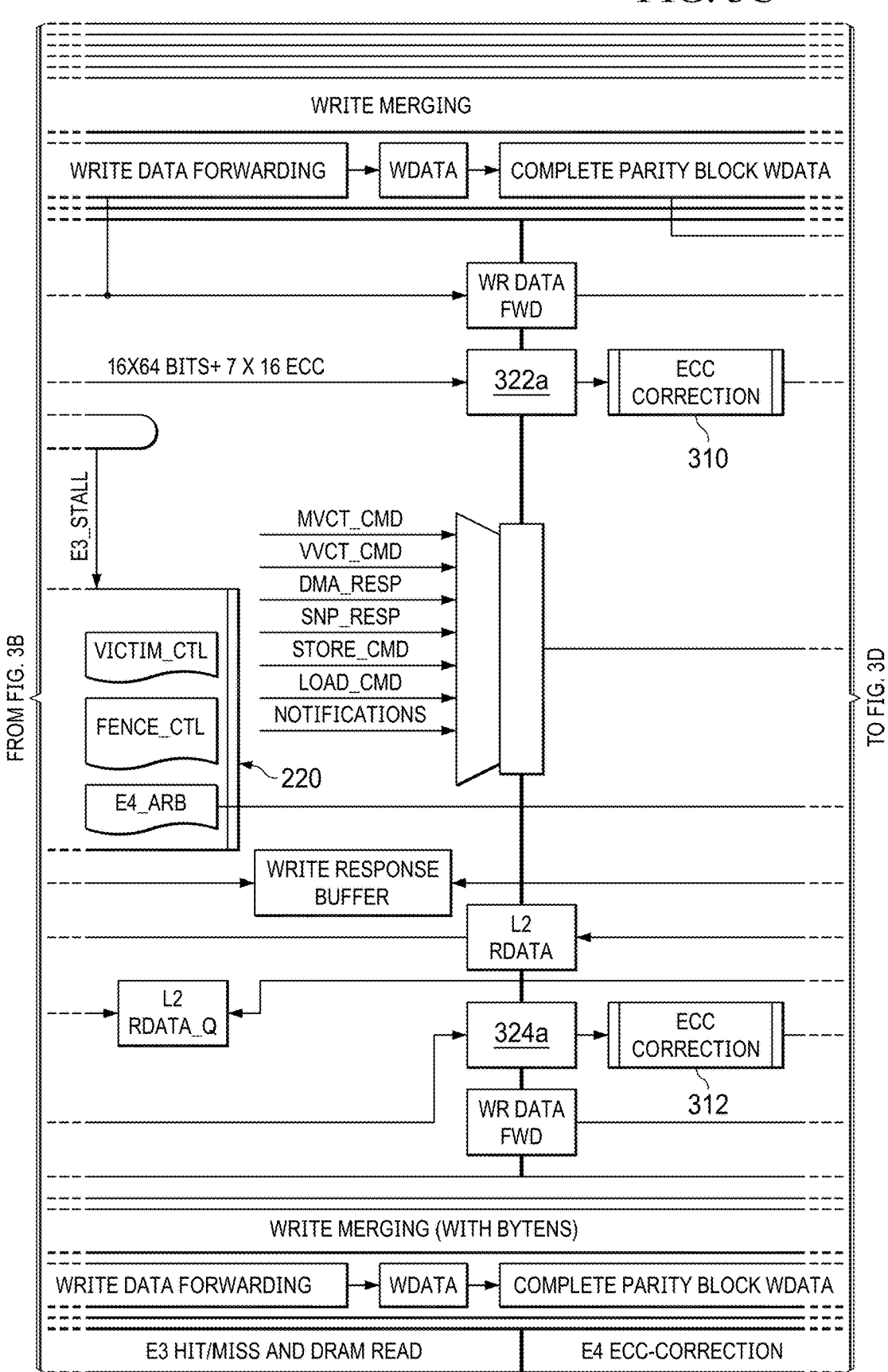
Figure 3D:
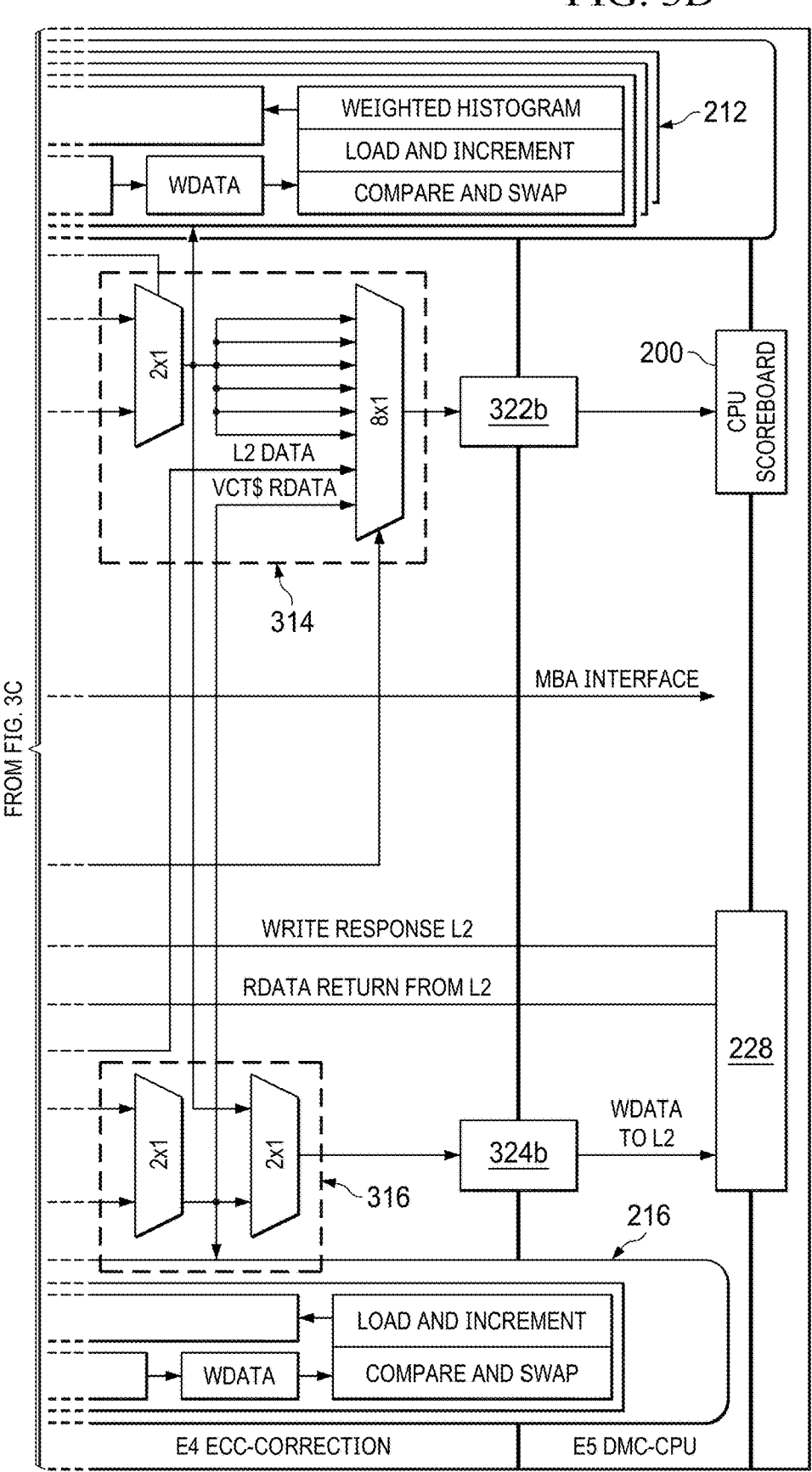

The elements of FIGS. 3A and 3D are arranged in a manner representing the flow of transaction processing. The temporal elements are represented by stages E1-E5. Each stage represents a discrete period of time, and in some examples each stage represents a clock cycle or an integer number of clock cycles.

Write Miss Caching in L1 Data Cache

In operation, the example CPU 102 transmits instructions (e.g., returns data based on a read operation, write data to a particular memory location). The first time the example CPU 102 requests data for a particular memory address, if the data for the memory address is not stored in the main storage 214, the tag ram 208 will output a read miss and the L1 cache will send the read miss information out (e.g., to L2 cache 112, L3 cache 114, and/or the extended memory 106) to be serviced (e.g., return the data corresponding to the address of the request from the CPU 102). The L1 cache 110 may then perform a read allocate. A read allocate is when the L1 cache 110 stores the data in the main storage 214, updates the tag RAM 208, etc., to identify that the data for the address is now stored in the main data storage. The L1 cache 110 may return the data to the CPU 102 and/or wait for the CPU 102 to send out a subsequent read request for the same address. If the CPU 102 sends out a subsequent read request for the same address, the tag RAM 208 will identify that the data for the address is now present in the main storage 214, thereby resulting in a read hit. If the CPU 102 does a write to the same address, the tag RAM 208 will identify a write hit because the address is stored in the main storage 214. For a write hit, the CPU 102 will provide data to write, and the L1 cache 110 will write the data into the main storage 214 corresponding to the address.

If the initial action from the CPU 102 (or a subsequent action from the CPU 102) resulted in a write miss (e.g., the memory address that the CPU 102 is attempting to write to is not stored in the example main storage), the L1 cache 110 can perform a write miss. During a write miss, the L1 cache 110 sends the write miss out to the higher level cache (e.g., L2 cache 112, L3 cache 114, etc.) and/or extended memory 106 to retrieve the data from the memory address, stories the data in the main storage 214, and then writes the data from the CPU 102 in the main storage 214 at a location corresponding to the memory address.

However, when the CPU 102 performs a write operation, it typically does not need the information that it has written right away. Accordingly, some example cache systems included a write buffer to store write instructions from the CPU to prevent stalling the CPU (e.g., by attempting to load memory address from higher cache before writing the data). In this manner, the CPU can continue to send instructions while the L1 cache interfaces with higher level cache to obtain the data in the memory address corresponding to the write instructions in the buffer, and stores the data in the main storage and writes the data (e.g., stored in the write buffer) in parallel with subsequent instructions from the CPU. However, the CPU may only write a few number of bytes per write instruction and the interface between the L1 cache and higher level caches and/or the extended memory is capable of sending a larger number of bytes (e.g., 64 byte bandwidth). Accordingly, the transmission of a few number of bytes per cycle on a large byte interface is inefficient.

In the system of FIGS. 3A-3D, instead of implementing a write buffer, a section of the victim storage 218 is dedicated for write-miss information. Accordingly, the example victim storage 218 is a victim cache and a write miss buffer. The section of the victim storage is called the write miss cache. In some examples, the write miss cache may be additionally or alternatively implemented in the main storage 214. In some examples, the write miss cache is a 128 bytes of a cache line. The write miss cache stores all the write miss data until the write miss cache is full and/or there is more than a first threshold number of bytes that can be sent to higher level cache and/or extended memory. Once the write miss cache is full or the first threshold amount of write miss data has been added to the write miss cache, the victim storage 218 combines a second threshold amount of the write miss data in the write miss cache into one signal that is sent to the higher level cache (e.g., via the example L2 interface 228) to be written in the address stored in the higher level cache (e.g., the L2 cache 112) and/or the extended memory 106. In this manner most or all of the bandwidth of the interface can be utilized in a particular cycle. The second threshold may be the same as or different than the first threshold. Additionally, the write data is stored locally in the main storage 214 or the victim storage 218. Thus, if an additional read or write operation is sent from the CPU 102 prior to the write operation being passed to the higher cache (e.g., the L2 cache 112, the example L3 cache 114, etc.) and/or the extended memory 106, the cache controller 220 can read and/or write the data to the corresponding address within the write miss cache before it gets transmitted to higher level cache and/or the extended memory 106.

In some examples, the structure of the write miss cache in the victim storage 218 includes a byte enable register file that represents the value bytes (e.g., the bytes to be written) of the write miss information. For example, if a write miss corresponding to writing data for a first byte and a third byte of a memory address is stored in the write miss cache, the victim storage 218 stores the write miss data for the first and third byte in conjunction with the memory address and populates the corresponding entry of byte enable register file with a first value (e.g., '1') for the elements of the entry that correspond to the first and third byte and a second value (e.g., '0') for the remaining elements of the entry. In this manner, when the write miss data is sent to higher level cache, the byte enable bits of the entry are included in the transmission so that the higher level cache knows which data is valid (e.g., which bytes are to be written to) and which data is invalid (e.g., which bytes should not be written to).

In certain cases, if a read or a write request is a hit in the main storage 214, the results of the victim storage 218 may be disregarded. Where the main storage 214 is configured as a one way associative cache, cache request conflicts as with multiple datapaths are straight forward. A datapath is one or more logic circuits that, when executed and/or otherwise invoked, effectuate the transmission or delivery of data (e.g., logic signal(s), bit vector(s), etc.) from a source to a destination. Cache request conflicts from the multiple datapaths may be an issue for the victim storage 218 where the victim storage 218 is fully associative and can store write-miss entries as well as cache entries. Cache request conflicts for two datapaths may be handled as described in the following examples. Of note, in the following examples, cache operations are described in the context of a particular datapath. However, it may be understood that the examples are directed to combinations of particular cache operations, and which datapath a particular cache operation is on does not matter.

In a first example, there is a cache read miss for a first datapath and a cache write hit for a second datapath, with two different memory addresses. In certain cases where the victim storage 218 is fully associative, cache requests can go to any location within the victim storage 218. Referring to FIGS. 3A-3D, address generation for a location within the victim storage 218 occurs in the E2 pipestage along with address lookup in the victim cache tag RAM 210, thus address generation for a location within the victim cache is performed before it is known whether an address of the cache request is a hit or miss. After the controller 220 determines that there is a read miss on the main storage 214, a request to obtain the memory address of the read request is issued to a higher level cache or memory. Where the main storage 214 is one way associative, the memory address of the read request of the first datapath maps to a single location in the main storage 214. If there is already cached data in the single location, the already cached data is evicted from the main storage 214 to the victim storage 218 to the pre-generated location within the victim storage 218. If this pre-generated location is the same location the cache write of the second datapath is a hit on, a conflict occurs. This conflict may be detected by the cache controller 220. As indicated above, address generation for a location within the victim storage 218 occurs before it is known whether the address of cache request is a hit or a miss, thus there is an address generated for a second location within the victim storage 218 for the cache write of the second datapath prior to the determination that the cache write is a hit. Based on the detection of the conflict, this second location within the victim cache may be used to store the data evicted from the main storage 214 by the read miss.

In another example, there may be a cache read miss for the first datapath and a cache write hit for the second datapath, as with the first example. In this example, due to the read miss, a request to obtain the memory address of the read request is issued to a higher level cache or memory and the already cached data is evicted from the main storage 214 to the victim storage 218 to a pre-generated location, here location A, within the victim storage 218. In this example, the cache write of the second datapath hits on location A within the victim storage 218 as well, resulting in a set conflict. One possible solution to such a conflict is to load the requested read miss from the higher level cache or memory directly to the victim cache in a separate location. Another solution to the conflict is for the cache controller 220 to stall the read miss such that the already cached data is not evicted to the victim storage 218 until after the cache write of the second datapath completes to location A and location A is evicted to a higher level cache or memory. In certain cases, the stall may occur while waiting for the higher level cache or memory to return the read miss data.

As another example, a first cache write may be received on the first datapath for the victim storage 218 and a second cache write is also received on the second datapath for the victim storage 218. If the first cache write and the second cache write are addressed to different memory addresses, then both cache writes may proceed in parallel to the victim storage 218. If the first cache write and the second cache write are both addressed to the same memory address and both are cache misses, then the victim cache controller 224 allocates a single location in the allocated victim cache write-miss memory and merges the first cache write and the second cache write in the victim cache store queue 216. The merged data may then be written to the victim cache write-miss memory along with merged byte enable, priority, and color tag information. If the first cache write and the second cache write are both addressed to the same memory address and both are cache hits, both the first cache write and the second cache write are merged into the cache at the hit location.

As another example a cache read may be received on the first datapath for the victim storage 218 and a cache write may be received on the second datapath for the victim storage 218. In the cases where the cache read is a hit and the cache write is a hit to different locations in the victim storage 218, the cache read and cache write proceed in parallel without conflicts. In the case the cache read is a hit and the cache write is a miss to different locations in the victim storage 218, the cache read and cache write also proceed in parallel without conflicts. In the case the cache read is a miss and the cache write is a hit to different locations in the victim storage 218, the cache read may use an address generated for a location within the victim storage 218 for the cache write as discussed above. In the case the cache read is a miss and the cache write is a miss to different locations in the victim storage 218, both the cache read and the cache write use addresses generated for locations within the victim storage 218.

In another example, a cache read may be received on the first datapath for the victim storage 218 and a cache write may be received on the second datapath for the victim storage 218. In certain cases, the cache read may be a hit for a first address of a set of addresses stored in the victim storage 218. The cache write may also be a hit for a second address of the same set of addresses stored in the victim storage 218. In such a case, the cache read and the cache write may proceed in parallel without conflicts. In another case, the cache read may be a hit for a first address of a set of addresses stored in the victim storage 218. The cache write may be a miss for a second address of the same set of addresses stored in the victim storage 218. In such a case, the cache read and the cache write may proceed in parallel without conflicts. In another case, the cache read may be a miss for a first address of a set of addresses stored in the victim storage 218. The cache write may be a hit for a second address of the same set of addresses stored in the victim storage 218. In such a case, as similar to that discussed above, the cache read may be stalled until after the cache write of the second datapath completes to the location in the victim storage 218 and is evicted to a higher level cache or memory. The cache read then proceeds to read the set of addresses from the higher level cache or memory into the victim storage 218. In another case, the cache read may be a miss for a first address of a set of addresses stored in the victim storage 218. The cache write may also be a miss for a second address of the same set of addresses stored in the victim storage 218. In such a case, the cache read and the cache write may proceed in parallel without conflicts.

In another example, a cache read may be received on the first datapath for the victim storage 218 and a cache write may be received on the second datapath for the victim storage 218. In certain cases, the cache read may be a hit for an address stored in the victim storage 218. The cache write may also be a hit for the same address stored in the victim storage 218. In such a case, the cache read may proceed first and the cache write may be stalled until after the cache read completes. Alternatively, the order of the cache write and cache read may be based on the datapath on which the cache write and cache read are received, with the cache operation arriving on a lower (or higher) numbered datapath being completed before the other cache operation. In certain cases, the cache read may be a miss for an address stored in the victim storage 218. The cache write may also be a miss for the same address stored in the victim storage 218. In such a case, the cache write operation may be forwarded to a higher level cache or memory and then the cache read may obtain the data from the higher level cache or memory after the cache write operation completes for storage into the victim storage 218.

In another example, a first cache read may be received on the first datapath for the victim storage 218 and a second cache read may be received on the second datapath for the victim storage 218. If the first cache read and the second cache read are for different memory addresses, then there are no conflicts for either hits nor misses. In certain cases, the first cache read may be a miss for a first address of a set of addresses. The second cache read may also be a miss for a second address of the same set of addresses. If the first cache read and the second cache read have different priority levels, a higher level cache or memory is accessed based on the higher of the different priority levels. Otherwise, the higher level cache or memory is accessed and the set of memory addresses obtained for storage in the victim storage 218. The case where the first cache read and the second cache read are for the same address is handled identically.

Example methods, apparatus, systems, and articles of manufacture to facilitate Write Miss Caching in L1 data cache are disclosed herein. Further examples and combinations thereof include the following: Example 1 includes an apparatus comprising a first cache storage, a second cache storage, wherein the second cache storage includes a first portion operable to store a first set of data evicted from the first cache storage and a second portion, a cache controller coupled to the first cache storage and the second cache storage and operable to receive a write operation, determine that the write operation produces a miss in the first cache storage, and in response to the miss in the first cache storage, provide write miss information associated with the write operation to the second cache storage for storing in the second portion.

Example 2 includes the apparatus of example 1, wherein the cache controller is operable to compare the second portion of the second cache storage to a threshold, and based on the second portion exceeding the threshold, cause the write miss information to be transmitted to a second cache.

Example 3 includes the apparatus of example 2, wherein the threshold corresponds to a bandwidth of an interface.

Example 4 includes the apparatus of example 2, wherein the threshold corresponds to a size of the second portion.

Example 5 includes the apparatus of example 1, wherein the write miss information is first write miss information, the cache controller operable to the second cache storage is to not provide the first write miss information from the first cache storage to the second cache storage if the second cache storage includes second write miss information for a memory address corresponding to the first write miss information.

Example 6 includes the apparatus of example 1, wherein the first cache storage and the second cache storage are connected in parallel to a central processing unit.

Example 7 includes the apparatus of example 1, wherein the write miss information is first write miss information, the cache controller operable to, when a first memory address of the first write miss information from the first cache storage matches a second memory address of second write miss information stored in the second portion, to merge the first write miss information with the second write miss information.

Example 8 includes the apparatus of example 7, wherein the cache controller is to merge the first write miss information with the second write miss information by at least one of (a) maintaining first write information of the first write miss information or (b) discarding second write information of the second write miss information when the second write information corresponds to the same one or more bytes as the first write miss information.

Example 9 includes the apparatus of example 1, wherein the second portion includes a byte enable register, the cache controller to store values in the byte enable register based on the write miss information.

Example 10 includes the apparatus of example 9, wherein the values correspond to elements of the write miss information that will be written.

Example 11 includes a system comprising a central processing unit to output a write command corresponding to a memory address, a first cache storage to output write miss information from a first storage to a second storage when the first cache storage does not store data for the memory address, and a second cache storage, wherein the second cache storage includes a first portion operable to store a first set of data evicted from the first cache storage and a second portion, the second cache storage to store the write miss information in a dedicated section of the second storage, the dedicated section being dedicated to the write miss information.

Example 12 includes the system of example 11, wherein the second cache storage is to, when the dedicated section has more than a threshold amount of write miss information, output the write miss information to a second cache.

Example 13 includes the system of example 12, wherein the threshold corresponds to a bandwidth of an interface to the second cache.

Example 14 includes the system of example 12, wherein the threshold corresponds to a size of the second portion.

Example 15 includes the system of example 11, wherein the second cache storage is to not store the write miss information from the first storage in the second portion if the second cache storage includes second write instructions corresponding to a same memory address as the write miss information from the central processing unit.

Example 16 includes the system of example 11, wherein the first cache storage and the second cache storage are connected in parallel to the central processing unit.

Example 17 includes the system of example 11, wherein the write miss information is first write miss information, further including a controller to, when a first memory address of the first write miss information from the first cache storage matches a second memory address of second write miss information stored in the second portion, merge the first write miss information with the second write miss information.

Example 18 includes the system of example 17, wherein the cache controller is to merge the first write miss information with the second write miss information by at least one of (a) maintaining first write information of the first write miss information or (b) discarding second write information of the second write miss information when the second write information corresponds to the same one or more bytes as the first write miss information.

Example 19 includes a method comprising receiving a write operation, determining that the write operation produces a miss in a first cache storage, and in response to the miss in the first cache storage, proving write miss information associated with the write operation to a second cache storage element with a first portion and a second portion for storing in the second portion, the first portion storing a first set of data evicted from the first cache storage.

Example 20 includes the method of example 19, further including comparing the second portion of the second cache storage to a threshold, and based on the second portion exceeding the threshold, outputting the write miss information to a second cache.

Figure 4A:
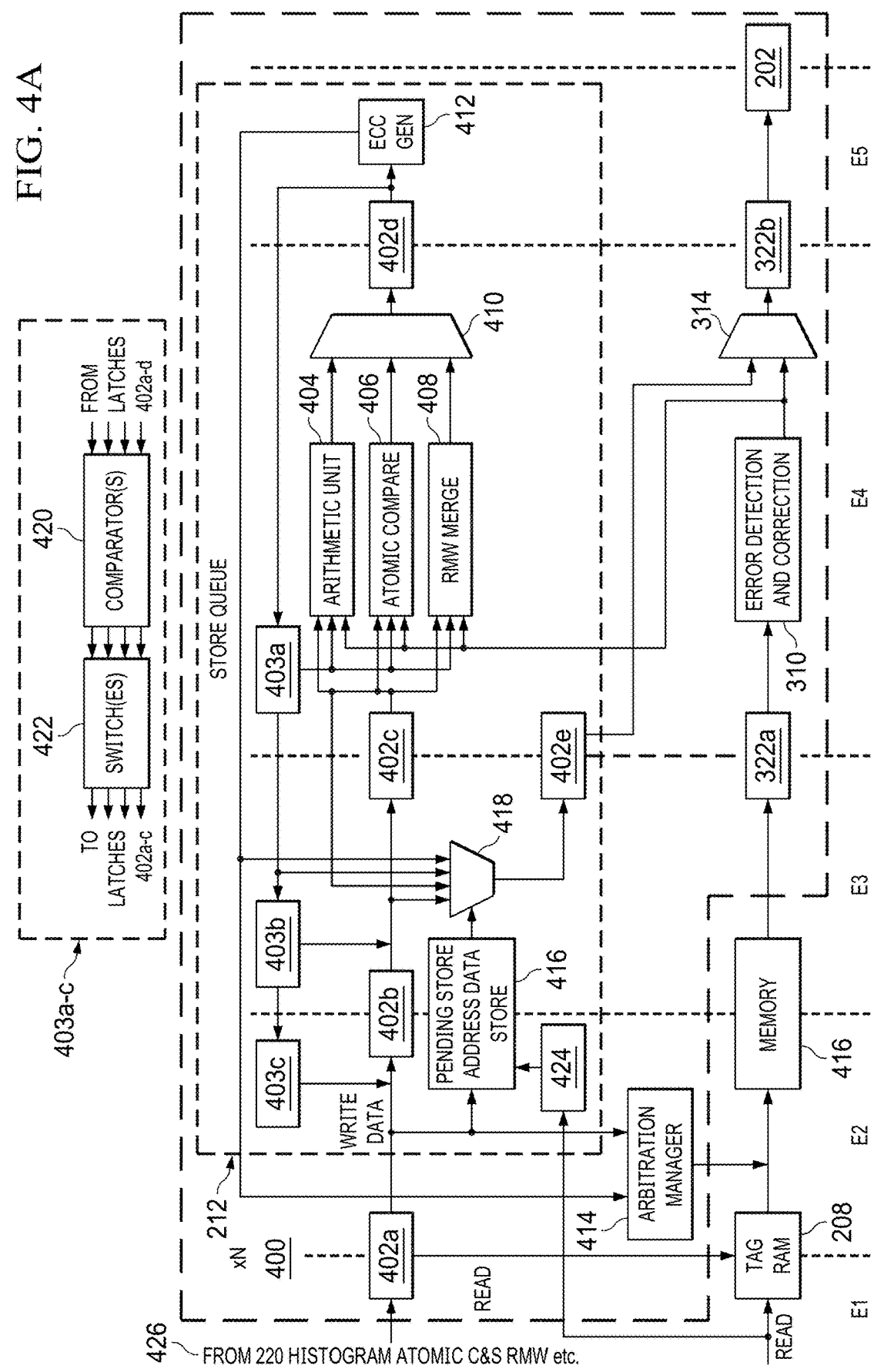
FIG. 4A is an example circuit implementation of the main cache store queue of FIGS. 3A-3D.

FIG. 4A is an example circuit implementation of the main cache store queue 212 of FIGS. 2 and/or 3. In FIG. 4A, the main cache store queue 212 includes an example latches 402a, 402b, 402c, 402d, 402e, example merge circuits 403a-c, an example arithmetic component 404, an example atomic compare component 406, an example read-modify-write merge component 408, an example select multiplexer 410, and example ECC generator 412, an example arbitration manager 414, an example pending store address data store 416, an example priority multiplexer 418, an example read port 424, and an example write port 426. The example merge circuits 403a-d include an example comparator(s) 420, and example switches 422. The example of FIG. 4A illustrates a single pipeline of the main cache store queue 212. However, the main storage element 214 may be arranged to support more than one independent copy of the pipeline with respect to different banks as indicated by the dashed box 400. Accordingly, the pipeline of FIG. 4A may be reproduced multiple times for different banks, as further described below.

In FIG. 4A, the example latches 402a, 402b, 402c, 402d, 402e, are electronic devices configured to store information (e.g., bytes, bits, etc.) obtained by the main cache store queue 212. The example latches 402a-c pass the write data and information corresponding to whether the write data needs to be combined with the read and corrected data out of the ECC logic 310 in the arithmetic unit 404, the atomic unit 406, and/or the RMW merge component 408. In the example of FIG. 4A, the latch 402a is communicatively coupled to the cache controller 220 to obtain read, write, and/or modify instructions. Such read, modify, and/or write instructions may originate from the CPU 102, and transmitted to the latch 402a via the cache controller 220. Latch 402a is coupled to latch 402b, the tag RAM 208, the arbitration manager 414, and the pending store address data store 416 to transmit such read, modify, and/or write instructions to the latch 402b, the tag RAM 208, the arbitration manager 414, and the pending store address data store 416 in response to a subsequent clock cycle of the cache controller 220.

In the example of FIG. 4A, the latch 402b is coupled to latch 402a, the pending store address data store 416, latch 402c, the priority multiplexer 418, and the comparator(s) 420 to transmit the obtained read, modify, and/or write instruction in response to a subsequent clock cycle of the cache controller 220. In this manner, the value obtained from the read, modify, and/or write instruction (e.g., the byte value, the bit value, etc.), propagates through the main cache store queue 212.

The example latch 402c is coupled to the latch 402b, the priority multiplexer 418, the arithmetic component 404, the atomic compare component 406, and the read-modify-write merge component 408. This coupling enables the latch 402c to transmit the value obtained from the read, modify, and/or write instruction (e.g., the byte value, the bit value, etc.) to the arithmetic component 404, the atomic compare component 406, and/or the read-modify-write merge component 408 in response to a subsequent clock cycle of the cache controller 220. In some examples disclosed herein, latch 402c may transmit the value obtained from the read, modify, and/or write instruction (e.g., the byte value, the bit value, etc.) to one or more of the arithmetic component 404, the atomic compare component 406, and/or the read-modify-write merge component 408. For example, in the event the cache controller 220 transmits an instruction to write a bit into a currently stored word, the latch 402c may transmit the value obtained from the read, modify, and/or write instruction (e.g., the byte value, the bit value, etc.) to the read-modify-write merge component 408. In other examples disclosed herein, though the cache controller 220 may transmit an instruction to write a bit into a currently stored word, the latch 402c may transmit the value obtained from the read, modify, and/or write instruction (e.g., the byte value, the bit value, etc.) to the arithmetic component 404, the atomic compare component 406, and/or read-modify-write merge component 408.

The example latch 402d is coupled to the first multiplexer 410, the ECC generator 412, and the latch 402e. This coupling enables the latch 402d to transmit the value obtained from first multiplexer 410 to ECC generator 412 and/or the merging circuit 403a in response to a subsequent clock cycle of the cache controller clock 220.

The example latch 402e is coupled to priority multiplexer 418 and to the MUX circuit 314 of FIGS. 3 and/or 4. This coupling enables the latch 402e to transmit the value obtained from the from the priority multiplexer 418 to MUX circuit 314 in response to a subsequent clock cycle of the cache controller 220. For example, on a read operation by the CPU 102 to an address that hits the main storage element 214, a previous write to the same address could still be inflight (e.g., not completely written to the main storage element 214). In such an example, the latch 402e collects the unwritten data byte and provides it to the MUX 314 which eventually gets sent back to the CPU 102.

The example merging circuit 403a is coupled to the latch 402d, the merging circuit 403b, the arithmetic component 404, the atomic compare component 406, and the readmodify-write merge component 408. The example merging circuit 403b is coupled to the merging circuit 403a, the priority multiplexer 418, and the merging circuit 403c. The example merging circuit 403c is coupled to the merging circuit 403b and the latch 402b. The example merging circuits 403a-c facilitate the comparison of read operations in different sections of the main cache store queue 212 to potentially reroute write operations to be merged with write operations corresponding to the same memory address location, as further described below. Although the example of FIG. 4A includes three merging circuits 403a-c, there may be additional merging circuits to merge write operations from other sections of the main cache store queue 212 (e.g., a merging circuit coupling the output of the latch 402d to the output of latch 402b and/or latch 402a, etc.). In some examples, the merging circuits 403a-c are combined into a single circuit that compares the write operations from the different latches 402b-d and reroutes based on matching memory addresses in any two or more of the different latches 402b-d.

In the example illustrated in FIG. 4A, the arithmetic component 404 is coupled to the latch 402c, the first multiplexer 410, and to the ECC logic 310 to perform arithmetic operations on (e.g., increment, decrement, etc.) data from the main storage 214. Additionally, the arithmetic component 404 performs histogram operations on the data stored in the main storage 214. The example arithmetic component 404 of the illustrated example of FIG. 4A is implemented by a logic circuit such as, for example, a hardware processor. However, any other type of circuitry may additionally or alternatively be used such as, for example, one or more analog or digital circuit(s), logic circuits, programmable processor(s), application specific integrated circuit(s) (ASIC(s)), programmable logic device(s) (PLD(s)), field programmable logic device(s) (FPLD(s)), digital signal processor(s) (DSP(s)), etc. Operation of the example arithmetic component 404 is further described below.

In the example illustrated in FIG. 4A, the atomic compare component 406 is coupled to the latch 402c, the first multiplexer 410, and to the ECC logic 310 to compare data at a memory address to a key and, in the event the data at the memory address matches the key, replace the data. The example atomic compare component 406 the illustrated example of FIG. 4A is implemented by a logic circuit such as, for example, a hardware processor. However, any other type of circuitry may additionally or alternatively be used such as, for example, one or more analog or digital circuit(s), logic circuits, programmable processor(s), application specific integrated circuit(s) (ASIC(s)), programmable logic device(s) (PLD(s)), field programmable logic device(s) (FPLD(s)), digital signal processor(s) (DSP(s)), etc. Operation of the example atomic compare component 406 is further described below.

In the example illustrated in FIG. 4A, the read-modify-write merge component 408 is coupled to the latch 402c, the first multiplexer 410, and to the ECC logic 310 to facilitate the read, modify, and/or write instruction(s) sent by the cache controller 220. For example, the read-modify-write merge component 408 is coupled to the ECC logic 310 to obtain the currently stored word that is to be affected by the read, modify, and/or write instruction(s). In an example write operation, the read-modify-write merge component 408 is configured to update the currently stored word obtained from the ECC logic 310 with the new bit(s), byte(s), etc., obtained from the latch 402c. Additional description of the read-modify-write merge component 408 is described below. The example read-modify-write merge component 408 of the illustrated example of FIG. 4A is implemented by a logic circuit such as, for example, a hardware processor. However, any other type of circuitry may additionally or alternatively be used such as, for example, one or more analog or digital circuit(s), logic circuits, programmable processor(s), application specific integrated circuit(s) (ASIC(s)), programmable logic device(s) (PLD(s)), field programmable logic device(s) (FPLD(s)), digital signal processor(s) (DSP(s)), etc.

The example first multiplexer 410 is coupled to the arithmetic component 404, the atomic compare component 406, and the read-modify-write merge component 408 to transmit, based on an indication from the cache controller 220, the output of either the arithmetic component 404, the atomic compare component 406, or the read-modify-write merge component 408 to the latch 402d. For example, in the event the cache controller 220 indicates to perform a write function (e.g., the cache control transmits a write request to the latch 402b), an indication is sent by the cache controller 220 to the first multiplexer 410 to select the input connected to the read-modify-write merge component 408 to be transmitted to the latch 402d. The example first multiplexer 410 of the illustrated example of FIG. 4A is implemented by a logic circuit such as, for example, a hardware processor. However, any other type of circuitry may additionally or alternatively be used such as, for example, one or more analog or digital circuit(s), logic circuits, programmable processor(s), application specific integrated circuit(s) (ASIC(s)), programmable logic device(s) (PLD(s)), field programmable logic device(s) (FPLD(s)), digital signal processor(s) (DSP(s)), etc.

In the example illustrated in FIG. 4A, the ECC generator 412 is coupled to the latch 402d and to the merging circuit 403a to facilitate error detection and correction in the value (e.g., byte(s), bit(s), etc.) stored in the latch 402d. For example, the ECC generator 412 is configured to regenerate the ECC (E.g., generate error detection code) value which will be stored with the data (e.g., merged word output from the read-modify-write merge component 1108). The ECC value is used by the error detection and correction circuit to determine whether the error occurred during a read and/or write operation, as further described above. The example ECC generator 412 of the illustrated example of FIG. 4A is implemented by a logic circuit such as, for example, a hardware processor. However, any other type of circuitry may additionally or alternatively be used such as, for example, one or more analog or digital circuit(s), logic circuits, programmable processor(s), application specific integrated circuit(s) (ASIC(s)), programmable logic device(s) (PLD(s)), field programmable logic device(s) (FPLD(s)), digital signal processor(s) (DSP(s)), etc.

In FIG. 4A, the example arbitration manager 414 is coupled to the latch 402a, the latch 402b, the pending store address datastore 416, and the main storage 214 to facilitate the read, modify, and/or write instructions obtained from the cache controller 220. For example, in the event a write instruction is received from the cache controller 220, the arbitration manager 414 is configured to transmit a read instruction of the corresponding currently stored word to the main storage 214. In addition, the arbitration manager 414 is coupled to the main storage 214 to arbitrate between conflicting accesses of the main storage 214. When multiple operations attempt to access the main storage 214 in the same cycle, the arbitration manager 414 may select which operation(s) are permitted to access the main storage 214 according to a priority scheme. Suitable priority schemes are described in more detail in below; however, in one example, the arbitration prioritizes read operations over write operations because write data that is in the main cache store queue 212 is available for use by subsequent operations even before it is written to the main storage 214. Thus, there is minimal performance impact in allowing the write data to wait in the main cache store queue 212. However, as the main cache store queue 214 fills with write data that has not yet been written back, the priority of the write operations may increase until they are prioritized over competing read operations.

The example arbitration manager 414 of the illustrated example of FIG. 4A is implemented by a logic circuit such as, for example, a hardware processor. However, any other type of circuitry may additionally or alternatively be used such as, for example, one or more analog or digital circuit(s), logic circuits, programmable processor(s), application specific integrated circuit(s) (ASIC(s)), programmable logic device(s) (PLD(s)), field programmable logic device(s) (FPLD(s)), digital signal processor(s) (DSP(s)), etc.

In the example of FIG. 4A, the pending store address data store 416 is configured to store the address of the read, modify, and/or write instruction obtained from the cache controller 220. In this manner, the pending store address datastore 416 maintains a log of the addresses associated with each value stored in any of the latches 402a, 402b, 402c, 402d, 402e, and/or the merging circuits 403a, 403b, and/or 403c. The example pending store address datastore 416 of the illustrated example of FIG. 4A may be implemented by any device for storing data such as, for example, flash memory, magnetic media, optical media, etc. Furthermore, the data stored in the pending store address datastore 416 may be in any data format such as, for example, binary data, comma delimited data, tab delimited data, structured query language (SQL) structures, etc.

The example priority multiplexer 418 is coupled to the latch 402b, the latch 402c, the latch 402d, and the merging circuit 403a to facilitate read operations in the event either of the of the latch 402b, the latch 402c, the latch 402d, or the merging circuit 403a are storing a value corresponding to a write instruction. For example, the cache controller may initiate the following four write instructions regarding a four byte word having addresses A3, A2, A1, and A0: write address A0 with the byte 0x11, write address A1 with the byte 0x22, write address A3 with the byte 0x23, and write address A0 with the byte 0x44. In such an example, in the event the cache controller 220 initiates a read instruction to read the entire four byte word, the priority multiplexer 418 is configured to obtain the byte value 0x11 stored in the merging circuit 403a, the byte value 0x22 stored in the latch 402d, the byte value 0x23 stored in the latch 402c, and the byte value 0x22 stored in the latch 402b. Additionally, the pending store address data store 416 transmits an instruction to the priority multiplexer 418 indicating which address value in is associated with the byte value stored in the latch 402b, the latch 402c, the latch 402d, and the merging circuit 403a. In such an example, since the byte value stored in the latch 402b is associated with the address A0 and the byte value stored in the merging circuit 403a is also associated with the address A0, the priority multiplexer 418 is configured to transmit a packet to the latch 402e indicating that address A0 is 0x44 (e.g., the most recent write instruction associated with the address A0), address A1 is 0x22, and address A3 is 0x23.

In this manner, the MUX circuit 314 is configured to update the value of the currently stored word with the byte values obtained from the priority multiplexer 418. Such an operation ensures that a read instruction transmitted by the main cache store queue 212 probably indicates the correct word, even though the write instructions may not have fully propagated through the main cache store queue 212.

An example read path (e.g., the read input to the tag RAM 208) may run in parallel with the main cache store queue 212. Because a read operation (e.g., a read instruction) may refer to data in a write operation (e.g., a write instruction) that may not have completed yet, the main cache store queue 212 may include write forwarding functionality that allows the read path to obtain data from the main cache store queue 212 that has not yet been written back to the main storage 214. In an example, the main cache store queue 212 includes pending store address data store 416 that records the addresses of the operations at each stage of the main cache store queue 212, a priority multiplexer 418 to select data from one of the stages (e.g., latches) of the main cache store queue 212 for forwarding, and a MUX circuit 314 that selects between the output of the main storage 214 (by way of the error detection and correction circuit 310) and the forwarded main cache store queue 212 data from the data priority multiplexer 418.

Alternatively, because a read operation (e.g., a read instruction, a read command, etc.) may refer to victimizing (e.g., evicting) data in a write operation (e.g., a write instruction, a write command, etc.) that may not have completed yet, the main cache store queue 212 includes a read-invalidate functionality that forwards in-flight data (e.g., data of the store queue 212 not yet stored in the main storage element 214) to the victim storage element 214 and/or the L2 cache 212 and invalidates the in-flight data remaining in the store queue 212.

The example read port 424 is coupled to the read path and the data store 416. The read port 424 may be implemented by an interface that interfaces with the main cache controller 222 whenever a read-miss occurs. For example, the read port 424 is utilized to receive victim addresses and read-invalidate commands from the main cache controller 222. The read port 424 is to send the victim addresses to the data store 416 to be compared against the pending addresses stored in the data store 416.

The example write port 426 is coupled to the write path and the latch 402a. The write port 426 may be implemented by an interface that interfaces with the main cache controller 222 (e.g., the cache controller 220) to obtain a write instruction. For example, the write port 426 is utilized to receive addresses and values from the cache controller 220 to write.

The elements of FIG. 4A are arranged in a manner representing the flow of transaction processing. The temporal elements are represented by stages E1-E5. Each stage represents a discrete period of time, and in some examples each stage represents a clock cycle or an integer number of clock cycles.

An example flow of a read operation through the main cache store queue 212 will now be described. In a first cycle, corresponding to stage E1, the L1 data cache 110 retrieves a record from the tag RAM 208 that is associated with an address of the read operation to determine whether the data is stored in the main storage 214. In a direct mapped example, the L1 data cache 110 need not wait for the tag RAM 208 comparison before requesting data from the main storage 214, and thus, the tag RAM 208 comparison between the address of the read operation and the record of cached addresses may extend into a second or third clock cycle.

In the second cycle, corresponding to stage E2, the L1 data cache 110 may request the data and ECC syndrome bits from the main storage 214 if the arbitration manager 414 permits. In this cycle, the L1 data cache 110 may also determine whether newer data is available in the main cache store queue 212 by comparing the read address to the pending store address data store 416. If so, the priority multiplexer 418 is set to forward the appropriate data from the main cache store queue 212.

Data and ECC may be provided by the main cache storage 214 in the third cycle, corresponding to stage E3. However, this data may or may not correspond to the memory address specified by the read operation because the L1 data cache 110 may allocate multiple extended memory addresses to the same entry in the cache's main storage 214. Accordingly, in the third cycle, the L1 data cache 110 determines whether the provided data and ECC from the main storage 214 corresponds to the memory address in the read operation (e.g., a cache hit) based on the comparison of the tag RAM 208 record. In the event of a cache hit, the data and ECC bits are received by the error detection and correction circuit 310, which corrects any errors in the data in a fourth cycle, corresponding to stage E4.

As explained above, newer data that has not yet been written to the main storage 214 may be present in the main cache store queue 212, and may be forwarded from the main cache store queue 212 by the priority multiplexer 418. If so, the MUX circuit 314 selects the forwarded data over the corrected data from the main storage 214.

Either the corrected data from the main storage 214 or the forwarded data from the main cache store queue 212 is provided to the L1 data cache 110 in a fifth cycle, corresponding to stage E5. In this way, the controller 220 may provide data with full ECC checking and correction in the event of a cache hit in about 5 cycles.

In the event that the data and ECC bits are not present in the main storage 214 (e.g., a cache miss), the main cache store queue 212 may stall until the data can be retrieved from either the extended memory 106 and/or the victim storage 218, at which point the data may be written to the main storage and the tag RAM 208 may be updated. Methods and Apparatus to Facilitate Fully Pipelined Read-Modify-Write Support in Level 1 Data Cache Using Store Queue and Data Forwarding In examples disclosed herein, there are two cache systems operating in tandem (e.g., the main storage 214 and the victim cache storage 218). In examples disclosed herein, the main storage 214 is a direct mapped cache element and the victim cache storage 218 is a fully associative cache storage. Both the direct mapped main storage 214 and the fully associative victim cache storage 218 are protected by an error correcting code (ECC). With this, example applications include reading a line from main storage 214 and/or moving a line from the main storage 214. As such, ECC logic would correct the cache line and regenerate the ECC syndrome, and then write the line to victim cache storage 218. Such an application may utilize two additional clock cycles of the CPU (e.g., one clock cycle for error correction by the ECC logic and another clock cycle for ECC syndrome regeneration). To reduce this latency, examples disclosed herein include utilizing the same parity block size between the main storage 214 and the victim cache storage 218. Thus, both the main storage 214 and the victim cache storage 218 calculate and/or otherwise determine parity on a 32-bit boundary. In this manner, the L1 cache 110 can move a cache line directly from main storage 214 to the victim cache storage 218 with less latency.

In examples disclosed herein, the L1 data cache 110 supports a number of operations that read data from the cache and make changes to the data before rewriting it. For example, the L1 data cache 110 may support read-modify-write operations. A read-modify-write operation reads existing data and overwrites at least a portion of the data. In ECC embodiments, a read-modify-write operation may be performed when writing less than a full bank width (e.g., when writing less than a 32-bit, 4-byte word). The read functionality of the read-modify-write is used because the portion of the data in the bank that will not be overwritten still contributes to the ECC syndrome bits.

A read-modify-write operation may be split into a write operation and a read operation, and the main cache store queue 212 may be structured such that the read operation in the read path stays synchronized with the write operation in the main cache store queue 212. The read operation and the write operation remain synchronized until the read-modify-write merge component 408 overwrites at least a portion of the read data with the write data to produce merged data. The merged data is provided to the ECC generator 412 that generates new ECC syndrome bits for the merged data, and then the merged data and ECC syndrome bits may be provided to the arbitration manager 414 for storing in the main storage 214.

In an example read-modify-write operation, the cache controller 220 of FIGS. 2 and/or 3 transmits a write request indicating a subset of bytes of a word, or an entire word (e.g., a first set of data), to be written. In such an example, the write request transmitted by the cache controller 220 includes an address value of the byte(s) to be written and the data to write to the indicated bytes. For example, the main storage 214 of FIGS. 2 and/or 3 may include the four-byte word 0x12345678 associated with addresses A3, A2, A1, A0. In such an example, address A3 corresponds to the byte 0x12, address A2 corresponds to the byte 0x34, address A1 corresponds to the byte 0x56, and address A0 corresponds to the byte 0x78 of the stored word. In such an example operation, the cache controller 220 may transmit a write request to replace address A3 with the byte 0x33, replace address A1 with the byte 0x22, and replace address A0 with the byte 0x11 of the currently stored word 12345678. Further in such an example, the first write request to replace address A3 of the stored word with the byte 0x33 would result in the stored word becoming 0x33345678, the second write request to replace address A1 of the stored word with the byte 0x22 would result in the stored word becoming 0x33342278, and the third write request to replace address A0 of the stored word with the byte 0x11 would result in the stored word becoming 0x33342211.

To process such a request, the L1 data cache 110 compares an address of the read operation to a record of the tag RAM 208, and the L1 data cache requests the data and ECC syndrome bits from the main storage 214 and/or the main cache store queue 212. Because the read-modify-write operation will modify the data, in examples that track MESI (Modified, Exclusive, Shared, and Invalid) states of entries in the main storage 214, a cache hit that is not in either the Modified or Exclusive state may be considered a cache miss. When the data is obtained in the proper state and any errors are corrected, it is provided to the read-modify-write merge component 408. In this same cycle, the read-modify-write merge component 408 may overwrite at least a portion of the corrected data with the write data to produce merged data. The ECC generator 412 generates new ECC syndrome bits for the merged data.

In examples disclosed herein, the ECC generator 412 operates on word granularity. That is, the ECC generator 412 calculates the ECC syndrome for a block of data. In examples disclosed herein, the block of data may four bytes (e.g., a word). The main cache store queue 212 processes the write instruction by, at a first example cycle (e.g., to compete the first write request of replacing address A3 with the byte 0x33), because the ECC generator 412 operates on word granularity (e.g., a 4-byte or 32-bit word), the cache controller 220 initiates a read request of the currently stored byte in address A3 of the currently stored word. In this example, the byte and address in the first write request (e.g., 0x33 and A3) is stored in the latch 402b. In addition, the cache controller 220 transmits a read request of the entire currently stored word to the main storage 214. Thus, at the end of the first cycle, a read request of the entire currently stored word is transmitted to the main storage 214 and the byte 0x33 is stored in the first latch 402b.

At an example second cycle (e.g., to complete the second write request of replacing address A1 with the byte 0x22) the byte from the first write request is transmitted to the latch 402c, the entire currently stored word is transmitted from the main storage 214 to the ECC logic 310, and the second write request (e.g., to replace address A1 with the byte 0x22) is transmitted by the cache controller 220 to be stored in the latch 402b. During the second cycle, the read-modify-write merge component 408 obtains the byte stored in the latch 402c and the entire currently stored word transmitted by the ECC logic 310. In this manner, the read-modify-write merge component 408 identifies the address of the byte in the currently stored word to be updated. Once the read-modify-write merge component 408 identifies and/or otherwise obtains (a) the value (e.g., byte value, bit value, etc.) of the portion of the currently stored word to be updated from the latch 402c and the (b) currently stored word from the ECC logic 310, the read-modify-write merge component 408 writes (e.g., replaces, merges, etc.) the portion of the currently stored word with the value of the portion of the currently stored word obtained from the latch 402c. For example, the read-modify-write merge component 408 writes the value of the portion of the word to an address value corresponding to the portion of the word in the word. Such an example written portion output by the read-modify-write merge component 408 may be referred to herein as the merged word. In some examples disclosed herein, such a merged word is provided by the read-modify-write merge component 1108 for writing to the victim storage 218.

In response, to initiate the write portion of the example read-modify-write operation, the select multiplexer 410 transmits the merged word from the read-modify-write merge component 408 to be stored in the latch 402d. At a subsequent clock cycle, the ECC generator 412 obtains the merged word from the latch 402d and generates the corresponding ECC syndrome bits. At either the same, or a subsequent clock cycle, the ECC generator 412 transmits the merged word though the merging circuits 403a, 403b, and 403c to be handled by the arbitration manager 414 to be stored in the main storage 214.

However, in such an example described above, because three consecutive write instructions were transmitted by the cache controller 220 corresponding to the same stored word in the main storage 214, the read-modify-write merge component 408 can merge these three write instructions into one transaction when writing the three values of the three write instructions to the currently stored word. For example, prior to storing the merged word from a first write instruction in the main storage 212, the main storage queue 212 feedbacks (e.g., transmits) the merged word for use in the subsequent second write instruction.

Figure 4B:
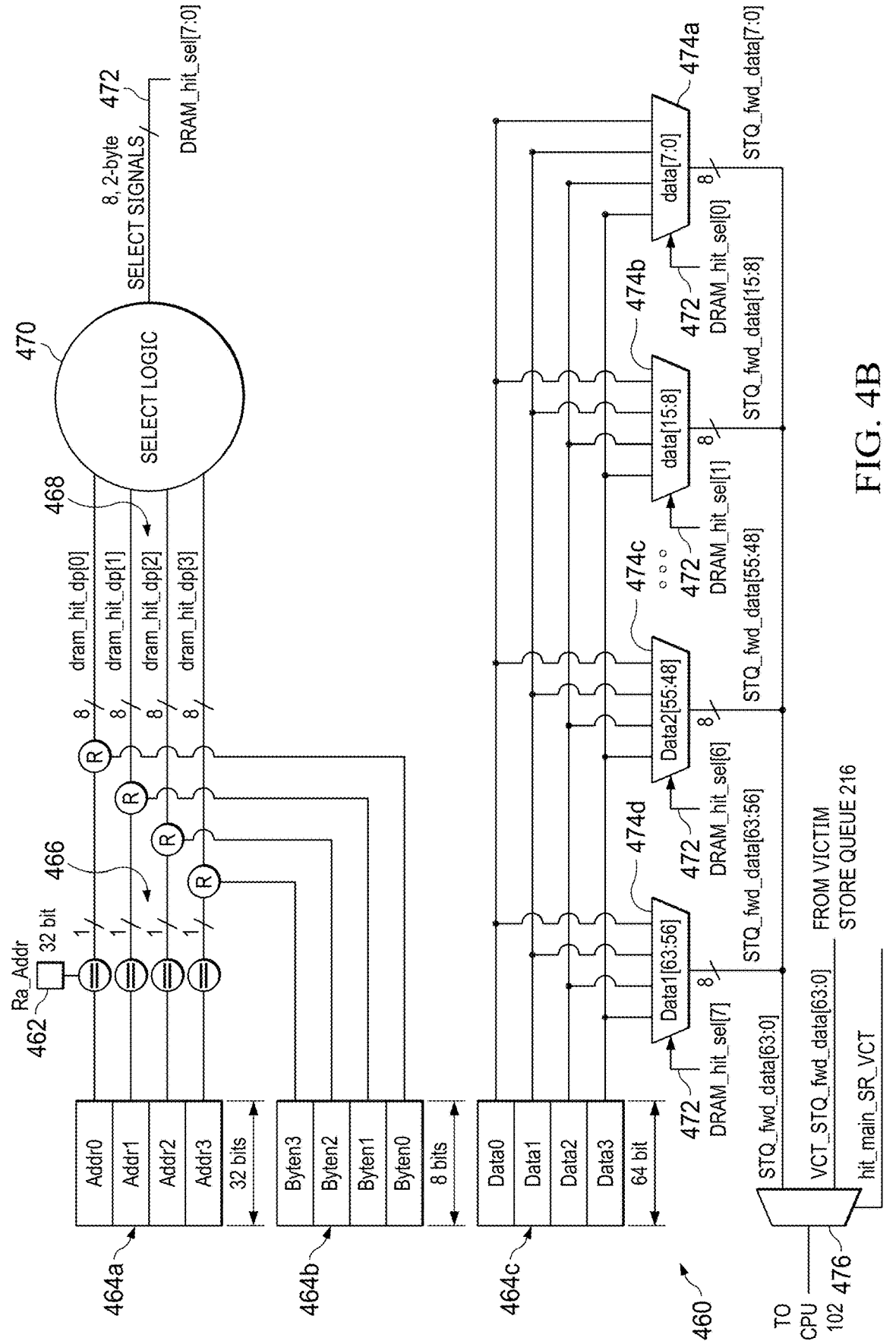
FIG. 4B is an example circuit implementation of example data forwarding logic implemented in connection with the main cache store queue of FIGS. 3A-4A.

FIG. 4B is an example circuit implementation of example data forwarding logic 460 implemented in connection with the main cache store queue 212 of FIGS. 3A-4A. While FIG. 4B is described as example data forwarding logic 460 to be implemented in connection with the main cache store queue 212, in other examples disclosed herein, any of the examples described in FIG. 4B may be implemented in connection with the victim cache store queue 216.

In the example of FIG. 4B, the example address line 462 (RD_ADDR) is coupled to the cache controller 220 to obtain an example read instruction from the CPU 102. In the example of FIG. 4B, such an example address line 462 obtains the read instruction for the main cache store queue 212. In this manner, the main cache store queue 212 could forward any data from in-flight write transactions when executing the CPU 102 read instruction. In the main cache store queue 212, an instruction from the CPU 102 (e.g., a read instruction and/or otherwise transaction, and/or a write instruction and/or otherwise transaction) includes an address, a byte enable (byten) and associated data. The topology of FIG. 4B includes example address stores 464a (e.g., the pending store address data store 416 of FIG. 4), example byten stores 464b (e.g., byte enable stores), and example data stores 464c (e.g., any of the latches 402a, 402b, 402c, etc.). In FIG. 4B, address addr0 of the address stores 464a corresponds to the oldest read and/or write instruction in the main cache store queue 212 and address addr3 of the address stores 464a corresponds to the newest read and/or write instruction in the main cache store queue 212.

The incoming address via the address line 462 (e.g., a read instruction) is compared against all the addresses (e.g., addr0, addr1, addr2, and addr3) in the address stores 464a by example compare logic 466. In examples disclosed herein, the compare logic 466 may compare the address of the read instruction against any number of entries as addresses addr0, addr1, addr2, and addr3 may be fully or partially equivalent (e.g., the same). In this manner, the example outputs of the compare logic 466 are 4-bit signals. Such 4-bit signals are generated based on the corresponding byte enable signals of the byten stores 464b. Such 4-bit signals may haves any value (e.g., all zeros, all ones, partial zeros and partial ones, etc.).

In example operation, the four addresses of the address stores 464a may include one or more valid bytes (e.g., bytes that are a logic high). In examples disclosed herein, the main cache store queue 212 is 64 bits (e.g., 8 bytes) and, thus, the main cache store queue 212 may perform a write on any number of bytes, such as, from one to eight.

In response to the compare logic 466 identifying the address of the address stores 464a that are to be included based on the byte enables in the byten stores 464b, the example output lines 468 transmit a 8-bit result for each address in the address stores 464a. In examples disclosed herein, there are four output lines 468 (e.g., dram_hit_DP0 [0][7:0], dram_hit_dp0[1][7:0], dram_hit_dp0[2][7:0] and dram_hit_dp0[3][7:0]). In operation, bits set to a logic high (e.g., 1) in any of the output lines 468 indicate that the corresponding byte of the corresponding address of the address stores 464a has valid data to be forwarded. For example, if the first output line of the output lines 468 includes dram_hit_dp0 [0], the byte value for the corresponding read instruction may be obtained from any of the addresses in the address store 464a.

The example of FIG. 4B includes example select logic 470 and example select lines 472. In examples disclosed herein, the select lines 472 include eight, 2-byte outputs.

Accordingly, there is one select signal of the select signals for each of the corresponding byte enables of the byten stores 464c. In an example operation, in the event a read instruction indicates to read multiple addresses having multiple enabled bytes, the example select logic 720 selects the most recent data. Such an output of the select logic 470 (e.g., the select lines 472) control example multiplexers 474a-474h (multiplexers 474e-h not shown), respectively. In the example of FIG. 4B, the multiplexers 474a-h, include 8 1-byte input terminals. In operation, the multiplexers 474a-h obtain their respective select line of the select lines 472 which indicate which byte of each of the data stores 464c to forward. In this manner, the main cache store queue 212 can forward data from different infight stores (e.g., any of the data stores 464c) based on address comparison (e.g., a comparison performed by the comparators 466), their corresponding byte enables of the byten stores 464b, and the order in which the main cache store queue 212 was issued a write instruction (e.g., the comparison performed by the select logic 470).

In examples disclosed herein, any of the address line 462, the address stores 464a, the byten stores 464b, the data stores 464c, the compare logic 466, the output lines 468, the select logic 470, the select lines 472, and/or the multiplexers 474a-h may be implemented in the victim cache store queue 216. In FIG. 4B, the output terminals of the multiplexers 474a-h are coupled to an example cache multiplexers 476. In the example of FIG. 4B, cache multiplexer 476 is also coupled to similar multiplexers implemented in this manner in association with the victim cache store queue 216. In operation, the cache multiplexer 476 obtains a select signal from the cache controller (e.g., the main cache controller 222 or the victim cache controller 224) that transmitted the read instruction. In this manner, the cache multiplexer 476 facilitates data forwarding to the CPU 102.

In some examples, the topology of FIG. 4B may correspond to the example write data forwarding component of the main cache store queue 212, the write data forwarding component of the victim cache store queue 216, and the MUX circuits 314, 316. In such an example, the cache multiplexer 476 may be implemented by the example MUX circuits 314, 316. Additionally, in such an example, any of the address line 462, the address stores 464a, the byten stores 464b, the data stores 464c, the compare logic 466, the output lines 468, the select logic 470, the select lines 472, and/or the multiplexers 474a-h may be implemented by the example write data forwarding component of the main cache store queue 212, and of the address line 462, the address stores 464a, the byten stores 464b, the data stores 464c, the compare logic 466, the output lines 468, the select logic 470, the select lines 472, and/or the multiplexers 474a-h, as implemented in association with the victim storage 216, may be implemented by the example write data forwarding component of the victim cache store queue 216.

In some examples, the topology of FIG. 4B may correspond to the pending store address data store 418 and example priority multiplexer 418. For example, the address stores 464a, the byten stores 464b, and/or the data stores 464c may be implemented by the example pending store address data store 416. In a further example, any of the address line 462, the compare logic 466, the output lines 468, the select logic 470, the select lines 472, and/or the multiplexers 474a-h may be implemented by the example priority multiplexer 418.

In examples disclosed herein, the topology of FIG. 4B is utilized for each bank of the main storage 214 and the victim storage 218. For example, if the main storage 214 has 8 banks, the topology of FIG. 4B would be replicated 8 times, one for each bank.

Example methods, apparatus, systems, and articles of manufacture to facilitate fully pipelined read-modify-write support in level 1 data cache using store queue and data forwarding are disclosed herein. Further examples and combinations thereof include the following:

Example 1 includes an apparatus comprising a first storage, a second storage, a store queue coupled to the first storage and the second storage, the store queue operable to receive a first memory operation specifying a first set of data, process the first memory operation for storing the first set of data in at least one of the first storage and the second storage, receive a second memory operation, and prior to storing the first set of data in the at least one of the first storage and the second storage, feedback the first set of data for use in the second memory operation.

Example 2 includes the apparatus of example 1, wherein the second memory operation is a read modify-write operation and specifies a second set of data, and the store queue is operable to prior to storing the first set of data in the at least one of the first storage and the second storage, merge the first set of data and the second set of data to produce a third set of data, and provide the third set of data for storing in at least one of the first storage and the second storage.

Example 3 includes the apparatus of example 2, further including receiving a third memory operation indicating to read the third set of data.

Example 4 includes the apparatus of example 1, wherein the second storage is configured as a victim storage of the first storage.

Example 5 includes the apparatus of example 1, wherein the store queue further includes a datastore configured to store a first address value of the first set of data.

Example 6 includes the apparatus of example 1, wherein the store queue further includes an error code correcting generator to generate error detection code.

Example 7 includes the apparatus of example 6, wherein the error code correcting generator is to generate the error detection code in response to processing the first memory operation.

Example 8 includes a method comprising receiving a first memory operation specifying a first set of data, processing the first memory operation for storing the first set of data in at least one of a first storage and a second storage, receiving a second memory operation, and prior to storing the first set of data in the at least one of the first storage and the second storage, transmitting the first set of data for use in the second memory operation.

Example 9 includes the method of example 8, wherein the second memory operation is a read modify-write operation and specifies a second set of data, the method further including prior to storing the first set of data in the at least one of the first storage and the second storage, merging the first set of data and the second set of data to produce a third set of data, and providing the third set of data for storing in at least one of the first storage and the second storage.

Example 10 includes the method of example 9, further including receiving a third memory operation indicating to read the third set of data.

Example 11 includes the method of example 8, wherein the second storage is configured as a victim storage of the first storage.

Example 12 includes the method of example 8, further including storing a first address value of the first set of data.

Example 13 includes the method of example 8, further including generating error detection code.

Example 14 includes the method of example 13, further including generating the error detection code in response to processing the first memory operation.

Example 15 includes a system comprising a central processing unit configured to transmit a first memory operation and a second memory operation, a first storage coupled to the central processing unit, a second storage coupled to the central processing unit, a store queue coupled to the first storage, the second storage, and the central processing unit, the store queue operable to receive the first memory operation specifying a first set of data, process the first memory operation for storing the first set of data in at least one of the first storage and the second storage, receive the second memory operation, and prior to storing the first set of data in the at least one of the first storage and the second storage, feedback the first set of data for use in the second memory operation.

Example 16 includes the system of example 15, wherein the second memory operation is a read modify-write operation and specifies a second set of data, and the store queue is operable to prior to storing the first set of data in the at least one of the first storage and the second storage, merge the first set of data and the second set of data to produce a third set of data, and provide the third set of data for storing in at least one of the first storage and the second storage.

Example 17 includes the system of example 16, further including receiving a third memory operation indicating to read the third set of data.

Example 18 includes the system of example 15, wherein the second storage is configured as a victim storage of the first storage.

Example 19 includes the system of example 15, wherein the store queue further includes a datastore configured to store a first address value of the first set of data.

Example 20 includes the system of example 15, wherein the store queue further includes an error code correcting generator to generate error detection code in response to processing the first memory operation.

Methods and Apparatus to Reduce Read-Modify-Write Cycles for Non-Aligned Writes

When issuing a write instruction to a multi-banked storage, such a write instruction may be transmitted with a corresponding read instruction, regardless of the size of the write instruction, in an attempt to execute a full read-modify-write cycle of such a write instruction. For example, in such an application, a write instruction may be obtained by a CPU indicating to write 128 bits across two 64-bit memory banks, starting at address A0 of the first memory bank. In such an example, though the entirety of both the example memory banks are being written, such an application maintains a read instruction to read the data currently stored in the two example memory banks. However, such an approach is inefficient as twice the processing power (e.g., a write and a read instruction) is used. Additionally, such an approach does not provide any control logic and/or processing circuitry to analyze the write instruction.

In the example illustrated in FIG. 4A, the main storage 214 and/or the victim storage 218 may be multi-banked storages. For example, the main storage 214 may include sixteen memory banks (e.g., sixteen sub-RAMs), each 64 bits wide. In such an example, in the event the cache controller 220 transmits a write instruction to write all 64 bits of a first bank of the main storage 214 (e.g., write a 64-bit word starting with the first address of the first bank), the write instruction can be executed without initiating a read instruction. For example, the bank processing logic 303 may detect that such a write of an entire bank is to be performed and, thus, indicate to the cache controller 220 to initiate the read-modify-write operation, negating to transmit the read instruction.

Similarly, in the event the cache controller 220 transmits a write instruction to the write port 426 to write all 128 bits of a first bank and a second bank of the main storage 214 (e.g., a write instruction indicating to write a 128 bit word starting with the first address of the first bank and ending with the last address of the second bank), the write instruction can be implemented without initiating a read instruction. For example, the bank processing logic 303 may detect that such a write of the entirety of multiple banks is to be performed and, thus, indicate to the cache controller 220 to initiate the read-modify-write operation, negating to transmit the read instruction.

However, in some examples disclosed herein, the cache controller 220 may transmit a write instruction to write 130 bits of data (or any write instruction indicating to write to a subset of the memory banks). Of the 130 bits of data, 64 bits of data may be written to a first bank, 64 bits of data may be written to a second bank, and 2 bits of data may be written to a third bank of the main storage (e.g., a write instruction indicating to write a 130 bit work starting with the first address of the first bank and ending with the second address of the third bank). In such an example, the bank processing logic 303 detects that all addresses of the first bank and the second bank of the main storage 214 are to be written entirely and, thus, indicate to the cache controller to initiate the read-modify-write operations for the first bank and the second bank of the main storage, negating to transmit the read instruction. In such an example, the bank processing logic 303 may detect (e.g., determine) that a subset of the memory banks of the main storage 214 (e.g., the third bank of the memory storage) is to be partially written (e.g., two addresses of the 64 addresses are to be written), and, thus, indicate to the cache controller 220 to initiate a full read-modify-write operation of the third bank of the main storage 214. In examples disclosed herein, the bank processing logic 303 determines whether to cause a read operation to be performed (e.g., whether to initiate a full read-modify-write operation) in response to the write operation based on whether a number of addresses in the subset of the plurality of memory banks to write satisfies a threshold. In examples disclosed herein, the threshold is not satisfied when the number of addresses in the subset of the plurality of memory banks is greater than 0 and/or less than the number of addresses in the memory bank. In this example, the bank processing logic 303 generates an indication to the CPU 102 to execute the write instruction as a full read-modify-write transaction. In examples disclosed herein, the threshold is satisfied when the number of addresses in the subset of the plurality of memory banks is equal to the number of addresses in the memory bank. n this example, the bank processing logic 303 generates an indication to the CPU 102 to execute the write instruction as a partial read-modify-write transaction (e.g., negating the read). Example description of a read-modify-write operation is described above.

Example methods, apparatus, systems, and articles of manufacture to reduce read-modify-write cycles for non-aligned writes are disclosed herein. Further examples and combinations thereof include the following:

Example 1 includes an apparatus comprising a memory that includes a plurality of memory banks, an interface configured to be coupled to a central processing unit, the interface to obtain a write operation from the central processing unit, wherein the write operation is to write a subset of the plurality of memory banks, and bank processing logic coupled to the interface and to the memory, the bank processing logic to determine the subset of the plurality of memory banks to write based on the write operation, and determine whether to cause a read operation to be performed in response to the write operation based on whether a number of addresses in the subset of the plurality of memory banks to write satisfies a threshold.

Example 2 includes the apparatus of example 1, wherein the threshold is satisfied when all addresses of the at least one of the number of the plurality of memory banks is included in the write operation.

Example 3 includes the apparatus of example 1, wherein the bank processing logic is to when the number of addresses of the at least one of the number of the plurality of memory banks to write does not satisfy the threshold, generate a second indication to the central processing unit to execute the write operation to the at least one of the number of the plurality of memory banks with issuing the read operation.

Example 4 includes the apparatus of example 1, wherein the bank processing logic determines the number of the plurality of memory banks to write based on the write operation by determining a total number of addresses included in the write operation, and determining the number of the plurality of memory banks based on having an address included in the total number of addresses.

Example 5 includes the apparatus of example 1, wherein the write operation indicates a number of the plurality of memory banks to rewrite.

Example 6 includes the apparatus of example 1, wherein the plurality of memory banks are sixteen memory banks.

Example 7 includes the apparatus of example 1, wherein the memory is a victim storage.

Example 8 includes a system comprising a central processing unit configured to generate a write operation indicating to write to a subset of a plurality of memory banks, a victim storage including the plurality of memory banks, and bank processing logic coupled to the central processing unit and to the victim storage, the bank processing logic to determine the subset of the plurality of memory banks to write based on the write operation, and determine whether to cause a read operation to be performed in response to the write operation based on whether a number of addresses in the subset of the plurality of memory banks to write satisfies a threshold.

Example 9 includes the system of example 8, wherein the threshold is satisfied when all addresses of the at least one of the number of the plurality of memory banks is included in the write operation.

Example 10 includes the system of example 8, wherein the bank processing logic is to when the number of addresses of the at least one of the number of the plurality of memory banks to write does not satisfy the threshold, generate a second indication to the central processing unit to execute the write operation to the at least one of the number of the plurality of memory banks with issuing the read operation.

Example 11 includes the system of example 10, wherein the central processing unit is further to generate a read-modify-write operation to be executed by the at least one of the number of the plurality of memory banks in response to the second indication.

Example 12 includes the system of example 8, wherein the bank processing logic determines the number of the plurality of memory banks to write based on the write operation by determining a total number of addresses included in the write operation, and determining the number of the plurality of memory banks based on having an address included in the total number of addresses.

Example 13 includes a method comprising determining a subset of a plurality of memory banks of a memory to write based on a write operation, and determine whether to cause a read operation to be performed in response to the write operation based on whether a number of addresses in the subset of the plurality of memory banks to write satisfies a threshold.

Example 14 includes the method of example 13, further including transmitting an indication to a central processing unit in response to the threshold being satisfied.

Example 15 includes the method of example 13, wherein the threshold is satisfied when all addresses of the at least one of the number of the plurality of memory banks is included in the write operation.

Example 16 includes the method of example 13, further including when the number of addresses of the at least one of the number of the plurality of memory banks to write does not satisfy the threshold, generating a second indication to execute the write operation to the at least one of the number of the plurality of memory banks with issuing the read operation.

Example 17 includes the method of example 13, wherein determining the number of the plurality of memory banks to write is performed by determining a total number of addresses included in the write operation, and determining the number of the plurality of memory banks based on having an address included in the total number of addresses.

Example 18 includes the method of example 13, wherein the write operation indicates a number of the plurality of memory banks to rewrite.

Example 19 includes the method of example 14, further including obtaining the write operation from the central processing unit, the write operation indicating the number of the plurality of memory banks to write.

Example 20 includes the method of example 14, wherein the memory is a victim storage.

Aggressive Write Merging to Reduce Bank Pressure

In the example of FIG. 4A, the example main cache store queue 212 stores a number of write operations at different sections of the main cache store queue 212 (e.g., at the example latches 402a-e). For example, when the CPU 102 transmits three separate write operations in a row, the first write operation that the CPU 102 provided is stored at the first latch 402b and moved to the second latch 402c when the second operation is received at the first latch 402b. Accordingly, after the three write operations are received, the first latch 402b will store and/or output the last write operation with respect to time (e.g., which is last to be stored in the main storage 214), the second latch 402c will have the second write operation (e.g., which is second to be stored in the main storage 214), and the third latch 402d will have the first write operation (e.g., which was the first to be stored in the example main storage 214). Whenever data in the main cache store queue 212 is next to be stored in the main storage 214, the example arbitration manager 414 reserves a cycle for the data to be written into the example main storage 214. Accordingly, during the reserved cycle, the main storage 214 may not be available to perform read operations. However, if the data operations stored in two or more of the latches 402b, 402c, 402d correspond to the same memory address, the data can be merged in order to write the data into the memory address of the main storage 214 once, instead of two or three times. For example, if the write operation stored in the latch 402d corresponds to writing a byte of the memory address and the write operation stored in the latch 402c corresponds to writing the same byte to the memory address, the second write will overwrite the first write.

Instead of reserving a cycle to write the first byte into the main storage 214, which will be overwritten in a subsequent cycle, the main cache store queue 212 merges the two writes into one write, so that only one cycle is used to write the second transaction (e.g., to avoid reserving a cycle for the first write). Such an aggressive merge reduces the number of cycles reserved for write operations. In this manner, the main storage 214 will have extra cycles to perform read operations, thereby decreasing the latency of the overall systems.

To enable an aggressive merge of write operations to the same memory address, the output of the example latches 402b-402d are coupled to the example merging circuits 403a-403c. For example, the output of the third latch 402d may be coupled to the merging circuit 403a, the output of the second latch 402c may be coupled to the merging circuit 403b, and the output of the first latch 402b may couple to the merging circuit 403c. The output of the merging circuit 403a may additionally be coupled to the output of the second latch 402c and the merging circuit 403b, the merging circuit 403b may be coupled to the merging circuit 403c, and the merging circuit 403c may be coupled to the input of the first latch 402b. Additionally or alternatively, there may be additional comparator circuits that compare outputs of a different set of latches (e.g., a comparator circuit to compare the output of latch 402b with the output of latch 402d). The example merging circuits 403a-c include example comparator(s) 420 and example switches 422.

The comparator(s) 420 compare the memory address locations for each write operation that is stored in the respective laches 402b-402d to determine whether any of the write operations in the example store queue correspond to the same memory address. The example comparator 420 may be one comparator to compare all the write operations of the latches 402b-402d or may be separate comparators 420, to compare two of the latches 402b-d (e.g., a first comparator to the memory address of latch 402b to the memory address of latch 402c, a second comparator to the memory address of 402b to the memory address of latch 402d, etc.). The comparator(s) 420 output the results of the comparisons (e.g., with one or more signals corresponding to the one or more comparisons) to the example switch(es) 422 and/or the arbitration manager 414. If the example arbitration manager 414 receives a signal indicative of a match, the arbitration manager 414 will not reserve the cycle for a first write operation while the first write operation is merged with a second write operation to the same memory location (e.g., to free up cycles for other cache operations).

The example switch(es) 422 reroute the write operations in the example latches 402b-402d based on the comparison. For example, if the memory address of the write operation stored in the example latch 402d is the same as the memory address stored in the latch 402c, the example switch(es) 422 enable and/or disable to reroute the output of the latch 402d to latch 402c, instead of routing to the example arbitration manager 414. In this manner, the two write operations are combined and written into the main storage 214 in a subsequent cycle as a single write operation instead of two write operations. The switch(es) 422 may be electrical switches, transistors (e.g., MOSFETS), demultiplexers, and/or any other component that can reroute a signal in a circuit.

When a MUX of one of the merging circuit 403a-c receives a rerouted write operation, the MUX performs a merging protocol for the one or more rerouted write operations that prioritizes the newest write operation. For example, if the comparator(s) 420 determines that the write operation stored in the example latch 402c corresponds to the same memory address as the write operation stored in the example latch 402d, the MUX of the comparator(s) 420 merge the data (as further described in conjunction with FIG. 4D) and the switches(es) 422 reroute the merged write operation stored in the example latch 402d to the latch 402c. In such an example, if the write operation in the example latch 402c corresponds to writing data to byte0 and byte2 of the memory address and the write operation from the latch 404d corresponds to writing data to byte0 and byte1, the example merging circuit 403a merges the two write operations to keep the writing data stored in latch 402c (e.g., the write to byte0 and byte2) and include the write data from latch 402d that doesn't overlap (e.g., byte2). In this example, the merging circuit 403a discards the write data of byte 0 from the latch 404d as part of the merging operation because the data to be written at byte 0 from the latch 404d will be overwritten by the write instructions of the latch 402c. Accordingly, in the above example, the merged data corresponds to the write data for byte0 from latch 402c, the write data for byte1 from latch 404d, and the write data for byte2 from the latch 402c. When a subsequent write operation is added to the main cache store queue 212, the merged write data from the latch 402c may be manipulated (e.g., via one of the example blocks 404, 406, 408) and/or pushed to the next latch 402d to be stored in the example main storage 214 during a subsequent cycle. An example hardware implementation of the merging protocol is further described below in conjunction with FIG. 4D.

Figure 4C:
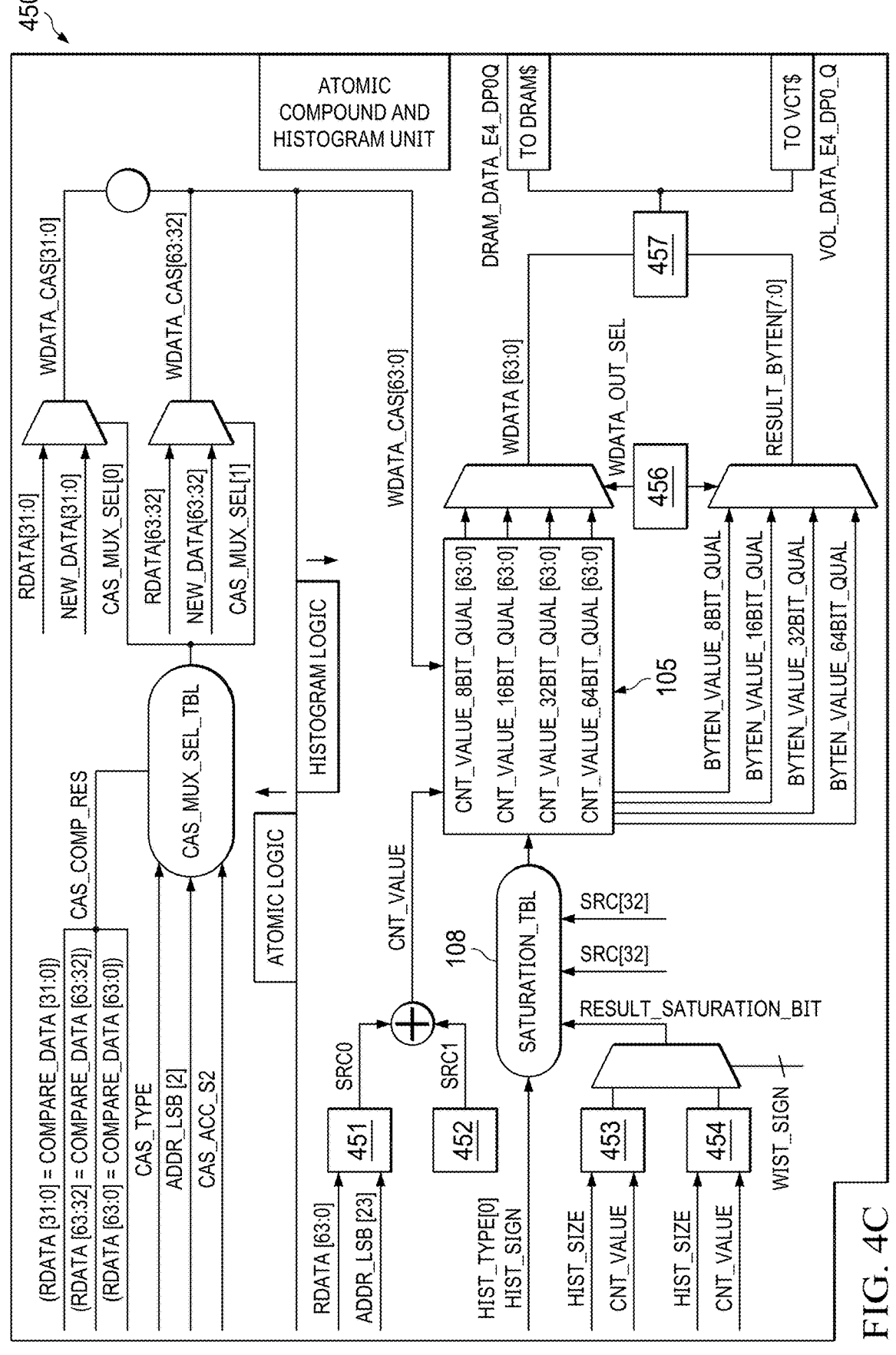
FIG. 4C is an additional example circuit implementation of the main cache store queue and/or of a victim cache store queue.
Figure 4D:
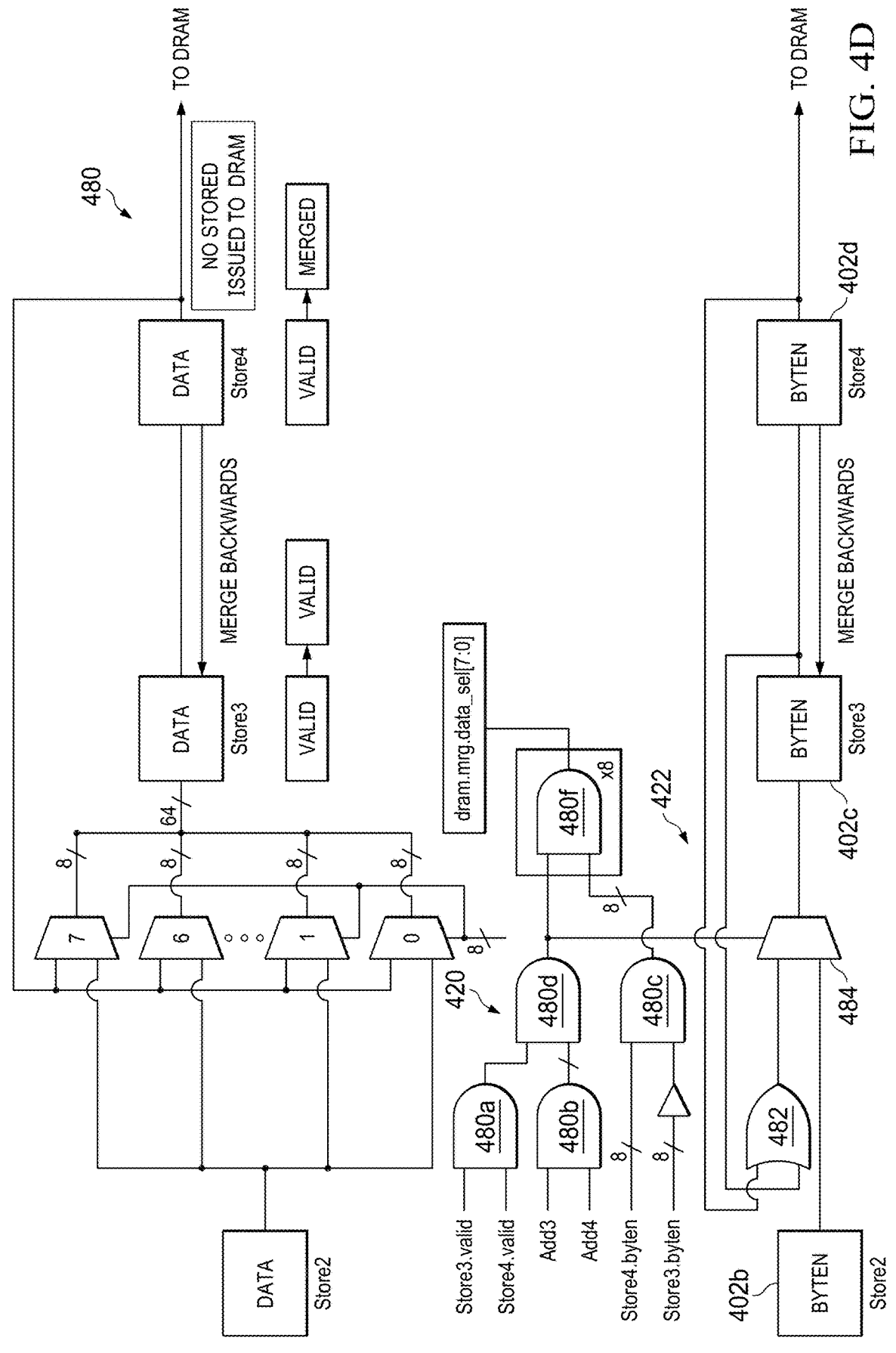
FIG. 4D is an example hardware implementation of a merging circuit of FIG. 4A.
Figure 11A:
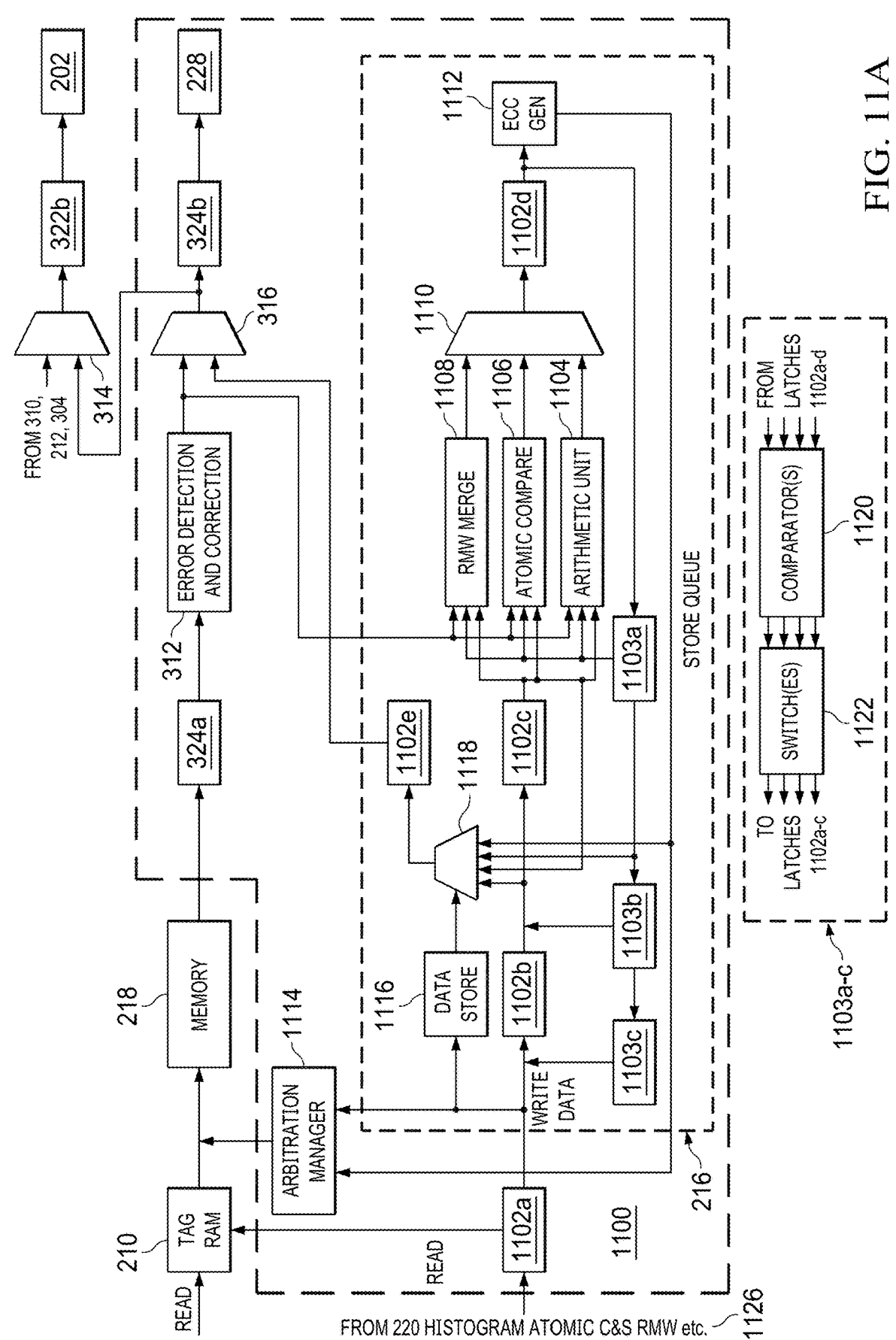
FIG. 11A is an example circuit implementation of the victim cache store queue of FIGS. 3A-3D.

FIG. 4D illustrates a hardware implementation of the merging circuit 402c of FIG. 4A and/or 1102c of FIG. 11A (e.g., to merge data from the latch 402d to the latch 402c). Similar hardware setups can be implemented to merge data between any two latches. The example of FIG. 4D includes the example latches (e.g., stores) 402b-402d and hardware components for the comparator 420 and the switch 422 of FIG. 4A. The example comparator circuit 420 includes comparators and/or logic gates 480a-480f and the switch circuit 422 includes an OR gate 482 and a MUX 484. Although described in conjunction with FIG. 4A, if described in conjunction with the victim cache store queue 216 of FIG. 11A, the latches 1102a-d, example comparator 1120 and example switch 322 of FIG. 11A could be used.

In the example of FIG. 4D, the example latch 402d outputs the stored data to the example storage (e.g., the main storage 214 or the victim storage 218 via the arbitration manager 414, 1114), which locks its bank for a first cycle. FIG. 4D illustrates the write-merge locking old data in the bank of the storage when the old data is preceded by another store/latch including new write data to the same address. Although the example of FIG. 4C illustrates a merge between the example latch 402d and the example latch 402c, a similar structure may be used to merge data between any of the latches 402a-402d. For example, if the address of data at the latch 402d matches with the address of the data at the latch 402b, then the latch 402 can merge its data with the data at latch 402b. Additionally, the data at three or more latches may be merged into a single latch if the data at the three or more latches correspond to the same address. As described above, if the data at a particular latch is merged with data and a prior latch, the data at the particular latch is invalid (e.g., by setting a bit to a value corresponding to invalided) or discarded so that the arbitration is not performed for that data to be locked in a bank in the storage.

In operation, the example comparator 480b compares the address of the data at latch 402d is compared to the address of the data at latch 403c. The output of the comparator 480b is valid only if both the latches 402c and 402d include a bit that is set to valid. Accordingly, the example comparator 480a compares the valid bits from the latches 402c, 402d to ensure that the bits are both valid. In this manner, the example comparator 480d only outputs a value (e.g., '1') when the address at latch 402c and the address at latch 402d are the same and the valid bits of both latches 402c, 402d are valid. Otherwise, the example comparator 480d outputs a second value ('0'). The output of the comparator 480d is input to the select line of the MUX 484 of the switch 422. Thus, if the addresses of the latches 402c, 402d are the same and value, the comparator 480d will control the MUX 484 of the switch 422 to output merged data (e.g., from the OR gate 482 of the switch 422).

The example ADD gate 480c performs a logic AND function with the byten of latch 402d and not of the byten of latch 402c (e.g., using a NOT gate). The output of the example ADD gate 480c ensures that if there is a byte being written by both the latch 402c and 402d, then the latch 402c is held and the latch 402d is ignored because the latch 402c has the most recent store issued by the CPU 102. Accordingly, the example comparator 480f only outputs the most recent stored issued by the CPU 102 for an address in the store queue. The output of the comparator 480f corresponds to dram_mrg_data_sel[7:0], which is the signal used to select final merged data between the logic gate 402d and logic gate 402c on a byte by byte basis. Similar merge logic exists on merging the byten of the latch 402c and the latch 402d. The signal marked as (1) is used to selected between store_byten or (store3_byten merged with store_4_byten), as described above.

Example methods, apparatus, systems, and articles of manufacture to facilitate aggressive write merging to reduce bank pressure are disclosed herein. Further examples and combinations thereof include the following: Example 1 includes an apparatus comprising a first cache storage, a second cache storage, a store queue coupled to at least one of the first cache storage and the second cache storage and operable to receive a first memory operation, process the first memory operation for storing the first set of data in at least one of the first cache storage and the second cache storage, receive a second memory operation, and prior to storing the first set of data in the at least one of the first cache storage and the second cache storage, merge the first memory operation and the second memory operation.

Example 2 includes the apparatus of example 1, wherein the first memory operation specifies a first set of data, the second memory operation specifies a second set of data, and the store queue is operable to prior to storing the first set of data in the at least one of the first cache storage and the second cache storage, merge the first set of data and the second set of data to produce a third set of data, and provide the third set of data for storing in at least one of the first cache storage and the second cache storage.

Example 3 includes the apparatus of example 2, wherein the store queue is to store the third set of data in the at least one of the first cache storage or the second cache storage in one cycle.

Example 4 includes the apparatus of example 1, wherein the store queue is operable to merge the first memory operation and the second memory operation by cancelling a part of the first memory operation.

Example 5 includes the apparatus of example 4, wherein the part of the first memory operation are bytes that the second memory operation is to write to.

Example 6 includes the apparatus of example 4, wherein the part is a first part, the store queue operable to merge the first memory operation and the second memory operation by maintaining a second part of the first memory operation.

Example 7 includes the apparatus of example 6, wherein the second part of the first memory operation are bytes that the second memory operation is not to write to.

Example 8 includes the apparatus of example 1, wherein the first cache storage is a main cache storage and the second cache storage is a victim cache storage.

Example 9 includes a system comprising a central processing unit coupled in parallel to a first cache storage and a second cache storage, a store queue coupled to at least one of the first cache storage and the second cache storage and operable to process a first memory operation from the central processing unit, the first memory operation for storing the first set of data in at least one of the first cache storage and the second cache storage, prior to storing the first set of data in the at least one of the first cache storage and the second cache storage, merge the first memory operation and a second memory operation corresponding to a same memory address.

Example 10 includes the system of example 9, wherein the first memory operation specifies a first set of data, the second memory operation specifies a second set of data, and the store queue is operable to prior to storing the first set of data in the at least one of the first cache storage and the second cache storage, merge the first set of data and the second set of data to produce a third set of data, and provide the third set of data for storing in at least one of the first cache storage and the second cache storage.

Example 11 includes the apparatus of example 10, further including a store queue to store the third set of data in the at least one of the first cache storage or the second cache storage in one cycle.

Example 12 includes the system of example 9, wherein the store queue is operable to merge the first memory operation and the second memory operation by cancelling a part of the first memory operation.

Example 13 includes the system of example 12, wherein the part of the first memory operation are bytes that the second memory operation is to write to.

Example 14 includes the system of example 12, wherein the part is a first part, the store queue operable to merge the first memory operation and the second memory operation by maintaining a second part of the first memory operation.

Example 15 includes the system of example 14, wherein the second part of the first memory operation are bytes that the second memory operation is not to write to.

Example 16 includes the system of example 9, wherein the first cache storage is a main cache storage and the second cache storage is a victim cache storage.

Example 17 includes a method comprising obtaining a first memory operation, processing, by executing an instruction with a processor, the first memory operation for storing a first set of data in at least one of a first cache storage and a second cache storage, obtaining a second memory operation, and prior to storing the first set of data in the at least one of the first cache storage and the second cache storage, merging, by executing an instruction with the processor, the first memory operation and the second memory operation.

Example 18 includes the method of example 17, wherein the first memory operation corresponds to a first set of data and the second memory operation corresponds to a second set of data, further including prior to storing the first set of data in the at least one of the first cache storage and the second cache storage, merging the first set of data and the second set of data to produce a third set of data, and providing the third set of data for storing in at least one of the first cache storage and the second cache storage.

Example 19 includes the method of example 18, further including storing the third set of data in the at least one of the first cache storage or the second cache storage in one cycle.

Example 20 includes the method of example 17, further including merging the first memory operation and the second memory operation by cancelling a part of the first memory operation.

Optimized Atomic Operations and Histogram Operations Support in L1 Cache

Atomic operations are further examples of multi-part memory operations. For example, an atomic compare and swap operation manipulates a value stored at a memory location based on the results of a comparison of the existing value stored at the memory location. For example, the CPU 102 may want to replace the data stored in the L1 cache 110 with a new value if the existing value stored in the L1 cache 110 matches a specific value.

In some example systems, when a CPU wanted to perform an atomic operation, the CPU sent a read operation to a memory address, performed the manipulation on the read data, and then executed a write operation to the same memory address to store the manipulated data. Additionally, in such example systems, the L1 cache paused, rejected, blocked, and/or halted any transactions from other devices (e.g., other cores of the CPU, higher level cache, the extended memory, etc.) until the atomic operation was complete (e.g., to avoid manipulation of the memory address corresponding to the atomic operation during the atomic operation). Accordingly, such example techniques required lots of effort on behalf of the CPU and lots of reserved cycles that increase latency.

In the example of FIG. 4A, the example main cache store queue 212 handles atomic operations in conjunction with the read modify write structure. In this manner, the example CPU 102 can send a single atomic operation to the L1 cache 110, and the main cache store queue 212 handles the atomic data manipulation and writing operation. Accordingly, the CPU 102 utilizes a single cycle to execute an atomic operation and can use the other cycles (e.g., used in some example atomic protocols) to perform other functions, thereby reducing the latency of the overall computing system 100.

In operation, when the CPU 102 transmits an atomic operation and/or an atomic compare and swap operation to increment and/or swap the data at a memory address by a value of 1, for example, the atomic instruction is received by the latch 402a and the tag RAM 208 verifies whether the memory address is stored in the example main storage 214. If the memory address is stored in the example main storage 214, the tag RAM 208 instructs the example main storage 214 to output the data at the memory address while the atomic instructions are passed to the example latch 402b. While the main storage 214 outputs the data to the latch 322a, the example latch 402b outputs the atomic operation to the latch 402c. At this point the ECC logic 310 performs error detection and/or correction protocol as described above, and the data from the memory address location is forwarded to the example arithmetic component 404 (e.g., for atomic operations) or the atomic compare component 406 (e.g., for the atomic compare and swap operations). The arithmetic component 404 obtains the atomic operation (e.g., including data identifying how to manipulate the data) and/or the atomic compare and swap 406 obtains the atomic compare and swap operation (e.g., including a key and data to be written if the key matches read data) from the latch 402c and obtains the data from the corresponding memory address from the output of the ECC logic 310. The arithmetic component 404 performs the manipulation to the data (e.g., increment the data by 1) and/or the atomic compare component 406 may perform the swap (replaces the data if the read data matches a key, etc.) and outputs the incremented and/or swapped-in data for the corresponding memory address (e.g., the atomic result) to the example latch 402d via the example MUX 410. (e.g., which is enabled via the cache controller 220). The latch 402d outputs the new data corresponding to the memory address to the ECC generator 412 to generate the ECC bit and the arbitration manager 414 writes the new data (e.g., the atomic result and/or atomic compare and swap result) to the memory address in conjunction with the ECC bit in the example main storage 214. Additionally or alternatively, the corrected value out of the EDD logic 412 is returned to the CPU 102. Thus, the atomic operation is performed with only one instruction from the CPU 102.

The atomic compare component 406 and/or the arithmetic component 404 have several inputs. For example, the atomic component 406 receives (e.g., obtains) the type of atomic operation to perform (e.g. atomic compare and swap, or atomic swap), the new data to swap in, the ECC corrected data read out the of the cache 310, and the size of the size of the data to be manipulated during the atomic operation (e.g., 32-bit or 64-bit), In the example circuit implementation 450 of FIG. 4B, the atomic compare component 406 receives an atomic compare and swap operation and the arithmetic component 404 receives an atomic operation. The atomic compare component 406 compares the comparison value (e.g., a key) provided by the CPU 102 against the ECC data 310. On a match, the new data is swapped in place of the old data (e.g. ECC data 310) and output to the MUX 410. The size of the new data swapped-in is determined by cas_acc_sz input (e.g. 32-bit or 64-bit). In the example circuit implementation 450 of FIG. 4C, the atomic compare component 406 may also receive an atomic swap operation. The atomic compare component 406 will swap-in the new data replacing the ECC data 310 regardless of the comparison result and output the new value to the mux 410 and the old data from the address is read from the main storage 214 and is provided back to the CPU 102. The size of the new data swapped-in is determined by cas_acc_sz input (e.g. 32-bit or 64-bit). In the example circuit implementation 450 of FIG. 4C, the arithmetic component 404 may also receive an atomic operation. The arithmetic component 404 will manipulate the ECC data 310 and store the manipulated data in the main storage element 214. The size of the new data swapped-in is determined by cas_acc_sz input (e.g. 32-bit or 64-bit). Although the example circuit 450 of FIG. 4C is described above in conjunction with the main store queue, the circuit 450 can be described in conjunction with a victim store queue as further described below in conjunction with FIG. 11A.

FIG. 4C illustrates an example circuit diagram of parts of the main cache store queue 212 of FIG. 4A and/or parts of the victim cache store queue 216 of FIG. 11A. FIG. 4C illustrates a detailed circuit diagram of the arithmetic unit 404, 1104.

The arithmetic unit 404 may be used for other types of memory transactions such as histogram operations. A histogram operation retrieves a value stored in memory that may represent a bin of a histogram, the histogram operation then modifies the values before storing it back to the same memory address or an alternative address. In an example, a first data set contains the values [0, 0, 2, 0, 0, 3], and a second data set contains bins representing the number of occurrences of respective values within the first data set. In some example systems that lack an arithmetic unit 404, to perform a histogram function, the CPU reads each in the first data set and increments the second data set for each value. For example, to determine how many 0s are stored in a 10 byte data set, the CPU may perform 10 reads. Then to determine how many is are in the same data set, the CPU will perform an additional 10 reads. Thus, to perform a histogram operation, such systems may need to perform (N)(M) reads, where N is the size of the section of memory (e.g., 10 bytes) being read and M is the number of values that could be store in each byte. Like an atomic operation, the L1 SRAM may have to block, pause, halt, discard, etc. all other read and/or write operations until the histogram operation is complete. In contrast, the arithmetic unit 404 may be used to perform the same operation with a single transaction from the CPU.

The arithmetic unit 404, 1104 has several inputs including the type of histogram (e.g., weighted or increment, signed or not signed), histogram size (e.g., byte, halfword, or word), histogram weight (e.g., signed weights to be added per selected bins for weighted histograms, weight equal to one for normal histogram), histogram sign (e.g., existing big signed or not), and histogram saturate enable.

Component 451 of FIG. 4C selects a bin read out of the ECC component 310 for the bank illustrated in FIG. 4C. Component 452 selects the weight to be added to the bin from the vector of weights provided by the CPU 102. Cnt_value is the sum of the bin value from component 451 and the weight provided by the CPU 102. Component 453, component 454 and component 458 are used as part of the saturation circuit. Component 453 receives the histogram size (byte, halfword, or word) and the count value (the sum of the outputs of components 451, 452) and determines if a signed bin will saturate. Component 454 receives the histogram size (byte, halfword, or word) and the count value (the sum of the outputs of components 451, 452) and determines if a unsigned bin will saturate. The outputs of components 453 and 454 are sent to a MUX which selects whether to use the signed saturate value or the unsigned saturate values based on the kind of bin selected (e.g. signed or unsigned). Component 458 receives the output of the MUX, the histogram saturate enable, the type of histogram (e.g. signed or not signed), the sign bit of the bin, and the sign bit of the weight and outputs an updated cnt_value adjusted for the selected saturation kind (e.g., based on the above Table 1). Components 455, 456, 457 are used to position the resultant cnt_value and byte enables in the correct bit positions for writing the new data bank to the correct bin.

In the example of FIG. 4A, the CPU 102 instructs the main storage 214 to perform the histogram operation. Thereby changing the number of cycles that the CPU 102 has to reserve for the operation from (N)(M) to 1. Additionally, because the atomic operation protocol is already implemented in the store queue, the histogram operation can be performed using the arithmetic component 404 by performing N reads for the N size of the memory and incrementing a count for each value in the example main cache store queue 212, thereby reducing the number or read operation from (N)(M) operations to N operations.

In operation, when the CPU 102 transmits a histogram operation corresponding to a section (e.g., a SRAM line) of the main storage 214, the histogram operation is stored in the example latch 402*a* while the tag RAM 208 verifies whether the memory address corresponding to the histogram operation is available in the main storage 214. The example cache controller 220 facilitates the read operation for each byte of the section identified in the histogram operation (e.g., where histogram bins are accessed in parallel by reading up to 128 Bytes at the same time). If available, the tag RAM 208 instructs the main storage 214 to output the data at a first byte of the section of the main storage 214 while the histogram operation is output by the example latch 402*a* to the example latch 402*b*. When the example main storage 214 outputs the data that has been read from the memory address to the example latch 322*a*, the latch 402*b* outputs the histogram operation to the example latch 402*c*. After the ECC logic 310 performs the error detection and correction functionality, the data read at the byte is sent to the example arithmetic component 404.

After receiving the read value from the ECC logic 310 and the histogram instructions from the latch 402*c*, the arithmetic component 404 initiates data representative of the histogram. For example, the arithmetic component 404 may initiate a vector (e.g., representing a histogram) with an initial value (e.g., zero) for each possible value that could be stored in the bytes of the main storage. The arithmetic component 404 increments the value of the vector based on output by the ECC logic 310 (e.g., the read byte). For example, if the read value of the byte is 0, the arithmetic component 404 increments the value corresponding to 0 in the vector.

Because each vector is incremented in parallel, the resulting vector corresponds to a histogram of the values that were read in the corresponding sections of SRAM in parallel. Because a value of the histogram is incremented for each bit, the resulting vector is a histogram of the values stored in the section of memory identified in the histogram operation from the CPU 102. In some examples, the arithmetic component 404 may increment in parallel by some weighted value (e.g., 1.5). When complete, the example histogram is input to the example MUX 418 (e.g., controlled by the example pending store address table 416) to be input to the MUX 314 via the example latch 402*e*. Once the operation is complete, the example cache controller 220 controls the MUX 314 to output the final histogram vector to the example CPU interface 202 via the example latch 322*b*, thereby ending the histogram operation.

In some examples, the L1 cache 110 supports functionality where a histogram bin can saturate after the histogram bin includes more than a threshold limit of the bin size (e.g., a byte, a halfword, a word, etc.). The below Table 1 illustrates an example of saturation values. Using this functionality, the histogram bin values will not roll over once they reach the maximum value.

operations are disclosed herein. Further examples and combinations thereof include the following: Example 1 includes a system comprising a cache storage coupled to an arithmetic component, and a cache controller coupled to the cache storage, wherein the cache controller is operable to receive a memory operation that specifies a set of data, retrieve the set of data from the cache storage, utilize the arithmetic component to determine a set of counts of respective values in the set of data, generate a vector representing the set of counts, and provide the vector.

Example 2 includes the system of example 1, wherein the cache controller is operable to provide the vector for storing in the cache storage.

Example 3 includes the system of example 1, wherein the cache controller is operable to provide the vector to a processor.

Example 4 includes the system of example 1, further including a store queue coupled to the cache controller, the store queue including the arithmetic component.

Example 5 includes the system of example 1, wherein the cache storage is at least one of a main cache storage or a victim cache storage.

Example 6 includes the system of example 1, wherein the arithmetic component is to obtain (a) the set of data from the cache storage via an error detection and correction circuit and (b) the memory operation from a central processing unit via a latch.

Example 7 includes the system of example 1, wherein the cache controller is operable to provide the vector to a central processing unit based on a single instruction from the central processing unit at a single cycle.

Example 8 includes a system comprising a cache storage, and a cache controller coupled to the cache storage and an arithmetic component, wherein the cache controller is operable to receive a memory operation specifying a first set of data and an arithmetic operation, retrieve the first set of data from the cache storage, utilize the arithmetic component to perform the arithmetic operation on the first set of data to produce a second set of data, and provide the second set of data.

Example 9 includes the system of example 8, wherein the cache controller is operable to provide the second set of data for storing in the cache storage.

Example 10 includes the system of example 8, wherein the cache controller is operable to provide the second set of data to a processor.

Example 11 includes the system of example 8, further including a store queue coupled to the cache controller, the store queue including the arithmetic component.

Example 12 includes the system of example 8, wherein the cache storage is at least one of a main cache storage or a victim cache storage.

TABLE 1

| | | Histogram Saturation Values | | | |
| | | Saturate Min | Saturate Max | Unsaturate Min | Unsaturate Max |
| --- | --- | --- | --- | --- | --- |
| Byte | Signed | 0 × 80 | 0 × 7F | 0 × 80 | 0 × 7F |
| Byte | Unsigned | 0 × 0 | 0 × FF | 0 × 0 | 0 × FF |
| HalfWord | Signed | 0 × 8000 | 0 × 7FFF | 0 × 8000 | 0 × 7FFF |
| HalfWord | Unsigned | 0 × 0 | 0 × FFFF | 0 × 0 | 0 × FF |
| Word | Signed | 0 × 8000_0000 | 0 × 7FFF_FFFF | 0 × 8000_0000 | 0 × 7FFF_FFFF |

Example methods, apparatus, systems, and articles of manufacture to facilitate optimized atomic and histogram Example 13 includes the system of example 8, wherein the arithmetic component is to obtain (a) the first set of data from the cache storage via an error detection and correction circuit and (b) the memory operation from a central processing unit via a latch.

Example 14 includes the system of example 8, wherein the cache controller is operable to provide the second set of data to a central processing unit based on a single instruction from the central processing unit at a single cycle.

Example 15 includes a method comprising obtaining a memory operation that specifies a set of data, obtaining the set of data from a cache storage, determining a set of counts of respective values in the set of data, generating a vector representing the set of counts, and providing the vector.

Example 16 includes the method of example 15, wherein the vector is provided to the cache storage.

Example 17 includes the method of example 15, wherein the vector is provided to a processor.

Example 18 includes the method of example 15, wherein the cache storage is at least one of a main cache storage or a victim cache storage.

Example 19 includes the method of example 15, further including obtaining (a) the set of data from the cache storage via an error detection and correction circuit and (b) the memory operation from a central processing unit via a latch.

Example 20 includes the method of example 15, wherein the providing the vector to a central processing unit is based on a single instruction from the central processing unit at a single cycle.

Atomic Compare and Swap Support in L1 Cache for Coherent System

If data from an address is stored in the L1 cache 110, data for the same address may also be cached in other caches (e.g., L2 cache 112, and/or L3 cache 114). Accordingly, the memory address needs to be tracked and/or monitored to ensure that any changes to the data in one cache is identified, tracked, and/or reflected to the other caches (e.g., L2 cache 112 and L3 cache 114). As described above in conjunction with FIGS. 3A-3D, the example MESI RAM 300 tracks the state of the data stored in the main storage 214 to be able to avoid issues with mismatched data in different caches that correspond to the same memory address. For example, if the CPU 102 transmits a read operation, the example MESI RAM 300 changes the state of the memory address to shared, because the data in the memory address will not be manipulated. If the CPU 102 transmits a write operation, the example MESI RAM 300 changes the state of the memory address to exclusive, because the data in the memory address will be manipulated and the main storage 214 needs write permission for the address. After the data in the memory address is written to the main storage 214, the MESI RAM 300 updates the state of the memory address to modified (e.g., indicating that the memory address has been modified).

As described above, during atomic and/or histogram protocols, the data from a memory address is read from the main storage 214 and provided to the main cache store queue 212 to be updated (e.g., incremented) and written back into the main storage 214. However, if the MESI RAM 300 has identified the state of the corresponding memory address as in shared state, the write operation of the atomic protocol may cause problems with other level caches (e.g., because the write will cause a mismatch of data in different caches).

To avoid such data mismatches during atomic operations (e.g., including atomic compare and swap), the example cache controller 220 marks cache hits that correspond to a shared state as a cache miss. In this manner, the cache controller 220 can instruct the L2 interface 228 to send the cache miss to the higher level cache with an exclusive state request. In this manner, the higher level cache can grant the exclusive state to the L1 cache 110 and the L1 cache 110 can perform the read and write operation as part of the atomic operation in response to receiving the granted exclusive state.

After the cache miss with exclusive request is sent to the higher level cache and the higher level cache responds with the write data and the exclusive response, the example atomic operation logic 406 will instruct the MESI RAM 300 to tag the data as modified. The received data from the L2 cache 112 is transmitted into the main cache store queue 212 to be stored in the main storage 214. Because the operation was an atomic operation (e.g., a regular atomic operation or an atomic compare and swap) or a histogram protocol, the data from the higher level cache is manipulated by the example arithmetic component 404 and/or the example atomic compare component 406 for the manipulation and stored in the example main storage 215 via the example ECC generator 412 and the example arbitration manager 414.

Example methods, apparatus, systems, and articles of manufacture to facilitate an atomic compare and swap are disclosed herein. Further examples and combinations thereof include the following: Example 1 includes a system comprising a cache storage, a cache controller coupled to the cache storage wherein the cache controller is operable to receive a memory operation that specifies a key, a memory address, and a first set of data, retrieve a second set of data corresponding to the memory address, compare the second set of data to the key, based on the second set of data corresponding to the key, cause the first set of data to be stored at the memory address, and based on the second set of data not corresponding to the key, complete the memory operation without causing the first set of data to be stored at the memory address.

Example 2 includes the system of example 1, further including a storage queue for the cache storage, the storage queue including a latch to interface with a tag random access memory (RAM) to retrieve the second set of data from the cache storage, an atomic compare component, the cache controller to cause the atomic compare component to compare the second set of data to the key, and if the key does not match the second set of data, discard the first set of data, and an arbitration manager to, if the key matches the second set of data, store the first set of data at the memory address in the cache storage.

Example 3 includes the system of example 1, wherein the cache storage is at least one of a main cache storage or a victim cache storage.

Example 4 includes the system of example 2, wherein the latch is a first latch, the atomic compare component to obtain (a) the second set of data from the cache storage via an error detection and correction circuit and (b) the atomic compare and swap command from the first latch via a second latch.

Example 5 includes the system of example 1, wherein the cache controller is operable to complete the memory operation based on a single instruction from a central processing unit at a single cycle.

Example 6 includes the system of example 1, further including a modified, exclusive, shared, invalid (MESI) component to determine a state of the memory address of the memory operation, and the cache controller operable to, if the memory address of the memory operation corresponds to a shared state, provide miss instructions to another cache, the miss instructions including an exclusive state request.

Example 7 includes the system of example 6, wherein the cache controller is to cause an arbitration manger to, if the first data matches the key, store the first set of data at the memory address in the cache storage after the exclusive state request has been granted from the other cache.

Example 8 includes the system of example 6, wherein the cache controller causes a tag RAM to retrieve the second set of data from the cache storage from the memory address after the exclusive state request has been granted from the other cache.

Example 9 includes a storage queue for a cache storage, the storage queue comprising a latch to retrieve a memory operation that specifies a key, a memory address, and a first set of data, and retrieve a second set of data corresponding to the memory address, and an atomic compare component to compare the second set of data to the key, based on the second set of data corresponding to the key, cause the first set of data to be stored at the memory address, and based on the second set of data not corresponding to the key, complete the memory operation without causing he first set of data to be stored at the memory address.

Example 10 includes the storage queue of example 9, wherein the cache storage is at least one of a main cache storage or a victim cache storage.

Example 11 includes the storage queue of example 9, wherein the latch is a first latch, the atomic compare component to obtain (a) the second set of data from the cache storage via an error detection and correction circuit and (b) the atomic compare and swap command from the first latch via a second latch.

Example 12 includes the storage queue of example 9, wherein, if the first data matches the key, the storage queue performs the atomic compare and swap command based on a single instruction from a central processing unit at a single cycle.

Example 13 includes the storage queue of example 9, further including a modified, exclusive, shared, invalid (MESI) component to determine a state of the memory address of the memory operation, and an interface to, if the memory address of the memory operation corresponds to a shared state, provide miss instructions to another cache, the miss instructions including an exclusive state request.

Example 14 includes the storage queue of example 13, further including an arbitration manager to, if the first data matches the key, store the first set of data at the memory address after the exclusive state request has been granted from the other cache.

Example 15 includes the storage queue of example 13, wherein the latch is to interface with a tag RAM to read the second set of data after the exclusive state request has been granted from the other cache.

Example 16 includes a method comprising receiving a memory operation that specifies a key, a memory address, and a first set of data, retrieving a second set of data corresponding to the memory address, comparing the second set of data to the key, based on the second set of data corresponding to the key, causing the first set of data to be stored at the memory address, and based on the second set of data not corresponding to the key, completing the memory operation without causing the first set of data to be stored at the memory address.

Example 17 includes the method of example 16, further including interfacing with a tag random access memory (RAM) to retrieve the second set of data from a cache storage, comparing the second set of data to the key, and if the key does not match the second set of data, discarding the first set of data, and if the key matches the second set of data, storing the first set of data at the memory address in the cache storage.

Example 18 includes the method of example 17, further including (a) the second set of data via an error detection and correction circuit and (b) the memory operation from a central processing unit.

Example 19 includes the method of example 16, wherein the completing of the memory operation is based on a single instruction from a central processing unit at a single cycle.

Example 20 includes the method of example 16, further including determining a state of the memory address of the memory operation, and if the memory address of the memory operation corresponds to a shared state, providing miss instructions to another cache, the miss instructions including an exclusive state request.

Methods and Apparatus for Inflight Data Forwarding and Invalidation of Pending Writes in Store Queue In examples disclosed herein, when the CPU 102 issues a read operation, the tag RAM accesses 204, 206 determine if the read operation hits or misses the main storage element 214 and/or the victim storage element 218. In examples where the tag RAM accesses 204, 206 determine that the read common misses both the main storage element 214 and the victim storage element 214, the cache controller 220 sends an operation to the main storage element 214 to create a victim (e.g., to determine a line in the main storage element 214 to evict). In some examples, problems may arise when the main storage element 214 evicts a line that corresponds to outstanding writes. For example, a line in the main storage element 214 that is currently having data written to it by the store queue 212 can have outstanding writes located in any of the latches 402a-d. In some examples, an error may occur when a new address replaces the line in the main storage element 214 that was evicted and the store queue 212 is still attempting to write data from a previous write operation into the same line.

Examples disclosed herein include a read-invalidate operation to be issued to the store queue 212 when the cache controller 220 determines that a read operation is a read miss. The cache controller 220 sends the read-invalidate operation to the store queue 212 when the main storage element 214 creates a victim. The read-invalidate operation notifies the store queue 212 to compare the address of the victim to all the addresses stored in the latches 402a-d. If any of the addresses in the latches 402a-d match the address of the victim, the priority multiplexer 418 sends the data in the matching address to the latch 402e to transmit the data to MUX circuit 314. Such an operation may be referred to as data forwarding of in-flight data. For example, when the priority multiplexer 418 sends data corresponding to the victim to the MUX circuit 314 via the latch 402e, the MUX circuit 314 forwards the data of the victim to the victim storage element 218 and/or the L2 cache 112. Additionally, the read-invalidate operation invalidates the data stored in the latches 402a-d when the latches 402a-d include the address corresponding to the victim. For example, each of the latches 402a-d include a valid tag. The valid tag indicates to the latches 402a-d whether data is to be stored in the main storage element 214. When the read-invalidate operation invalidates the valid tag, the latches 402a-d discontinue writing the invalid data to main storage element 214.

In an example operation, the CPU 102 issues a write operation. In some examples, the write operation corresponds to an Address A. For example:

Write operation=Write (Address A): Data 1//write Data 1 to cache line corresponding to Address A The store queue 212 obtains the write operation and begins the process of writing data to Address A of the main store element 214. In some examples, the Address A corresponds to cache line 1 in the main storage element 214. Subsequently, the CPU 102 issues a read operation. In some examples, the read operation corresponds to an Address B. For example:

Read operation=Read (Address B)//read Data 2 in cache line corresponding to Address B The example tag RAM accesses 204, 206 check the addresses in the tag RAM 208 and the tag RAM 210 and determine neither of the tag RAMs 208, 210 include Address B. The cache controller 220 obtains the read-miss result from the tag RAM accesses 204, 206 and issues an allocate operation to determine a victim in the main storage element 214 to evict to the victim storage element 218 and/or the L2 cache 112. When the cache controller 220 obtains a response corresponding to a victim, the cache controller 220 issues a read-invalidate operation to the store queue 212.

The read port 424 of the store queue 212 obtains the read-invalidate operation and obtains the address of the victim. The read port 424 sends the address of the victim to the data store 416 to be compared to all of the addresses stored in the latches 402*a-d*. If the data store 416 determines any of the addresses stored in the latches 402*a-d* match the address of the victim, the data store 416 outputs an operation to the priority multiplexer 418 to send the data corresponding to the victim address to the latch 402*e*. The latch 402*e* forwards the data to the MUX circuit 314 to send to the victim storage element 218 and/or the L2 cache 112.

Additionally, in response to the addresses stored in the latches 402*a-d* matching the victim address, the latches 402*a-d* invalidate the data corresponding to the victim address. For example, the valid tag in the latches 402*a-d* are updated to indicate that the data in the latch corresponding to the victim address is invalid. In this example, the store queue 212 will not attempt to write that data to the cache line corresponding to the previous address that was evicted.

Example methods, apparatus, systems, and articles of manufacture for inflight data forwarding and invalidation are disclosed herein. Further examples and combinations thereof include the following:

Example 1 includes an apparatus comprising a cache storage, a cache controller coupled to the cache storage and operable to receive a first memory operation, determine that the first memory operation corresponds to a read miss in the cache storage, determine a victim address in the cache storage to evict in response to the read miss, issue a read-invalidate command that specifies the victim address, compare the victim address to a set of addresses associated with a set of memory operations being processed by the cache controller, and in response to the victim address matching a first address of the set of addresses corresponding to a second memory operation of the set of memory operations, provide data associated with the second memory operation.

Example 2 includes the apparatus of example 1, wherein the cache controller is to issue the read-invalidate command when a tag random access memory access issues a read-miss.

Example 3 includes the apparatus of example 1, wherein the cache controller is to determine the victim address to evict from the cache storage to make room for a data of a third memory operation.

Example 4 includes the apparatus of example 1, wherein the cache controller is operable to discontinue writing data associated with the second memory operation in the cache storage.

Example 5 includes the apparatus of example 1, further including a first latch, a second latch, a third latch, and a fourth latch, wherein the first latch, the second latch, the third latch, or the fourth latch is to store data for the victim address.

Example 6 includes the apparatus of example 5, wherein the first latch, the second latch, the third latch, and the fourth latch include a valid tag that is to be updated to invalid when any of the first latch, the second latch, the third latch, or the fourth latch store the data for the victim address.

Example 7 includes the apparatus of example 1, further including a read port to initiate the comparison between the victim address and the set of addresses associated with the set of memory operations being processed by the cache controller when the read port obtains the read-invalidate command and the victim address.

Example 8 includes a method to invalidate a write operation, the method comprising receiving a first memory operation, determining that the first memory operation corresponds to a read miss in a cache storage, determining a victim address in the cache storage to evict in response to the read miss, issuing a read-invalidate command that specifies the victim address, comparing the victim address to a set of addresses associated with a set of memory operations being processed by a cache controller, and in response to the victim address matching a first address of the set of addresses corresponding to a second memory operation of the set of memory operations, providing data associated with the second memory operation.

Example 9 includes the method of example 8, further including issuing the read-invalidate command when a tag random access memory access issues a read-miss.

Example 10 includes the method of example 8, further including determining the victim address to evict from the cache storage to make room for a data of a third memory operation.

Example 11 includes the method of example 8, further including discontinuing writing the data associates with the second memory operation in the cache storage.

Example 12 includes the method of example 8, further including storing data for the victim address in at least one of a first latch, a second latch, a third latch, and a fourth latch.

Example 13 includes the method of example 12, further including updating a valid tag of the first latch, the second latch, the third latch, or the first latch to invalid when any of the first latch, the second latch, the third latch, and the fourth latch store the data for the victim address.

Example 14 includes the method of example 8, further including initiating the comparison between the victim address and the set of addresses associated with the set of memory operations being processed by the cache controller when a read port obtains the read-invalidate command and the victim address.

Example 15 includes a system comprising a central processing unit to output a first memory operation, a cache coupled to the central processing unit, the cache including a cache storage, a cache controller coupled to the cache storage and operable to receive the first memory operation, determine that the first memory operation corresponds to a read miss in the cache storage, determine a victim address in the cache storage to evict in response to the read miss, issue a read-invalidate command that specifies the victim address, compare the victim address to a set of addresses associated with a set of memory operations being processed by the cache controller, and in response to the victim address matching a first address of the set of addresses corresponding to a second memory operation of the set of memory operations, provide data associated with the second memory operation and invalidate the second memory operation.

Example 16 includes the system of example 15, wherein the cache is a first cache and wherein the first cache is operable to retrieve data associated with the first memory operation from a second cache in response to the cache storage not including the data associated with the first memory operation.

Example 17 includes the system of example 15, wherein the cache includes a store queue to store write data of the second memory operation into the cache storage in multiple clock cycles, each clock cycle writing at least one portion of the data associated with the second memory operation to the cache storage.

Example 18 includes the system of example 17, wherein the cache is a first cache and wherein the cache controller is operable to provide portions of data remaining in the store queue to a second cache for storing when the second memory operation is invalidated.

Example 19 includes the system of example 15, wherein the cache includes a store queue to store outstanding writes, the second memory operation corresponding to an outstanding write.

Figure 5:
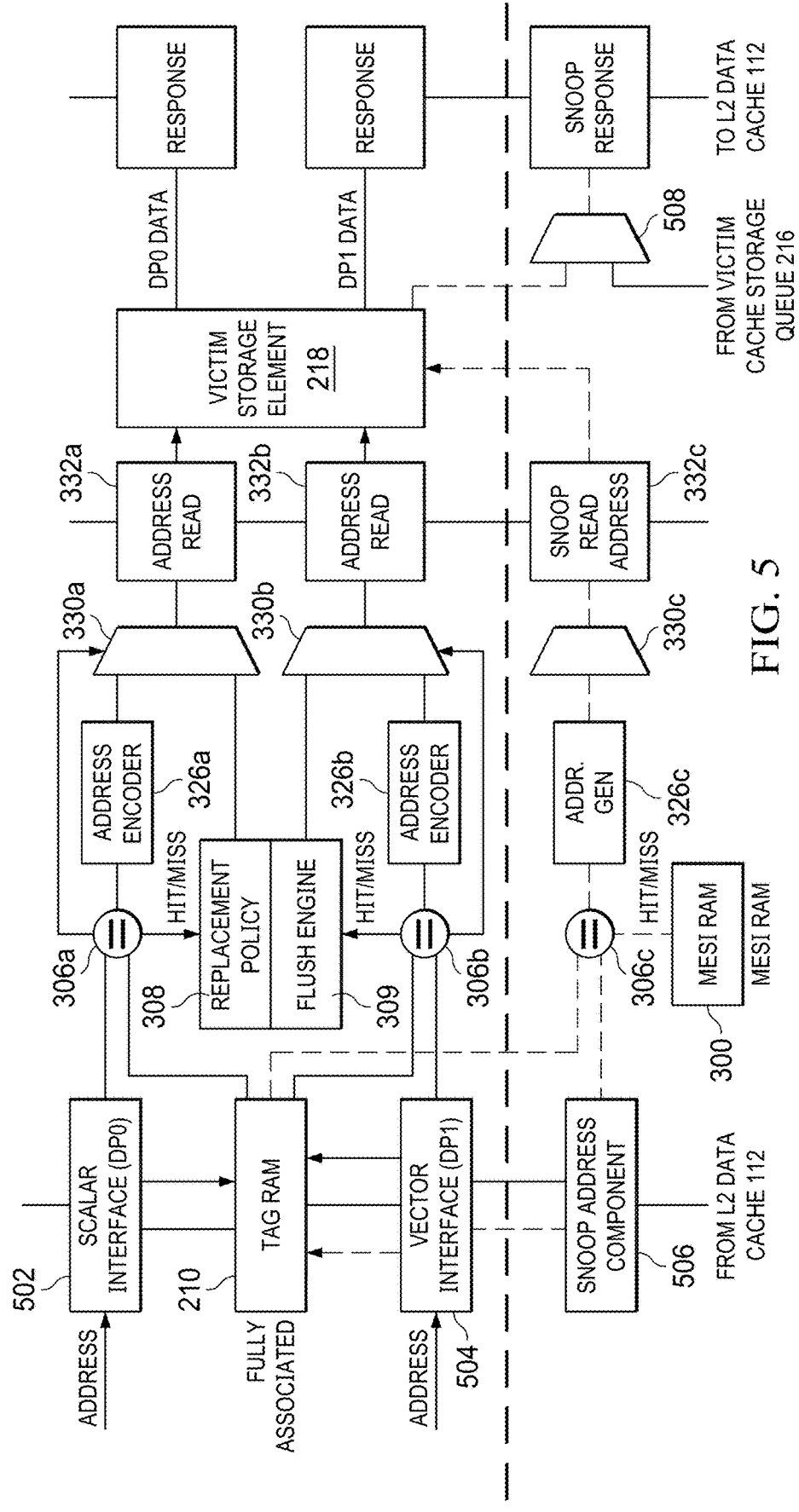
FIG. 5 illustrates an example victim cache-based section of the level one cache of FIGS. 3A-3D.

Example 20 includes the system of example 15, wherein the central processing unit outputs the first memory operation subsequently to outputting the second memory operation. FIG. 5 illustrates an example victim cache-based section of the level one (L1) cache 110 of FIGS. 1 and 3. FIG. 5 includes the tag RAM 210, the victim storage 218, the MESI RAM 300, the example hit/miss comparison logic 306a, 306b, 306c, the example replacement policy 308 (e.g., the replacement policy component 308), the example address encoders 326a, 326b, 326c, example multiplexers (MUXs) 330a, 330b, 330c, the example address reads 332a, 332b, 332c, an example scalar interface 502, an example vector interface 504, an example snoop address component 506, and an example response multiplexer 508. FIG. 5 illustrates a victim cache system that supports dual data paths and a coherency pipeline.

In FIG. 5, the example scalar interface 502 is an interface coupling the L1 cache 110 of the data cache 108 of FIG. 1 to the example processing core 104a. In some examples, the scalar interface 502 is an interface corresponding to a first data path (DP0) in the dual data path victim cache system. In some examples, the scalar interface 502 is an interface corresponding to a second data path (DP1) in the dual data path cache system. The example scalar interface 502 is a 64-bit wide bidirectional and/or unidirectional interface. Alternatively, the example scalar interface 502 may support a different quantity of bits (e.g., 32 bits, 128 bits, etc.). In some examples, the scalar interface 502 receives and/or obtains data from the core 104a. In some examples, the scalar interface 502 sends data from the victim storage 218 to the core 104a. The example scalar interface 502 is coupled to the example tag RAM 210, and comparison logic 306 to compare an address from the CPU 102 to addresses in the tag RAM 210.

In FIG. 5, the example vector interface 504 is an interface coupling the L1 cache 110 of the data cache 108 of FIG. 1 to the example processing core 104a. In some examples, the vector interface 504 is an interface corresponding to a second data path (DP1) in the dual data path cache system. In some examples, the vector interface 504 is an interface corresponding to a first data path (DP0) in the dual data path cache system. The example vector interface 504 is a 512-bit wide interface. Alternatively, the example vector interface 504 may support a different quantity of bits (e.g., 256 bits, 1024 bits, etc.). In some examples, the vector interface 504 receives and/or obtains data from the core 104a. In some examples, the vector interface 504 sends data from the victim storage 218 to the core 104a. The example vector interface 504 is coupled to the example tag RAM 210, the snoop address component 506, and comparison logic 306b to compare an address from the CPU 102 to addresses from the tag RAM 210. In some examples, the scalar interface 502 and the vector interface 504 are implemented by the CPU interface 202 (FIG. 2). For example, the scalar interface 502 and the vector interface 504 can be included in the CPU interface 202.

In FIG. 5, the example tag RAM 210 is connected to the example interfaces 502, 504. However, in some examples, the tag RAM 210 may be coupled to the interfaces 502, 504 via the example victim tag RAM access 206 (FIG. 2). The example tag RAM 210 is a dual-port fully associated tag RAM to support the dual data paths (e.g., scalar data path and vector data path). As used herein, a fully associated tag RAM 210 permits data from the main storage 214 (FIG. 2) to be stored in any cache block rather than forcing each memory address into one particular block. In some examples, because the tag RAM 210 is fully associated, the victim storage 218 is also fully associated.

In FIG. 5, the comparison logic 306a is connected to the scalar interface 502, the tag RAM 210, the address encoder 326a, and the replacement policy component 308. The comparison logic 306b is connected to the vector interface 504, the tag RAM 210, the address encoder 326b, and the replacement policy component 308. The comparison logic 306a, 306b supports both scalar and vector data paths. For example, the comparison logic 306 can compare scalar data to data of tag RAM 210 and/or vector data to the data of the tag RAM 210. The comparison logic 306 provides a hit or miss output to the replacement policy component 308 and the address encoders 326a, 326b. In some examples, the comparison logic 306 provides the hit or miss output to the multiplexers 330a, 330b.

Figure 6:
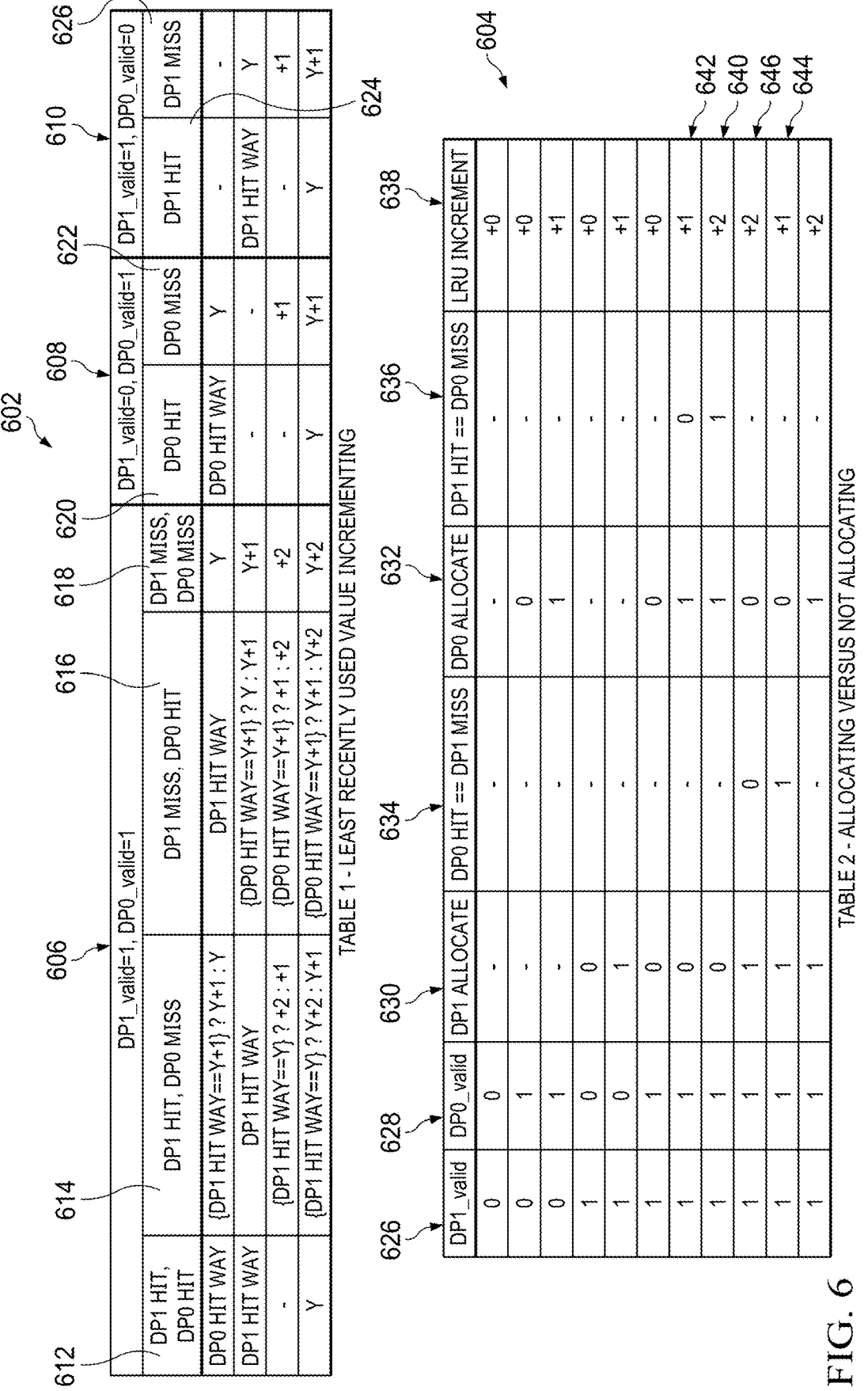
FIG. 6 illustrates an example first table and an example second table for implementing an example replacement policy component of FIGS. 3A-3D and 5.

In FIG. 5, the example replacement policy component 308 is coupled to the comparison logic 306a, 306b. The example replacement policy component 308 is control/decision making logic. The example replacement policy component 308 dictates the entries (e.g., the data) of the example victim storage 218 based on a plurality of inputs. For example, the replacement policy component 308 can determine whether the cache controller 220 (FIG. 2) is to remove and/or enter entries to/from the victim storage 218. The control logic of the replacement policy component 308 is configured to resolve address conflicts between the 2 addresses (e.g., scalar and vector) in such a way that data-consistency is maintained. FIG. 6 illustrates the control logic of the example replacement policy component 308.

In FIG. 5, the example address encoders 326a, 326b encode memory addresses into a form interpretable by the victim storage 218. For example, the address encoders 326a, 326b can operate similarly to the address encoder 326 of FIGS. 3A-3D. The example address encoders 326a, 326b output encoded addresses to the multiplexers 330a, 330b. For example, address encoder 326a can output encoded memory addresses to multiplexer 330a and address encoder 326b can output encoded memory addresses to multiplexer 330b.

In FIG. 5, the multiplexers 330a, 330b select an address in response to executing the comparison logic 306a, 306b. For example, the multiplexer 330a can obtain an input from the comparison logic 306a corresponding to a hit and therefore select the encoded address from the address encoder 326a. Additionally and/or alternatively, the multiplexer 330a may obtain an input from the comparison logic 306a corresponding to a miss and therefore select the memory address chosen by the replacement policy component 308. The example multiplexers 330a, 330b are coupled to address reads 332a, 332b.

In FIG. 5, the example address reads 332a, 332b read the address values selected by the multiplexers into the victim storage 218. For example, the address reads 332a, 332b can identify addresses that are to be stored and/or removed from the victim storage 218.

In FIG. 5, the example victim storage 218 is a fully associative cache. For example, the fully associated victim storage 218 can place data, when data is fetched (e.g., victimized) from the main storage 214, in any unused block of the cache. The placement of the data in the victim storage 218 is based on the replacement policy component 308. For example, the replacement policy component 308 can determine when and where a line of data from the main storage 214 should be placed in the victim storage 218. In some examples, when the address reads 332a, 332b read data into the victim storage 218, the victim storage 218 outputs a response. In some examples, the victim storage 218 generates a DP0 response, a DP1 response, and a snoop response to be transmitted to the L2 data cache 112. In some examples, the responses include data requested by the CPU 102. For example, based on the address reads 332a, 332b, the victim storage 218 can output data from a memory address location if the CPU 102 has requested such data. Additionally and/or alternatively, based on the address reads 332a, 332b, the victim storage 218 can output eviction data to the L2 cache 112 if the replacement policy component 308 is replacing data in the victim storage 218.

In FIG. 5, the example snoop address component 506 is implemented by a snoop data path and/or otherwise interface. In addition to the two CPU data paths (e.g., DP0 and DP1), the L1 cache 110 includes the snoop data path to add coherency to the L1 cache 110. The example snoop address component 506 is connected to the tag RAM 210 and comparison logic 306c. In some examples, the snoop address component 506 obtains an example snoop request address issued by a higher-level data cache (e.g., the L2 data cache 112) that issues an address read to the tag RAM 210. For example, the snoop address component 506 attempts to read a memory address from the tag RAM 210. Additionally, the snoop address component 506 provides the address read to the comparison logic 306c. The snoop address component 506 and more generally, the coherency pipeline, is utilized to store the MESI state of every cache line in the victim storage 218 in the MESI RAM 300. By storing the MESI state of every cache line in the MESI RAM 300, the victim cache system supports coherency.

In FIG. 5, the example MESI RAM 300 is connected to the comparison logic 306c. The example MESI RAM 300 tracks the states of a cache line in the main storage 214 and the victim storage 218 by marking the cache line as modified, exclusive, shared, or invalid based on the comparison logic 306c. For example, when the snoop address component 506 issues a read to the tag RAM 210, the tag RAM 210 returns or does not return the correct memory address. Thus, the comparison logic 306c compares the memory address of the snoop issued read and the tag RAM 210 results to determine the state of the cache line.

In the example topology illustrated in FIG. 5, the response multiplexer 508 is coupled to the victim storage 218 and to the victim cache store queue 216. In this manner, the response multiplexer 508 is configured to select between the data obtained by the victim storage 214 and/or the data obtained by the victim cache store queue 216 to transmit the data most recent to the system. Example operational description of the priority multiplexer 508 is described below.

Methods and Apparatus for Multi-Banked Victim Cache with Dual Datapath

In some victim caches, there is not support for a multi-bank architecture. For instance, a victim cache may be a monolithic storage device that does not support multiple accesses by a processor (e.g., a CPU) during the same clock cycle. For example, a request to access data in a single victim cache can lock up the entire victim cache. In such examples, there is a single register file capable of supporting one full victim cache line access per clock cycle. In some such examples, an entire victim cache line associated with the single victim storage can be locked to service the request because the single register file is allocated to the victim storage data bank that received such a request.

Examples disclosed herein include a multi-banked victim cache with a dual datapath. In some disclosed examples, the victim storage 218 of FIG. 2 has a plurality of banks and, thus, is multi-banked, or has a multi-bank data or memory structure. Advantageously, the multi-bank structure of the victim storage 218 can effectuate support for two or more accesses (e.g., CPU accesses) per clock cycle. Advantageously, the multi-bank structure of the victim storage 218 allows the two or more accesses to be serviced and/or fulfilled without performance overhead.

In some disclosed examples, the victim storage 218 has a two-port fully associative tag ram (e.g., the tag ram 210 of FIG. 2). In some disclosed examples, hit/miss comparison is supported for both scalar and vector addresses. In such disclosed examples, based on the hit/miss decision on each of the datapaths (e.g., the scalar data path, the vector data path, etc.) the victim storage 218 is locked. In an example where an access to the victim storage 218 is a hit, then the location of the hit entry is selected. In an example, where an access to the victim storage 218 is a miss, then allocation policy is checked for a particular set of the victim storage 218.

In some disclosed examples, in a subsequent pipe stage, the selected sets of the victim storage 218 for both addresses are read and response(s) is/are given back to the CPU. In some disclosed examples, the set selection logic resolves address conflict between the two addresses (e.g., the scalar address and the vector address) in such a manner that data-consistency is maintained. In some disclosed examples, the control logic resolves address conflict as well.

In some disclosed examples, bank arbitration logic calculates and/or otherwise determines the banks required for each of the addresses and selects the read on each of the banks. In some disclosed examples, the control logic resolves any bank conflict between the two addresses to effectuate serialization of the two memory operations. In some disclosed examples where both datapaths access the same address, the control logic can effectuate not issuing multiple allocation requests for the same address. Once the data is read from the victim storage 218, example data muxing logic can fold the data into the correct data lanes before returning the data back to the CPU as read response(s).

Figure 7A:
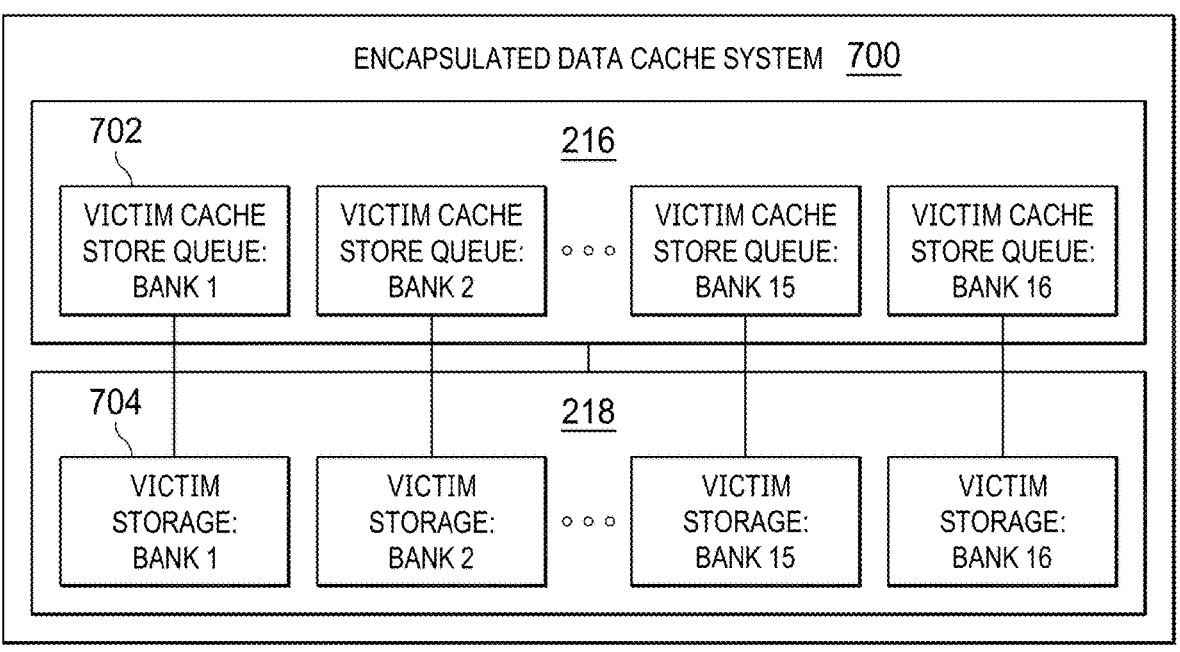
FIG. 7A illustrates an example encapsulated data cache system including a victim cache store queue and victim storage.

FIG. 7A is a schematic illustration of a first example encapsulated data cache system 700. The first encapsulated data cache system 700 can be an example circuit implementation of the L1 cache 110 of FIG. 1 or portion(s) thereof, and/or, more generally, the data cache 108 of FIG. 1 or portion(s) thereof. The first encapsulated data cache system 700 is encapsulated to provide a unified storage view to an external system (e.g., one or more CPUs, one or more processors, external hardware, etc.). For example, the first encapsulated data cache system 700 can be encapsulated using firmware, software, hardware logic, etc., and/or a combination thereof to encapsulate and/or otherwise abstract all complexity related to read after write (RAW) hazards, write after write (WAW) hazards, data forwarding, etc. Advantageously, the unified architecture depicted in the example of FIG. 7A can provide separate ports to an external system (e.g., the CPU 102) to simplify obtaining access to the most recent versions of data of interest.

In the example of FIG. 7A, the first encapsulated data cache system 700 includes the victim cache store queue 216 of FIG. 2 and the victim storage 218 of FIG. 2. In FIG. 7A, the victim cache store queue 216 includes a plurality of first example independently addressable banks (e.g., data banks, store banks, data store banks, etc.) 702. For example, the first independently addressable banks 702 can be bank queues, bank sub-queues, etc. In such examples, the bank queues, the bank sub-queues, etc., can include a plurality of storage elements, as depicted below in FIG. 7C and/or FIG. 7E. The first independently addressable banks 702 are victim cache store queue banks (e.g., victim cache store queue data banks, victim cache bank queues, victim cache bank sub-queues, etc.). In FIG. 7A, the victim cache store queue 216 includes 16 of the victim cache store queue banks 702. Alternatively, there may be fewer or more than 16 instances of the victim cache store queue banks 702.

In FIG. 7A, the victim storage 218 includes a plurality of second example independently addressable banks (e.g., data banks, store banks, data store banks, etc.) 704. The second independently addressable banks 704 are victim storage banks (e.g., victim storage data banks). In FIG. 7A, the victim storage 218 includes 16 of the victim storage banks 704. Alternatively, there may be fewer or more than 16 instances of the victim storage banks 704. For example, the victim cache store queue 216 can include a plurality of bank queues or bank sub-queues including a first bank queue or a first bank sub-queue (e.g., VICTIM CACHE STORE QUEUE: BANK 1) and the victim storage 218 can include a plurality of data banks including a first data bank (e.g., VICTIM STORAGE: BANK 1).

In some examples, the victim cache store queue 216 and the victim storage 218 each have 256 rows with each row having a line width of 1024 bits, but being divided into 16 banks as illustrated in FIG. 7A, with 64 bits per row in a given bank. In some examples, the victim cache store queue 216 and the victim storage 218 each have 384 rows with each row having a line width of 1024 bits, but being divided into 16 banks as illustrated in FIG. 7A, with 64 bits per row in a given bank. Of course, the cache size described in the above examples are only two examples and the disclosure is not limited to any particular cache line width, number of banks, or rows, etc. As depicted in FIG. 7A, each of the first banks 702 correspond to one of the second banks 704. For example, a first bank (BANK 1) of the victim cache store queue 216 is in circuit with a first bank (BANK 1) of the victim storage 218 and, thus, corresponds with the first bank of the victim storage 218.

Advantageously, the multi-bank structure of the victim cache store queue 216, the victim storage 218, and/or, more generally, the first encapsulated data cache system 700, can service read and write operations that are sent to the banks in parallel. In some examples, each bank arbitrates its own processes in response to the read and/or write operations. By allowing each bank of the first encapsulated data cache system 700 to operate independently, operation of the first encapsulated data cache system 700 is more efficient since an entire cache line is not locked up when a request is received. Rather, only the portion of the cache line allocated to the bank that received such a request would be locked.

FIG. 7C depicts an example victim cache multi-bank structure 720. In some examples, the L1 cache 110, the L2 cache 112, and/or the L3 cache 114 of FIG. 1 can have the victim cache bank structure 720. In some examples, the victim cache store queue 216 of FIG. 2 and/or the victim storage 218 of FIG. 2 can have the victim cache multi-bank structure 720. For example, the victim cache multi-bank structure 720 can be an example implementation of the victim cache store queue 216 and/or the victim storage 218.

The victim cache multi-bank structure 720 is a data or memory structure that includes 16 example banks (Banks 0-15) 722, with each of the banks 722 having a data width of 64 bytes (e.g., bytes 0-7). Each of the banks 722 includes 16 example rows (Rows 0-15) 724, with each of the rows 724 having a data width of 128 bytes (e.g., 128 bytes=8 bytes/bank*16 banks). In FIG. 7C, each of the banks 722 can store 128 bytes (e.g., 128 bytes=8 bytes/row*16 rows). In FIG. 7C, the victim cache multi-bank structure 720 can store 2048 bytes (e.g., 2048 bytes=128 bytes/bank*16 banks). The victim cache multi-bank structure 720 is independently addressable by bank. For example, the first row of the rows 724 has a starting row address of 0 and an ending row address of 127, a second row of the rows 724 has a starting row address of 128 and an ending row address of 255, etc.

In some examples, a cache line can be 128 bytes of data that fits in a width of memory (e.g., DRAM) or storage unit (e.g., the main storage 214, the victim storage 218, etc.). In the example of FIG. 7C, a cache line can consume an entire row of the victim cache bank structure 720. For example, a cache line can use one of the rows 724 of 16 banks, where each bank is 8 bytes wide. Advantageously, the victim cache bank structure 720 can enable 16 different cache lines to access data stored therein.

Figure 8A:
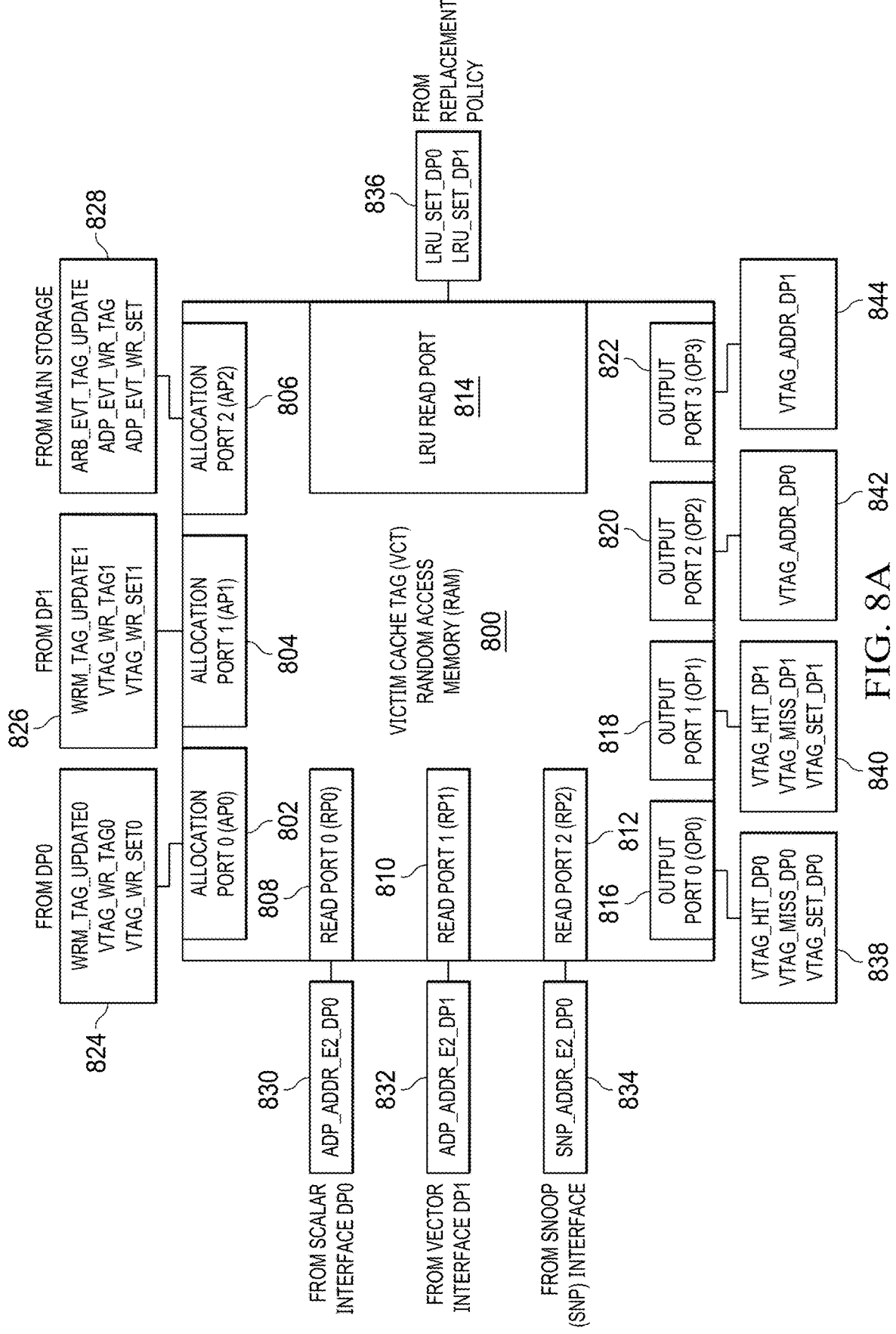
FIG. 8A illustrates a schematic illustration of an example implementation of victim cache tag random access memory.

FIG. 8A illustrates a schematic illustration of example victim cache tag (VCT) random access memory (RAM) 800. The VCT RAM 800 can be an example implementation of the tag ram 210 of FIG. 2. For example, the VCT RAM 800 can store addresses of data stored in the victim cache store queue 216, the victim storage 218, etc., of FIG. 2. The VCT RAM 800 is a multi-bank VCT RAM. For example, the VCT RAM 800 can include a plurality of banks (e.g., data banks, memory banks, etc.), such as 16 banks, although the VCT RAM 800 can have a different quantity of banks.

The VCT RAM 800 includes example allocation ports 802, 804, 806 including a first example allocation port (AP0) 802, a second example allocation port (AP1) 804, and a third example allocation port (AP2) 806. The VCT RAM 800 includes example read ports 808, 810, 812 including a first example read port (RP0) 808, a second example read port (RP1) 810, and a third example read port (RP2) 812. The VCT RAM 800 includes an example LRU read port 814. The VCT RAM 800 includes example output ports 816, 818, 820, 822 including a first example output port (OP0) 816, a second example output port (OP1) 818, a third example output port (OP2) 820, and a fourth example output port (OP3) 822. Alternatively, VCT RAM 800 may fewer or more allocation ports, read ports, LRU read ports, and/or output ports than depicted in FIG. 8A.

The VCT RAM 800 includes the allocation ports 802, 804, 806 to fill the victim storage 218. For example, the allocation ports 802, 804, 806 can be configured to receive requests from external hardware (e.g., the CPU 102, the main storage 214, etc.) to store data in the victim storage 218. The first allocation port 802 is configured to receive first example data 824. For example, the first allocation port 802 can receive the first data 824 from the write state machine associated with the scalar data path (DP0). The first data 824 includes WRM_TAG_UPDATE0 data, which can be representative of a control signal generated from the CPU interface 202 of FIG. 2 (e.g., the scalar data path (DP0)). The control signal can be generated to inform the VCT RAM 800 that the CPU interface 202 has a cache line to be moved from the CPU interface 202 to the victim storage 218 and, thus, the CPU interface 202 has an address to be moved from the CPU interface 202 to the tag ram 210. The first data 824 includes VTAG_WR_TAG0 data, which can be representative of an address (e.g., a tag address) of the VCT RAM 800 that can correspond to an address of data to be stored in the victim cache 218. The first data 824 includes VTAG_WR_SET0 data, which can be representative of the address of the victim cache 218 of where to store the data (e.g., the victim cache tag for DP0).

The second allocation port 804 is configured to receive second example data 826. For example, the second allocation port 804 can receive the second data 826 from the write state machine associated with the vector data path (DP1). The second data 826 includes WRM_TAG_UPDATE1 data, which can be representative of a control signal generated from the CPU interface 202 of FIG. 2 (e.g., the vector data path (DP1)). The control signal can be generated to inform the VCT RAM 800 that the CPU interface 202 has a cache line to be moved from the CPU interface 202 to the victim storage 218 and, thus, the CPU interface 202 has an address to be moved from the CPU interface 202 to the tag ram 210. The second data 826 includes VTAG_WR_TAG1 data, which can be representative of an address (e.g., a tag address) of the VCT RAM 800 that can correspond to an address of data to be stored in the victim cache 218. The second data 826 includes VTAG_WR_SET1 data, which can be representative of the address of the victim cache 218 of where to store the data (e.g., the victim cache tag for DP1).

The third allocation port 806 is configured to receive third example data 828. The third data 828 includes ARB_EVT_TAG_UPDATE data, which can be representative of a control signal generated from the main storage 214. The control signal is an arbitration (ARB) evict (EVT) tag update control signal, which can be generated to inform the VCT RAM 800 that the main storage 214 has a cache line to be moved from the main storage 214 to the victim storage 218 and, thus, the main storage 214 has an address to be moved from the tag ram 208 to the tag ram 210. The third data 828 includes ADP_EVT_WR_TAG data, which can be representative of an address (e.g., a tag address) of the VCT RAM 800 that can correspond to an address of data to be stored in the victim cache 218. The third data 828 includes ADP_EVT_WR_SET data, which can be representative of the address of the victim cache 218 of where to store the data (e.g., the victim cache tag for the line moved from the main cache to the victim cache). For example, ADP_EVT_WR_TAG and ADP_EVT_WR_SET data can be referred to as address datapath (ADP) data. The first data 824, the second data 826, and/or the third data 828 can be one or more data packets, one or more signals based on a communication protocol (e.g., an inter-integrated circuit (I2C) protocol), etc.

The VCT RAM 800 includes the read ports 808, 810, 812 to provide interfaces for which external hardware (e.g., the CPU 102) can request to read and/or otherwise access data stored in the victim storage 218. The first read port 808 is configured to receive fourth example data 830. For example, the first read port 808 can receive the fourth data 830 from the scalar interface 502 of the CPU 102. The fourth data 830 includes ADP_ADDR_E2_DP0 data, which can be representative of an address of the victim storage 218 that the scalar interface 502 requests access to.

The second read port 810 is configured to receive fifth example data 832. For example, the second read port 810 can receive the fifth data 832 from the vector interface 504 of the CPU 102. The fifth data 832 includes ADP_ADDR_E2_DP1 data, which can be representative of an address of the victim storage 218 that the vector interface 504 requests access to.

The third read port 812 is configured to receive sixth example data 834. For example, the third read port 812 can receive the sixth data 834 from the snoop address component 506 of FIG. 5 (e.g., the snoop interface). The sixth data 834 includes SNP_ADDR_E2_DP0 data, which can be representative of an address of the victim storage 218 that the snoop address component 506 requests access to.

The LRU read port 814 is configured to receive seventh example data 836. For example, the LRU read port 814 can receive the seventh data 836 from the replacement policy component 308 of FIGS. 3A-3D. The seventh data 836 includes LRU_SET_DP0 and LRU_SET_DP1, which can be representative of respective addresses associated with the least randomly used (LRU) cache lines of the victim storage 218. For example, the LRU read port 814 can be a victim least randomly used (VLRU) read port configured to receive LRU data from the replacement policy component 308.

The VCT RAM 800 includes the output ports 816, 818, 820, 822 to transmit outputs to external hardware (e.g., the CPU 102, the main storage 214, etc.) in response to a read request or a write request (e.g., an allocation request) associated with the victim storage 218. The first output port 816 is configured to transmit first example output data 838. For example, the first output port 816 can transmit the first output data 838 to the scalar interface 502. The first output data 838 includes VTAG_HIT_DP0 data, which can indicate that data requested by the scalar interface 502 is stored in the victim storage 218. The first output data 838 includes VTAG_MISS_DP0 data, which can indicate that the data requested by the scalar interface 502 is not stored in the victim storage 218. The first output data 838 includes VTAG_SET_DP0 data, which can be representative of the address in the victim storage 218 where the data requested by the scalar interface 502 is stored.

The second output port 818 is configured to transmit second example output data 840. For example, the second output port 818 can transmit the second output data 840 to the vector interface 504. The second output data 840 includes VTAG_HIT_DP1 data, which can indicate that data requested by the vector interface 504 is stored in the victim storage 218. The second output data 840 includes VTAG_MISS_DP1 data, which can indicate that the data requested by the vector interface 504 is not stored in the victim storage 218. The second output data 840 includes VTAG_SET_DP1 data, which can be representative of the address in the victim storage 218 where the data requested by the vector interface 504 is stored.

The third output port 820 is configured to transmit third example output data 842. For example, the third output port 820 can transmit the third output data 842 to the replacement policy component 308. The third output data 842 includes VTAG_ADDR_DP0 data, which can be representative of the address of the victim storage 218 that is associated with the request LRU_SET_DP0 by the replacement policy component 308 received at the LRU read port 814.

The fourth output port 822 is configured to transmit fourth example output data 844. For example, the fourth output port 822 can transmit the fourth output data 844 to the replacement policy component 308. The fourth output data 844 includes VTAG_ADDR_DP1 data, which can be representative of the address of the victim storage 218 that is associated with the request LRU_SET_DP1 by the replacement policy component 308 received at the LRU read port 814.

Figure 8B:
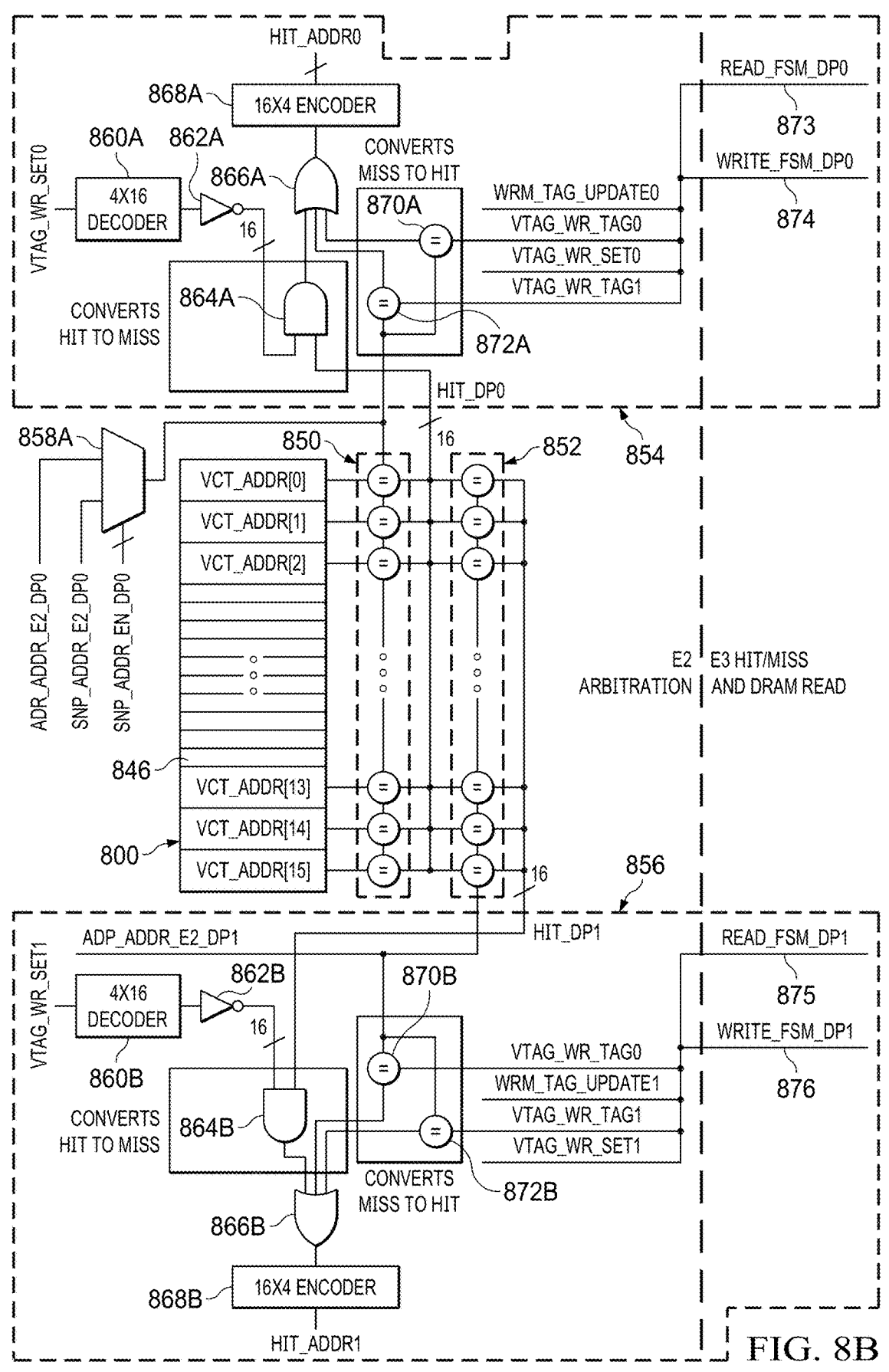
FIG. 8B illustrates another schematic illustration of the example implementation of the victim cache tag random access memory of FIG. 8A.

FIG. 8B illustrates another schematic illustration of the example implementation of the VCT RAM 800 of FIG. 8A. For example, FIG. 8B can correspond to the victim cache-based section of the L1 cache 110 of FIG. 5, or portion(s) thereof.

FIG. 8B depicts another example implementation of the VCT RAM 800 of FIG. 8A. In FIG. 8B, the VCT RAM 800 includes 16 example sets 846. For example, the sets 846 include a first set VCT_ADDR[0], a second set VCT_ADDR[1], etc. Alternatively, the VCT RAM 800 may include fewer or more than 16 of the sets 846.

The VCT RAM 800 is victim cache tag storage configured to store addresses (e.g., tag addresses) that correspond to the sets 846. Each of the sets 846 is coupled to a respective one of first example comparators 850 and a respective one of second example comparators 852. The first comparators 850 can be an example implementation of the comparison logic 306a of FIGS. 3 and/or 5. The second comparators 852 can be an example implementation of the comparison logic 306b of FIGS. 3 and/or 5. The first set VCT_ADDR[0] is coupled to a first one of the first comparators 850 and a first one of the second comparators 852, the second set VCT_ADDR[1] is coupled to a second one of the first comparators 850 and a second one of the second comparators 852, etc.

The first comparators 850 and the second comparators 852 are coupled to respective example address encoder logic circuits 854, 856 including a first example address encoder logic circuit 854 and a second example address encoder logic circuit 856. The first comparators 850 are coupled to the first address encoder logic circuit 854. The second comparators 852 are coupled to the second address encoder logic circuit 856.

The address encoder logic circuit 854, 856 can be example implementations of the address encoders 326a, 326b of FIGS. 3 and/or 5. For example, the first address encoder logic circuit 854 can be an example implementation of the address encoder 326a. In other examples, the second address encoder logic circuit 856 can be an example implementation of the address encoder 326b.

A first example multiplexer 858A is coupled to the first address encoder logic circuit 854. The first address encoder logic circuit 854 includes a first example decoder 860A, a first example inverter (e.g., a logic gate, an inverting logic gate, etc.) 862A, a first example AND gate (e.g., a logic gate, an AND logic gate, etc.) 864A, a first example OR gate (e.g., a logic gate, an OR logic gate, etc.) 866A, a first example encoder 868A, a third example comparator 870A, and a fourth example comparator 872A.

FIG. 8B depicts only one instance each of the first AND gate 864A, the first OR gate 866A, the third comparator 870A, and the fourth comparator 872A for clarity. However, each of the first AND gate 864A, the first OR gate 866A, the third comparator 870A, and the fourth comparator 872A can be representative of 16 instances of said component. For example, the first AND gate 864A can be representative and/or otherwise implement 16 instances of the first AND gate 864A, the first OR gate 866A can be representative of and/or otherwise implement 16 instances of the first OR gate 866A, etc.

The first multiplexer 858A has a first input to receive ADP_ADDR_E2_DP0, which is representative of an address requested by the DP0 interface from the E2 Arbitration stage of FIGS. 3A-3D. The first multiplexer 858A has a second input to receive SNP_ADDR_E2_DP0, which is representative of a snoop address requested by the snoop interface from the E2 Arbitration stage of FIGS. 3A-3D. The first multiplexer 858A has a select input to receive SNP_ADDR_EN_DP0, which is representative of an enable signal from the snoop interface that, when asserted, can invoke the first multiplexer 858A to select the second input. An output of the first multiplexer 858A is coupled to inputs of the first comparators 850. For example, each of the first comparators 850 can compare an address from the output of the first multiplexer 858A to a corresponding one of the sets of the VCT RAM 800. In such examples, a first one of the first comparators 850 can compare an address included in ADP_ADDR_E2_DP0 to the address stored in VCT_ADDR [0]. In some such examples, the first one of the first comparators 850 can output and/or otherwise generate a logic one in response to the address from the first multiplexer 858A matching the address stored in VCT_ADDR[0].

Outputs of the first multiplexer 858A are coupled to a first input of the third comparator 870A. An output of an example DP0 read finite-state machine (FSM) (READ_FSM_DP0) 873 and/or an output of an example DP0 write finite-state machine (WRITE_FSM_DP0) 874 is coupled to a second input of the third comparator 870A. The DP0 read finite-state machine 873 and the DP0 write finite-state machine 874 are hardware implemented finite-state machines that execute logic on data from the scalar interface 502 of FIG. 5. For example, the DP0 read finite-state machine 873 and/or the DP0 write finite-state machine 874 can transmit one or more of WRM_TAG_UPDATE0, VTAG_WR_TAG0, and VTAG_WR_SET0 to the third comparator 870A and/or the fourth comparator 872A. The DP0 read finite-state machine 873 and/or the DP0 write finite-state machine 874 can transmit VTAG_WR_TAG0 to a sixth example comparator 872B included in the second address encoder logic circuit 856. WRM_TAG_UPDATE0, VTAG_WR_TAG0, and VTAG_WR_SET0 are described above in connection with FIG. 8A.

The first decoder 860A is a 4×16 decoder. The first decoder 860A has an input to receive VTAG_WR_SET0 data, which can be representative of an in-flight address from the scalar interface 502 to the victim storage 218. The first decoder 860A has an output coupled to an input of the first inverter 862A. The first decoder 860A can convert the in-flight address to a bit vector where each bit is inverted by one of the 16 instances of the first inverter 862A. An output of the first inverter 862A is coupled to a first input of the first AND gate 864A. A second input of the first AND gate 864A is coupled to the result bit of the tag comparison from the first comparators 850 with set 0 (e.g., VCT_ADDR[0]) and the output of the first multiplexer 858A. For example, the second input of the first AND gate 864A can be configured to receive HIT_DP0 data, which can be representative of a 16-bit vector, where each of the bits can correspond to whether the ADP_ADDR_E2_DP0 data is a hit (e.g., a bit value of 1) or a miss (e.g., a bit value of 0) in the victim storage 218.

An output of the first AND gate 864A is coupled to a first input of the first OR gate 866A. An output of the third comparator 870A is coupled to a second input of the first OR gate 866A. An output of the fourth comparator 872A is coupled to a third input of the first OR gate 866A. An output of the first OR gate 866A is coupled to an input of the first encoder 868A. The first encoder 868A is a 16×4 encoder. For example, the first encoder 868A can generate HIT_ADDR0 data, which can be representative of VTAG_SET_DP0 of FIG. 8A. In such examples, HIT_ADDR0 can correspond to the first output data 838 of FIG. 8A.

The second address encoder logic circuit 856 includes a second example decoder 860B, a second example inverter (e.g., a logic gate, an inverting logic gate, etc.) 862B, a second example AND gate (e.g., a logic gate, an AND logic gate, etc.) 864B, a second example OR gate (e.g., a logic gate, an OR logic gate, etc.) 866B, a second example encoder 868B, a fifth example comparator 870B, and the sixth example comparator 872B.

FIG. 8B depicts only one instance each of the second AND gate 864B, the second OR gate 866B, the fifth comparator 870B, and the sixth comparator 872B for clarity. However, each of the second AND gate 864B, the second OR gate 866B, the fifth comparator 870B, and the sixth comparator 872B can be representative of 16 instances of said component. For example, the second AND gate 864B can be representative and/or otherwise implement 16 instances of the second AND gate 864B, the second OR gate 866B can be representative of and/or otherwise implement 16 instances of the second OR gate 866B, etc.

The second address encoder logic circuit 856 has a first input to receive ADP_ADDR_E2_DP1, which is representative of an address requested by the DP1 interface from the E2 Arbitration stage of FIGS. 3A-3D. ADP_ADDR_E2_DP1 is coupled to inputs of the second comparators 852. For example, each of the second comparators 852 can compare the address included in ADP_ADDR_E2_DP1 to a corresponding one of the sets of the VCT RAM 800. In such examples, a first one of the second comparators 852 can compare an address included in ADP_ADDR_E2_DP1 to the address stored in VCT_ADDR [0]. In some such examples, the first one of the second comparators 852 can output and/or otherwise generate a logic one in response to the address included in ADP_ADDR_E2_DP1 matching the address stored in VCT_ADDR[0].

ADP_ADDR_E2_DP1 is coupled to a first input of the fifth comparator 870B. An output of an example DP1 read finite-state machine (READ_FSM_DP1) 875 and/or an output of an example DP1 write finite-state machine (WRITE_FSM_DP1) 876 is coupled to a second input of the fifth comparator 870B. The DP1 read finite-state machine 875 and the DP1 write finite-state machine 876 are hardware implemented finite-state machines that execute logic on data from the vector interface 504 of FIG. 5. For example, the DP1 read finite-state machine 875 and/or the DP1 write finite-state machine 876 can transmit one or more of WRM_TAG_UPDATE1, VTAG_WR_TAG1, and VTAG_WR_SET1 to the fifth comparator 870B and/or the sixth comparator 872B. The DP1 read finite-state machine 875 and/or the DP1 write finite-state machine 876 can transmit VTAG_WR_TAG1 to the fourth comparator 872A included in the first address encoder logic circuit 854. WRM_TAG_UPDATE1, VTAG_WR_TAG1, and VTAG_WR_SET1 are described above in connection with FIG. 8A.

The second decoder 860B is a 4×16 decoder. The second decoder 860B has an input to receive VTAG_WR_SET1 data, which can be representative of an in-flight address from the vector interface 504 to the victim storage 218. The second decoder 860B has an output coupled to an input of the second inverter 862B. The second decoder 860B can convert the in-flight address to a bit vector where each bit is inverted by one of the 16 instances of the second inverter 862B. An output of the second inverter 862B is coupled to a first input of the second AND gate 864B. A second input of the second AND gate 864B is coupled to the result bit of the tag comparison from the second comparators 852 with set 0 (e.g., VCT_ADDR[0]) and ADP_ADDR_E2_DP1. For example, the second input of the second AND gate 864B can be configured to receive HIT_DP1 data, which can be representative of a 16-bit vector, where each of the bits can correspond to whether the ADP_ADDR_E2_DP1 data is a hit (e.g., a bit value of 1) or a miss (e.g., a bit value of 0) in the victim storage 218.

An output of the second AND gate 864B is coupled to a first input of the second OR gate 866B. An output of the fifth comparator 870B is coupled to a second input of the second OR gate 866B. An output of the sixth comparator 872B is coupled to a third input of the second OR gate 866B. An output of the second OR gate 866B is coupled to an input of the second encoder 868B. The second encoder 868B is a 16×4 encoder. For example, the second encoder 868B can generate HIT_ADDR1 data, which can be representative of VTAG_SET_DP1 of FIG. 8A. In such examples, HIT_ADDR1 can correspond to the second output data 840 of FIG. 8A.

In example operating conditions, the first address encoder logic circuit 854 can receive a first read address (e.g., ADP_ADDR_E2_DP0) for a store instruction requested by the CPU 102 of FIG. 1, where the first read address is received from the E2 pipeline stage (ARBITRATION) of FIGS. 3A-3D. In response to the first multiplexer 858A selecting the first input, the first multiplexer 858A can transmit the first read address to the first comparators 850. The first comparators 850 can compare the read address to the respective ones of the sets 846. If, a first one of the first comparators 850 determines that the read address matches an address stored at the corresponding one of the sets 846, the first one of the first comparators 850 can assert and/or otherwise output a logic one, otherwise the first one of the first comparators 850 outputs a logic zero. Accordingly, the first comparators 850 can generate HIT_DP0 on a 16-bit data bus as a 16-bit vector in response to the comparisons. For example, the 16-bit vector can be an implementation of a train (e.g., a pulse train) of signals representative of a bit vector. The first comparators 850 can transmit HIT_DP0 to the first AND gate 864A.

Portion(s) of the first address encoder logic circuit 854 and/or the second address encoder logic circuit 856 are cache hit-miss conversion logic. For example, the first AND gate 864A, the third comparator 870A, and/or the fourth comparator 872A can be an example implementation of cache hit-miss conversion logic. In such examples, the second AND gate 864B, the fifth comparator 870B, and/or the sixth comparator 872B can be an example implementation of the cache hit-miss conversion logic.

The first AND gate 864A is configured to determine whether to convert a hit (e.g., a cache hit) to a miss (e.g., a cache miss). For example, a new address (VTAG_WR_SET0) can be written to the victim storage 218 during the E3 pipeline stage of FIGS. 3A-3D while the first read address is being processed during the E2 pipeline stage. In such examples, the first decoder 860A can convert the new address into a 16-bit value, which can be inverted by the first inverter 862A. The first inverter 862A can transmit the inverted 16-bit value to the first input of the first AND gate 864A. The first AND gate 864A can assert a logic one in response to VTAG_WR_SET0 not matching the address in HIT_DP0 and, thus, does not convert the cache hit to a cache miss. In other examples, the first AND gate 864A can output a logic zero in response to VTAG_WR_SET0 matching the address in HIT_DP0 and, thus, converts the cache hit to a cache miss because the address requested in ADP_ADDR_E2_DP0 has been overwritten and is no longer available at that address.

In example operating conditions, the third comparator 870A and the fifth comparator 870B can be configured to convert a cache miss to a cache hit. For example, the third comparator 870A can determine that the first read address (ADP_ADDR_E2_DP0) in the VCT RAM 800 requested during the E2 pipeline stage is getting written in the E3 pipeline stage, which is represented by VTAG_WR_TAG0. In such examples, the third comparator 870A can assert a logic one in response to ADP_ADDR_E2_DP0 matching VTAG_WR_TAG0 and, thus, convert the cache miss to a cache hit and HIT_ADDR0 can be updated with VTAG_WR_SET0 because the data will be available when the ADP_ADDR_E2_DP0 address is read during the E3 pipeline stage.

In example operating conditions, the fourth comparator 872A and the sixth comparator 872B can be configured to convert a cache miss to a cache hit. For example, the fourth comparator 872A can determine that the first read address (ADP_ADDR_E2_DP0) in the VCT RAM 800 requested during the E2 pipeline stage is getting written in the E3 pipeline stage by the vector interface 504, which is represented by VTAG_WR_TAG1. In such examples, the fourth comparator 872A can assert a logic one in response to ADP_ADDR_E2_DP0 matching VTAG_WR_TAG1 and, thus, convert the cache miss to a cache hit and HIT_ADDR0 can be updated with VTAG_WR_SET1 because the data will be available when the ADP_ADDR_E2_DP0 address is read during the E3 pipeline stage.

In example operating conditions, the first OR gate 866A and the second OR gate 866B can be configured to generate an output to a corresponding one of the first encoder 868A or the second encoder 868B. For example, the first OR gate 866B can transmit a 16-bit vector representative of a cache miss (e.g., 16 bit values of 0) or a cache hit (e.g., 16-bit value of an address of the cache hit). In such examples, the first encoder 868A can encode the 16-bit value from the first OR gate 866A as a 4-bit address and, thus, generate HIT_ADDR0. Such example operations can be applicable to the second OR gate 866B, the second encoder 868B, and/or, more generally, the second address encoder logic circuit 856.

Example methods, apparatus, systems, and articles of manufacture for multi-banked victim cache with dual datapath are disclosed herein. Further examples and combinations thereof include the following:

Example 1 includes a cache system comprising a storage element that includes banks operable to store data, ports operable to receive memory operations in parallel, wherein each of the memory operations has a respective address, and a plurality of comparators coupled such that each of the comparators is coupled to a respective port of the ports and a respective bank of the banks and is operable to determine whether a respective address of a respective memory operation received by the respective port corresponds to the data stored in the respective bank.

Example 2 includes the cache system of example 1, further including victim cache including victim cache data, and the data is tag data corresponding to the victim cache data.

Example 3 includes the cache system of example 1, wherein the memory operations include a first memory operation, further including cache including cache data, the data is tag data corresponding to the cache data, and a first comparator of the plurality of the comparators to generate a signal in response to detecting a cache hit based on first data associated with the first memory operation corresponding to the data in the storage element.

Example 4 includes the cache system of example 1, wherein the plurality of the comparators is a plurality of first comparators, and further including an address encoder logic circuit including a decoder having a decoder input and a decoder output, the decoder input coupled to a first finite-state machine associated with a scalar interface of a central processing unit, a plurality of inverters having a respective inverter input and a respective inverter output, the inverter inputs coupled to the decoder output, a plurality of AND logic gates having a respective first input and a respective second input, a respective one of the first inputs coupled to a respective one of the inverter outputs, a respective one of the second inputs coupled to a respective one of outputs of the plurality of the first comparators, a plurality of second comparators coupled to respective ones of the outputs of the plurality of the first comparators and the first finite-state machine, and a plurality of third comparators coupled to the respective outputs of the plurality of the first comparators and a second finite-state machine associated with a vector interface of the central processing unit.

Example 5 includes the cache system of example 4, wherein a first AND logic gate of the plurality of the AND logic gates is to output a logic low signal to convert a cache hit to a cache miss in response to a first address associated with the scalar interface matching a second address associated with the cache hit.

Example 6 includes the cache system of example 4, wherein a first comparator of the plurality of the second comparators is to output a logic high signal to convert a cache miss to a cache hit in response to a first address associated with the scalar interface matching a second address associated with the cache miss.

Example 7 includes the cache system of example 4, wherein a first comparator of the plurality of the third comparators is to output a logic high signal to convert a cache miss to a cache hit in response to a first address associated with the vector interface matching a second address associated with the cache miss.

Example 8 includes the cache system of example 4, wherein the address encoder logic circuit includes a plurality of OR logic gates having a respective third input, a respective fourth input, and a respective fifth input, the third inputs coupled to a respective one of outputs of the plurality of the AND logic gates, the fourth inputs coupled to a respective one of outputs of the plurality of the second comparators, the fifth inputs coupled to a respective one of outputs of the plurality of the third comparators, and an encoder having an encoder input and an encoder output, the encoder input coupled to outputs of the plurality of the OR logic gates, the encoder output coupled to an input of a multiplexer.

Example 9 includes the cache system of example 1, wherein the plurality of the comparators is a plurality of first comparators, and further including an address encoder logic circuit including a decoder having a decoder input and a decoder output, the decoder input coupled to a first finite-state machine associated with a vector interface of a central processing unit, a plurality of inverters having a respective inverter input and a respective inverter output, the inverter inputs coupled to the decoder output, a plurality of AND logic gates having a respective first input and a respective second input, a respective one of the first inputs coupled to a respective one of the inverter outputs, a respective one of the second inputs coupled to a respective one of outputs of the plurality of the first comparators, a plurality of second comparators coupled to respective ones of the outputs of the plurality of the first comparators and the first finite-state machine, and a plurality of third comparators coupled to the respective outputs of the plurality of the first comparators and a second finite-state machine associated with a vector interface of the central processing unit.

Example 10 includes a victim cache system comprising a victim cache store queue including first data banks, and a victim storage coupled to the victim cache store queue, the victim storage including second data banks different from the first data banks.

Example 11 includes the victim cache system of example 10, wherein at least one of the first data banks or the second data banks includes 16 data banks.

Example 12 includes the victim cache system of example 10, wherein the first data banks includes a first data bank having 8 addresses each having a data width of 1 byte, the first data bank configured to store 64 bits.

Example 13 includes the victim cache system of example 10, wherein the second data banks includes a second data bank having 8 addresses each having a data width of 1 byte, the second data bank configured to store 64 bits.

Example 14 includes the victim cache system of example 10, wherein a respective one of the first data banks is coupled to a respective one of the second data banks.

Example 15 includes a method to identify a cache hit in a victim cache, the method comprising receiving a first read address from a first interface of a processor, receiving a second read address from a second interface of the processor, comparing the first read address and the second read address to data banks of a multi-bank victim cache tag memory, in response to mapping at least one of the first read address or the second read address to a first data bank of the data banks, identifying a cache hit, and outputting a cache hit address representative of a victim cache address of cache data stored in the victim cache.

Example 16 includes the method of example 15, wherein the first interface is a scalar interface and the second interface is a vector interface.

Example 17 includes the method of example 15, further including in response to identifying the cache hit, comparing the cache hit address to a first address received from a finite-state machine associated with the first interface, the first address representative of an address written to in the victim cache in a previous pipeline stage, and in response to the cache hit address matching the first address, converting the cache hit to a cache miss.

Example 18 includes the method of example 15, further including in response to identifying the cache hit, comparing the cache hit address to a first address received from a finite-state machine associated with the second interface, the first address representative of an address written to in the victim cache in a previous pipeline stage, and in response to the cache hit address matching the first address, converting the cache hit to a cache miss.

Example 19 includes the method of example 15, further including in response to not mapping at least one of the first read address or the second read address to any of the data banks, identifying a cache miss, comparing the first read address to a first address received from a finite-state machine associated with the first interface, the first address representative of an address written to in the victim cache in a subsequent pipeline stage, and in response to the first read address matching the first address, converting the cache miss to the cache hit.

Example 20 includes the method of example 15, further including in response to not mapping at least one of the first read address or the second read address to any of the data banks, identifying a cache miss, comparing the second read address to a first address received from a finite-state machine associated with the second interface, the first address representative of an address written to in the victim cache in a subsequent pipeline stage, and in response to the second read address matching the first address, converting the cache miss to the cache hit.

Example 21 includes the method of example 15, wherein comparing the first read address and the second read address to the data banks of the multi-bank victim cache tag memory is executed substantially in parallel.

Methods and Apparatus for Allocation in a Victim Cache System

Data cache architectures including a victim cache system enable the main cache (e.g., the main storage 214) to allocate data to a victim cache (e.g., the victim storage 218) when the main cache needs to create a victim. For example, when an incoming instruction is a read-miss, the main cache needs to make room for data of the read-miss. The main cache may be a direct mapped cache such that the read-miss can only be stored in one location, indicated by the address of the read-miss. The main cache may allocate data of the read-miss location to be moved to the victim cache when the data is dirty and evict data of the read-miss location to be sent out to higher level memory locations when the data of the location is clean. For example, the main cache controller may elect a modified (e.g., dirty) line in the main storage to be victimized and an unmodified (e.g., clean) line in the main storage to be evicted. A dirty and/or modified line of data is data that has been updated by the CPU 102. For example, when the cache line in the main storage 214 is present only in the current state and has been modified from the value in the main memory (e.g., so that a read of the data in extended memory 106 is flagged or permitted because it is not up-to-date or valid), the cache line is dirty and/or modified and therefore is a candidate for allocation (e.g., victimization). The example MESI RAM 300 stores and/or tracks the cache line states (e.g., clean, dirty, shared, exclusive, etc.), therefore allowing and/or enabling the identification of dirty lines in the main storage 214.

An allocation policy of the main storage may instruct the main cache controller to elect to victimize a modified line because the data for the memory address is not located in higher level cache or is located in higher level cache but is outdated. Such an allocation policy may instruct the main cache controller to not allocate/victimize a clean and/or shared line in the main storage because that line includes data at the memory address that is already located in the higher level cache (e.g., L2 cache, L3 cache, extended memory, etc.).

However, such an allocation policy creates latency (e.g., increased the time it would take for the CPU to retrieve the requested data) when only allocating dirty and/or modified lines in the L1 cache 110. The latency is a result of using extra clock cycles to retrieve from higher level memory. For example, due to the parallel connection of the main storage 214 and the victim storage 218, retrieving data from the higher level memories takes more time than retrieving data from the victim storage 218.

In examples disclosed herein, the allocation policy reduces the latency of allocating cache lines from the main cache (e.g., the main storage 214) to the victim cache (e.g., the victim storage 218). For example, due to the architecture of the L1 cache 110 (e.g., the parallel connection between the main storage 214 and the victim storage 218), the allocation policy enables the main cache controller 222 to allocate any cache line (e.g., clean and/or dirty) in the main storage 214 to the victim storage 218. The configuring of the main storage 214 and the victim storage 218 in parallel enables the victim storage 218 to act as an extension of the main storage 214. Thus, in addition to providing a location to store victim lines, the victim storage 218 can also provide extra associativity to the main storage 214 by moving any cache line (e.g., clean and/or dirty) from the main storage 214 to the victim storage 214. For example, because the victim storage 218 and main storage 214 are accessed in parallel (e.g., at the same time) by the CPU 102, if a clean line was to be accessed and it was allocated to the victim storage 218, the latency for accessing the clean line of data would not be effected.

In an example operation, the main cache controller 222 obtains an instruction (e.g., a memory operation) from the CPU interface 202 (e.g., the scalar interface 502 and/or the vector interface 504). The main cache controller 222 obtains results from the main tag RAM access 204 corresponding to the instruction. For example, the main tag RAM access 204 determines if the address in the instruction matches an address in the tag RAM 208 and provides the results to the main cache controller 222. In some examples, the main cache controller 222 determines that the main storage 214 is to victimize and/or allocate data to the victim storage 218 based on the instruction and the results from the main tag RAM access 204. For example, the main cache controller 222 determines if the instruction is a read operation and if the read operation is a miss (e.g., determined based on the main tag RAM access 204 results). If the read operation is a miss, the main cache controller 222 determines that the main storage 214 needs to allocate the line, way, block, slot, etc. of data for allocation in the victim storage 218.

In some examples, the main cache controller 222 allocates the line corresponding to the address of the read-miss operation. For example, if a read operation wants to read data from Address A but the main storage 214 stores different data for that address location (e.g., Address A'), the main cache controller 222 has to remove the data of Address A' because the data of Address A can only be stored in one location (e.g., Address A) of the main storage 214. The main cache controller 222 identifies the location in the direct mapped cache (e.g., the main storage 214) that is mapped to Address A' and allocates data of Address A' to the victim storage 218. Therefore, the read operation can store data of Address A in the main storage 214.

Example methods, apparatus, systems, and articles of manufacture for allocation of data are disclosed herein. Further examples and combinations thereof include the following:

Example 1 includes an apparatus comprising a first cache storage, a second cache storage, a cache controller coupled to the first cache storage and the second cache storage and operable to receive a memory operation that specifies an address, determine, based on the address, that the memory operation evicts a first set of data from the first cache storage, determine that the first set of data is unmodified relative to an extended memory, and cause the first set of data to be stored in the second cache storage.

Example 2 includes the apparatus of example 1, wherein the cache controller is to identify a portion in the first cache storage corresponding to a directly mapped location of the address.

Example 3 includes the apparatus of example 1, wherein the cache controller is to allocate the first set of data to the second cache storage to create space for data of a second memory operation.

Example 4 includes the apparatus of example 1, wherein the cache controller is to receive a second memory operation that specifies a second address, determine, based on the second address, that the second memory operation evicts a second set of data from the first cache storage, determine that the second set of data is modified relative to an extended memory, and cause the second set of data to be stored in the second cache storage.

Example 5 includes the apparatus of example 1, wherein the cache controller is to perform an outstanding transaction of a store queue on the first set of data during the eviction.

Example 6 includes the apparatus of example 1, wherein the second cache storage is to provide associativity to the first cache storage when the second cache storage stores the first set of data.

Example 7 includes the apparatus of example 1, wherein the second cache storage is a victim cache storage.

Example 8 includes a method comprising receiving a memory operation that specifies an address, determining, based on the address, that the memory operation evicts a first set of data from a first cache storage, determining that the first set of data is unmodified relative to an extended memory, and cause the first set of data to be stored in a second cache storage.

Example 9 includes the method of example 8, further including identifying a portion in the first cache storage corresponding to a directly mapped location of the address.

Example 10 includes the method of example 8, further including allocating the first set of data to the second cache storage to create space for data of a second memory operation.

Example 11 includes the method of example 8, further including receiving a second memory operation that specifies a second address, determining, based on the second address, that the second memory operation evicts a second set of data from the first cache storage, determining that the second set of data is modified relative to an extended memory, and causing the second set of data to be stored in the second cache storage.

Example 12 includes the method of example 8, further including performing an outstanding transaction of a store queue on the first set of data during the eviction.

Example 13 includes the method of example 8, wherein storing the first set of data allocated from the first cache storage includes providing associativity to the first cache storage.

Example 14 includes the method of example 8, wherein the second cache storage is a victim cache storage.

Example 15 includes a system comprising a central processing unit to output a memory operation that specifies an address, and a cache coupled to the central processing unit, the cache operable to obtain the memory operation from the central processing unit, the cache further including a first cache storage, a second cache storage, and a cache controller to determine, based on the address of the memory operation, that the memory operation evicts a first set of data from the first cache storage, determine that the first set of data is unmodified relative to an extended memory, and cause the first set of data to be stored in the second cache storage.

Example 16 includes the system of example 15, wherein the cache further includes a first tag random access memory coupled to the central processing unit, the first cache storage, and the cache controller, and a second tag random access memory coupled to the central processing unit, the second cache storage, and the cache controller.

Example 17 includes the system of example 15, wherein the cache controller is to determine, based on a second address of a second memory operation, that the second memory operation evicts a second set of data from the first cache storage, determine that the second set of data is modified relative to an extended memory, and cause the second set of data to be stored in the second cache storage.

Example 18 includes the system of example 15, wherein the cache controller is to perform an outstanding transaction of a store queue on the first set of data during the eviction.

Example 19 includes the system of example 15, wherein the first cache storage and the second cache storage are connected in parallel to the central processing unit.

Example 20 includes the system of example 15, wherein the first cache storage is a direct mapped cache and the second cache storage is a fully associative cache, the direct mapped cache coupled and the fully associative cache coupled to the central processing unit in parallel.

Methods and Apparatus to Facilitate Read-Modify-Write Support in A Coherent Victim Cache with Parallel Data Paths To facilitate a memory system that operates with memory coherence, that is, to facilitate a memory system in which corresponding memory locations for each processing element contain the same stored data, some example systems are prevented from including a victim storage. Examples disclosed herein overcome this challenge by facilitating a fully coherent memory system in which the victim storage (e.g., the victim storage 218) can operate in memory coherence operations in the system.

To provide coherency on the data cache 108, the example scalar interface 502 (e.g., a sixty-four-bit wide interface) and the example vector interface 504 (e.g., a five hundred and twelve-bit wide interface) are included in the victim storage 218 of the L1 cache 110. In this manner, the victim storage 218 of the L1 cache 110 is capable of servicing two data paths from the CPU 102.

In some examples disclosed herein, the snoop address component 506 is utilized to store the MESI state of every cache line in the victim storage 218 in the MESI RAM 300. By storing the MESI state of every cache line in the MESI RAM 300, the victim cache system supports coherency.

Additionally, the example snoop address component 506 obtains an example snoop request from a higher-level memory cache memory (e.g., the L2 data cache 112) and is transmits such a snoop request to the tag RAM 210 and comparison logic 306c. In some examples, the snoop address component 506 triggers an address read instruction to the tag RAM 210. For example, when the L2 data cache 112 is unable to identify data requested in a read request from the CPU 102, the L2 data cache 112 transmits the snoop address component 506 to the lower level, L1 data cache 110 to attempt to execute a read request of a memory address in the tag RAM 210. Additionally, the snoop address component 506 provides the address read to the comparison logic 306c. In the event a miss is identified (e.g., the read issued to the tag RAM 210 returns a miss), an appropriate snoop response indicating that a read was unsuccessful is generated and transmitted to the higher-level data cache that generated the snoop address component 506 (e.g., the L2 data cache 112).

Alternatively, in the event a hit is identified (e.g., the read issued to the tag RAM 210 returns a hit), the state of the corresponding line in the MESI RAM 300 is read and the example address encoder 326c generates an address value for use by the victim storage 218 in obtaining the data. Accordingly, an appropriate response indicating that the read request was successful is generated and transmitted back to the higher-level data cache that generated the snoop address component 506 (e.g., the L2 data cache 112) as the snoop response. In examples disclosed herein, the snoop response includes the data in the victim storage 218 corresponding to the address in the tag RAM 210.

In an example operation, the corresponding store queue (e.g., the victim cache store queue 216) may be processing a write instruction to the address that is being read via the snoop address. Accordingly, while the victim storage 218 is servicing a snoop request (e.g., while the snoop request is being processed in response to the snoop address component 506 obtaining the snoop request), the victim cache store queue 216 forwards the data from the victim cache store queue 216 (e.g., the data stored in latch 402e) to the response multiplexer 508. In this manner, any state change obtained by the vector interface 504 due to the snoop address and any recently updated address obtained from the victim cache store queue 216 is forwarded to the higher-level data cache (e.g., the L2 data cache 112).

In the topology illustrated in FIG. 5, the coherency pipeline is longer than the victim cache pipeline to provide enough time for the victim cache controller 224 to properly order a potential snoop response and/or subsequent CPU 102 operation in the event such a snoop response and/or subsequent CPU 102 operation is issued to a higher level memory controller.

In examples disclosed herein, the victim storage 218 of the L1 data cache 110 is capable of issuing tag-updates to higher level cache controller in the event tracking of cache lines is requested. In this manner, the victim storage 218 can facilitate tracking of cache lines to distinguish between exclusive and modified cache elements.

In examples disclosed herein, the victim storage 218 of the L1 data cache 110 supports global coherence operation by allowing a global coherence operation to process on a fully associative cache and iterating over the tag RAM 208 based on sets.

While the above-mentioned operation is described in connection with the L1 data cache 110, any of the above-mentioned operations and/or elements may be implemented on any of the L2 data cache 112, the L3 data cache 114, and/or any additional level data cache in the data cache 108.

Example methods, apparatus, systems, and articles of manufacture to facilitate read-modify-write support in a coherent victim cache with parallel data paths are disclosed herein. Further examples and combinations thereof include the following:

Example 1 includes an apparatus comprising a random-access memory configured to be coupled to a central processing unit via a first interface and a second interface, the random-access memory configured to obtain a read request indicating a first address to read via a snoop interface, an address encoder coupled to the random-access memory, the address encoder to, when the random-access memory indicates a hit of the read request, generate a second address corresponding to a victim cache based on the first address, and a multiplexer coupled to the victim cache to transmit a response including data obtained from the second address of the victim cache.

Example 2 includes the apparatus of example 1, wherein the read request is transmitted by a level two data cache.

Example 3 includes the apparatus of example 1, wherein the multiplexer is configured to be coupled to a victim cache storage queue, the multiplexer to obtain input data from the victim cache storage queue indicating a value to be written to the second address.

Example 4 includes the apparatus of example 3, wherein the multiplexer is configured to transmit the response including the input data from the victim cache storage queue.

Example 5 includes the apparatus of example 1, wherein the random-access memory is a tag random access memory.

Example 6 includes the apparatus of example 1, wherein the victim cache is a multi-bank memory.

Example 7 includes the apparatus of example 1, wherein the first interface is a scalar interface and the second interface is a vector interface.

Example 8 includes the apparatus of example 7, wherein the scalar interface is a sixty-four-bit wide interface, the vector interface is a five hundred and twelve-bit wide interface.

Example 9 includes a system comprising a controller, a first memory, a second memory configured to obtain a snoop request from the first memory, the second memory to execute a read request of a random-access memory in response to the snoop request, when the random-access memory indicates a hit of the read request, generate an address corresponding to a victim cache, the address to be used in reading the victim cache, and transmit a response to the second memory including data obtained from the address of the victim cache.

Example 10 includes the system of example 9, wherein the first memory is a level two cache memory and he second memory is a level one cache memory.

Example 11 includes the system of example 9, wherein the second memory includes a multiplexer configured to be coupled to a victim cache storage queue, the multiplexer to obtain input data from the victim cache storage queue indicating a value to be written to the address of the victim cache in the second memory.

Example 12 includes the system of example 11, wherein the multiplexer is configured to transmit the response including the input data from the victim cache storage queue.

Example 13 includes the system of example 9, wherein the second memory is coupled to the controller via a scalar interface and a vector interface, and the second memory is coupled to the first memory via a snoop interface.

Example 14 includes the system of example 13, wherein the scalar interface is a sixty-four-bit wide interface, the vector interface is a five hundred and twelve-bit wide interface.

Example 15 includes the system of example 13, wherein the controller is a central processing unit.

Example 16 includes a method comprising obtaining a read request indicating a first address to read via a snoop interface, when the read request is a hit, generate a second address corresponding to a victim cache based on the first address, and generating a response including data obtained from the second address of the victim cache.

Example 17 includes the method of example 16, further including transmitting the read request from a level two data cache.

Example 18 includes the method of example 16, further including obtaining input data from a victim cache storage queue indicating a value to be written to the second address.

Example 19 includes the method of example 18, further including transmitting the response including the input data from the victim cache storage queue.

Example 20 includes the method of example 16, wherein the victim cache is a multi-bank memory.

Methods and Apparatus for Eviction in Dual Datapath Victim Cache System

In a victim cache system, the main cache (e.g., the main storage 214) victimizes (e.g., allocates) cache lines to the victim cache (e.g., victim storage 218) when the main cache needs to store new data. When the main cache creates a victim, the replacement policy (e.g., replacement policy component 308) determines where the victim can be stored in the victim cache (e.g., the victim storage 218). In some examples, the victim cache is full and thus needs to evict data to the higher level cache memories (e.g., L2 cache 112, L3 cache 114, extended memory 106). The victim cache (e.g., victim storage 218) also evicts data to the higher level cache memories when a write-miss occurs. For example, the victim storage 218 includes a write-miss buffer that buffers write-miss data. The replacement policy may utilize fixed schemes to determine what data to evict from the victim cache. For example, eviction schemes such as First In First Out (FIFO) scheme, Random scheme, and Least Recently Used (LRU) scheme. However, such eviction schemes are not configured to efficiently manage the eviction of data from the victim cache when there are two or more data paths.

For example, the FIFO scheme evicts a block of data that has been in the victim cache for the longest time (e.g., the data in slot 0 if it is the first time the eviction is occurring). In a dual data path victim cache system (e.g., the victim cache section illustrated in FIG. 5), the FIFO scheme does not work when two incoming CPU accesses (e.g., instructions) are both misses and/or are both allocating instructions. In such an example, if two sets from the victim cache are not speculatively locked and read, then additional stalls are created.

In a different example, the main storage 214 stores an address A and the victim storage 218 stores an address B. The CPU 102 sends two requests: the CPU 102 requests to read data of address A' utilizing DP0 and the CPU 102 requests to read data from address B utilizing DP1. The data of address A' is mapped to the same location as the address A in the main storage 214. Therefore, the first data path DP0 needs to allocate the data in address A to the victim storage 218 (e.g., allocate data of address A' into the main storage 214). In a regular FIFO scheme, address A would be allocated to slot 0 of the victim storage 218. However, the slot 0 is occupied by address B and the CPU 102 is requesting to access the address B in parallel to requesting to allocate data of the read instruction to address A'. Therefore, if the data path DP0 evicted address B from slot 0, a stall (e.g., a cycle or a number of cycles for which the CPU 102 is stalled waiting for the memory access) would be created in order to retrieve the evicted data later from higher level caches.

Examples disclosed herein include an eviction scheme that efficiently evicts data from the victim storage 218 in a dual data path victim cache system. The example eviction scheme is implemented by the replacement policy component 308 of FIGS. 3 and 5. For example, the replacement policy component 308 includes logic that analyzes inputs and produces an output. For example, the replacement policy component 308 obtains inputs from the hit-miss comparison logic 306a and 306b and determines what location in the victim storage 218 is to be replaced by data from the main storage 214 and/or replaced by data from the write-miss instruction. In examples disclosed herein, the replacement policy component 308 reserves entries (e.g., ways, sets, cache lines, etc.) in the victim storage 218 that correspond to eviction locations. For example, the replacement policy component 308 speculatively locks (e.g., reserves) first and second victim cache lines (e.g., sets) that are specifically for eviction. The first and second victim cache lines may be locked for specific data paths (e.g., first victim cache line locked for DP0 and second victim cache line locked for DP1). The eviction logic implemented by the replacement policy component 308 is described in further detail below in connection with FIG. 6.

Turning to FIG. 6, an example first table 602 and an example second table 604 are depicted. The example first and second tables 602, 604 describe the logic of the example replacement policy component 308. The example replacement policy component 308 utilizes an LRU value. As used herein, an LRU value corresponds to a way that is the least recently used portion in the victim storage 218. In some examples, the LRU value corresponds to a location in the victim storage element 218 that has not been recently accessed by the first or second data path. In a fully associated cache (e.g., the victim storage 218), an address can be mapped to any "way" in the cache. Thus, a way is a block in the cache that stores data and includes a tag. In some LRU schemes, when the victim cache needs to evict data, the data in the location indicated by the LRU value (e.g., the data in the portion not recently accessed in the victim storage 218) is evicted. For example, in a 3-way cache, an address A, an address B, and an address C occupy all three ways (e.g., blocks, slots, etc.). In this example, address A has been recently accessed by the CPU 102, address B was accessed just prior to the address A access, and address C was accessed prior to address B. Therefore, address C is the least recently used address and the portion mapped to address C has a location equal to the LRU value.

The example first table 602 of FIG. 6 includes a first data path scenario 606, a second data path scenario 608, and a third data path scenario 610. The example data path scenarios 606, 608, 610 correspond to the validity of the transactions (e.g., accesses) on DP0 and DP1 of FIG. 5. Validity of a transaction corresponds to whether the CPU 102 sends valid instructions to the L1 cache 110. A valid instruction on the first data path DP0 and an invalid instruction on the second data path DP1 corresponds to when the processing cores send an instruction on the first data path DP0 and leave the second data path DP1 idle. In some examples, during a particular clock cycle, the first data path DP0 includes invalid instructions. In some examples, during a particular clock cycle, the second data path DP1 includes invalid instructions. Additionally and/or alternatively, both the data paths DP0 and DP1 can include valid instructions and/or can include invalid instructions.

In the example first table 602, the first data path scenario 606 corresponds to when both data paths (DP0, DP1) of FIG. 5 include valid transactions (DP0_valid=1, DP1_valid=1) in the same clock cycle. In some examples, the replacement policy component 308 obtains results and/or instructions from both data paths DP0, DPL.

In the example first table 602, the second data path scenario 608 corresponds to the first data path (DP0) including a valid transaction (DP0_valid=1) and the second data path (DP1) including an invalid transaction (DP1_valid=0).

In such an example, the replacement policy component 308 determines that the transaction of DP1 includes invalid instructions.

In the example first table 602, the third data path scenario 610 corresponds to the first data path (DP0) including an invalid transaction (DP0_valid=0) and the second data path (DP1) including a valid transaction (DP1_valid=1). In some examples, the replacement policy component 308 determines that that transaction of DP0 is includes invalid instructions.

The example first data path scenario 606 in the example first table 602 includes an example hit-hit action 612, an example miss-hit action 614, an example hit-miss action 616, and an example miss-miss action 618. The example hit-hit action 612 is indicative that the address on DP0 and the address on DP1 hit (e.g., matches) an address in either of the tag RAMs 208, 210. In other words, the example hit-hit action 612 is indicative that the address on DP0 and the address on DP1 hit an address in main storage 214, the victim storage 218 and/or the write miss cache (described above in connection with FIGS. 3A-3D). The example miss-hit action 614 is indicative that the address on DP0 does not match an address in main storage 214, the victim storage 218, and/or the write miss cache and that the address on DP1 hits an address in the main storage 214, the victim storage 218 and/or the write miss cache. In some examples, the miss portion of the miss-hit action 614 is indicative that DP0 is to allocate a cache line from the main storage 214 to the victim storage 218 and thus, is evicting data from the victim storage 218 to make room for the cache line of the main storage 214. The example hit-miss action 616 is indicative that the address on DP0 hits an address in the victim storage 218 and/or the write miss cache and that the address on DP1 does not match an address in the victim storage 218 and/or the write miss cache. In some examples, the miss portion of the hit-miss action 616 is indicative that DP1 is to allocate a cache line from the main storage 214 to the victim storage 218 and thus, is evicting data from the victim storage 218 to make room for the cache line of the main storage 214. The example miss-miss action 618 is indicative that the addresses of DP0 and DP1 both do not have a match in the victim storage 218 and/or the write miss cache. In some examples, the miss-miss action 618 is indicative that both data paths DP0 and DP1 are to allocate data from the main storage 214 to the victim storage 218. Additionally and/or alternatively, a miss is indicative that a write-miss is to write data to the write-miss buffer in the victim storage 218.

The example second data path scenario 608 in the example first table 602 includes an example DP0 hit action 620 and an example DP0 miss action 622. In the second data path scenario 608, the first data path DP0 includes a valid transaction and the second data path DP1 includes an invalid transaction. In some examples, the replacement policy component 308 disregards the second data path DP1 because the second data path DP1 does not include instructions.

The example third data path scenario 610 in the example first table 602 includes an example DP1 hit action 624 and an example DP1 miss action 626. The example DP1 hit action 624 corresponds to the action the replacement policy component 308 takes when the address of the second data path DP1 matches an address in the victim storage 218 and/or the write miss cache. The example DP1 miss action 624 corresponds to the action the replacement policy component 308 takes when the address of the second data path DP1 does not match an address in the victim storage 218 and/or the write miss cache. Similarly to the example DP0 hit action 620 and the DP0 miss action 622 under the example second data path scenario 608, the example replacement policy component 308 disregards the transaction of the first data path DP0 in the example third data path scenario 610 because the transaction is invalid.

In the example first table 602, DP0 Hit Way indicates a portion of the victim storage 218 and/or the write miss cache that should be accessed (e.g., read from, evicted, written to, etc.) by the first data path DP0 when the instruction is a hit. In the example first table 602, DP1 Hit Way is a portion in the victim storage 218 and/or the write miss cache that should be accessed by the second data path DP1 when the instructions is a hit.

In the example first table 602, the variable 'Y' is the variable that indicates the location of the current way selected as the LRU and indicates where the first data path DP0 should remove data from. In some examples, Y is assigned to the DP0 pointer. For example, when DP0 needs to evict a portion in the victim storage 218, then DP0 pointer points to the location Y (e.g., the LRU way) for eviction. In some examples, the replacement policy component 308 is to store an indicator of the LRU way of the victim storage 218 to be replaced by DP0. For example, the replacement policy component 308 keeps an indicator, that can be accessed by the cache controller 220, that a particular way, not recently accessed, is available for eviction by the first data path DP0. As used herein, the terms "pointer" and "indicator" may be used interchangeably.

In the example first table 602, the variable 'Y+1' indicates the location of the next LRU way where the second data path DP1 should remove data from. In some examples, 'Y+1' is assigned to the DP1 pointer. For example, when the second data path DP1 needs to evict a portion in the victim storage 218, the DP1 pointer points to the location Y+1 (e.g., the next LRU way) for eviction. In some examples, the replacement policy component 308 is to store an indicator of the LRU way of the victim storage 218 to be replaced by DP1. For example, the replacement policy component 308 keeps an indicator, that can be accessed by the cache controller 220, that a particular way, not recently accessed, is available for eviction by the first data path DP0.

In a first example operation of the replacement policy component 308, both data paths (DP0 and DP1) include valid transactions (e.g., indicated in first data path scenario 606) and both data paths (DP0 and DP1) include addresses that match addresses in the example victim storage element 218 (e.g., the hit-hit action 612). For example, the comparison logic 306a and 306b compares the addresses of DP0 and DP1 to addresses in the example tag RAM 210 and provides a hit result to the replacement policy component 308. Since both data paths are valid and both data paths are hits, the DP0 Hit Way points to the portion (e.g., the way) in the victim storage 218 that includes hit/matching data corresponding to data path DP0 and DP1 Hit Way points to the way that includes the hit/matching data corresponding to data path DP1. The victim storage 218 responds with the requested data. The location of the LRU way does not increment and remains at location Y.

In a second example operation of the replacement policy component 308, both data paths (DP0 and DP1) include valid transactions (e.g., indicated in first data path scenario 606), the first data path DP0 is a miss, and the second data path DP1 hits the victim storage 218 (e.g., the miss-hit action 614). For example, the first comparison logic 306a returns a "miss" result to the replacement policy component 308 and the second comparison logic 306b returns a "hit" result to the replacement policy component 308. The DP1

Hit Way points to the portion (e.g., way) in the victim storage 218 that includes the hit/matching data (e.g., the hit way). In some examples, the first data path DP0 is to evict data from a portion (e.g., way) in the victim storage 218. Therefore, the DP0 pointer points to the location Y in the victim storage 218 that is to be evicted.

Before eviction occurs, the replacement policy component 308 determines if the DP1 Hit Way matches the address of the LRU way (e.g., location Y). If the DP1 Hit Way does not have the same location as Y, the DP0 pointer points to the way having a location equal to the location Y (e.g., the LRU way). If the DP1 Hit Way does match the address of the LRU way, the DP0 pointer points to the location of the DP1 pointer (Y+1) so that the DP0 can evict data without conflicting with DP1 Hit Way.

In the second example scenario 614, the LRU value and the next LRU value are incremented based on which location was evicted. For example, if DP0 evicted data from location Y+1 (e.g., the DP1 Hit Way matches the location of the DP0 pointer), the LRU value is incremented twice and the next LRU value is incremented twice. Otherwise, if DP0 evicted data from location Y (e.g., DP1 Hit Way did not match the location of DP0 pointer) the LRU value is incremented once and the next LRU value is incremented once.

In a third example operation of the replacement policy component 308, both data paths (DP0 and DP1) include valid transactions (e.g., indicated in first data path scenario 606), the first data path DP0 is a hit, and the second data path DP1 is a miss (e.g., the hit-miss action 616). For example, the first comparison logic 306a returns a "hit" result to the replacement policy component 308 and the second comparison logic 306b returns a "miss" result to the replacement policy component 308. The DP0 Hit Way points to the way in the victim storage 218 that includes the hit/matching data. In some examples, the miss causes the second data path DP1 to evict a way to make room in the victim storage 218. Therefore, the DP1 pointer points to location Y+1 in the victim storage 218 that is to be evicted.

Before eviction occurs, the replacement policy component 308 determines if the DP0 Hit Way matches the address of the next LRU way (e.g., location Y+1). If the replacement policy component 308 determines the DP0 Hit Way matches the address of the next LRU way (e.g., Y+1), the DP1 pointer points to the location of the DP0 pointer (e.g., location Y) so that the DP1 can evict data without conflicting with DP0 Hit Way. If the DP0 Hit Way does not match the address of the next LRU way, then the DP1 evicts data from location Y+1.

In the third example scenario 616, the LRU value and the next LRU value are incremented based on which location was evicted. For example, if DP1 evicted data from location Y (e.g., the DP0 Hit Way matches the location of the DP1 pointer), the LRU value is incremented once and the next LRU value is incremented once. Otherwise, if DP1 evicted data from location Y+1 (e.g., DP0 Hit Way did not match the location of DP1 pointer) the LRU value is incremented twice and the next LRU value is incremented twice.

In a fourth example operation of the replacement policy component 308, both data paths (DP0 and DP1) include valid transactions (e.g., indicated in first data path scenario 606) and both data paths are flagged as misses (e.g., column 618). For example, the comparison logic 306a and 306b returns "miss" results to the replacement policy component 308 when both addresses in the data paths DP0 and DP1 are not found and/or matched with the addresses in the tag RAMs 208, 210. In the fourth operation, both data paths DP0 and DP1 are to evict ways in the victim storage 218. Therefore, DP0 pointer points to location Y and DP1 pointer points to location Y+1.

When both eviction operations are complete, the LRU value is incremented by two (e.g., Y+2) and the next LRU value is incremented by two (e.g., (Y+1)+2). In a subsequent operation, if DP0 and DP1 are misses, DP0 Way points to the new LRU value (e.g., Y+2) and DP1 Way points to the next LRU value (e.g., (Y+1)+2).

In a fifth example operation of the replacement policy component 308, the first data path DP0 is a valid transaction and the second data path DP1 is an invalid transaction (e.g., indicated in second data path scenario 608). In the fifth example operation, the first data path DP0 is a hit (e.g., indicated in the DP0 hit action 620). For example, the comparison logic 306a returns a "hit" result to the replacement policy component 308. The DP0 Hit Way points to the way in the victim storage 218 that includes the matching data. The LRU value (Y) remains the same because no data is to be evicted in the clock cycle.

In a sixth example operation of the replacement policy component 308, the first data path DP0 is a valid transaction and the second data path DP1 is an invalid transaction (e.g., indicated in second data path scenario 608). In the sixth example operation, the first data path DP0 is a miss (e.g., indicated in the DP0 miss action 622). For example, the comparison logic 306a returns a "miss" result to the replacement policy component 308. In this example, the first data path DP0 is to evict data from the victim storage 218. The example DP0 pointer points to the location Y (e.g., the LRU way). After eviction, the LRU value is incremented (e.g., Y+1).

In a seventh example operation of the replacement policy component 308, the first data path DP0 is an invalid transaction and the second data path DP1 is a valid transaction (e.g., indicated in third data path scenario 610). In the seventh example operation, the second data path DP1 is a hit (e.g., indicated in the DP1 hit action 624). For example, the comparison logic 306b returns a "hit" result to the replacement policy component 308. The DP1 Hit Way points to the way in the victim storage 218 that includes the matching data. The LRU value (Y) remains the same because no data is to be evicted in the clock cycle.

In an eighth example operation of the replacement policy component 308, the first data path DP0 is an invalid transaction and the second data path DP1 is a valid transaction (e.g., indicated in third data path scenario 610). In the eighth example operation, the second data path DP1 is a miss (e.g., indicated in the DP1 miss action 626). For example, the comparison logic 306b returns a "miss" result to the replacement policy component 308. In this example, the second data path DP1 is to evict data from the victim storage 218. The DP1 pointer points to the location Y (e.g., the LRU way). The DP1 pointer does not point to location Y+1 because of the invalid transaction of DP0. Otherwise, when both transactions are valid, DP1 always points to Y+1 (e.g., unless switched when DP0 Hit Way matches Y+1). After the second data path DP1 evicts the data from location Y, the LRU value is incremented (e.g., Y+1).

Turning to the second table 604, second table 604 illustrates the incrementation of the LRU value when the first data path DP0 and/or the second data path DP1 is allocating data into the victim storage 218. For example, when a read-miss occurs, the main storage 214 allocates a line of data to the victim storage 218 utilizing one of the data paths. The second table 604 includes a first valid column 626, a second valid column 628, a first allocate column 630, a second allocate column 632, a first LRU interference 634, a second LRU interference 636, and an LRU increment column 638.

In the second table 604, the example first valid column 626 corresponds to the validity of the second data path transaction. For example, a zero (0) indicates the DP1 transaction is invalid and a one (1) indicates that the DP1 transaction is valid. The example second valid column 628 corresponds to the validity of the first data path transaction. For example, a zero (0) indicates the DP0 transaction is invalid and a one (1) indicates that the DP0 transaction is valid.

In the second table 604, the example first allocate column 630 indicates the allocation status of the second data path DP1. The allocation status corresponds to allocation of data from the main storage 214 to the victim storage 218 in a clock cycle. For example, a zero (0) indicates that the second data path DP1 is not allocating data into the victim storage 218 and a one (1) indicates that the second data path DP1 is allocating data into the victim storage 218. The example second allocate column 632 indicates the allocation status of the first data path DP0. For example, a zero (0) indicates that the first data path DP0 is not allocating data into the victim storage 218 and a one (1) indicates that the first data path DP0 is allocating data into the victim storage 218. When a data path is allocating data into the victim storage 218, the data path evicts a way (e.g., slot, block, etc.) to make room for the data being allocated. In some examples, data is allocated to the victim storage 218 when a read-miss occurs in the main storage 214.

In the second table 604, the first LRU interference column 634 indicates whether the first data path DP0 hits the same location in the victim storage 218 as the location of the second data path allocate pointer. For example, the address of the first data path DP0 is located in the least recently used location of the victim storage 218. The first LRU interference column 634 includes a one (1) to indicate that the first data path DP1 hit location equals the location of the second data path DP1 allocate pointer.

The second LRU interference column 636 indicates whether the second data path DP1 hits the same location in the victim storage 218 as the location of the second data path allocate pointer. For example, the address of the second data path DP1 is located in the least recently used location of the victim storage 218. The second LRU interference column 636 includes a one (1) to indicate that the second data path DP1 hit location equals the location of the first data path allocate pointer. As used herein, the first data path allocate pointer points to the location Y (LRU value) when DP0 is to allocate and the second data path allocate pointer points to the location Y+1 (next LRU value) when the DP1 is to allocate. In some examples, the pointers notify the cache controller 220 to evict a portion of the victim storage 218 to the higher level caches (e.g., L2 112, L3 114, extended memory 106). The example replacement policy component 308 may initialize the first data path allocate pointer to point to location Y (LRU portion) and initialize the second data path allocate pointer to point to Y+1 (next LRU portion).

In the second table 604, the LRU increment column 628 indicates the incrementation of the LRU value, Y. For example, the replacement policy component 308 increments the LRU value by one (e.g., Y+1), by two (e.g., Y+2), or by nothing (e.g., Y). In some examples, the incrementation of the LRU value depends on the status of the data paths DP0 and DP1.

In an example operation, both the first data path DP0 and the second data path DP1 include valid transactions. The example replacement policy component 308 determines if any of the data paths are allocating. For example, the cache controller 220 sends information to the replacement policy component 308 when the main storage 214 needs to allocate data.

If the first data path DP0 is allocating data (e.g., moving data from the main storage 214 to the victim storage 218), the first data path DP0 evicts data (e.g., indicated by the first data path allocate pointer) from the victim storage 214. To evict data, the replacement policy component 308 determines whether the second data path DP1 was a hit and where the hit location is. For example, the replacement policy component 308 analyzes the location of the address of the second data path DP1 and determines if that location matches the location of the first data path allocate pointer.

If the second data path hit location is equal to the location of the first data path allocate pointer (e.g., DP1 hit location=Y), the replacement policy component 308 updates the first data path allocate pointer to point to the next LRU value (Y+1) (e.g., notifies the cache controller 220 to evict data of next LRU value). In this manner, the second data path DP1 reads/writes from the hit location Y and the first data path DP0 evicts data of the LRU location Y+1. By way of this operation, the first data path DP0 does not evict the read/write data of DP1. After the eviction has occurred (e.g., eviction of data from Y+1 in the victim storage 218), the replacement policy component 308 increments the first data path allocate pointer by two and the second data path allocate pointer by two. For example, the replacement policy component 308 increments LRU value (Y) by two and the next LRU value (Y+1) by two because DP0 just evicted location Y+1, and therefore, the new LRU value will be Y+2. This operation is illustrated at row 640.

If the second data path hit location is not equal to the location of the first data path allocated pointer (e.g., DP1 hit location does not equal Y), the replacement policy component 308 notifies the cache controller 220 that location Y is to be evicted. In this manner, the cache controller 220 evicts data from the location Y in the victim storage 218. After eviction has occurred (e.g., eviction of data from Y in the victim storage 218), the replacement policy component 308 increments the first data path allocate pointer by one and the second data path allocate pointer by one. For example, the replacement policy component 308 increments LRU value (Y) by one and the next LRU value (Y+1) by one because DP0 just evicted location Y, and therefore, the new LRU value will be Y+1. This operation is illustrated at row 642.

In a different operation, the second data path DP1 is allocating data (e.g., moving data from the main storage 214 to the victim storage) and the second data path DP1 evicts data (e.g., indicated by the second data path allocate pointer) from the victim storage 214. To evict data, the replacement policy component 308 determines whether the first data path DP0 was a hit and where the hit location is. For example, the replacement policy component 308 analyzes the location of the address of the first data path DP0 and determines if that location matches the location of the second data path allocate pointer.

If the first data path hit location is equal to the location of the second data path allocate pointer (e.g., DP0 hit location=Y+1), the replacement policy component 308 updates the second data path allocate pointer to point to the LRU value (Y) (e.g., notifies the cache controller 220 to evict data of LRU value). In this manner, the first data path DP0 reads/writes from the hit location Y+1 and the second data path DP1 evicts data of the LRU location Y. By way of this operation, the second data path DP1 does not evict the read/write data of DP0. After the eviction has occurred (e.g., eviction of data from Y in the victim storage 218), the replacement policy component 308 increments the first data path allocate pointer by one and the second data path allocate pointer by one. For example, the replacement policy component 308 increments LRU value (Y) by one and the next LRU value (Y+1) by one because DP1 just evicted location Y, and therefore, the new LRU value will be Y+1. This operation is illustrated at row 644.

If the first data path hit location is not equal to the location of the second data path allocated pointer (e.g., DP0 hit location does not equal Y+1), the replacement policy component 308 notifies the cache controller 220 that location Y+1 is to be evicted. In this manner, the cache controller 220 evicts data from the location Y+1 in the victim storage 218. After eviction has occurred (e.g., eviction of data from Y+1 in the victim storage 218), the replacement policy component 308 increments the first data path allocate pointer by two and the second data path allocate pointer by two. For example, the replacement policy component 308 increments the LRU value (Y) by two and the next LRU value (Y+1) by two because DP1 just evicted location Y+1, and therefore, the new LRU value will be Y+2. This operation is illustrated at row 646.

Example methods, apparatus, systems, and articles of manufacture for eviction in a victim storage are disclosed herein. Further examples and combinations thereof include the following:

Example 1 includes an apparatus comprising a cache storage, a cache controller operable to receive a first memory operation and a second memory operation concurrently, comparison logic operable to identify if the first and second memory operations missed in the cache storage, and a replacement policy component operable to, when at least one of the first and second memory operations corresponds to a miss in the cache storage, reserve an entry in the cache storage to evict based on the first and second memory operations.

Example 2 includes the apparatus of example 1, wherein the replacement policy component is to speculatively lock the entry in the cache storage for eviction.

Example 3 includes the apparatus of example 1, wherein the replacement policy component is operable to store an indicator of a first way of the cache storage to be replaced, in response to the first memory operation missing in the cache storage and the second memory operation hitting in the cache storage determine whether the second memory operation is directed to the first way of the cache storage indicated by the indicator, and increment the indicator to indicate a second way of the cache storage based on the second memory operation being directed to the first way of the cache storage, and causing the second way of the cache storage to be evicted based on the first memory operation and the incremented indicator.

Example 4 includes the apparatus of example 1, wherein the replacement policy component is operable to store an indicator of a second way of the cache storage to be replaced, in response to the second memory operation missing in the cache storage and the first memory operation hitting in the cache storage determine whether the first memory operation is directed to the second way of the cache storage indicated by the indicator, and decrement the indicator to indicate a first way of the cache storage based on the first memory operation being directed to the second way of the cache storage, and causing the first way of the cache storage to be evicted based on the second memory operation and the incremented indicator.

Example 5 includes the apparatus of example 1, wherein the replacement policy component is operable to store a first indicator of a first way and a second indicator of a second way of the cache storage to be replaced, in response to the first memory operation missing in the cache storage and the second memory operation missing in the cache storage causing the first way of the cache storage to be evicted based on the first memory operation and the second way of the cache storage to be evicted based on the second memory operation.

Example 6 includes the apparatus of example 5, wherein the replacement policy component is operable to increment the first indicator by two locations and the second indicator by two locations after the first way and the second way of the cache storage are evicted.

Example 7 includes the apparatus of example 1, wherein the cache storage is a victim cache storage.

Example 8 includes the apparatus of example 1, further including a first interface and a second interface, the first interface to obtain the first memory operation from a central processing unit and the second interface to obtain the second memory operation from the central processing unit, the first interface and the second interface coupled to the comparison logic and the cache controller.

Example 9 includes the apparatus of example 8, wherein the first interface is a vector interface and the second interface is a scalar interface.

Example 10 includes a method comprising receiving a first memory operation and a second memory operation concurrently, identifying if the first and second memory operations missed in a cache storage, and when at least one of the first and second memory operations corresponds to a miss in the cache storage, reserving an entry in the cache storage to evict based on the first and second memory operations.

Example 11 includes the method of example 10, further including speculatively locking the entry in the cache storage for eviction.

Example 12 includes the method of example 10, further including storing an indicator of a first way of the cache storage to be replaced, in response to the first memory operation missing in the cache storage and the second memory operation hitting in the cache storage determining whether the second memory operation is directed to the first way of the cache storage indicated by the indicator, and incrementing the indicator to indicate a second way of the cache storage based on the second memory operation being directed to the first way of the cache storage, and causing the second way of the cache storage to be evicted based on the first memory operation and the incremented indicator.

Example 13 includes the method of example 10, further including storing an indicator of a second way of the cache storage to be replaced, in response to the second memory operation missing in the cache storage and the first memory operation hitting in the cache storage determining whether the first memory operation is directed to the second way of the cache storage indicated by the indicator, and decrementing the indicator to indicate a first way of the cache storage based on the first memory operation being directed to the second way of the cache storage, and causing the first way of the cache storage to be evicted based on the second memory operation and the incremented indicator.

Example 14 includes the method of example 10, further including storing a first indicator of a first way and a second indicator of a second way of the cache storage to be replaced, in response to the first memory operation missing in the cache storage and the second memory operation missing in the cache storage causing the first way of the cache storage to be evicted based on the first memory operation and the second way of the cache storage to be evicted based on the second memory operation.

Example 15 includes the method of example 14, further including incrementing the first indicator by two locations and the second indicator by two locations after the first way and the second way of the cache storage are evicted.

Example 16 includes a system comprising a central processing unit to concurrently output a first memory operation and a second memory operation, a cache coupled to the central processing unit, the cache further including a cache storage, a cache controller operable to receive a first memory operation and a second memory operation concurrently, comparison logic operable to identify if the first and second memory operations missed in the cache storage, and a replacement policy component operable to, when at least one of the first and second memory operations corresponds to a miss in the cache storage, reserve an entry in the cache storage to evict based on the first and second memory operations.

Example 17 includes the system of example 16, wherein the cache storage is a first cache storage, the cache further including a second cache storage coupled in parallel with the first cache storage.

Example 18 includes the system of example 16, wherein the cache storage is a victim cache storage.

Example 19 includes the system of example 16, wherein the cache further includes a first interface and a second interface, the first interface is a 64-bit wide bidirectional scalar interface and the second interface is a 512-bit wide vector interface.

Example 20 includes the system of example 16, wherein the replacement policy component is operable to adjust the entry reservations in the cache storage based on 1) a validity of the first and second memory operations, 2) whether the cache storage stores data for the first and second memory operations, and 3) whether the first and second memory operations are to allocate data to the cache storage or write data to the cache storage. FIG. 11A is an example circuit implementation of the victim cache store queue 216 of FIGS. 2 and/or 3. In FIG. 11A, the victim cache store queue 216 includes example latches 1102a, 1102b, 1102c, 1102d, 1102e, example merge circuits 1103a-c, an example arithmetic component 1104, an example atomic compare component 1106, an example read-modify-write merge component 1108, an example select multiplexer 1110, and example ECC generator 1112, an example arbitration manager 1114, an example pending store address data store 1116, an example priority multiplexer 1118, and an example write port 1126. The example merge circuits 1103a-d include an example comparator(s) 1120, and example switches 1122. The example of FIG. 11A illustrates a single pipeline of the victim cache store queue 216. However, the victim storage element 216 may be arranged to support more than one independent copy of the pipeline with respect to different banks as indicated by the dashed box 1100. Accordingly, the pipeline of FIG. 11A may be reproduced multiple times for different banks, as further described below.

Methods and Apparatus for Read-Modify-Write Support in Multi-Banked Data Ram Cache for Bank Arbitration Some monolithic storage devices do not support multiple accesses by a processor (e.g., a CPU) during the same clock cycle. For example, a request to access data in a single main storage can lock up the entire single main storage. In such examples, there is a single register file capable of supporting one full cache line access per clock cycle. In some such examples, an entire cache line associated with the single main storage can be locked to service the request because the single register file is allocated to the storage data bank that received such a request.

Examples disclosed herein include multi-banked data RAM cache for bank arbitration. In some disclosed examples, the main cache store queue 212 of FIG. 2 has a plurality of banks (e.g., storage banks, storage data banks, memory banks, etc.) and, thus, is multi-banked, or has a multi-bank data or memory structure. In some disclosed examples, the main storage 214 of FIG. 2 has a plurality of banks and, thus, is multi-banked, or has a multi-bank data or memory structure. Advantageously, the multi-bank structure of the main cache store queue 212 and/or the main storage 214 can effectuate support for two or more accesses (e.g., CPU accesses) per clock cycle. Advantageously, the multi-bank structure of the main cache store queue 212 and/or the main storage 214 allows the two or more accesses to be serviced and/or fulfilled without performance overhead.

In some disclosed examples, arbitration logic is coupled to the main cache storage queue 212 and/or the main storage 214 in an arrangement to resolve bank access conflicts. For example, the main cache storage queue 212 can be divided into 16 independently addressable banks. In such examples, the arbitration logic can include 16 sets of arbitration logic, where each set of the arbitration logic is in circuit with a corresponding one of the 16 independently addressable banks. Advantageously, the arbitration logic can resolve bank access conflicts of a first bank of the 16 banks independently of a second bank of the 16 banks.

Figure 7B:
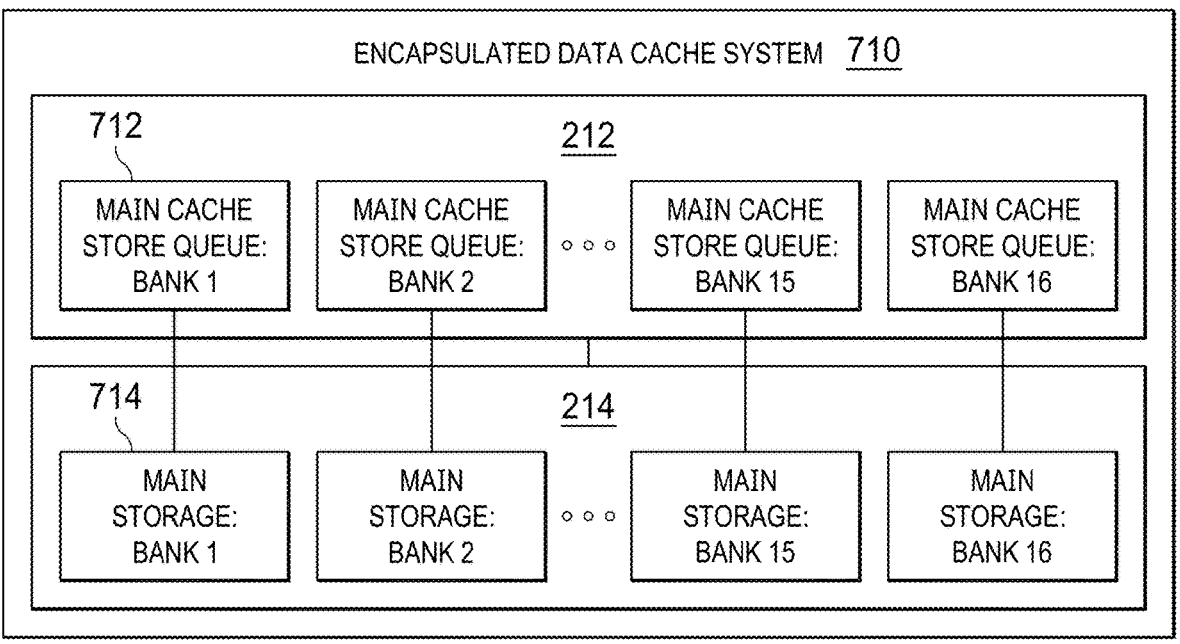
FIG. 7B illustrates another example encapsulated data cache system including a main cache store queue and main storage.
Figure 7C:
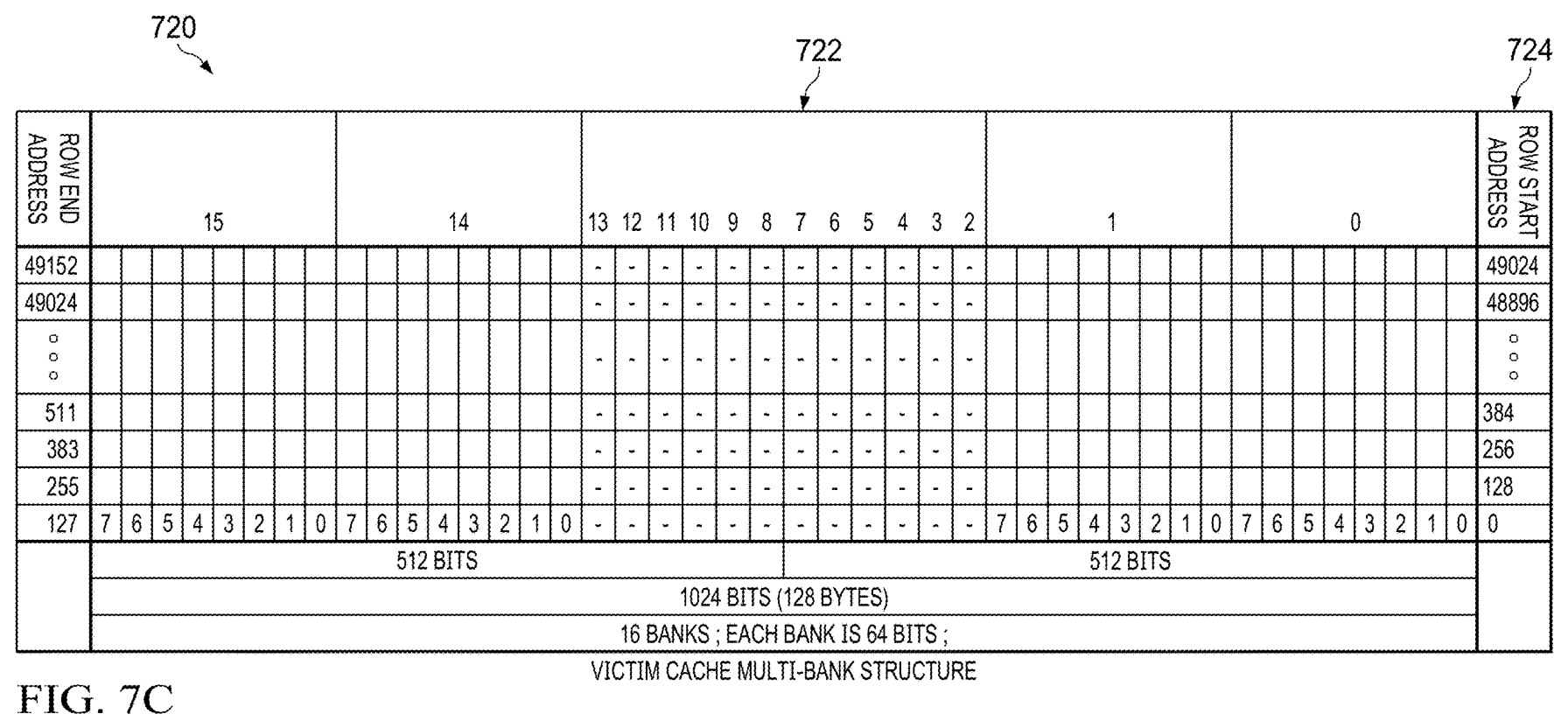

FIG. 7B is a schematic illustration of a second example encapsulated data cache system 710. The second encapsulated data cache system 710 can be an example circuit implementation of the L1 cache 110 of FIG. 1 or portion(s) thereof, and/or, more generally, the data cache 108 of FIG. 1 or portion(s) thereof. The second encapsulated data cache system 710 is encapsulated to provide a unified storage view to an external system (e.g., one or more CPUs, one or more processors, external hardware, etc.). For example, the second encapsulated data cache system 710 can be encapsulated using firmware, software, hardware logic, etc., and/or a combination thereof to encapsulate and/or otherwise abstract all complexity related to read after write (RAW) hazards, write after write (WAW) hazards, data forwarding, etc. Advantageously, the unified architecture depicted in the example of FIG. 7B can provide separate ports to an external system (e.g., the CPU 102) to simplify obtaining access to the most recent versions of data of interest.

In the example of FIG. 7B, the second encapsulated data cache system 710 includes the main cache store queue 212 of FIG. 2 and the main storage 214 of FIG. 2. In FIG. 7B, the main cache store queue 212 includes a plurality of first example independently addressable banks (e.g., data banks, store banks, data store banks, etc.) 712. For example, the first independently addressable banks 712 can be bank queues, bank sub-queues, etc. In such examples, the bank queues, the bank sub-queues, etc., can include a plurality of storage elements, as depicted below in FIG. 7D and/or FIG. 7E. The first independently addressable banks 712 are main cache store queue banks (e.g., main cache store queue data banks, main cache bank queues, main cache bank sub-queues, etc.). In FIG. 7B, the main cache store queue 212 includes 16 of the main cache store queue banks 712. Alternatively, there may be fewer or more than 16 instances of the main cache store queue banks 712.

In FIG. 7B, the main storage 214 includes a plurality of second example independently addressable banks (e.g., data banks, store banks, data store banks, etc.) 714. The second independently addressable banks 714 are main storage banks (e.g., main storage data banks). In FIG. 7B, the main storage 214 includes 16 of the main storage banks 714. Alternatively, there may be fewer or more than 16 instances of the main storage banks 714. For example, the main cache store queue 212 can include a plurality of bank queues or bank sub-queues including a first bank queue or a first bank sub-queue (e.g., MAIN CACHE STORE QUEUE: BANK 1) and the main storage 214 can include a plurality of data banks including a first data bank (e.g., MAIN STORAGE: BANK 1).

In some examples, the main cache store queue 212 and the main storage 214 each have 256 rows with each row having a line width of 1024 bits, but being divided into 16 banks as illustrated in FIG. 7B, with 64 bits per row in a given bank. In some examples, the main cache store queue 212 and the main storage 214 each have 384 rows with each row having a line width of 1024 bits, but being divided into 16 banks as illustrated in FIG. 7B, with 64 bits per row in a given bank. Of course, the cache size described in the above examples are only two examples and the disclosure is not limited to any particular cache line width, number of banks, or rows, etc. As depicted in FIG. 7B, each of the first banks 712 correspond to one of the second banks 714. For example, a first bank (BANK 1) of the main cache store queue 212 is in circuit with a first bank (BANK 1) of the main storage 214 and, thus, corresponds with the first bank of the main storage 214.

Advantageously, the multi-bank structure of the main cache store queue 212, the main storage 214, and/or, more generally, the second encapsulated data cache system 710, can service read and write operations that are sent to the banks in parallel. In some examples, each bank arbitrates its own processes in response to the read and/or write operations. By allowing each bank of the second encapsulated data cache system 710 to operate independently, operation of the second encapsulated data cache system 710 is more efficient since an entire cache line is not locked up when a request is received. Rather, only the portion of the cache line allocated to the bank that received such a request would be locked.

FIG. 7D depicts an example main cache multi-bank structure 730. In some examples, the L1 cache 110, the L2 cache 112, and/or the L3 cache 114 of FIG. 1 can have the main cache multi-bank structure 730. In some examples, the main cache store queue 212 of FIG. 2 and/or the main storage 214 of FIG. 2 can have the main cache multi-bank structure 730. For example, the main cache multi-bank structure 730 can be an example implementation of the main cache store queue 212 and/or the main storage 214.

The main cache multi-bank structure 730 is a data or memory structure that includes 16 example banks (Banks 0-15) 732, with each of the banks 732 having a data width of 64 bytes (e.g., bytes 0-7). Each of the banks 732 includes 16 example rows (Rows 0-15) 734, with each of the rows 734 having a data width of 128 bytes (e.g., 128 bytes=8 bytes/bank*16 banks). In FIG. 7D, each of the banks 732 can store 128 bytes (e.g., 128 bytes=8 bytes/row*16 rows). In FIG. 7D, the main cache multi-bank structure 730 can store 2048 bytes (e.g., 2048 bytes=128 bytes/bank*16 banks). The main cache multi-bank structure 730 is independently addressable by bank. For example, the first row of the rows 734 has a starting row address of 0 and an ending row address of 127, a second row of the rows 734 has a starting row address of 128 and an ending row address of 255, etc.

In some examples, a cache line can be 128 bytes of data that fits in a width of memory (e.g., DRAM) or storage unit (e.g., the main storage 214, the victim storage 218, etc.). In the example of FIG. 7D, a cache line can consume an entire row of the main cache bank structure 730. For example, a cache line can use one of the rows 734 of 16 banks, where each bank is 8 bytes wide. Advantageously, the main cache bank structure 730 can enable 16 different cache lines to access data stored therein.

Figure 7E:
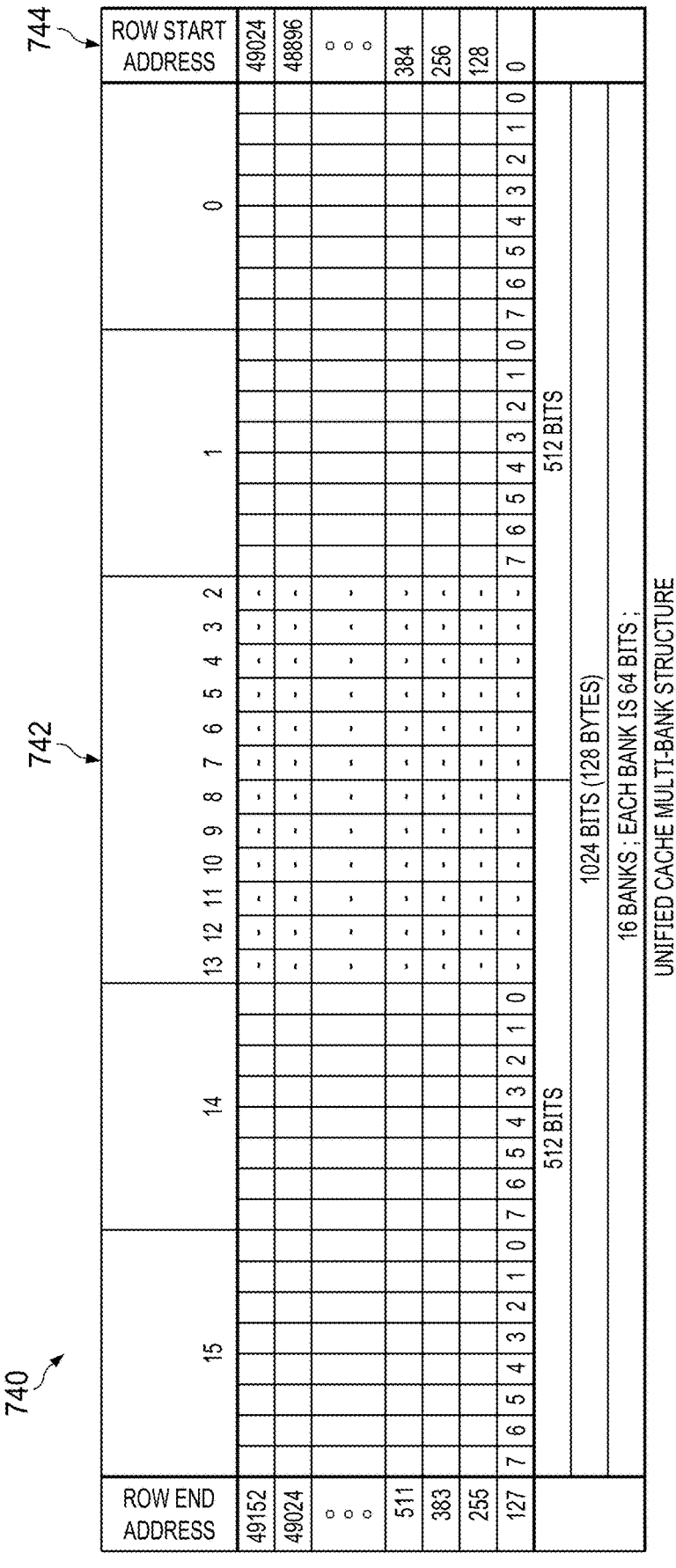
FIG. 7E illustrates an example unified cache bank structure.

FIG. 7E depicts an example unified cache multi-bank structure 740. In some examples, the L1 cache 110, the L2 cache 112, and/or the L3 cache 114 of FIG. 1 can have the unified cache bank structure 740. In some examples, the main cache store queue 212 of FIG. 2, the main storage 214 of FIG. 2, the victim cache store queue 216 of FIG. 2, and/or the victim storage 218 of FIG. 2 can have the unified cache multi-bank structure 740. For example, the unified cache multi-bank structure 740 can be an example implementation of the main cache store queue 212, the main storage 214, the victim cache store queue 216, and/or the victim storage 218.

The unified cache multi-bank structure 740 is a data or memory structure that includes 16 example banks (Banks 0-15) 742, with each of the banks 742 having a data width of 64 bytes (e.g., bytes 0-7). Each of the banks 742 includes 16 example rows (Rows 0-15) 744, with each of the rows 744 having a data width of 128 bytes (e.g., 128 bytes=8 bytes/bank*16 banks). In FIG. 7E, each of the banks 742 can store 128 bytes (e.g., 128 bytes=8 bytes/row*16 rows). In FIG. 7E, the unified cache multi-bank structure 740 can store 2048 bytes (e.g., 2048 bytes=128 bytes/bank*16 banks). The unified cache multi-bank structure 740 is independently addressable by bank. For example, the first row of the rows 744 has a starting row address of 0 and an ending row address of 127, a second row of the rows 744 has a starting row address of 128 and an ending row address of 255, etc.

FIGS. 9A and 9B (collectively FIG. 9) depict example instruction servicing workflows 900, 910, 920 that can be executed by the main cache controller 222, the victim cache controller 224, and/or, more generally, the cache controller 220 of FIG. 2, and/or, more generally, the L1 cache 110 of FIGS. 1 and/or 2. For example, the instruction servicing workflows 900, 910, 920 can be executed to in connection with at least one of the main cache store queue 212, the main storage 214, the victim cache store queue 216, or the victim storage 218 of FIG. 2. The instruction servicing workflows 900, 910, 920 include a first example instruction servicing workflow 900, a second example instruction servicing workflow 910, and a third example instruction servicing workflow 920.

The first instruction servicing workflow 900 is executed in response to receiving a first example store instruction 902. The first store instruction 902 is a CPU write operation or command to write 64 bytes at address (Addr) 0. The address processing components 302a-c of FIGS. 3A-3D can rotate and/or otherwise organize first data (CPU-Write Data) included in the first store instruction 902 to generate first example rotated or aligned data (Write-Data Aligned) 904.

The address processing components 302a-c of FIGS. 3A-3D can use a memory address from the store instruction to determine which banks of the main cache store queue 212, the main storage 214, the victim cache store queue 216, and/or the victim storage 218 of FIG. 2 are needed for the first store instruction 902. For example, the address processing components 302a-c can determine that Addr 0 of the first store instruction 902 is indicative of 8 entire banks (e.g., 8 of the banks 722 of FIG. 7C) to be read from and written to.

In such examples, the address processing components 302a-c can determine that the number or quantity of banks to read from is 0x00FF and the number or quantity of banks to write to is 0x00FF. For example, the address processing components 302a-c can determine that Banks 0-7 of FIG. 7C need to be accessed, where each of the banks has a corresponding bit (e.g., a first bit for Bank 7, a second bit for Bank 6, a third bit for Bank 5, etc.). When a bank is to be read from or written to, the corresponding bit position has a bit value of 1 and a bit value of 0 otherwise. In such examples, the address processing components 302a-c can generate an address for the number of banks read of 0x00FF, which is 11111111 in binary, based on each of the bits for Banks 0-7 having a 1 value (e.g., Bank 7 is 1, Bank 6 is 1, etc.) indicative of that respective bank needed to be accessed for the first store instruction 902.

In some examples, the bank processing logic 303 of FIGS. 3A-3D detects whether incoming store instructions, such as the first store instruction 902, indicate a write of an entire bank, or a write of a partial bank. In the first instruction servicing workflow 900, the bank processing logic 303 can determine that, since all of the needed banks are to be completely overwritten, then none of the banks are needed to be first read from. For example, the bank processing logic 303 can determine that the number of banks read is 0x000, which is 000000000 in binary and is indicative of each of the banks not needed to be read from. Advantageously, the bank processing logic 303 can reduce the number of banks to read from and, thus, improves efficiency and/or otherwise optimizes operation of the main cache store queue 212, the main storage 214, and/or, more generally, the encapsulated data cache system 700 of FIG. 7 by executing less read operations compared to previous implementations of cache systems.

The second instruction servicing workflow 910 is executed in response to receiving a second example store instruction 912. The second store instruction 912 is a CPU write operation or command to write 64 bytes at Addr 3. The address processing components 302a-c can rotate and/or otherwise organize second data (CPU-Write Data) included in the second store instruction 912 to generate second example rotated or aligned data (Write-Data Aligned) 914. For example, the address processing components 302a-c can shift the second data to place the second data in the correct lane associated with cache memory, such as the L1 cache 110.

The address processing components 302a-c can determine that Addr 3 of the second store instruction 912 is indicative of 8 entire banks (e.g., 8 of the banks 702 of FIG. 7) to be read from and written to. In such examples, the address processing components 302a-c can determine that the number or quantity of banks to read from is 0x01FF and the number or quantity of banks to write to is 0x01FF. For example, the address processing components 302a-c can determine that Banks 0-8 of FIG. 7 need to be accessed, where each of the banks has a corresponding bit (e.g., a first bit for Bank 8, a second bit for Bank 7, a third bit for Bank 6, etc.). In such examples, the address processing components 302a-c can generate an address for the number of banks read of 0x01FF, which is 111111111 in binary, based on each of the bits for Banks 0-8 having a 1 value (e.g., Bank 8 is 1, Bank 7 is 1, etc.) indicative of that respective bank needed to be accessed for the second store instruction 912.

In some examples, the bank processing logic 303 of FIGS. 3A-3D detects whether the third store instruction 922 indicates a write of an entire bank, or a write of a partial bank. In the second instruction servicing workflow 910, the bank processing logic 303 can determine that when Banks 0 and 8 are to be completely overwritten, then Banks 0 and 8 do not need to be first read from. For example, the bank processing logic 303 can determine that the number of banks read is 0x0101, which is 100000001 in binary and is indicative of Banks 0 and 8 not needed to be read from. Advantageously, the bank processing logic 303 can reduce the number of banks to read from and, thus, improves efficiency and/or otherwise optimizes operation of the main cache store queue 212, the main storage 214, and/or, more generally, the encapsulated data cache system 700 of FIG. 7 by executing less read operations compared to previous implementations of cache systems.

The third instruction servicing workflow 920 is executed in response to receiving a third example store instruction 922. The third store instruction 922 is a CPU write operation or command to write 64 bytes at Addr 113. The address processing components 302a-c can rotate and/or otherwise organize second data (CPU-Write Data) included in the third store instruction 922 to generate third example rotated or aligned data (Write-Data Aligned) 924. For example, the address processing components 302a-c can shift the third data to place the third data in the correct lane associated with cache memory, such as the L1 cache 110.

The address processing components 302a-c can determine that Addr 113 of the third store instruction 922 is indicative of 8 entire banks (e.g., 8 of the banks 722 of FIG. 7) to be read from and written to. In such examples, the address processing components 302a-c can determine that the number or quantity of banks to read from is 0xC07F and the number or quantity of banks to write to is 0xC07F. For example, the address processing components 302a-c can determine that Banks 0-6 and 14-15 of FIG. 7 need to be accessed, where each of the banks has a corresponding bit (e.g., a first bit for Bank 15, a second bit for Bank 14, a third bit for Bank 6, etc.). In such examples, the address processing components 302a-c can generate an address for the number of banks read of 0xC07F, which is 1100000001111111 in binary, based on each of the bits for Banks 0-6 and 14-15 having a 1 value (e.g., Bank 15 is 1, Bank 14 is 1, Bank 6 is 1, etc.) indicative of that respective bank needed to be accessed for the third store instruction 922.

In some examples, the bank processing logic 303 of FIG. 3A detects whether the third store instruction 922 indicates a write of an entire bank, or a write of a partial bank. In the third instruction servicing workflow 920, the bank processing logic 303 can determine that Banks 6 and 14-15 are to be completely overwritten, then Banks 6 and 14-15 do not need to be first read from. For example, the bank processing logic 303 can determine that the number of banks read is 0xC080, which is 1100000010000000 in binary and is indicative of Banks 6 and 14-15 not needed to be read from. Advantageously, the bank processing logic 303 can reduce the number of banks to read from and, thus, improves efficiency and/or otherwise optimizes operation of the main cache store queue 212, the main storage 214, and/or, more generally, the encapsulated data cache system 700 of FIG. 7 by executing less read operations compared to previous implementations of cache systems.

Figures 1, 10A:
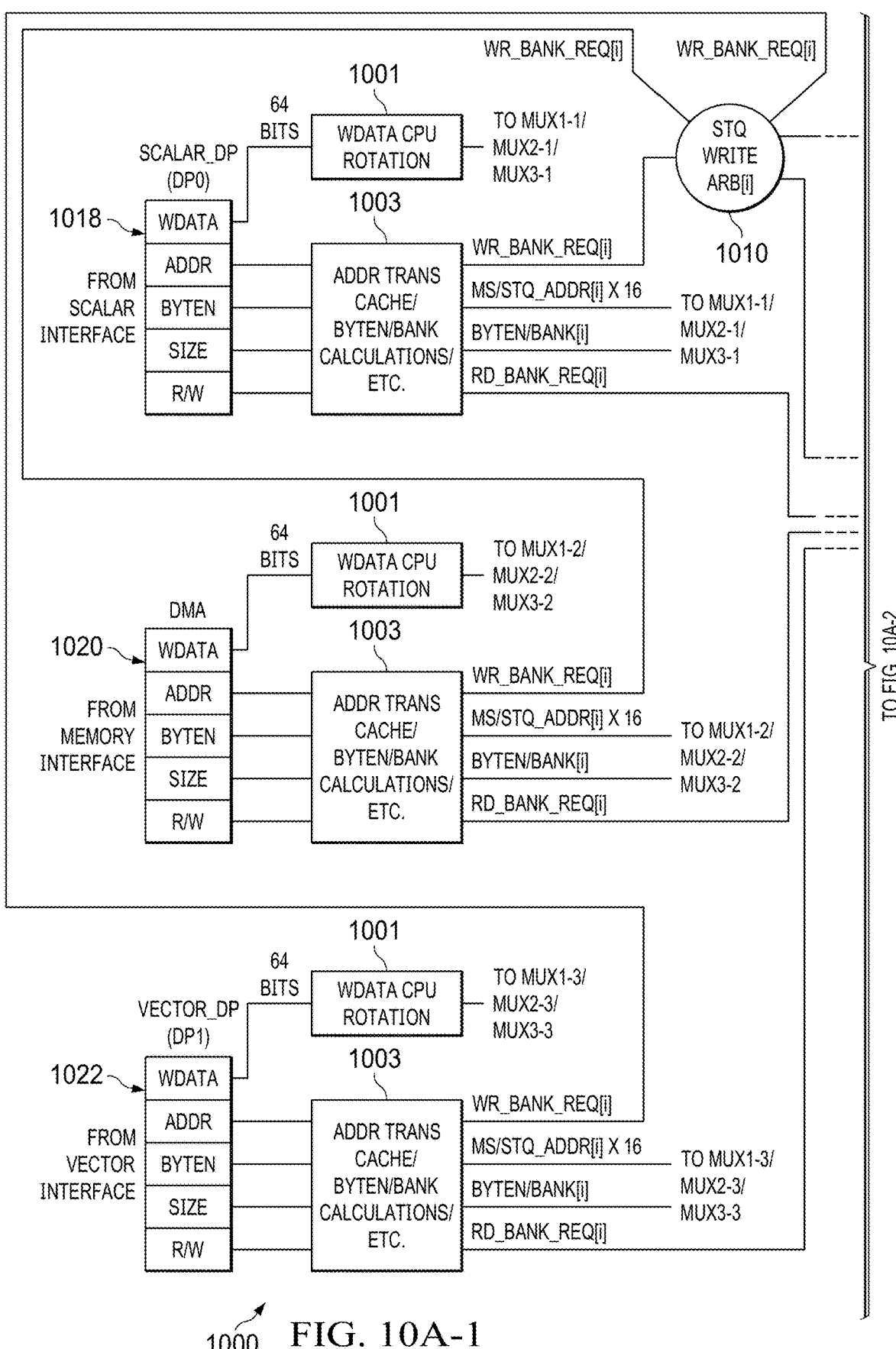
Figures 2, 10A:
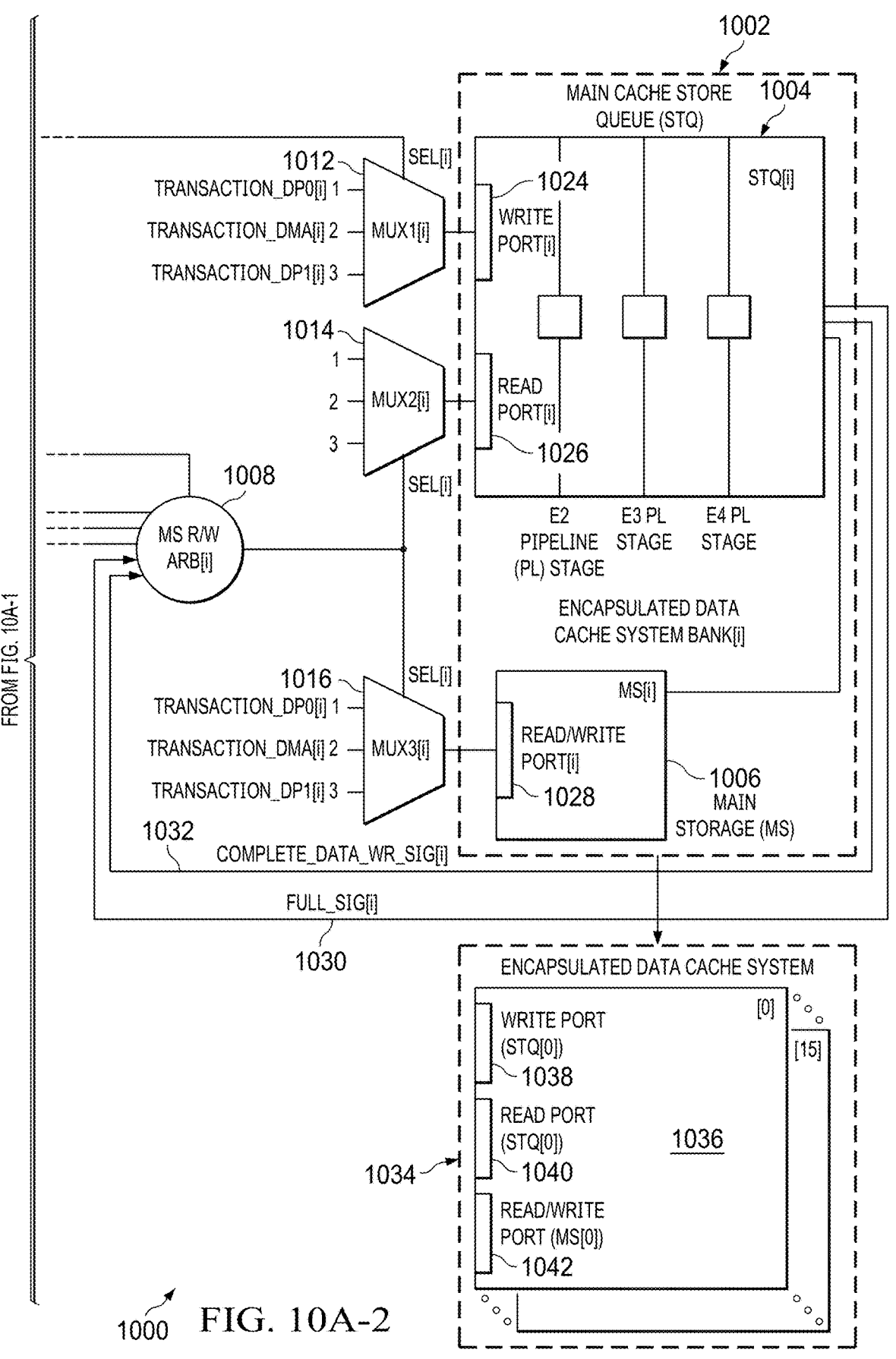

FIGS. 10A-1 and 10A-2 (collectively FIG. 10A) illustrate a schematic illustration of an example data cache system 1000. The data cache system 1000 can be an example implementation of the L1 cache 110 of FIGS. 1, 2, and/or 3, or portion(s) thereof. The data cache system 1000 includes a first example bank (ENCAPSULATED DATA CACHE SYSTEM BANK[i]) 1002 of the encapsulated data cache system 700 of FIG. 7B. For example, the first bank 1002 can correspond to MAIN CACHE STORE QUEUE: BANK 1 and MAIN STORAGE: BANK 1 of FIG. 7B. The first bank 1002 includes a first example main cache store queue bank 1004 of the main cache store queue 212 of FIG. 2, which can be an example implementation of MAIN CACHE STORE QUEUE: BANK 1 of FIG. 7B. The first bank 1002 includes a first example main storage bank 1006 of the main storage 214 of FIG. 2, which can be an example implementation of MAIN STORAGE: BANK 1 of FIG. 7B.

The data cache system 1000 includes first example address processing logic 1001 and second example address processing logic 1003. The first address processing logic 1001 and the second address processing logic 1003 can be example implementations of the address processing components 302a-c of FIGS. 3A-3D and/or the bank processing logic 303 of FIGS. 3A-3D. The first address processing logic 1001 can be an example implementation of at least one of the first address processing component 302a, the second address processing component 302b, or the third address processing component 302c of FIGS. 3A-3D. The second address processing logic 1001 can be an example implementation of at least one of the first address processing component 302a, the second address processing component 302b, or the third address processing component 302c of FIGS. 3A-3D.

The data cache system 1000 includes example arbitration logic 1008, 1010, and example multiplexer logic 1012, 1014, 1016. The arbitration logic 1008, 1010 includes first example arbitration logic (e.g., a first arbiter) 1008 and second example arbitration logic (e.g., a second arbiter) 1010. The first arbitration logic 1008 is a main storage read/write arbiter (MS R/W ARB [i]) and the second arbitration logic 1010 is a main cache store queue (STQ WRITE ARB[i]). The example arbitration logic 1008, 1010 of the illustrated example of FIG. 10A is implemented by a logic circuit such as, for example, a hardware processor. However, any other type of circuitry may additionally or alternatively be used such as, for example, one or more analog or digital circuit(s), logic circuits, programmable processor(s), application specific integrated circuit(s) (ASIC(s)), programmable logic device(s) (PLD(s)), field programmable logic device(s) (FPLD(s)), digital signal processor(s) (DSP(s)), etc. The example multiplexer logic 1012, 1014, 1016 of the illustrated example of FIG. 10A is implemented by a logic circuit such as, for example, a hardware processor. However, any other type of circuitry may additionally or alternatively be used such as, for example, one or more analog or digital circuit(s), logic circuits, programmable processor(s), application specific integrated circuit(s) (ASIC(s)), programmable logic device(s) (PLD(s)), field programmable logic device(s) (FPLD(s)), digital signal processor(s) (DSP(s)), etc.

The multiplexer logic 1012, 1014, 1016 includes a first example multiplexer (MUX1[i]) (e.g., a first multiplexer logic circuit) 1012, a second example multiplexer (MUX2[i] (e.g., a second multiplexer logic circuit) 1014, and a third example multiplexer (MUX3[i]) (e.g., a third multiplexer logic circuit) 1016. The multiplexers 1012, 1014, 1016 have a select input (SEL[i]), data inputs (1-3), and an output.

The first data inputs (data input 1) of the multiplexers 1012, 1014, 1016 are coupled to the first address processing logic 1001 and the second address processing logic 1003. The second data inputs (data input 2) of the multiplexers 1012, 1014, 1016 are coupled to the first address processing logic 1001 and the second address processing logic 1003. The third data inputs (data input 3) of the multiplexers 1012, 1014, 1016 are coupled to the first address processing logic 1001 and the second address processing logic 1003.

The select input of the first multiplexer 1012 is coupled to an output of the second arbitration logic 1010. The select input of the second multiplexer 1014 and the select input of the third multiplexer 1016 are coupled to outputs of the first arbitration logic 1008. The output of the first multiplexer 1012 is coupled to an example write port (WRITE PORT[i]) 1024 of the first main cache store bank 1004. The output of the second multiplexer 1014 is coupled to an example read port (READ PORT[i]) 1026 of the first main cache store bank 1004. The output of the third multiplexer 1016 is coupled to an example read/write port (READ/WRITE PORT[i]) 1028 of the first main storage bank 1006. The first arbitration logic 1008 is coupled to the first address processing logic 1001, the second address processing logic 1003, the second arbitration logic 1010, and outputs of the first main cache store queue bank 1004.

STQ[i] of FIG. 10A is representative of a single bank of a multi-bank implementation of the main cache store queue 212. For example, the main cache store queue 212 can have STQ[0]-STQ[15] representative of the main cache store queue 212 having 16 banks. In such examples, each of STQ[0]-STQ[15] can store 64 bits (i.e., 8 bytes). In some such examples, STQ[0]-STQ[15], and/or, more generally, the main cache store queue 212, can store 24,576 bits (i.e., 3072 bytes). Alternatively, each of STQ[0]-STQ[15] may store a different quantity of bits and, thus, the main cache store queue may store a different quantity of bits.

A plurality of the banks including the first bank 1002, can be encapsulated to form and/or otherwise generate an encapsulated data cache system 1034. For example, the encapsulated data cache system 1034 can be an example implementation of the encapsulated data cache system 700 of FIG. 7B. Advantageously, each corresponding bank of the main cache store queue 212 and the main storage 214 can be encapsulated together to form and/or otherwise generate example encapsulated data cache banks 1036 for simplification when interacting with external system(s). Each of the encapsulated data cache banks 1036 include an example encapsulated write port (WRITE PORT (STQ[i])) 438, an example encapsulated read port (READ PORT (STQ[i])) 1040, and an example encapsulated read/write port (READ/WRITE PORT MS[i])) 1042.

The first address processing logic 1001 and/or the second address processing logic 1003 can obtain example store instructions 1018, 1020, 1022 from one(s) of the interface(s) of FIG. 1 of the CPU 102 of FIG. 1. The store instructions 1018, 1020, 1022 include example data, such as WDATA, ADDR, BYTEN, SIZE, and R/W. WDATA corresponds to data (e.g., 64 bits of data) to be written and/or otherwise stored in at least one of the main cache store queue 212 or the main storage 214. ADDR corresponds to a data address associated with at least one of the main cache store queue 212 or the main storage 214. BYTEN corresponds to byte enable data. SIZE corresponds to a data size of a data access operation (e.g., a read operation, a write operation, a modify operation, etc., and/or a combination thereof). R/W corresponds to whether the store instruction is a read operation or a write operation.

The store instructions 1018, 1020, 1022 include a first example store instruction (SCALAR_DP (DP0)) 1018, a second example store instruction (DMA) 1020, and a third example store instruction (VECTOR_DP (DP1))1022. The first store instruction 1018 is transmitted from the scalar interface of FIG. 1 (e.g., the CPU interface 202 of FIG. 2) and, thus, corresponds to a scalar data path (SCALAR_DP (DP1)) of the data cache system 1000. The second store instruction 1020 is transmitted from the memory interface of FIG. 1, such as a direct memory access (DMA) interface and, thus, corresponds to a DMA data path (DMA). The third store instruction 1022 is transmitted from the vector interface of FIG. 1 (e.g., the CPU interface 202 of FIG. 2) and, thus, corresponds to a vector data path (VECTOR_DP (DP1)) of the data cache system 1000.

The first address processing logic 1001 and/or the second address processing logic 1003 generate transaction data (TRANSACTION_DP0[i], TRANSACTION DMA[i], TRANSACTION DP1[i]) that can be used to execute a data access operation associated with at least one of the main cache store queue 212 or the main storage 214. The first address processing logic 1001 can extract, and in some examples rotate, the WDATA from respective one(s) of the store instructions 1018, 1020, 1022 and transmit the extracted and/or rotated WDATA to a respective first input of the multiplexers 1012, 1014, 1016. For example, the first address processing logic 1001 can extract and rotate first WDATA from the first store instruction 1018 and transmit the first extracted and rotated WDATA to the first input of the first multiplexer 1012, the first input of the second multiplexer 1014, and the first input of the third multiplexer 1016.

The second address processing logic 1003 can determine an address (MS/STQ_ADDR[i]) for one or more of the 16 banks of at least one of the store queue 212 or the main storage 214. The address can be based on the ADDR data included in the store instructions 1018, 1020, 1022. The second address processing logic 1003 can determine a byte enable value per bank (BYTEN/BANK[i]) based on the BYTEN data included in the store instructions 1018, 1020, 1022. The second address processing logic 1003 can determine a write bank request (WR_BANK_REQ[i]) and/or a read bank request (RD_BANK_REQ[i]) based on the R/W data included in the store instructions 1018, 1020, 1022.

The first address processing logic 1001 and/or the second address processing logic 1003 can determine transaction data for respective ones of the store instructions 1018, 1020, 1022. The transaction data can include the rotated WDATA data, MS/STQ_ADDR[i], and BYTEN/BANK[i]. For example, the first address processing logic 1001 and/or the second address processing logic 1003 can generate first transaction data (TRANSACTION_DP0[i]) based on the first store instruction 1018, second transaction data (TRANSACTION_DMA[i]) based on the second store instruction 1020, and third transaction data (TRANSACTION_DP1[i]) based on the third store instruction 1022. In such examples, the first address processing logic 1001 and/or the second address processing logic 1003 can transmit the first transaction data to the first inputs of the multiplexers 1012, 1014, 1016, the second transaction data to the second inputs of the multiplexers 1012, 1014, 1016, and the third transaction data to the third inputs of the multiplexers 1012, 1014, 1016.

In example operating conditions, the first address processing logic 1001 and the second address processing logic 1003 obtain the store instructions 1018, 1020, 1022. The first address processing logic 1001 and the second address processing logic 1003 generate the first through third transaction data based on respective ones of the store instructions 1018, 1020, 1022. The first address processing logic 1001 and the second address processing logic 1003 transmit the first through third transaction data to the multiplexers 1012, 1014, 1016. The second address processing logic 1003 transmit either a read bank request or a write bank request corresponding to each of the store instructions 1018, 1020, 1022.

In example operating conditions, the first arbitration logic 1008 determines whether one(s) of the store instructions 1018, 1020, 1022 are requesting to read one or more banks of the main cache store queue 212 or write to one or more banks of the main storage 214. In example operating conditions, the first arbitration logic 1008 prioritizes read operations over write operations. In example operating conditions, the bank(s) of the store queue 212 can generate an example store queue full signal (FULL_SIG[i]) 1030 in response to the store queue 212 being full. In example operating conditions, the bank(s) of the store queue 212 can generate an example complete data write signal (COMLETE_DATA_WR_SIG[i]) 1032.

For example, the first store instruction 1018 can correspond to a write operation for Banks 0-4, the second store instruction 1020 can correspond to a read operation of Banks 5-9, and the third store instruction 1022 can correspond to a read operation of Banks 10-14. The second arbitration logic 1010 can assign DP0 to transmit the first transaction data to the write port 1024 of Banks 0-4 (e.g., WRITE PORT[0], WRITE PORT[1], WRITE PORT[2], etc.) because no other data paths are requesting a write operation to be serviced. The second arbitration logic 1010 can assign DP0 by generating a signal (SEL[i]) to instruct the first multiplexer 1012 to select the first transaction data. The first arbitration logic 1008 can assign DMA to transmit the second transaction data to the read port 1026 of Banks 5-9 (e.g., READ PORT[4], READ PORT[5], READ PORT[6], etc.) because no other data paths are requesting a read operation to be serviced in connection with Banks 5-9. The first arbitration logic 1008 can assign DMA by generating a signal (SEL[i]) to instruct the second multiplexer 1014 to select the second transaction data. The first arbitration logic 1008 can assign DP1 to transmit the third transaction data to the read port 1026 of Banks 10-14 (e.g., READ PORT[9], READ PORT [10], READ PORT[11], etc.) because no other data paths are requesting a read operation to be serviced in connection with Banks 10-14. The first arbitration logic 1008 can assign DP1 by generating a signal (SEL[i]) to instruct the third multiplexer 1016 to select the third transaction data. In such examples, Bank 15 is not assigned to any of the data paths.

In example operating conditions, if the first store instruction 1018 corresponds to a write operation for Banks 0-4 that is split, the first arbitration logic 1008 can delay and/or otherwise stall the write operation. For example, if a first portion of the write operation is associated with writing to the main cache store queue 212 and a second portion of the write operation is associated with reading from the main storage 214, the first arbitration logic 1008 can instruct the second arbitration logic 1010 to not service and/or otherwise not assign the first transaction data to the write port 1024.

In example operating conditions, if the first store instruction 1018 corresponds to a write operation for Banks 0-4 that is split, the main cache store queue 212 can instruct the first arbitration logic 408 to service the write operation when the complete data has bene assembled for writing. For example, if a first portion of the write operation is associated with writing to the main cache store queue 212 and a second portion of the write operation is associated with reading from at least one of the main cache store queue 212 or the main storage 214, the first arbitration logic 1008 can wait to assign the first transaction data to the read/write port 1028. In such examples, in response to locating data associated with the second portion in the main cache store queue 212, the main cache store queue 212 can deliver the located data to the main storage 214. In response to delivering the data to the main storage 214, the main cache store queue 212 can generate a signal (e.g., assert a logic high signal) for COMPLETE_DATA_WR_SIG[i] instructing the first arbitration logic 1010 to service the write operation because the complete set of data required for the write operation has been read and/or otherwise assembled for servicing.

Figures 1, 10B:
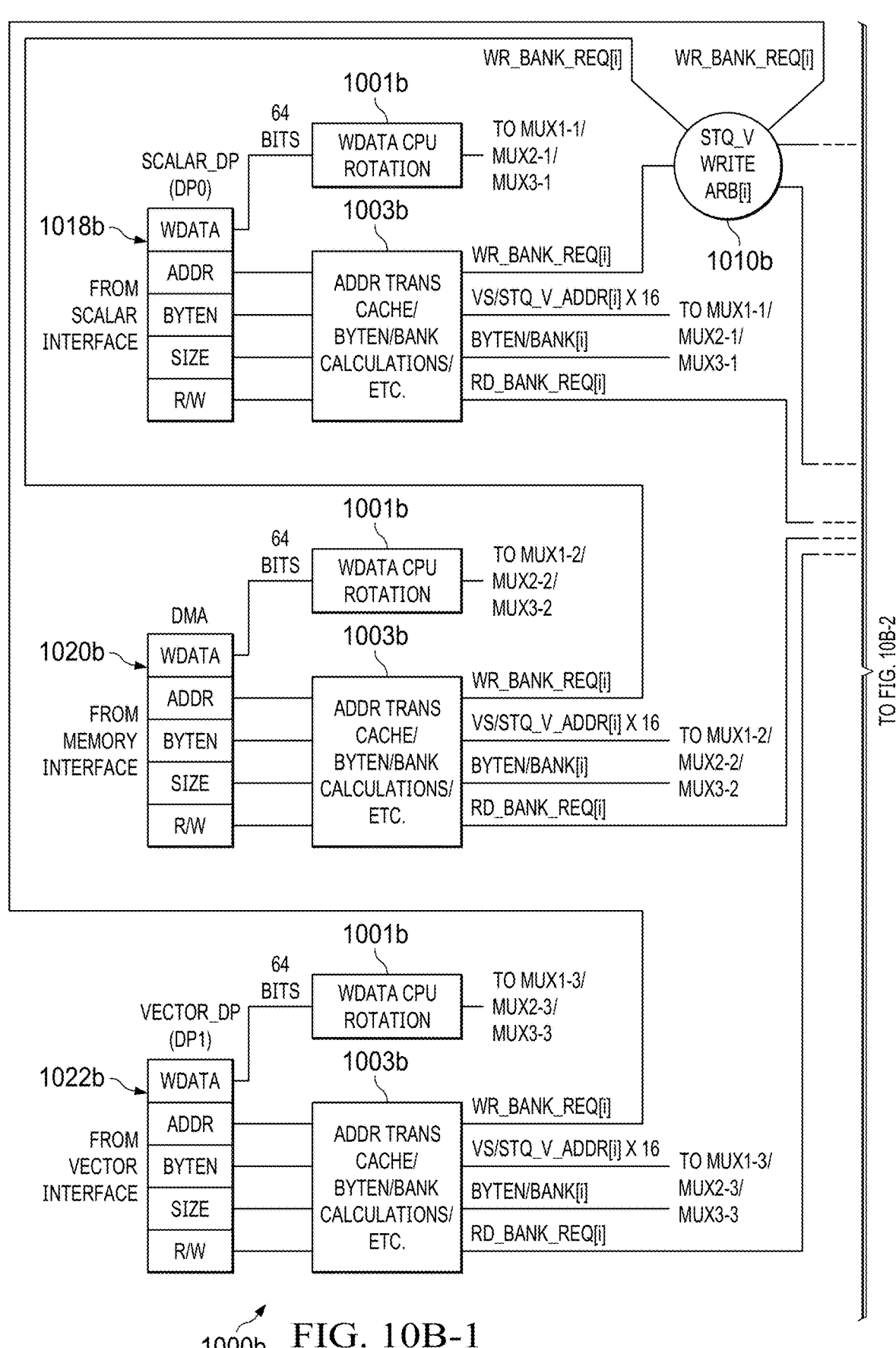
Figures 2, 10B:
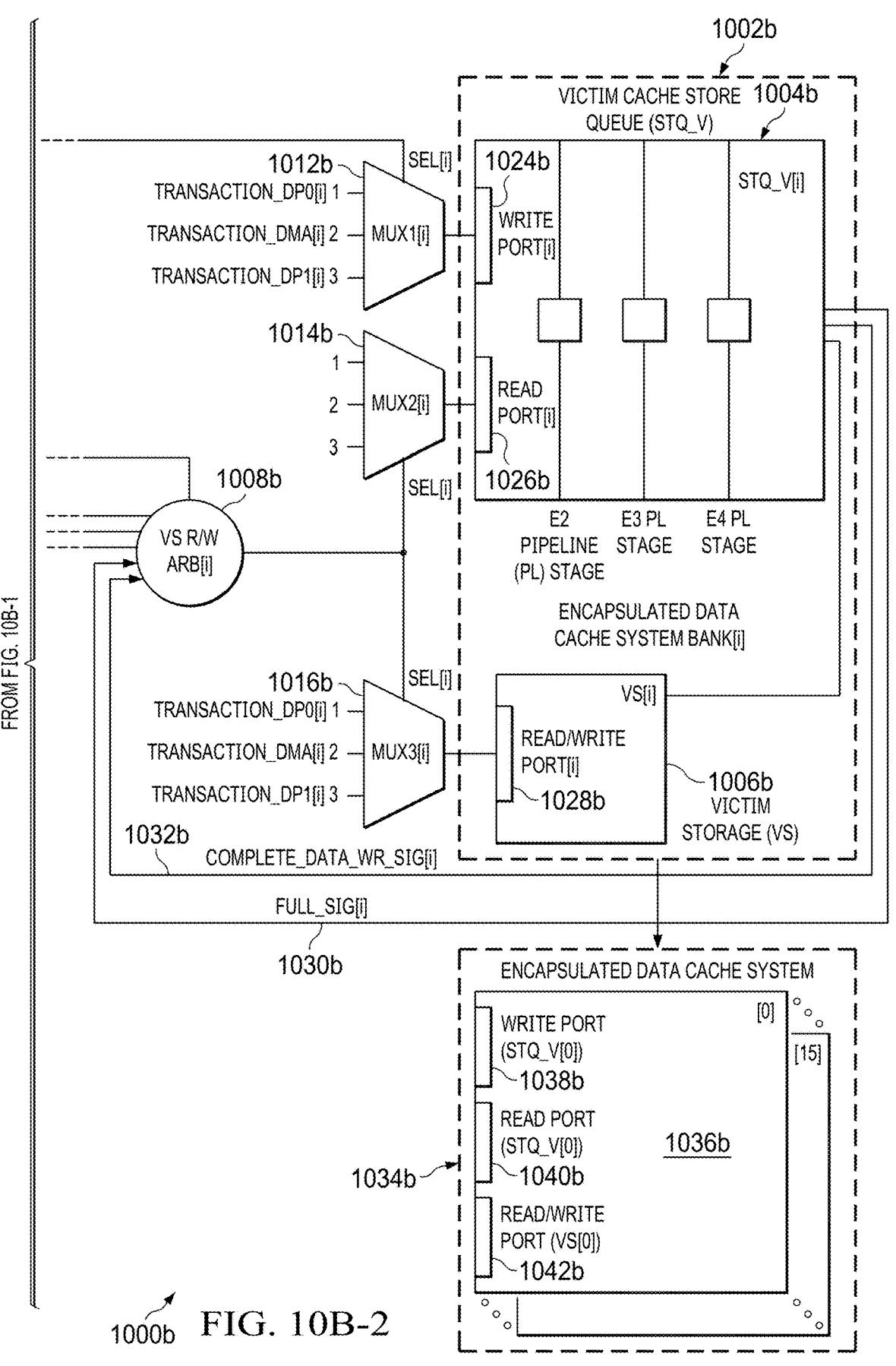

FIGS. 10B-1 and 10B-2 (collectively FIG. 10B) illustrate a schematic illustration of an example data cache system 1000*b*. The data cache system 1000*b* can be an example implementation of the L1 cache 110 of FIGS. 1, 2, and/or 3, or portion(s) thereof. The data cache system 1000*b* includes a first example bank (ENCAPSULATED DATA CACHE SYSTEM BANK[i]) 1002*b* of the encapsulated data cache system 700 of FIG. 7A. For example, the first bank 1002*b* can correspond to VICTIM CACHE STORE QUEUE: BANK 1 and VICTIM STORAGE: BANK 1 of FIG. 7A. The first bank 1002*b* includes a first example victim cache store queue bank 1004*b* of the victim cache store queue 216 of FIG. 2, which can be an example implementation of VICTIM CACHE STORE QUEUE: BANK 1 of FIG. 7A. The first bank 1002*b* includes a first example victim storage bank 1006*b* of the victim storage 218 of FIG. 2, which can be an example implementation of VICTIM STORAGE: BANK 1 of FIG. 7A.

The data cache system 1000*b* includes first example address processing logic 1001*b*, second example address processing logic 1003*b*, example arbitration logic 1008*b*, 1010*b*, and example multiplexer logic 1012*b*, 1014*b*, 1016*b*. The arbitration logic 1008*b*, 1010*b* includes first example arbitration logic (e.g., a first arbiter) 1008*b* and second example arbitration logic (e.g., a second arbiter) 1010*b*. The first arbitration logic 1008*b* is a victim storage read/write arbiter (VS R/W ARB[i]) and the second arbitration logic 1010*b* is a victim cache store queue (STQ_V WRITE ARB[i]). The example arbitration logic 1008*b*, 1010*b* of the illustrated example of FIG. 10B is implemented by a logic circuit such as, for example, a hardware processor. However, any other type of circuitry may additionally or alternatively be used such as, for example, one or more analog or digital circuit(s), logic circuits, programmable processor(s), application specific integrated circuit(s) (ASIC(s)), programmable logic device(s) (PLD(s)), field programmable logic device(s) (FPLD(s)), digital signal processor(s) (DSP(s)), etc. The example multiplexer logic 1012*b*, 1014*b*, 1016*b* of the illustrated example of FIG. 10B is implemented by a logic circuit such as, for example, a hardware processor. However, any other type of circuitry may additionally or alternatively be used such as, for example, one or more analog or digital circuit(s), logic circuits, programmable processor(s), application specific integrated circuit(s) (ASIC(s)), programmable logic device(s) (PLD(s)), field programmable logic device(s) (FPLD(s)), digital signal processor(s) (DSP(s)), etc.

The multiplexer logic 1012*b*, 1014*b*, 1016*b* includes a first example multiplexer (MUX1[i]) (e.g., a first multiplexer logic circuit) 1012*b*, a second example multiplexer (MUX2[i] (e.g., a second multiplexer logic circuit) 1014*b*, and a third example multiplexer (MUX3[i]) (e.g., a third multiplexer logic circuit) 1016*b*. The multiplexers 1012*b*, 1014*b*, 1016*b* have a select input (SEL[i]), data inputs (1-3), and an output.

The first data inputs (data input 1) of the multiplexers 1012*b*, 1014*b*, 1016*b* are coupled to the address processing logic 1001*b*, 1003*b*. The second data inputs (data input 2) of the multiplexers 1012*b*, 1014*b*, 1016*b* are coupled to the address processing logic 1001*b*, 1003*b*. The third data inputs (data input 3) of the multiplexers 1012*b*, 1014*b*, 1016*b* are coupled to the address processing logic 1001*b*, 1003*b*.

The select input of the first multiplexer 1012*b* is coupled to an output of the second arbitration logic 1010*b*. The select input of the second multiplexer 1014*b* and the select input of the third multiplexer 1016*b* are coupled to outputs of the first arbitration logic 1008*b*. The output of the first multiplexer 1012*b* is coupled to an example write port (WRITE PORT [i]) 1024*b* of the first victim cache store bank 1004*b*. The output of the second multiplexer 1014*b* is coupled to an example read port (READ PORT[i]) 1026*b* of the first victim cache store bank 1004*b*. The output of the third multiplexer 1016*b* is coupled to an example read/write port (READ/WRITE PORT[i]) 1028*b* of the first victim storage bank 1006*b*. The first arbitration logic 1008*b* is coupled to the address processing logic 1001*b*, 1003*b*, the second arbitration logic 1010*b*, and outputs of the first victim cache store queue bank 1004*b*.

STQ_V[i] of FIG. 10B is representative of a single bank of a multi-bank implementation of the victim cache store queue 216. For example, the victim cache store queue 216 can have STQ_V[0]-STQ_V[15] representative of the victim cache store queue 216 having 16 banks. In such examples, each of STQ_V[0]-STQ_V[15] can store 64 bits (i.e., 8 bytes). In some such examples, STQ_V[0]-STQ_V[15], and/or, more generally, the victim cache store queue 216, can store 24,576 bits (i.e., 3072 bytes). Alternatively, each of STQ_V[0]-STQ_V[15] may store a different quantity of bits and, thus, the victim cache store queue 216 may store a different quantity of bits.

A plurality of the banks including the first bank 1002*b*, can be encapsulated to form and/or otherwise generate an encapsulated data cache system 1034*b*. For example, the encapsulated data cache system 1034*b* can be an example implementation of the encapsulated data cache system 700 of FIG. 7A. Advantageously, each corresponding bank of the victim cache store queue 216 and the victim storage 218 can be encapsulated together to form and/or otherwise generate example encapsulated data cache banks 1036*b* for simplification when interacting with external system(s). Each of the encapsulated data cache banks 1036*b* include an example encapsulated write port (WRITE PORT (STQ_V[i])) 1038*b*, an example encapsulated read port (READ PORT (STQ_V [i])) 1040*b*, and an example encapsulated read/write port (READ/WRITE PORT MS[i])) 1042*b*.

The address processing logic 1001*b*, 1003*b* can obtain example store instructions 1018*b*, 1020*b*, 1022*b* from one(s) of the interface(s) of FIG. 1 of the CPU 102 of FIG. 1. The store instructions 1018*b*, 1020*b*, 1022*b* include example data, such as WDATA, ADDR, BYTEN, SIZE, AND R/W. WDATA corresponds to data (e.g., 64 bits of data) to be written and/or otherwise stored in at least one of the victim cache store queue 216 or the victim storage 218. ADDR corresponds to a data address associated with at least one of the victim cache store queue 216 or the victim storage 218. BYTEN corresponds to byte enable data. SIZE corresponds to a data size of a data access operation (e.g., a read operation, a write operation, a modify operation, etc., and/or a combination thereof). R/W corresponds to whether the store instruction is a read operation or a write operation.

The store instructions 1018*b*, 1020*b*, 1022*b* include a first example store instruction (SCALAR_DP (DP0)) 1018*b*, a second example store instruction (DMA) 1020*b*, and a third example store instruction (VECTOR_DP (DP1))1022*b*. The first store instruction 1018*b* is transmitted from the scalar interface of FIG. 1 (e.g., the CPU interface 202 of FIG. 2)

and, thus, corresponds to a scalar data path (SCALAR_DP (DP1)) of the data cache system 1000*b*. The second store instruction 1020*b* is transmitted from the memory interface of FIG. 1, such as a direct memory access (DMA) interface and, thus, corresponds to a DMA data path (DMA). The third store instruction 1022*b* is transmitted from the vector interface of FIG. 1 (e.g., the CPU interface 202 of FIG. 2) and, thus, corresponds to a vector data path (VECTOR_DP (DP1)) of the data cache system 1000*b*.

The address processing logic 1001*b*, 1003*b* can generate transaction data (TRANSACTION_DP0[i], TRANSACTION DMA[i], TRANSACTION DP1[i]) that can be used to execute a data access operation associated with at least one of the victim cache store queue 216 or the victim storage 218. The first address processing logic 1001*b* can extract, and in some examples rotate, the WDATA from respective one(s) of the store instructions 1018*b*, 1020*b*, 1022*b* and transmit the extracted and/or rotated WDATA to a respective first input of the multiplexers 1012*b*, 1014*b*, 1016*b*. For example, the first address processing logic 1001*b* can extract and rotate first WDATA from the first store instruction 1018*b* and transmit the first extracted and rotated WDATA to the first input of the first multiplexer 1012*b*, the first input of the second multiplexer 1014*b*, and the first input of the third multiplexer 1016*b*.

The second address processing logic 1003*b* can determine an address (MS/STQ_V_ADDR[i]) for one or more of the 16 banks of at least one of the victim cache store queue 216 or the victim storage 218. The address can be based on the ADDR data included in the store instructions 1018*b*, 1020*b*, 1022*b*. The second address processing logic 1003*b* can determine a byte enable value per bank (BYTEN/BANK[i]) based on the BYTEN data included in the store instructions 1018*b*, 1020*b*, 1022*b*. The second address processing logic 1003*b* can determine a write bank request (WR_BANK_REQ[i]) and/or a read bank request (RD_BANK_REQ[i]) based on the R/W data included in the store instructions 1018*b*, 1020*b*, 1022*b*.

The address processing logic 1001*b*, 1003*b* can determine transaction data for respective ones of the store instructions 1018*b*, 1020*b*, 1022*b*. The transaction data can include the rotated WDATA data, MS/STQ_V_ADDR[i], and BYTEN/BANK[i]. For example, the address processing logic 1001*b*, 1003*b* can generate first transaction data (TRANSACTION_DP0[i]) based on the first store instruction 1018*b*, second transaction data (TRANSACTION_DMA[i]) based on the second store instruction 1020*b*, and third transaction data (TRANSACTION_DP1[i]) based on the third store instruction 1022*b*. In such examples, the address processing logic 1001*b*, 1003*b* can transmit the first transaction data to the first inputs of the multiplexers 1012*b*, 1014*b*, 1016*b*, the second transaction data to the second inputs of the multiplexers 1012*b*, 1014*b*, 1016*b*, and the third transaction data to the third inputs of the multiplexers 1012*b*, 1014*b*, 1016*b*.

In example operating conditions, the address processing logic 1001*b*, 1003*b* obtain the store instructions 1018*b*, 1020*b*, 1022*b*. The address processing logic 1001*b*, 1003*b* generate the first through third transaction data based on respective ones of the store instructions 1018*b*, 1020*b*, 1022*b*. The address processing logic 1001*b*, 1003*b* transmit the first through third transaction data to the multiplexers 1012*b*, 1014*b*, 1016*b*. The second address processing logic 1003*b* transmit either a read bank request or a write bank request corresponding to each of the store instructions 1018*b*, 1020*b*, 1022*b*.

In example operating conditions, the first arbitration logic 1008*b* determines whether one(s) of the store instructions

1018b, 1020b, 1022b are requesting to read one or more banks of the victim cache store queue 216 or write to one or more banks of the victim storage 218. In example operating conditions, the first arbitration logic 1008b prioritizes read operations over write operations. In example operating conditions, the bank(s) of the victim cache store queue 216 can generate an example store queue full signal (FULL_SIG[i]) 1030b in response to the victim cache store queue 216 being full. In example operating conditions, the bank(s) of the victim cache store queue 216 can generate an example complete data write signal (COMLETE_DATA_WR_SIG [i]) 1032b.

For example, the first store instruction 1018b can correspond to a write operation for Banks 0-4, the second store instruction 1020b can correspond to a read operation of Banks 5-9, and the third store instruction 1022b can correspond to a read operation of Banks 10-14. The second arbitration logic 1010b can assign DP0 to transmit the first transaction data to the write port 1024b of Banks 0-4 (e.g., WRITE PORT[0], WRITE PORT[1], WRITE PORT[2], etc.) because no other data paths are requesting a write operation to be serviced. The second arbitration logic 1010b can assign DP0 by generating a signal (SEL[i]) to instruct the first multiplexer 1012b to select the first transaction data. The first arbitration logic 1008b can assign DMA to transmit the second transaction data to the read port 1026b of Banks 5-9 (e.g., READ PORT[4], READ PORT[5], READ PORT [6], etc.) because no other data paths are requesting a read operation to be serviced in connection with Banks 5-9. The first arbitration logic 1008b can assign DMA by generating a signal (SEL[i]) to instruct the second multiplexer 1014b to select the second transaction data. The first arbitration logic 1008b can assign DP1 to transmit the third transaction data to the read port 1026b of Banks 10-14 (e.g., READ PORT [9], READ PORT[10], READ PORT[11], etc.) because no other data paths are requesting a read operation to be serviced in connection with Banks 10-14. The first arbitration logic 1008b can assign DP1 by generating a signal (SEL[i]) to instruct the third multiplexer 1016b to select the third transaction data. In such examples, Bank 15 is not assigned to any of the data paths.

In example operating conditions, if the first store instruction 1018b corresponds to a write operation for Banks 0-4 that is split, the first arbitration logic 1008b can delay and/or otherwise stall the write operation. For example, if a first portion of the write operation is associated with writing to the victim cache store queue 216 and a second portion of the write operation is associated with reading from the victim storage 218, the first arbitration logic 1008b can instruct the second arbitration logic 1010b to not service and/or otherwise not assign the first transaction data to the write port 1024b.

In example operating conditions, if the first store instruction 1018b corresponds to a write operation for Banks 0-4 that is split, the victim cache store queue 216 can instruct the first arbitration logic 1008b to service the write operation when the complete data has been assembled for writing. For example, if a first portion of the write operation is associated with writing to the victim cache store queue 216 and a second portion of the write operation is associated with reading from at least one of the victim cache store queue 216 or the victim storage 218, the first arbitration logic 1008b can wait to assign the first transaction data to the read/write port 1028b. In such examples, in response to locating data associated with the second portion in the victim cache store queue 216, the victim cache store queue 216 can deliver the located data to the victim storage 218. In response to delivering the data to the victim storage 218, the victim cache store queue 216 can generate a signal (e.g., assert a logic high signal) for COMPLETE_DATA_WR_SIG[i] instructing the first arbitration logic 1010b to service the write operation because the complete set of data required for the write operation has been read and/or otherwise assembled for servicing.

In FIG. 11A, the example laches 1102a, 1102b, 1102c, 1102d, 1102e, are electronic devices configured to store information (e.g., bytes, bits, etc.) obtained by the victim cache store queue 216. The example latches 1102a-c pass the write data and information corresponding to whether the write data needs to be combined with the read and corrected data out of the ECC logic 310 in arithmetic unit 404, the atomic unit 406, and/or the RMW merge component 408. In the example of FIG. 11A, the latch 1102a is communicatively coupled to the cache controller 220 to obtain read, write, and/or modify instructions. Such read, modify, and/or write instructions may be originate from the CPU 102, and transmitted to the latch 1102a via the cache controller 220. Latch 1102a is coupled to latch 1102b, the tag RAM 210, the arbitration manager 1114, and the pending store address data store 1116 to transmit such read, modify, and/or write instructions to the latch 1102b, the tag RAM 210, the arbitration manager 1114, and the pending store address data store 1116 in response to a subsequent clock cycle of the cache controller 220.

In the example of FIG. 11A, the latch 1102b is coupled to latch 1102a, the pending store address data store 1116, latch 1102c, the priority multiplexer 1118, and the comparator(s) 1120 to transmit the obtained read, modify, and/or write instruction in response to a subsequent clock cycle of the cache controller 220. In this manner, the value obtained from the read, modify, and/or write instruction (e.g., the byte value, the bit value, etc.), propagates through the victim cache store queue 216.

The example latch 1102c is coupled to the latch 1102b, the priority multiplexer 1118, the arithmetic component 1104, the atomic compare component 1106, and the read-modify-write merge component 1108. This coupling enables the latch 1102c to transmit the value obtained from the read, modify, and/or write instruction (e.g., the byte value, the bit value, etc.) to the arithmetic component 1104, the atomic compare component 1106, and/or the read-modify-write merge component 1108 in response to a subsequent clock cycle of the cache controller 220. In some examples disclosed herein, latch 1102c may transmit the value obtained from the read, modify, and/or write instruction (e.g., the byte value, the bit value, etc.) to one or more of the arithmetic component 1104, the atomic compare component 1106, and/or the read-modify-write merge component 1108. For example, in the event the cache controller 220 transmits an instruction to write a bit into a currently stored word, the latch 1102c may transmit the value obtained from the read, modify, and/or write instruction (e.g., the byte value, the bit value, etc.) to the read-modify-write merge component 1108. In other examples disclosed herein, though the cache controller 220 may transmit an instruction to write a bit into a currently stored word, the latch 1102c may transmit the value obtained from the read, modify, and/or write instruction (e.g., the byte value, the bit value, etc.) to the arithmetic component 1104, the atomic compare component 1106, and/or read-modify-write merge component 1108.

The example latch 1102d is coupled to the first multiplexer 1110, the ECC generator 1112, and the latch 1102e. This coupling enables the latch 1102d to transmit the value obtained from first multiplexer 1110 to ECC generator 1112 and/or the latch 1102f in response to a subsequent clock cycle of the cache controller 220.

The example latch 1102e is coupled to priority multiplexer 1118 and to the MUX circuit 316 of FIGS. 3 and/or 11A. This coupling enables the latch 1102e to transmit the value obtained from the from the priority multiplexer 1118 to MUX circuit 316 in response to a subsequent clock cycle of the cache controller 220. For example, on a read operation by the CPU 102 to an address that hits the victim storage element 218, a previous write to the same address could still be inflight (e.g., not completely written to the victim storage element 218). In such an example, the latch 1102e collects the unwritten data byte(s) and provides them to the MUX 316 which eventually get sent back to the CPU 102.

The example merging circuit 1103a is coupled to the latch 1102d, the merging circuit 1103b, the arithmetic component 1104, the atomic compare component 1106, and the read-modify-write merge component 1108. The example merging circuit 1103b is coupled to the merging circuit 1103a, the priority multiplexer 1118, and the merging circuit 1103c. The example merging circuit 1103c is coupled to the merging circuit 1103b and the latch 1102b. The example merging circuits 1103a-c facilitate the comparison of read operations in different sections of the victim cache store queue 216 to potentially reroute write operations to be merged with write operations corresponding to the same memory address location, as further described below. Although the example of FIG. 11A includes three merging circuits 1103a-c, there may be additional merging circuits to merge write operations from other sections of the victim cache store queue 216 (e.g., a merging circuit coupling the output of the latch 1102d to the output of latch 1102b and/or latch 1102a, etc.). In some examples, the merging circuits 1103a-c is combined into a single circuit that compares the write operations from different latches 1102b-d and reroutes based on matching memory addresses in any two or more of the different latches 1102b-d.

In the example illustrated in FIG. 11A, the arithmetic component 1104 is coupled to the latch 1102c, the first multiplexer 1110, and to the ECC logic 312 to perform arithmetic operations on (e.g., increment, decrement, etc.) data from the victim storage 218. Additionally, the arithmetic component 1104 performs histogram operations on the data stored in the victim storage 218. The example arithmetic component 1104 of the illustrated example of FIG. 11A is implemented by a logic circuit such as, for example, a hardware processor. However, any other type of circuitry may additionally or alternatively be used such as, for example, one or more analog or digital circuit(s), logic circuits, programmable processor(s), application specific integrated circuit(s) (ASIC(s)), programmable logic device(s) (PLD(s)), field programmable logic device(s) (FPLD(s)), digital signal processor(s) (DSP(s)), etc. Operation of the example arithmetic component 1104 is further described below.

In the example illustrated in FIG. 11A, the atomic compare component 1106 is coupled to the latch 1102c, the first multiplexer 1110, and to the ECC logic 312 to compare data at a memory address to a key and, in the event the data at the memory address matches the key, replace the data. The example atomic compare component 1106 the illustrated example of FIG. 11A is implemented by a logic circuit such as, for example, a hardware processor. However, any other type of circuitry may additionally or alternatively be used such as, for example, one or more analog or digital circuit(s), logic circuits, programmable processor(s), application specific integrated circuit(s) (ASIC(s)), programmable logic device(s) (PLD(s)), field programmable logic device(s) (FPLD(s)), digital signal processor(s) (DSP(s)), etc. Operation of the example atomic compare component 1106 is further described below.

In the example illustrated in FIG. 11A, the read-modify-write merge component 1108 is coupled to the latch 1102c, the first multiplexer 1110, and to the ECC logic 312 to facilitate the read, modify, and/or write instruction(s) sent by the cache controller 220. For example, the read-modify-write merge component 1108 is coupled to the ECC logic 312 to obtain the currently stored word that is to be affected by the read, modify, and/or write instruction(s). In an example write operation, the read-modify-write merge component 1108 is configured to update the currently stored word obtained from the ECC logic 312 with the new bit(s), byte(s), etc., obtained from the latch 1102c. Additional description of the read-modify-write merge component 1108 is described below. The example read-modify-write merge component 1108 of the illustrated example of FIG. 11A is implemented by a logic circuit such as, for example, a hardware processor. However, any other type of circuitry may additionally or alternatively be used such as, for example, one or more analog or digital circuit(s), logic circuits, programmable processor(s), application specific integrated circuit(s) (ASIC(s)), programmable logic device(s) (PLD(s)), field programmable logic device(s) (FPLD(s)), digital signal processor(s) (DSP(s)), etc.

The example first multiplexer 1110 is coupled to the arithmetic component 1104, the atomic compare component 1106, and the read-modify-write merge component 1108 to transmit, based on an indication from the cache controller 220, the output of either the arithmetic component 1104, the atomic compare component 1106, or the read-modify-write merge component 1108 to the latch 1102d. For example, in the event the cache controller 220 indicates to perform a write function (e.g., the cache control transmits a write request to the latch 1102b), an indication is sent by the cache controller 220 to the first multiplexer 1110 to select the input connected to the read-modify-write merge component 1108 to be transmitted to the latch 1102d. The example first multiplexer 1110 of the illustrated example of FIG. 11A is implemented by a logic circuit such as, for example, a hardware processor. However, any other type of circuitry may additionally or alternatively be used such as, for example, one or more analog or digital circuit(s), logic circuits, programmable processor(s), application specific integrated circuit(s) (ASIC(s)), programmable logic device(s) (PLD(s)), field programmable logic device(s) (FPLD(s)), digital signal processor(s) (DSP(s)), etc.

In the example illustrated in FIG. 11A, the ECC generator 1112 is coupled to the latch 1102d and to the latch 1102f to facilitate error detection and correction in the value (e.g., byte(s), bit(s), etc.) stored in the latch 1102d. For example, the ECC generator 1112 is configured to regenerate the ECC value (e.g., generate error detection code) which will be stored with the data (e.g., the merged word output from the read-modify-write merge component 1108. The ECC value is used by the error detection and correction circuit to determine whether the error occurred during a read and/or write operation, as further described above. The example ECC generator 1112 of the illustrated example of FIG. 11A is implemented by a logic circuit such as, for example, a hardware processor. However, any other type of circuitry may additionally or alternatively be used such as, for example, one or more analog or digital circuit(s), logic circuits, programmable processor(s), application specific integrated circuit(s) (ASIC(s)), programmable logic device(s) (PLD(s)), field programmable logic device(s) (FPLD(s)), digital signal processor(s) (DSP(s)), etc.

In FIG. 11A, the example arbitration manager 1114 is coupled to the latch 1102a, the latch 1102b, the pending store address datastore 1116, and the victim storage 218 to facilitate the read, modify, and/or write instructions obtained from the cache controller 220. For example, in the event a write instruction is received from the cache controller 220, the arbitration manager 1114 is configured to transmit a read instruction of the corresponding currently stored word to the victim storage 218. In addition, the arbitration manager 1114 is coupled to the victim storage 218 to arbitrate between conflicting accesses of the victim storage 218. When multiple operations attempt to access the victim storage 218 in the same cycle, the arbitration manager 1114 may select which operation(s) are permitted to access the victim storage 218 according to a priority scheme. Suitable priority schemes are described in more detail in below; however, in one example, the arbitration prioritizes read operations over write operations because write data that is in the victim cache store queue 216 is available for use by subsequent operations even before it is written to the victim storage 218. Thus, there is minimal performance impact in allowing the write data to wait in the victim cache store queue 216. However, as the victim cache store queue 216 fills with write data that has not yet been written back, the priority of the write operations may increase until they are prioritized over competing read operations.

The example arbitration manager 1114 of the illustrated example of FIG. 11A is implemented by a logic circuit such as, for example, a hardware processor. However, any other type of circuitry may additionally or alternatively be used such as, for example, one or more analog or digital circuit(s), logic circuits, programmable processor(s), application specific integrated circuit(s) (ASIC(s)), programmable logic device(s) (PLD(s)), field programmable logic device(s) (FPLD(s)), digital signal processor(s) (DSP(s)), etc.

In the example of FIG. 11A, the pending store address data store 1116 is configured to store the address of the read, modify, and/or write instruction obtained from the cache controller 220. In this manner, the pending store address datastore 1116 maintains a log of the addresses associated with each value stored in any of the latches 1102a, 1102b, 1102c, 1102d, 1102e, 1102f, 1102g, and/or 1102h. The example pending store address datastore 1116 of the illustrated example of FIG. 11A may be implemented by any device for storing data such as, for example, flash memory, magnetic media, optical media, etc. Furthermore, the data stored in the pending store address datastore 1116 may be in any data format such as, for example, binary data, comma delimited data, tab delimited data, structured query language (SQL) structures, etc.

The example priority multiplexer 1118 is coupled to the latch 1102b, the latch 1102c, the latch 1102d, and the latch 1102f to facilitate read operations in the event either of the of the latch 1102b, the latch 1102c, the latch 1102d, or the latch 1102f are storing a value corresponding to a write instruction. For example, the cache controller may initiate the following four write instructions regarding a four bit word having addresses A3, A2, A1, and A0: write address A0 with the byte 0x11, write address A1 with the byte 0x22, write address A3 with the byte 0x23, and write address A0 with the byte 0x44. In such an example, in the event the cache controller 220 initiates a read instruction to read the entire four bit word, the priority multiplexer 1118 is configured to obtain the byte value 0x11 stored in the latch 1102f, the byte value 0x22 stored in the latch 1102d, the byte value 0x23 stored in the latch 1102c, and the byte value 0x22 stored in the latch 1102b. Additionally, the pending store address data store 1116 transmits an instruction to the priority multiplexer 1118 indicating which address value in is associated with the byte value stored in the latch 1102b, the latch 1102c, the latch 1102d, and the latch 1102f. In such an example, since the byte value stored in the latch 1102b is associated with the address A0 and the byte value stored in the latch 1102f is also associated with the address A0, the priority multiplexer 1118 is configured to transmit a packet to the latch 1102e indicating that address A0 is 0x44 (e.g., the most recent write instruction associated with the address A0), address A1 is 0x22, and address A3 is 0x23.

In this manner, the MUX circuit 316 is configured to update the value of the currently stored word with the byte values obtained from the priority multiplexer 1118. Such an operation ensures that a read instruction transmitted by the victim cache store queue 216 probably indicates the correct word, even though the write instructions may not have fully propagated through the victim cache store queue 216.

An example read path (e.g., the read input to the tag RAM 210) may run in parallel with the victim cache store queue 216. Because a read operation (e.g., a read instruction) may refer to data in a write operation (e.g., a write instruction) that may not have completed yet, the victim cache store queue 216 may include write forwarding functionality that allows the read path to obtain data from the victim cache store queue 216 that has not yet been written back to the victim storage 218. In an example, the victim cache store queue 216 includes pending store address data store 1116 that records the addresses of the operations at each stage of the victim cache store queue 216, a priority multiplexer 1118 to select data from one of the stages (e.g., latches) of the victim cache store queue 216 for forwarding, and a MUX circuit 316 that selects between the output of the victim storage 218 (by way of the error detection and correction circuit 312) and the forwarded victim cache store queue 216 data from the data priority multiplexer 1118.

The example write port 1126 is coupled to the write path and the latch 1102a. The write port 1126 may be implemented by an interface that interfaces with the victim cache controller 224 (e.g., the cache controller 220) to obtain a write instruction. For example, the write port 1126 is utilized to receive addresses and values from the cache controller 220 to write.

An example flow of a read operation through the victim cache store queue 216 will now be described. In a first cycle, the L1 data cache 110 retrieves a record from the tag RAM 210 that is associated with an address of the read operation to determine whether the data is stored in the victim storage 218. In a direct mapped example, the L1 data cache 110 need not wait for the tag RAM 210 comparison before requesting data from the victim storage 218, and thus, the tag RAM 210 comparison between the address of the read operation and the record of cached addresses may extend into a second or third clock cycle.

In the second cycle, the L1 data cache 110 may request the data and ECC syndrome bits from the victim storage 218 if the arbitration manager 1114 permits. In this cycle, the L1 data cache 110 may also determine whether newer data is available in the victim cache store queue 216 by comparing the read address to the pending store address data store 1116. If so, the priority multiplexer 1118 is set to forward the appropriate data from the victim cache store queue 216.

Data and ECC may be provided by the victim storage 218 in the third cycle. However, this data may or may not correspond to the memory address specified by the read operation because the L1 data cache 110 may allocate multiple extended memory addresses to the same entry in the cache's victim storage 218. Accordingly, in the third cycle, the L1 data cache 110 determines whether the provided data and ECC from the victim storage 218 corresponds to the memory address in the read operation (e.g., a cache hit) based on the comparison of the tag RAM 210 record. In the event of a cache hit, the data and ECC bits are received by the error detection and correction circuit 312, which corrects any errors in the data in a fourth cycle.

As explained above, newer data that has not yet been written to the victim storage 218 may be present in the victim cache store queue 216, and may be forwarded from the victim cache store queue 216 by the priority multiplexer 1118. If so, the MUX circuit 316 selects the forwarded data over the corrected data from the victim storage 218.

Either the corrected data from the victim storage 218 or the forwarded data from the victim cache store queue 216 is provided to the L1 data cache 110 in a fifth cycle. In this way, the controller 220 may provide data with full ECC checking and correction in the event of a cache hit in about 5 cycles.

In the event that the data and ECC bits are not present in the victim storage 218 (e.g., a cache miss), the victim cache store queue 216 may stall until the data can be retrieved from either the extended memory 106 and/or the victim storage 218, at which point the data may be written to the victim storage and the tag RAM 210 may be updated.

Figures 1, 11B:
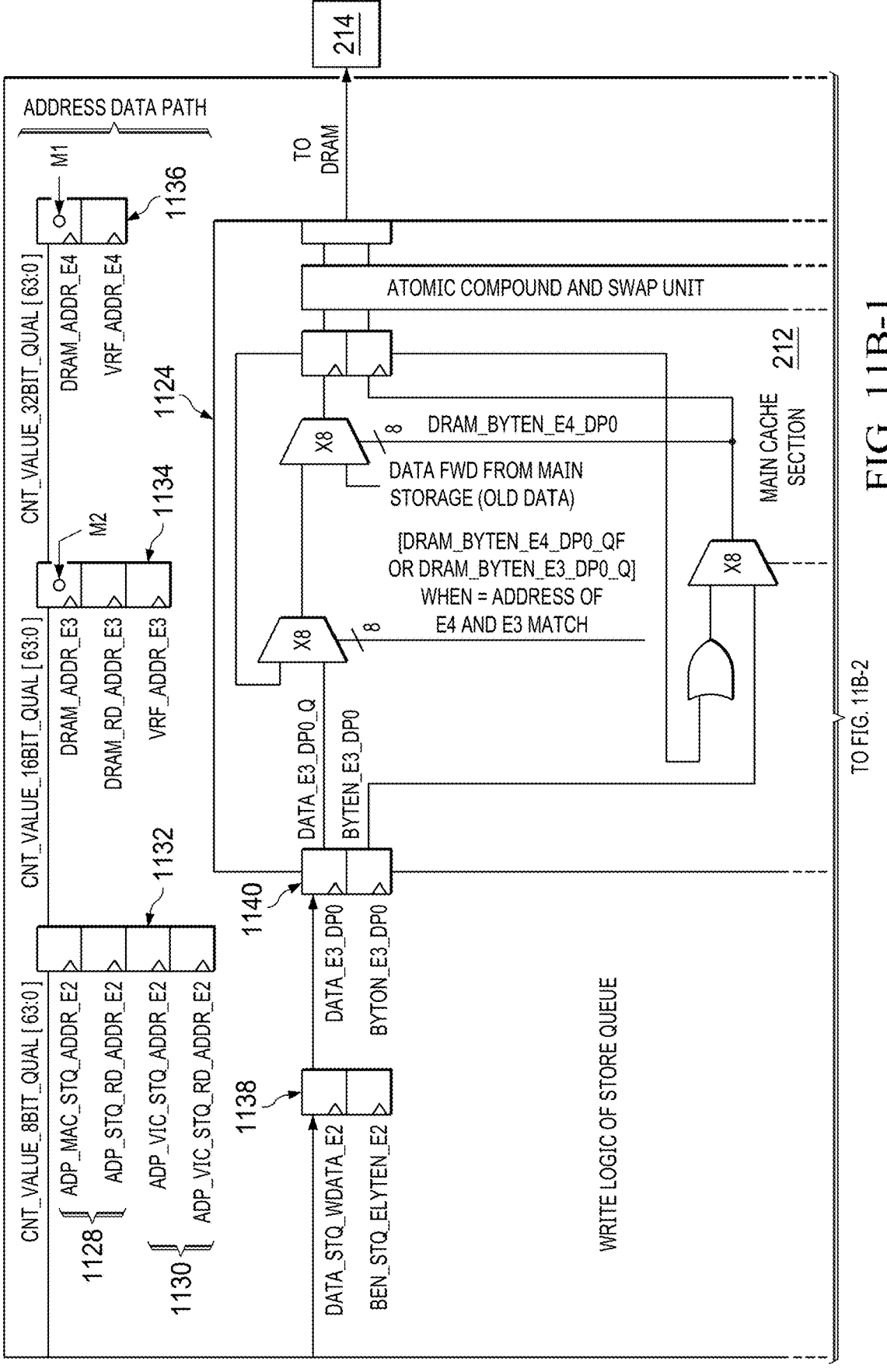
Figures 2, 11B:
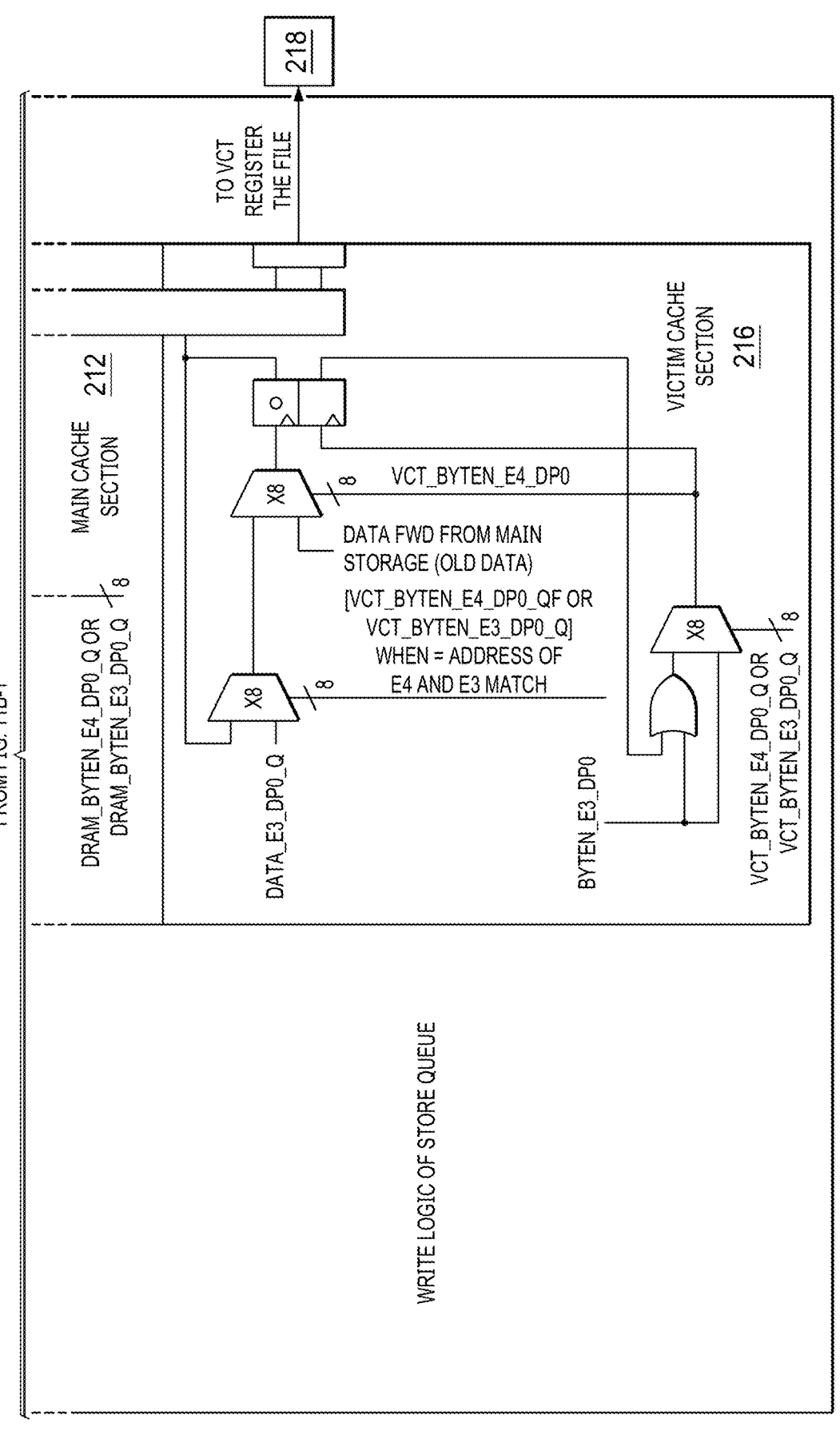

FIGS. 11B-1 and 11B-2 (collectively FIG. 11B) illustrate a schematic illustration of an example unified cache store queue 1124. In the example illustrated in FIG. 11B, the unified cache store queue 1124 may implement the example main cache store queue 212 and/or the victim cache store queue 216. In this manner, the topology illustrates example main cache read and write inputs 1128 and example victim cache read and write inputs 1130. For example, the main cache read and write inputs 1128 may implement the example read and write inputs of the main cache store queue 212 of FIGS. 2 and/or 4, and the victim cache read and write inputs 1130 may implement the example read and write inputs of the victim cache store queue 216 of FIGS. 2 and/or 11A. In the example of FIG. 11B, the main cache read and write inputs 1128 are pipelined separately from the victim cache read and write inputs 1130. Accordingly, in operation, the main cache read and write inputs 1128 and/or the victim cache read and write inputs 1130 are configured to obtain read and/or write instructions from the CPU 102. In some examples disclosed herein, the main cache read and write inputs 1128 and the victim cache read and write inputs 1130 may be referred to as inputs of the unified cache store queue 1124.

The unified cache store queue 1124 includes an example first pipestage (E2) 1132, an example second pipestage (E3) 1134, and an example fourth pipestage (E4) 1136. In this manner, the unified cache store queue 1124 is coupled to the first pipestage (E2) 1132 via example data pipestages 1138 and 1140, and the main storage 214 and the victim storage 218 of FIG. 2.

In operation, the CPU 102 transmits a read and/or a write instruction, which enters the unified cache store queue 1124 via the first pipestage (E2) 1132. In other examples disclosed herein, the unified cache store queue 1124 may obtain a read and/or write instruction from the CPU 102 via the cache controller 220. At this point, the example L1 cache 110 compares the address of incoming read and/or write instruction with the main cache tag ram 208 and the victim cache tag ram 210. Additionally, the determination of whether the read and/or write instruction is indented for the main storage 214 or the victim storage 218 is not yet known to the unified cache storage queue 1124.

In response to a subsequent clock cycle of the CPU 102, or the cache controller 202, the read and/or write instruction is transmitted to the third pipestage (E3) 1134. At this point, the L1 cache 110 determines, or has determined, if the read and/or write instruction is intended for the main storage 214 or the victim storage 218. Such a determination is transmitted to the unified cache store queue 1124 as a hit and/or miss signal.

In FIG. 11B, the physical address of the main storage 214 is a function of the CPU 102 address. The CPU 102 address determines which set of the direct mapped main storage 214 that maps to the CPU 102 address. In FIG. 11B, the size of the main storage 214 is 32 kilobytes (KB), and the cache line size is 128 byes, totaling 256 sets. Thus, the physical address of the CPU 102 may range from Address A0 to Address A255.

In FIG. 11B, the physical address of victim storage 216 is based on the following logic. First, the CPU 102 address is compared with all 16 entries of the victim storage 216. In the event the CPU 102 address corresponds to a hit in the victim storage 216, then the location of entry where the CPU 102 transaction hits is the physical address.

However, if the CPU 102 address does not correspond to a hit (e.g., corresponds to a miss), then the replacement policy chooses a location inside the victim storage 216. Since there are 16 physical address of the victim storage 216, the CPU 102 address may range from A0 to A15.

In the example of FIG. 11B, the information corresponding to whether the CPU 102 address is a hit or a miss is sent to the unified cache store queue 1124. Based on this information, the read and/or write instruction obtained by the CPU 102 enters either the main cache store queue 212 of the unified cache store queue 1124 or the victim cache store queue 216 of the unified cache store queue 1124.

Example methods, apparatus, systems, and articles of manufacture for read-modify-write support in multi-banked data ram cache for bank arbitration are disclosed herein. Further examples and combinations thereof include the following:

Example 1 includes a data cache system comprising a store queue including a plurality of bank queues, the plurality of the bank queues including a first bank queue, the first bank queue having a write port and a read port, the write port configured to receive a write operation, the read port configured to receive a read operation, storage coupled to the store queue, the storage including a plurality of data banks, the plurality of the data banks including a first data bank, the first data bank having a first port configured to receive the write operation or the read operation, a first multiplexer having a first select input and a first output, the first output coupled to the write port, a second multiplexer having a second select input and a second output, the second output coupled to the read port, a third multiplexer having a third select input and a third output, the third output coupled to the first port, and bank arbitration logic including first arbiters and second arbiters, the first arbiters including a first arbiter and the second arbiters including a second arbiter, the first arbiter coupled to the second arbiter, the second select input, and the third select input, the second arbiter coupled to the first select input.

Example 2 includes the data cache system of example 1, further including first address control logic coupled to a first input of the first arbiter, a first input of the second arbiter, a first input of the first multiplexer, a first input of the second multiplexer, and a first input of the third multiplexer, second address control logic coupled to a second input of the first arbiter, a second input of the second arbiter, a second input of the first multiplexer, a second input of the second multiplexer, and a second input of the third multiplexer, and third address control logic coupled to a third input of the first arbiter, a third input of the second arbiter, a third input of the first multiplexer, a third input of the second multiplexer, and a third input of the third multiplexer.

Example 3 includes the data cache system of example 2, further including a first interface coupled to an input of the first address control logic, the first interface coupled to a scalar data path, a second interface coupled to an input of the second address control logic, the second coupled to a direct memory access data path, and a third interface coupled to an input of the third address control logic, the third interface coupled to a vector data path.

Example 4 includes the data cache system of example 3, further including first write data rotate logic coupled to the first interface and the first input of the first multiplexer, the first input of the second multiplexer, and the first input of the third multiplexer, second write data rotate logic coupled to the second interface and the second input of the first multiplexer, the second input of the second multiplexer, and the second input of the third multiplexer, and third write data rotate logic coupled to the third interface and the third input of the first multiplexer, the third input of the second multiplexer, and the third input of the third multiplexer.

Example 5 includes the data cache system of example 1, wherein a first output of the first bank queue is coupled to a first input of the first arbiter and a first input of the second arbiter.

Example 6 includes the data cache system of example 1, wherein the plurality of the bank queues is a first quantity and the plurality of the data banks is a second quantity, where the first quantity is the same as the second quantity.

Example 7 includes the data cache system of example 1, wherein the storage is a dynamic random access memory, and the plurality of the data banks has a quantity of 16 data banks, each of the 16 data banks having a data width of 64 bytes.

Example 8 includes an encapsulated data cache system comprising encapsulated memory that includes a plurality of bank queues having a respective read port and a respective write port, and a plurality of data banks having a respective first port, the first port configured to receive a read operation or a write operation, a read port coupled to the encapsulated memory, the read port representative of the respective read port of the bank queues, the read port configured to read first data stored at one or more of the bank queues, a write port coupled to the encapsulated memory, the write port representative of the respective write port of the bank queues, the write port configured to write second data to one or more of the data banks, and a second port coupled to the encapsulated memory, the second port representative of the respective first port of the data banks, the second port configured to read third data from one or more of the data banks or write fourth data to one or more of the data banks.

Example 9 includes the encapsulated data cache system of example 8, further including a multiplexer having a select input and a first output, the first output coupled to the read port, and arbiter logic coupled to the select input, the arbiter logic to assign a first interface of a plurality of interfaces to a first bank queue of the bank queues and a first data bank of the data banks, the first interface to transmit transaction data from the first interface to the read port to invoke the read port to read at least one of the first data from the first bank queue or the third data from the first data bank.

Example 10 includes the encapsulated data cache system of example 9, further including address processing logic coupled to the first interface and the arbiter logic, the address processing logic to identify the first bank queue based on address data included in the transaction data.

Example 11 includes the encapsulated data cache system of example 9, wherein the multiplexer is a first multiplexer, the select input is a first select input, the transaction data is first transaction data, and further including a second multiplexer having a second select input and a second output, the second output coupled to the second port, and the arbiter logic coupled to the second select input, the arbiter logic to assign a second interface of the plurality of the interfaces to a second bank queue of the bank queues and a second data bank of the data banks, the second interface to transmit second transaction data from the second interface to the second port to invoke the second port to read at least one of the first data from the second bank queue or the third data from the second data bank.

Example 12 includes the encapsulated data cache system of example 11, wherein the second port is to read data from the second bank queue and the second data bank during a first time and the read port is to read at least one of the first data from the first bank queue or the third data from the first data bank during the first time.

Example 13 includes the encapsulated data cache system of example 9, wherein the multiplexer is a first multiplexer, the select input is a first select input, the transaction data is first transaction data, the arbiter logic is first arbiter logic, and further including a second multiplexer having a second select input and a second output, the second output coupled to the write port, and second arbiter logic coupled to the second select input, the second arbiter logic to not assign a second interface of the plurality of the interfaces to a second bank queue of the bank queues in response to the first arbiter logic not assigning the second interface to a second data bank of the data banks.

Example 14 includes the encapsulated data cache system of example 8, further including first arbiter logic coupled to the write port, and second arbiter logic coupled to the read port, the first port, and the first arbiter logic, the second arbiter logic to instruct the first arbiter logic to cause the write port to write the second data to the one or more of the bank queues in response to the bank queues having capacity to store the second data.

Example 15 includes the encapsulated data cache system of example 8, further including first arbiter logic coupled to the write port, and second arbiter logic coupled to the read port, the first port, and the first arbiter logic, the second arbiter logic to instruct the first arbiter logic to cause the write port to write the second data to the one or more of the bank queues in response to at least one of the first data retrieved from the one or more bank queues or the third data retrieved from the one or more data banks.

Example 16 includes a method comprising generating first transaction data based on first instructions from a processor and second transaction data based on second instructions from the processor, the first transaction data indicative of a first quantity of data banks to access for first data, the second transaction data indicative of a second quantity of data banks to access for second data, locating the first data for a first data access operation in a first data bank of at least one of a store queue or storage, locating second data for a second data access operation in a second data bank of at least one of the store queue or the storage, and in response to the first data bank being different from the second data bank, assigning the first transaction data to be transmitted to the first data bank and the second transaction data to be transmitted to the second data bank.

Example 17 includes the method of example 16, further including in response to the first data bank being the same as the second data bank, determining whether the first data access operation or the second data access operation is a read data operation or a write data operation, and in response to the first data access operation being the read data operation and the second data access operation being a write data operation, assigning the first transaction data to be transmitted to the first data bank and not assigning the second transaction data to be transmitted.

Example 18 includes the method of example 16, wherein the first data access operation includes reading a first portion of the first data from one or more of the first data banks and writing a second portion of the first data to one or more of the second data banks, the first data bank included in the one or more of the first data banks or the one or more of the second data banks, and further including in response to locating the first portion in the first data banks of the store queue transmitting the first portion from the store queue to the storage, transmitting a control signal from the store queue to arbiter logic, the arbiter logic coupled to the storage, and in response to the arbiter logic obtaining the control signal, writing the first portion and the second portion to the storage.

Example 19 includes the method of example 16, wherein the first data bank is included in the store queue, and further including, in response to the store queue being full, instructing arbiter logic coupled to the store queue to prevent assigning the first transaction to be transmitted to the first data bank.

Example 20 includes the method of example 16, further including determining a data access operation data size based on the first instructions, determining a data storage address based on the first instructions, mapping the data access operation data size and the data storage address to the first quantity of data banks to be accessed, the first quantity of data banks including a first data bank and a second data bank, and determining that the data access operation includes reading a first portion of the first data from the first data bank and writing a second portion of the first data to the second data bank.

Methods and Apparatus to Facilitate Read-Modify-Write Support in a Victim Cache

In examples disclosed herein, the victim storage 218 includes multiple memory banks, each bank being 64 bits wide. The victim storage 218 is parallel coupled with the main storage 214. Additionally, the banks in the victim storage 218 include two 32-bit parity blocks. In examples disclosed herein, 7 bits of ECC syndrome is stored for each of the 32-bit party blocks. Thus, the overall bank width is 118 bits. In other examples disclosed herein, any suitable bank width may be utilized.

In an example operation, in the event the cache controller 220 transmits a write instruction to the victim storage 218, and in the event the write instruction is not aligned with a parity block on the victim storage 218, the cache controller 220 indicates to the victim cache store queue 216 to perform a read-modify-write operation.

In examples disclosed herein, there are two cache systems operating in tandem (e.g., the main storage 214 and the victim cache storage 218). In examples disclosed herein, the main storage 214 is a direct mapped cache element and the victim cache storage 218 is a fully associative cache storage.

Both the direct mapped main storage 214 and the fully associative victim cache storage 218 are protected by an error correcting code (ECC). With this, example applications include reading a line from main storage 214, the ECC logic would correct the cache line and regenerate the ECC syndrome, and then write the line to victim cache storage 218. Such an application may utilize two additional clock cycles of the CPU (e.g., one clock cycle for error correction by the ECC logic and another clock cycle for ECC syndrome regeneration). To reduce this latency, examples disclosed herein include utilizing the same parity block size between the main storage 214 and the victim cache storage 218. Thus, both the main storage 214 and the victim cache storage 218 calculate and/or otherwise determine parity on a 32-bit boundary. In this manner, the L1 cache 110 can move a cache line directly from main storage 214 to the victim cache storage 218 with less latency.

In examples disclosed herein, the L1 data cache 110 supports a number of operations that read data from the cache and make changes to the data before rewriting it. For example, the L1 data cache 110 may support read-modify-write operations. A read-modify-write operation reads existing data and overwrites at least portion of the data. In ECC embodiments, a read-modify-write operation may be performed when writing less than a full bank width. The read functionality of the read-modify-write is used because the portion of the data in the bank that will not be overwritten still contributes to the ECC syndrome bits.

A read-modify-write operation may be split into a write operation and a read operation, and the victim cache store queue 216 may be structured such that the read operation in the read path stays synchronized with the write operation in the victim cache store queue 216. The read operation and the write operation remain synchronized until the read-modify-write merge component 1108 overwrites at least a portion of the read data with the write data to produce merged data. The merged data is provided to the ECC generator 1112 that generates new ECC syndrome bits for the merged data, and then the merged data and ECC syndrome bits may be provided to the arbitration manager 1114 for storing in the victim storage 218.

In an example read operation, the L1 data cache 110 compares an address of the read operation to a record of the tag RAM 210, and the L1 data cache requests the data and ECC syndrome bits from the victim storage 218 and/or the victim cache store queue 216. Because the read-modify-write operation will modify the data, in examples that track MESI (Modified, Exclusive, Shared, and Invalid) states of entries in the victim storage 218, a cache hit that is not in either the Modified or Exclusive state may be considered a cache miss. When the data is obtained in the proper state and any errors are corrected, it is provided to the read-modify-write merge component 1108. In this same cycle, the read-modify-write merge component 1108 may overwrite at least a portion of the corrected data with the write data to produce merged data. The ECC generator 1112 generates new ECC syndrome bits for the merged data.

In an example write operation, the cache controller 220 of FIGS. 2 and/or 3 transmits a write request indicating byte(s) of a word, or an entire word, to be re-written. In such an example, the write request transmitted by the cache controller 220 includes an address value of the byte and the byte value (e.g., a set of data). For example, the victim storage 218 of FIGS. 2 and/or 3 may include the four-bit word 0x12345678 associated with addresses A3, A2, A1, A0. In such an example, address A3 corresponds to the byte 0x12, address A2 corresponds to the byte 0x34, address A1 corresponds to the byte 0x56, and address A0 corresponds to the byte 0x78 of the stored word. In such an example operation, the cache controller 220 may transmit a write request to replace address A3 with the byte 0x33, replace address A1 with the byte 0x22, and replace address A0 with the byte 0x11 of the currently stored word 12345678. Further in such an example, the first write request to replace address A3 of the stored word with the byte 0x33 would result in the stored word becoming 0x33345678, the second write request to replace address A1 of the stored word with the byte 0x22 would result in the stored word becoming 0x33342278, and the third write request to replace address A0 of the stored word with the byte 0x11 would result in the stored word becoming 0x33342211.

To coordinate such a request, at a first example cycle (e.g., to compete the first write request of replacing address A3 with the byte 0x33), because the ECC generator 1112 operates on word granularity, the cache controller 220 initiates a read request of the currently stored byte (e.g., a read request of a second set of data stored in the victim storage 218) in address A3 of the currently stored word. In this example, the byte and address in the first write request (e.g., 0x33 and A3) is stored in the latch 1102b. In addition, the cache controller 220 transmits a read request of the entire currently stored word to the victim storage 218. Thus, at the end of the first cycle, a read request of the entire currently stored word is transmitted to the victim storage 218 and the byte 0x33 is stored in the first latch 1102b.

At an example second cycle (e.g., to complete the second write request of replacing address A1 with the byte 0x22) the byte from the first write request is transmitted to the latch 1102c, the entire currently stored word is transmitted from the victim storage 218 to the ECC logic 312, and the second write request (e.g., to replace address A1 with the byte 0x22) is transmitted by the cache controller 220 to be stored in the latch 1102b. During the second cycle, the read-modify-write merge component 1108 obtains the byte stored in the latch 1102c and the entire currently stored word transmitted by the ECC logic 312. In this manner, the read-modify-write merge component 1108 identifies the address of the byte in the currently stored word to be updated. Once the read-modify-write merge component 1108 identifies and/or otherwise obtains (a) the value (e.g., byte value, bit value, etc.) of the portion of the currently stored word to be updated from the latch 1102c and the (b) currently stored word from the ECC logic 312, the read-modify-write merge component 1108 writes (e.g., replaces, merges, etc.) the portion of the currently stored word (e.g., the second set of data) with the value of the portion of the currently stored word obtained from the latch 1102c (e.g., the first set of data). For example, the read-modify-write merge component 1108 writes the value of the portion of the word to an address value corresponding to the portion of the word in the word. In some examples disclosed herein, such a merged set of data is provided by the read-modify-write merge component 1108 for writing to the victim storage 218.

Example methods, apparatus, systems, and articles of manufacture to facilitate read-modify-write support in a victim cache are disclosed herein. Further examples and combinations thereof include the following:

Example 1 includes an apparatus comprising a first storage coupled to a controller, a second storage coupled to the controller and parallel coupled to the first storage, and a storage queue coupled to the first storage, the second storage, and to the controller, the storage queue to obtain a memory operation from the controller indicating an address and a first set of data, obtain a second set of data associated with the address from at least one of the first storage and the second storage, merge the first set of data and the second set of data to produce a third set of data, and provide the third set of data for writing to at least one of the first storage and the second storage.

Example 2 includes the apparatus of example 1, wherein the memory operation is a read memory operation indicating to read the second set of data associated with the address from at least one of the first storage and the second storage.

Example 3 includes the apparatus of example 2, wherein the storage queue is configured to obtain the read memory operation prior to merging the first set of data and the second set of data.

Example 4 includes the apparatus of example 1, wherein the store queue includes an error correcting code generator configured to generate error correcting code syndrome bits.

Example 5 includes the apparatus of example 1, wherein the first storage is a main storage and the second storage is a victim storage, the main storage and the victim storage located within a level one cache.

Example 6 includes the apparatus of example 1, wherein the controller is a cache controller configured to be coupled to a central processing unit interface to obtain the memory operation from a central processing unit.

Example 7 includes a system comprising a central processing unit configured to generate a memory operation, a first storage coupled to the central processing unit, a second storage coupled to the central processing unit and parallel coupled to the first storage, and a storage queue coupled to the first storage, the second storage, and to the central processing unit, the storage queue to obtain the memory operation from the central processing unit indicating an address and a first set of data, obtain a second set of data associated with the address from at least one of the first storage and the second storage, merge the first set of data and the second set of data to produce a third set of data, and provide the third set of data for writing to at least one of the first storage and the second storage.

Example 8 includes the system of example 7, wherein the memory operation is a read memory operation indicating to read the second set of data associated with the address from at least one of the first storage and the second storage.

Example 9 includes the system of example 8, wherein the storage queue is configured to obtain the read memory operation prior to merging the first set of data and the second set of data.

Example 10 includes the system of example 8, wherein the store queue includes an error correcting code generator configured to generate error correcting code syndrome bits.

Example 11 includes the system of example 10, wherein the error correcting code generator generates the error correcting code syndrome bits in response to merging the first set of data and the second set of data.

Example 12 includes the system of example 8, wherein the first storage is a main storage and the second storage is a victim storage, the main storage and the victim storage located within a level one cache.

Example 13 includes the system of example 8, further including a cache controller configured to be coupled to the store queue, the first storage, the second storage, and the central processing unit via an interface, the cache controller to obtain the memory operation from the central processing unit.

Example 14 includes a method comprising obtaining a memory operation from a controller indicating an address and a first set of data, obtaining a second set of data associated with the address from at least one of a first storage and a second storage, merging the first set of data and the second set of data to produce a third set of data, and providing the third set of data for writing to at least one of the first storage and the second storage.

Example 15 includes the method of example 14, wherein the memory operation is a first memory operation, wherein the address is a first address, further including obtaining a second memory operation indicating a second address and a fourth set of data, and merging the fourth set of data with the third set of data to produce a fifth set of data.

Example 16 includes the method of example 15, further including storing the first address and the second address in a data store.

Example 17 includes the method of example 15, wherein the first storage is a main storage, and wherein the second storage is a victim storage.

Example 18 includes the method of example 14, further including generating error detection code based on the third set of data, the error detection code to be stored with the third set of data.

Example 19 includes the method of example 14, further including obtaining a read memory operation indicating to read the second set of data.

Example 20 includes the method of example 14, wherein the controller is a cache controller configured to be coupled to a central processing unit interface to obtain the memory operation from a central processing unit.

Methods and Apparatus to Reduce Read-Modify-Write Cycles for Non-Aligned Writes in Victim Cache When issuing a write instruction to a multi-banked storage, such a write instruction may be transmitted with a corresponding read instruction, regardless of the size of the write instruction, in an attempt to execute a full read-modify-write cycle of such a write instruction. For example, in such an application, a write instruction may be obtained by a CPU indicating to write 128 bits across two 64-bit memory banks, starting at address A0 of the first memory bank. In such an example, though the entirety of both the example memory banks are being written, such an application maintains a read instruction to read the data currently stored int he two example memory banks. However, such an approach is inefficient as twice the processing power (e.g., a write and a read instruction) is needed. Additionally, such an approach does not provide any control logic and/or processing circuitry to analyze the write instruction.

In the example illustrated in FIG. 11A, the main storage 214 and/or the victim storage 218 may be multi-banked storages. For example, the victim storage 218 may include sixteen memory banks (e.g., sixteen sub-RAMs), each 64 bits wide. In such an example, in the event the cache controller 220 transmits a write instruction to write all 64 bits of a first bank of the victim storage 218 (e.g., write a 64-bit word starting with the first address of the first bank), the write instruction can be executed without initiating a read instruction. For example, the bank processing logic 303 may detect that such a write of an entire bank is to be performed and, thus, indicate to the cache controller 220 to initiate the read-modify-write operation, negating to transmit the read instruction.

Similarly, in the event the cache controller 220 transmits a write instruction to write all 128 bits of a first bank and a second bank of the victim storage 218 (e.g., a write instruction indicating to write a 128 bit word starting with the first address of the first bank and ending with the last address of the second bank), the write instruction can be implemented without initiating a read instruction. For example, the bank processing logic 303 may detect that such a write of the entirety of multiple banks is to be performed and, thus, indicate to the cache controller 220 to initiate the read-modify-write operation, negating to transmit the read instruction.

However, in some examples disclosed herein, the cache controller 220 may transmit a write instruction to write 130 bits of a first bank, a second bank, and a third bank of the victim storage (e.g., a write instruction indicating to write a 130 bit work starting with the first address of the first bank and ending with the second address of the third bank). In such an example, the bank processing logic 303 detects that all addresses of the first bank and the second bank of the victim storage 218 are to be written entirely and, thus, indicate to the cache controller to initiate the read-modify-write operations for the first bank and the second bank of the victim storage, negating to transmit the read instruction. In such an example, the bank processing logic 303 may detect that the third bank of the victim storage 218 is to be partially written (e.g., two addresses of the 64 addresses are to be written), and, thus, indicate to the cache controller 220 to initiate a full read-modify-write operation of the third bank of the victim storage 218. Example description of a read-modify-write operation is described above.

Aggressive Write Merging to Reduce Bank Pressure in Victim Cache

In the example of FIG. 11A, the example victim cache store queue 216 stores a number of write operations at different sections of the victim cache store queue 216 (e.g., at the example latches 1102a-e). For example, when the CPU 102 transmits three separate write operations in a row, the first write operation that the CPU 102 provided is stored at the first latch 1102b and moved to the second latch 1102c when the second operation is received at the first latch 1102b. Accordingly, after the three write operations are received, the first latch 1102b will store and/or output the last write operation with respect to time (e.g., which is last to be stored in the victim storage 218), the second latch 1102c will have the second write operation (e.g., which is second to be stored in the main storage 214), and the third latch 1102d will have the first write operation (e.g., which was the first to be stored in the example victim storage 218). Whenever data in the victim cache store queue 216 is next to be stored in the victim storage 218, the example arbitration manager 1114 reserves a cycle for the data to be written into the example victim storage 218. Accordingly, during the reserved cycle, the victim storage 218 may not be available to cannot perform read operations. However, if the data operations stored in two or more of the latches 1102b, 1102c, 1102d correspond to the same memory address, the data can be merged in order to write the data into the memory address of the victim storage 218 once, instead of two or three times. For example, if the write operation stored in the latch 1102d corresponds to writing a byte of the memory address and the write operation stored in the latch 1102c corresponds to writing a different byte to the memory address, the second write will overwrite the first write.

Instead of reserving a cycle to write the first byte into the victim storage 218, which will be overwritten in a subsequent cycle, the victim cache store queue 216 merges the two writes into one write, so that only one cycle is used to write the second transaction (e.g., to avoid reserving a cycle for the first write). Such an aggressive merge reduces the number of cycles reserved for write operations. In this manner, the victim storage 218 will have extra cycles to perform read operations, thereby decreasing the latency of the overall systems.

To enable an aggressive merge of write operations to the same memory address. the output of the example latches 1102b-1102d are coupled to the example merging circuits 1103a-403c. For example, the output of the third latch 1102d may be coupled to the merging circuit 1103a, the output of the second latch 1102c may be coupled to the merging circuit 1103b, and the output of the first latch 1102b may couple to the merging circuit 1103c. The output of the merging circuit 1103a may additionally be coupled to the output of the second latch 1102c and the merging circuit 1103b, the merging circuit 1103b may be coupled to the merging circuit 1103c, and the merging circuit 1103c may be coupled to the input of the first latch 1102b. Additionally or alternatively, there may be additional comparator circuits that compare outputs of a different set of latches (e.g., a comparator circuit to compare the output of latch 1102b with the output of latch 1102d). The example merging circuits 1103a-c include example comparator(s) 1120 and example switches 1122.

The comparator(s) 1120 compare the memory address locations for each write operation that is stored in the respective laches 1102b-1102d to determine whether any of the write operations in the example store queue correspond to the same memory address. The example comparator 1120 may be one comparator to compare all the write operations of the latches 1102b-1102d or may be separate comparators 1120, to compare two of the latches 1102b-d (e.g., a first comparator to the memory address of latch 1102b to the memory address of latch 1102c, a second comparator to the memory address of 1102b to the memory address of latch 1102d, etc.). The comparator(s) 1120 output the results of the comparisons (e.g., with one or more signals corresponding to the one or more comparisons) to the example switch(es) 1122 and/or the arbitration manager 1114. If the example arbitration manager 1114 receives a signal indicative of a match, the arbitration manager 1114 will not reserve the cycle for a first write operation while the first write operation is merged with a second write operation to the same memory location (e.g., to free up cycles for other cache operations).

The example switch(es) 1122 reroute the write operations in the example latches 1102b-1102d based on the comparison. For example, if the memory address of the write operation stored in the example latch 1102d is the same as the memory address stored in the latch 1102c, the example switch(es) 1122 enable and/or disable to reroute the output of the latch 1102d to latch 1102c, instead of routing to the example arbitration manager 1114. In this manner, the two write operations are combined and written into the victim storage 218 in a subsequent cycle as a single write operation instead of two write operations. The switch(es) 1122 may be electrical switches, transistors (e.g., MOSFETS), demultiplexers, and/or any other component that can reroute a signal in a circuit.

When a latch receives a rerouted write operation, a MUX of the one of the merging circuits 403a-c (e.g., as further described above in conjunction with FIG. 4D) performs a merging protocol for the one or more rerouted write operations that prioritizes the newest write operation. For example, if the comparator(s) 1120 determines that the write operation stored in the example latch 1102c corresponds to the same memory address as the write operation stored in the example latch 1102d, the switches(es) 1122 reroute the write operation stored in the example latch 1102d to the latch 1102c. In such an example, if the write operation in the example latch 1102c corresponds to writing data to byte0 and byte2 of the memory address and the write operation from the latch 1104d corresponds to writing data to byte0 and byte1, the example merging circuit 1103a merges the two write operations to keep the writing data stored in latch 1102c (e.g., the write to byte0 and byte2) and include the write data from latch 1102d that doesn't overlap (e.g., byte2). In this example, the write data of byte 0 from the latch 1104d is discarded because the data to be written at byte 0 from the latch 1104d will be overwritten by the write instructions of the latch 1102c. Accordingly, in the above example, the merged data corresponds to the write data for byte0 from latch 1102c, the write data for byte1 from latch 1104d, and the write data for byte2 from the latch 1102c. When a subsequent write operation is added to the victim cache store queue 216, the merged write data from the latch 1102c may be manipulated (e.g., via one of the example blocks 1104, 1106, 1108) and/or pushed to the next latch 1102d to be stored in the example victim storage 218 during a subsequent cycle. An example hardware implementation of the merging protocol is further described above in conjunction with FIG. 4C.

Optimized Atomic Operations and Histogram Operations Support in L1 in Victim Cache Atomic operations are further example of multi-part memory operations. For example, an atomic compare and swap operation manipulates a value stored in the memory location based on the results of a comparison of the existing value stored at the memory location. For example, the CPU 102 may want to replace the data stored in the L1 cache 110 with a new value if the existing value stored in the L1 cache 110 matches a specific value.

In some example systems, when a CPU wanted to perform an atomic operation, the CPU sent a read operation to a memory address, performed the manipulation on the read data, and then executed a write operation to the same memory address to store the manipulated data. Additionally, in such systems, the L1 cache may need to paused, rejected, blocked, and/or halted any transactions from other devices (e.g., other cores of the CPU, higher level cache, the extended memory, etc.) until the atomic operation was complete (e.g., to avoid manipulation of the memory address corresponding to the atomic operation during the atomic operation). Accordingly, such example techniques may require lots of effort on behalf of the CPU and lots of reserved cycles that increase latency.

In the example of FIG. 11A, the example victim cache store queue 216 handles atomic operations in conjunction with the read modify write structure. In this manner, the example CPU 102 can send a single atomic operations operation to the L1 cache 110, and the victim cache store queue 216 handles the atomic data manipulation and writing operation. Accordingly, the CPU 102 utilizes a single cycle to execute an atomic operation and can use the other cycles (e.g., used in atomic protocols) to perform other functions, thereby reducing the latency of the overall computing system 100.

In operation, when the CPU 102 transmits an atomic operation and/or an atomic compare and swap operation to increment and/or swap the data at a memory address by a value of 1, for example, the atomic instruction is received by the latch 1102a and the tag RAM 210 verifies whether the memory address is stored in the example victim storage 218. If the memory address is stored in the example victim storage 218, the tag RAM 210 instructs the example victim storage 218 to output the data at the memory address while the atomic instructions are passed to the example latch 1102b. While the victim storage 218 outputs the data to the latch 324a, the example latch 1102b outputs the atomic operation to the latch 1102c. At this point the ECC logic 312 performs error detection and/or correction protocol as described above, and the data from the memory address location is forwarded to the example arithmetic component 1104 (e.g., for atomic operations) or the atomic compare component 1106 (e.g., for the atomic compare and swap operations). The arithmetic component 1104 obtains the atomic operation (e.g., including data identifying how to manipulate the data) and/or the atomic compare and swap 1106 obtains the atomic compare and swap operation (e.g., including a key and data to be written if the key matches read data) from the latch 1102c and obtains the data from the corresponding memory address from the output of the ECC logic 312. The arithmetic component 1104 performs the manipulation to the data (e.g., increment the data by 1) and/or the atomic compare component 1106 may perform the swap (replaces the data if the read data matches a key, etc.) and outputs the incremented and/or swapped-in and outputs the incremented data for the corresponding memory address (e.g., the atomic result) to the example latch 1102d via the example MUX 1110. (e.g., which is enabled via the cache controller 220). The latch 1102d outputs the new data corresponding to the memory address to the ECC generator 1112 to generate the ECC bit and the arbitration manager 1114 writes the new data (e.g., the atomic result and/or atomic compare and swap result) to the memory address in conjunction with the ECC bit in the example victim storage 218. Additionally or alternatively, the corrected value out of the EDD logic 1112 is returned to the CPU 102. Thus, the atomic operation is performed with only one instruction from the CPU 102.

The atomic compare component 1106 and/or the arithmetic component 1104 have several inputs. For example, the atomic component 1106 receives (e.g., obtains) the type of atomic to perform (e.g. atomic compare and swap, or atomic swap), the new data to swap in, the ECC corrected data read out the of the cache 310, and the size of the size of the data to be manipulated during the atomic operation (e.g., 32-bit or 64-bit), In the example circuit implementation 450 of FIG. 4B, the atomic compare component 1106 receives an atomic compare and swap operation and the arithmetic component 1104 receives an atomic operation. The atomic compare component 1106 compares the comparison value (e.g., a key) provided by the CPU 102 against the ECC data 310. On a match, the new data is swapped in place of the old data (e.g. ECC data 310) and output to the MUX 1110. The size of the new data swapped-in is determined by cas_acc_sz input (e.g. 32-bit or 64-bit). In the example circuit implementation 450 of FIG. 4C, the atomic compare component 1106 may also receive an atomic swap operation. The atomic compare component 1106 will swap-in the new data replacing the ECC data 310 regardless of the comparison result and output the new value to the mux 1110 and the old data from the address is read from the main storage 214 and is provided back to the CPU 102. The size of the new data swapped-in is determined by cas_acc_sz input (e.g. 32-bit or 64-bit). In the example circuit implementation 450 of FIG. 4C, the arithmetic component 1104 may also receive an atomic operation. The arithmetic component 1104 will manipulate the ECC data 310 and store the manipulated data in the main storage element 214. The size of the new data swapped-in is determined by cas_acc_sz input (e.g. 32-bit or 64-bit). A histogram operation is where the CPU 102 wants to know the value of a bin stored many of each value is present in a section of victim storage 218 (e.g., a SRAM line from the SRAM portion of the victim storage 218). For example, if a SRAM line has 6 bins with the first bin storing 0, the second bin storing 0, the third bin storing 2, the fourth bin storing 0, the fifth bin storing 0, and the sixth bin storing 3. A histogram of the SRAM line may correspond to [0, 0, 2, 0, 0, 3]. Alternatively, the histogram may be structured in a different manner (e.g., [3, 0, 0, 2, 0, 0). In some example systems, to perform a histogram function, the CPU has to read each individual value and increment for each value. For example, to determine how many 0s are stored in a 10 byte SRAM line, the CPU will perform 10 reads. Then to determine how many is are in the same 10 byte SRAM line with 10 bins, the CPU will perform an additional 10 reads. Thus, to perform a histogram operation such system may need to perform (N)(M) reads, where N is the size of the section of memory (e.g., 10 bytes) being read and M is the number of values that could be store in each byte. Like an atomic operation, the L1 SRAM may have to block, pause, halt, discard, etc. all other read and/or write operations until the histogram operation is complete.

In the example of FIG. 11A, the CPU 102 instructs the victim storage 218 to perform the histogram operation. Thereby changing the number of cycles that the CPU 102 has to reserve for the operation from (N)(M) to 1. Additionally, because the atomic operation protocol is already implemented in the store queue, the histogram operation can be performed using the arithmetic component 1104 by performing N reads for the N size of the memory and incrementing a count for each value in the example victim SRAM store queue 216, thereby reducing the number or read operation from (N)(M) operations to N operations.

In operation, when the CPU 102 transmits a histogram operation corresponding to a section (e.g., a SRAM line) of the victim storage 218, the operation is stored in the example latch 1102a while the tag RAM 210 verifies whether the memory address corresponding to the histogram operation is available in the victim storage 218. The example cache controller 220 facilitates the read operation for each byte of the section identified in the histogram operation (e.g., where histogram bins are accessed in parallel by reading up to 128 Bytes at the same time). If available, the tag RAM 210 instructs the victim storage 218 to output the data at a first byte of the section of the victim storage 218 while the histogram operation is output by the example latch 1102a to the example latch 1102b. When the example victim storage 218 outputs the data that has been read from the memory address to the example latch 324a, the latch 1102b outputs the histogram operation to the example latch 1102c. After the ECC logic 312 performs the error detection and correction functionality, the data read at the byte is sent to the example arithmetic component 1104.

After receiving the read value from the ECC logic 312 and the histogram instructions from the latch 1102c, the arithmetic component 1104 initiates data representative of the histogram. For example, the arithmetic component 1104 may initiate a vector (e.g., representing a histogram) with an initial value (e.g., zero) for each possible value that could be stored in the bytes of the victim storage. The arithmetic component 1104 increments the value of the vector based on output by the ECC logic 312 (e.g., the read byte). For example, if the read value of the byte is 0, the arithmetic component 1104 increments the value corresponding to 0 in the vector.

Because each vector is incremented in parallel, the resulting vector corresponds to a histogram of the values that were read in the corresponding sections of SRAM in parallel. Because a value of the histogram is incremented for each bit, the resulting vector is a histogram of the values stored in the section of memory identified in the histogram operation from the CPU 102. In some examples, the arithmetic component 1104 may increment in parallel by some weighted value (e.g., 1.5). When complete, the example histogram is input to the example MUX 418 (e.g., controlled by the example pending store address table 1116) to be input to the MUX 316 via the example latch 1102*e*. Once the operation is complete, the example cache controller 220 controls the MUX 316 to output the final histogram vector to the example CPU interface 202 via the multiplexer circuit 314 and the example latch 322*b*, thereby ending the histogram operation.

In some examples, the L1 cache 110 supports functionality where a histogram bin can saturate after the histogram bin includes more than a threshold limit of the bin size (e.g., a byte, a halfword, a word, etc.). The above Table 1 illustrates an example of saturation values. Using this functionality, the histogram bin values will not roll over once they reach the maximum value.

Example methods, apparatus, systems, and articles of manufacture to facilitate victim cache and atomic operations are disclosed herein. Further examples and combinations thereof include the following: Example 1 includes a system comprising a first cache storage to store a first set of data, a second cache storage to store a second set of data that has been evicted from the first cache storage, and a storage queue coupled to the first cache storage and the second cache storage, the storage queue including an arithmetic component to receive the second set of data from the second cache storage in response to a memory operation, and perform an arithmetic operation on the second set of data to produce a third set of data, and an arbitration manager to store the third set of data in the second cache storage.

Example 2 includes the system of example 1, wherein the first cache storage is a main storage and the second cache storage is a victim storage.

Example 3 includes the system of example 1, wherein the arithmetic component to obtain (a) the second set of data from the second cache storage via an error detection and correction circuit and (b) the memory operation from a central processing unit via a latch.

Example 4 includes the system of example 1, wherein the third set of data is stored in the second cache storage with a single instruction from a central processing unit at a single cycle.

Example 5 includes the system of example 1, further including a modified, exclusive, shared, invalid (MESI) component to determine a state of a memory address included in the memory operation, and an interface to, if the memory address included in the memory operation corresponds to a shared state, send miss instructions to another cache, the miss instructions including an exclusive state request.

Example 6 includes the system of example 5, wherein the arbitration manager is to store the third set of data at the memory address in the second cache storage after the exclusive state request has been granted from the other cache.

Example 7 includes the system of example 5, wherein the arithmetic component is to receive the second set of data from the second cache storage after the exclusive state request has been granted from the other cache.

Example 8 includes the system of example 5, wherein the second cache storage and the first cache storage are connected in parallel to a central processing unit.

Example 9 includes the system of example 5, wherein the memory operation is an atomic operation.

Example 10 includes a storage queue comprising an arithmetic component to receive a second set of data from a cache storage in response to a memory operation, and perform an arithmetic operation on the second set of data to produce a third set of data, and an arbitration manager to store the third set of data in the cache storage.

Example 11 includes the storage queue of example 10, wherein the cache storage is a victim cache storage, the victim cache storage storing data that has been removed from a main cache storage.

Example 12 includes the storage queue of example 11, wherein the victim cache storage and the main cache storage are connected in parallel to a central processing unit.

Example 13 includes the storage queue of example 10, wherein the arithmetic component to obtain (a) the second set of data from the cache storage via an error detection and correction circuit and (b) the memory operation from a central processing unit via a latch.

Example 14 includes the storage queue of example 10, wherein the third set of data is stored in the cache storage with a single instruction from a central processing unit at a single cycle.

Example 15 includes the storage queue of example 10, wherein the arbitration manager is to store the third set of data at a memory address in the cache storage after an exclusive state request has been granted from another other cache.

Example 16 includes the storage queue of example 15, wherein the arithmetic component is to receive the second set of data from the cache storage from the memory address after the exclusive state request has been granted from the other cache.

Example 17 includes the storage queue of example 10, wherein the memory operation is an atomic operation.

Example 18 includes a method comprising obtaining a second set of data from a cache storage in response to a memory operation, and performing an arithmetic operation on the second set of data to produce a third set of data, and storing store the third set of data in the cache storage.

Example 19 includes the method of example 18, wherein the cache storage is a victim cache storage, the victim cache storage storing data that has been removed from a main storage.

Example 20 includes the method of example 19, further including storing the third set of data at a memory address in the cache storage after an exclusive state request has been granted from another other cache Atomic Compare and Swap Support in L1 in Victim Cache for Coherent System If data from an address is stored in the L1 cache 110, data for the same address may also be cached in other caches (e.g., L2 cache 112, and/or L3 cache 114). Accordingly, the memory address needs to be tracked and/or monitored to ensure that any changes to the data in one cache is identified, tracked, and/or reflected to the other caches (e.g., L2 cache 112 and L3 cache 114). As described above in conjunction with FIGS. 3A-3D, the example MESI RAM 300 tracks the state of the data stored in the victim storage 218 to be able to avoid issues with mismatched data in different caches that correspond to the same memory address. For example, if the CPU 102 transmits a read operation, the example MESI RAM 300 changes the state of the memory address to shared, because the data in the memory address will not be manipulated. If the CPU 102 transmits a write operation, the example MESI RAM 300 changes the state of the memory address to exclusive, because the data in the memory address will be manipulated and the victim storage 218 needs write permission for the address. After the data in the memory address is written to the victim storage 218, the MESI RAM 300 updates the state of the memory address to modified (e.g., indicating that the memory address has been modified).

As described above, during atomic and/or histogram protocols, the data from a memory address is read from the victim storage 218 and provided to the victim cache store queue 216 to be updated (e.g., incremented) and written back into the victim storage 218. However, if the MESI RAM 300 has identified the state of the corresponding memory address as in shared state, the write operation of the atomic protocol may cause problems with other level caches (e.g., because the write will cause a mismatch of data in different caches).

To avoid such data mismatches during atomic operations (e.g., including atomic compare and swap), the example cache controller 220 marks cache hits that correspond to a shared state as a cache miss. In this manner, the cache controller 220 can instruct the L2 interface 228 to send the cache miss to the higher level cache with an exclusive state request. In this manner, the higher level cache can grant the exclusive state to the L1 cache 110 and the L1 cache 110 can perform the read and write operation as part of the atomic operation in response to receiving the granted exclusive state.

After the cache miss with exclusive request is sent to the higher level cache and the higher level cache responds with the write data and the exclusive response, the example atomic operation logic 1106 will instruct the MESI RAM 300 to tag the data as modified. The received data from the L2 cache 112 is transmitted into the victim cache store queue 216 to be stored in the victim storage 218. Because the operation was an atomic operation (e.g., a regular atomic operation or an atomic compare and swap) or a histogram protocol, the data from the higher level cache is manipulated by the example arithmetic component 1104 and/or the example atomic compare component 1106 for the manipulation and stored in the example victim storage 218 via the example ECC generator 1112 and the example arbitration manager 1114.

While an example manner of implementing the L1 data cache 110 of FIG. 1 is illustrated in FIG. 2-5 and/or 10-11, one or more of the elements, processes and/or devices illustrated in FIG. 2-5 and/or 10-11 may be combined, divided, re-arranged, omitted, eliminated and/or implemented in any other way. Further, the example CPU interface 202, the example tag RAM accesses 204, 206, the example tag RAM 208, 210, the example main cache store que 212, the example main storage 214, the example victim cache store queue 216, the example victim storage 218, the example cache controller 220, the example main cache controller 222, the example victim cache controller 224, the example L2 interface 228, the example MESI RAM 300, the example address processing components 302*a-c*, the example bank processing logic 303, the example hit-miss comparison logic 304, 306, the example replacement policy component 208, the example ECC logic 310, the example MUX circuit 314, 316, 318, 320, 330, 330*a-c*, 410, 418, 508 the example latches 322*a*, 324*a*, 402*a-d*, **1102-*a-d*, the example address encoder 326, 326*a*, 326*b*, 328, 328*a*, 328*b* the example address read 332, the example merging circuits 403*a-c*, 1103*a-c*, the example arithmetic component 404, 1104 the example atomic compare component 406, 1106, the example RMW component 408, 1108, the example ECC generator 412, 1112, the example arbitration manager 414, 1114, the example pending store address database 416, 1116, the example comparator 420, 1120, the example switches

422, 1122, the example ports 424, 426, 1124, 1126 the interfaces 502, 504, the example address 506, and/or more generally the L1 data cache 110 of FIGS. 2-5 and/or 10-11 may be implemented by hardware, software, firmware and/or or any combination of hardware, software and/or firmware. Thus, for example, any of the example CPU interface 202, the example tag RAM accesses 204, 206, the example tag RAM 208, 210, the example main cache store que 212, the example main storage 214, the example victim cache store queue 216, the example victim storage 218, the example cache controller 220, the example main cache controller 222, the example victim cache controller 224, the example L2 interface 228, the example MESI RAM 300, the example address processing components 302*a-c*, the example bank processing logic 303, the example hit-miss comparison logic 304, 306, the example replacement policy component 208, the example ECC logic 310, the example MUX circuit 314, 316, 318, 320, 330, 330*a-c*, 410, 418, 508 the example latches 322*a*, 322*b*, 324*a*, 322*b*, 402*a-d*, **1102-*a-d*, the example address encoder 326, 326*a*, 326*b*, 328, 328*a*, 328*b* the example address read 332, the example merging circuits 403*a-c*, 1103*a-c*, the example arithmetic component 404, 1104 the example atomic compare component 406, 1106, the example RMW component 408, 1108, the example ECC generator 412, 1112, the example arbitration manager 414, 1114, the example pending store address database 416, 1116, the example comparator 420, 1120, the example switches 422, 1122, the example ports 424, 426, 1124, 1126 the interfaces 502, 504, the example address 506, and/or more generally the L1 data cache 110 of FIGS. 2-5 and/or 10-11 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example CPU interface 202, the example tag RAM accesses 204, 206, the example tag RAM 208, 210, the example main cache store que 212, the example main storage 214, the example victim cache store queue 216, the example victim storage 218, the example cache controller 220, the example main cache controller 222, the example victim cache controller 224, the example L2 interface 228, the example MESI RAM 300, the example address processing components 302*a-c*, the example bank processing logic 303, the example hit-miss comparison logic 304, 306, the example replacement policy component 208, the example ECC logic 310, the example MUX circuit 314, 316, 318, 320, 330, 330*a-c*, 410, 418, 508 the example latches 322*a*, 322*b*, 324*a*, 324*b*, 402*a-d*, **1102-*a-d*, the example address encoder 326, 326*a*, 326*b*, 328, 328*a*, 328*b*, the example address read 332, the example merging circuits 403*a-c*, 1103*a-c*, the example arithmetic component 404, 1104 the example atomic compare component 406, 1106, the example RMW component 408, 1108, the example ECC generator 412, 1112, the example arbitration manager 414, 1114, the example pending store address database 416, 1116, the example comparator 420, 1120, the example switches 422, 1122, the example ports 424, 426, 1124, 1126 the interfaces 502, 504, the example address 506, and/or more generally the L1 data cache 110 of FIGS. 2-5 and/or 10-11 is/are hereby expressly defined to include a non-transitory computer readable storage device or storage disk such as a memory, a digital versatile disk (DVD), a compact disk (CD), a Blu-ray disk, etc. including the software and/or firmware. Further still, the example L1 data cache 110 of FIG. 1 may include one or more elements, processes and/or devices in addition to, or instead of, those illustrated in FIGS. 2-5 and/or 10-11, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

A flowchart representative of example hardware logic, machine readable instructions, hardware implemented state machines, and/or any combination thereof for implementing the L1 data cache of FIG. 1-5 and/or 10-11 is shown in FIGS. 12-33. The machine readable instructions may be one or more executable programs or portion(s) of an executable program for execution by a computer processor such as the processor 3412 shown in the example processor platform 3400 discussed below in connection with FIG. 34. The program may be embodied in software stored on a non-transitory computer readable storage medium such as a CD-ROM, a floppy disk, a hard drive, a DVD, a Blu-ray disk, or a memory associated with the processor 3412, but the entire program and/or parts thereof could alternatively be executed by a device other than the processor 3412 and/or embodied in firmware or dedicated hardware. Further, although the example program is described with reference to the flowchart illustrated in FIG. 34, many other methods of implementing the example L1 cache 110 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a compiled format, an executable format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example processes of FIGS. 12-33 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are open ended terms. Thus, whenever a claim employs any form of "include" or "comprise" (e.g., comprises, includes, comprising, including, having, etc.) as a preamble or within a claim recitation of any kind, additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" refers to implementations including any of (1) at least one A, (2) at least one B, and (3) at least one A and at least one B. Similarly, as used herein in the context of describing structures, components, items, objects and/or things, the phrase "at least one of A or B" refers to implementations including any of (1) at least one A, (2) at least one B, and (3) at least one A and at least one B. As used herein in the context of describing the performance or execution of processes, instructions, actions, activities and/or steps, the phrase "at least one of A and B" refers to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" refers to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

Figure 12:
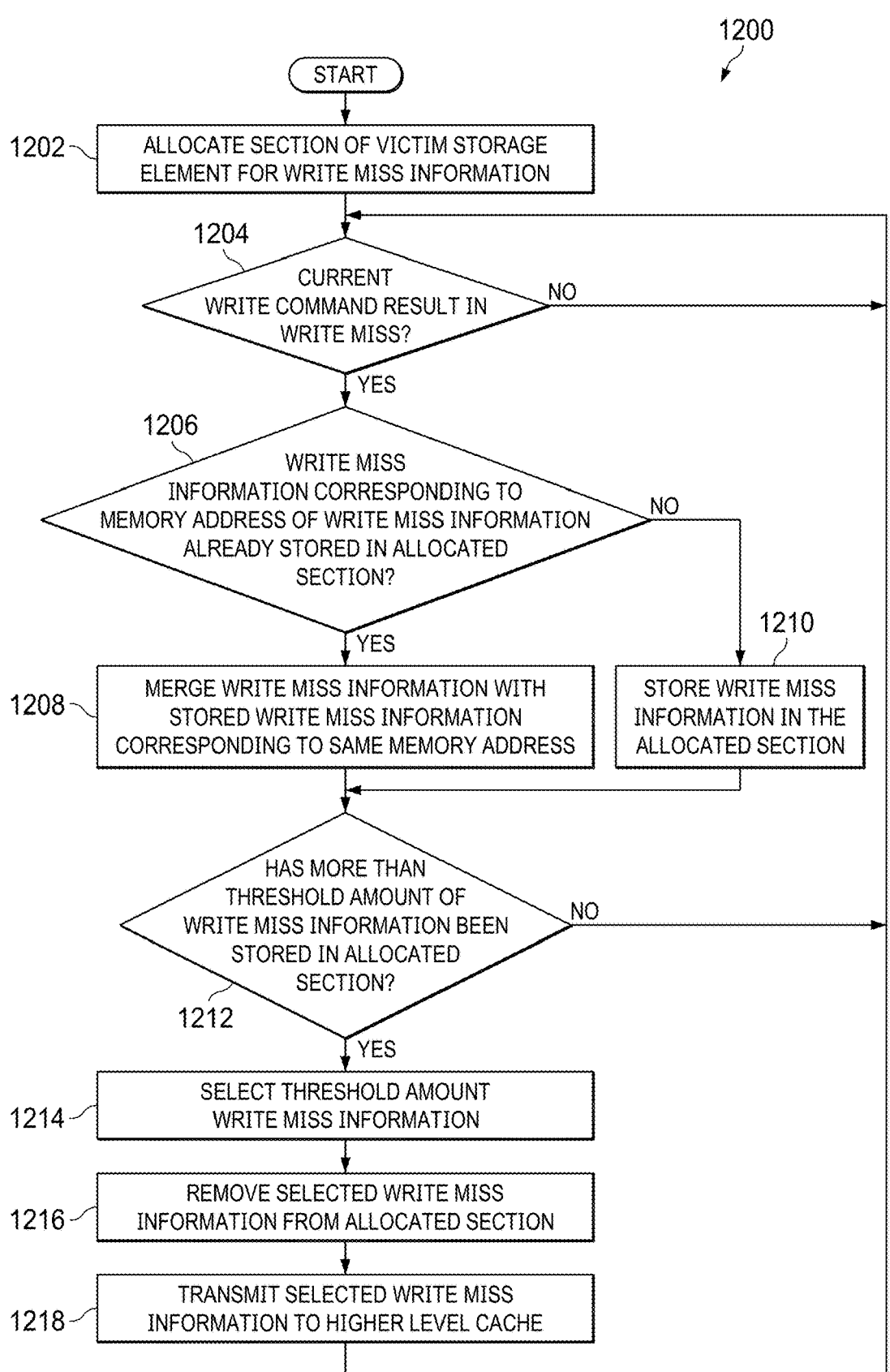

FIG. 12 is an example flowchart representative of example machine readable instructions 1200 that may be executed by the example L1 cache 110 of FIGS. 1-5 to perform write miss caching in the example victim storage 218 as described above. Although the instructions of FIG. 12 are described in conjunction with the L1 cache 110 of FIGS. 1-5, the instructions may be described in conjunction with any type of storage in any type of cache.

At block 1202, the example cache controller 220 allocates a section of the victim storage 218 for write miss information (e.g., a write miss cache). As described above, the write miss information corresponds to when the CPU 102 transmits write instructions to the example L1 cache 110 to a memory address that is not stored in the storages 214, 218 of the L1 cache 110 (e.g., so the write instructions are sent to higher level cache for execution). At block 1204, the cache controller 220 accesses the output of the example hit/miss logic 304, 306 to determine if a current write operation from the CPU 102 (e.g., received by the cache controller 220) resulted in a write miss (e.g., the memory address from the write operation is not stored in the example storages 214, 218). In some examples, where the operation from the CPU 102 missed the main storage 214 but hit the victim storage 218, the hit miss comparison logic 304 may transmit a write miss to the example victim storage 218. In such an example, the victim storage 218 discards the write miss information because the operation hit the victim storage 218.

If the cache controller 220, after interfacing with the one or more of the example tag RAMs 208, 210, determines that a current write operation from the CPU 102 did not result in a write miss (block 1204: NO), control returns to block 1204 until a write operation results in a write miss. If the cache controller 220 determines that a current write operation from the CPU 102 results in a write miss (block 1204: YES), the example cache controller 220 determines if the write miss information corresponds to the same memory address as any write miss information already stored in the allocated section (block 1206). If the example cache controller 220 determines that the write miss information corresponds to the same memory address as any write miss information already stored in the allocated section (block 1206: YES), the cache controller 220 instructs the example victim storage 218 to merge the write miss information with the stored write miss information corresponding to the same memory address (block 1208). The example victim storage 218 merges the two write miss information by overwriting the older write miss information with the most recent write miss information when the most recent write miss information overlaps (e.g., corresponds to the same bytes as) the older write miss information (e.g., discarding the older write miss information that overlaps the more recent write miss information) and maintaining the older write miss information that does not overlap the more recent write miss information.

If the example cache controller 220 determines that the write miss information does not correspond to the same memory address as any write miss information already stored in the allocated section (block 1206: NO), the cache controller 220 stores, in the example victim storage 218, the write miss information in the allocated section (block 1210).

At block 1212, the example cache controller 220 determines if more than a threshold amount of write miss information has been stored in the allocated section. The threshold amount may be set to the size of the victim cache (e.g., the threshold is satisfies when the allocated section is full), the size of the L2 interface 228 (e.g., if the L2 interface has a 64 byte bandwidth, then the threshold is set to 64 bytes), and/or any other amount set by a user and/or manufacturer. If the example cache controller 220 determines that more than the threshold (e.g., a first threshold) amount of write miss information has not been stored in the allocated section (block 1212: NO), control returns to block 1204.

If the example cache controller 220 determines that more than the threshold amount of write miss information has been stored in the allocated section (block 1212: YES), the cache controller 220 selects a threshold (e.g., a second threshold) amount of write miss information (e.g., the N oldest write miss information stored in the allocated section where N corresponds to the threshold) from the allocated section of the victim storage 218 (block 1214). The second threshold may correspond to (e.g., be the same as) the first threshold and/or may correspond to the bandwidth of the L2 interface 228 (e.g., if the bandwidth of the L2 interface 228 is 64 bytes, than no more than 64 bytes of write miss data is selected). Additionally or alternatively, the cache controller 220 may proceed to block 1210 when a threshold amount of time has occurred. At block 1216, the cache controller 220 causes the example victim storage 218 to remove the selected write miss information from the allocated section. At block 1218, the example L2 cache interface 228 transmits the selected write miss information to the higher level cache (e.g., the L2 cache 112). As described above, sending multiple write miss information to utilize more of the bandwidth of the L2 interface 112 results in a more efficient system.

FIG. 13 is an example flowchart representative of example machine readable instructions 1300 that may be executed by the example L1 cache 110 of FIGS. 1-5 to facilitate a read-modify-write operation, in conjunction with the above Section 2. In FIG. 13, the main cache store queue 212 obtains a write instruction transmitted by the CPU 102 (e.g., transmitted through the cache controller 220) indicating byte(s) of a word, or an entire word, to be re-written. (Block 1302). In some examples disclosed herein, the write port 426 may obtain the write instruction transmitted by the CPU 102.

At block 1304, the main cache store queue 212 transmits the value of the portion of the word to be rewritten to the latch 402b. (Block 1304). In some examples, the latch 402b transmits the value of the portion of the word to be rewritten to the latch 402c.

At block 1306, the main cache store queue 212 stores the address value associated with the location of the portion of the word to be rewritten in the pending store address data store 416. (Block 1306). Additionally, the tag ram 208 transmits a read instruction (e.g., a read request) of the entire currently stored word to the main storage 214. (Block 1308). At block 1310, the main cache store queue 212 determines whether there has been a subsequent clock cycle of the CPU 102, or the cache controller 220. (Block 1310). In some examples disclosed herein, the latch 402*c* determines whether there has been a subsequent clock cycle of the CPU 102, or the cache controller 220. In response to determining that there has not been a subsequent clock cycle of the CPU 102, or the cache controller 220, (e.g., the control of block 1310 returns a result of NO), the process waits.

Alternatively, in response to determining that there has been a subsequent cycle of the CPU 102, or the cache controller 220, (e.g., the control of block 1310 returns a result of YES), the read-modify-write merge component 408 obtains the value of the portion of the word (e.g., the byte) stored in the latch 402*c*. (Block 1312). Additionally, the read-modify-write merge component 408 obtains the entire currently stored word transmitted by the ECC logic 310. (Block 1314). In this manner, the read-modify-write merge 408 identifies the address of the byte in the currently stored word to be updated. Once the read-modify-write merge component 408 identifies and/or otherwise obtains (a) the value (e.g., byte value, bit value, etc.) of the portion of the currently stored word to be updated from the latch 402*c* and the (b) currently stored word from the ECC logic 310, the read-modify-write merge component 408 writes (e.g., replaces) the portion of the currently stored word with the value of the portion of the currently stored word obtained from the latch 402*c*. (Block 1316).

At block 1318, the main cache store queue 212 generates error detection code based on the word, the error detection code to be stored with the word. (Block 1318). In some examples disclosed herein the ECC generator 412 generating error detection code based on the word, the error detection code to be stored with the word.

The control of block 1318 may be performed in response to an additional subsequent clock cycle of the CPU 102, or the cache controller 220.

In response, the main cache store queue 212 determines whether an additional write instruction is obtained. (Block 1322). the event the main cache store queue 212 determines another write instruction is obtained (e.g., the control of block 1322 returns a result of YES), the process returns to block 1302. Alternatively, in the event the main cache store queue 212 determines another write instruction is not obtained (e.g., the control of block 1322 returns a result of NO), the process 1300 may wait until a threshold timeout period occurs, thus ending the process 1300.

Figure 14:
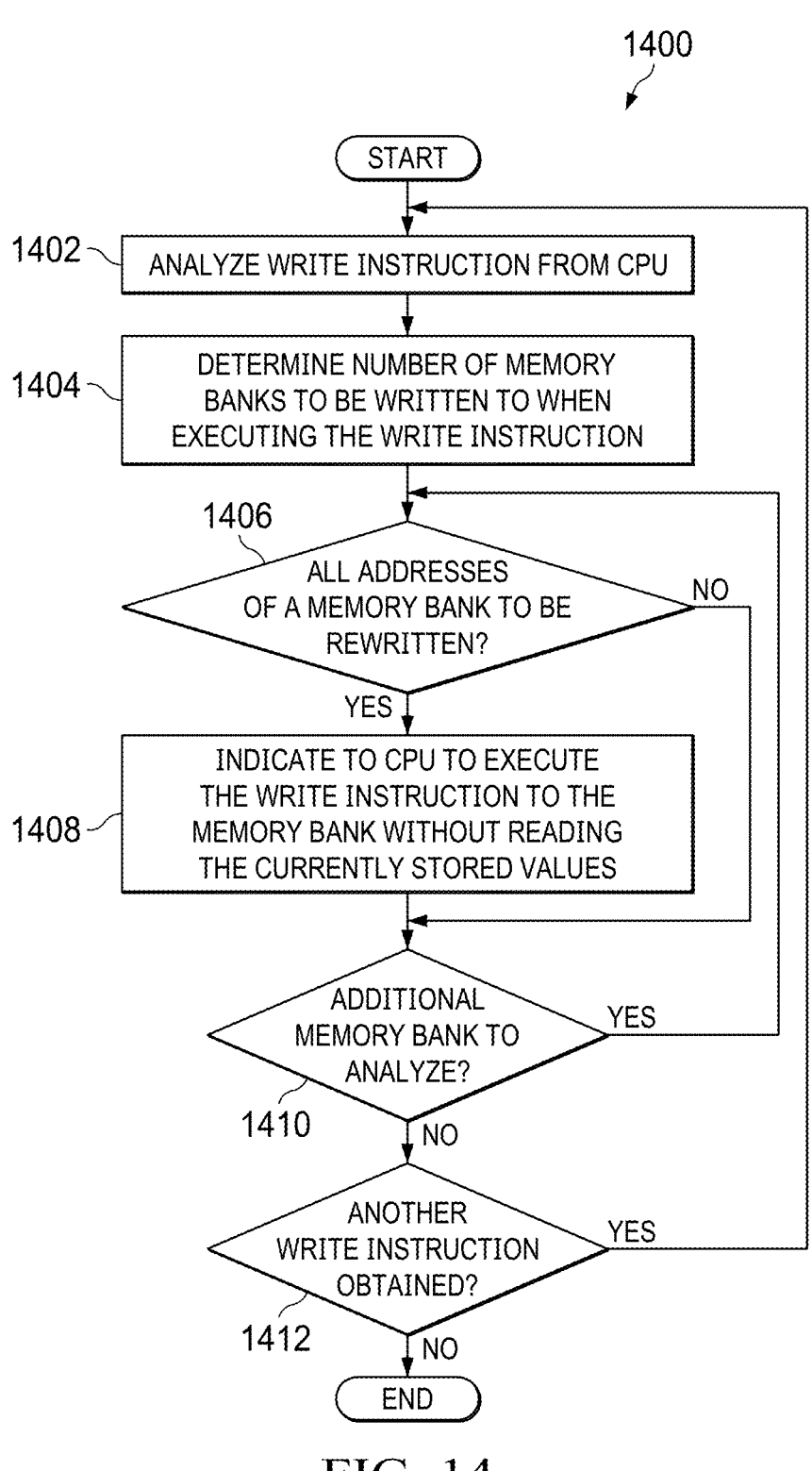

FIG. 14 is an example flowchart representative of example machine readable instructions 1400 that may be executed by the example L1 cache 110 of FIGS. 1-5 to facilitate a read-modify-write operation for non-aligned writes, in conjunction with the above-Sections 3 and/or 14. At block 1402, the bank processing logic 303 of FIGS. 3A-3D analyzes the write instructions obtained from the CPU 102 (e.g., the write instructions obtained via the CPU interface 202). For example, the bank processing logic 303 may operate as initial processing circuitry to determine the nature of the write instruction.

In this manner, the bank processing logic 303 determines the number of memory banks to be written to when executing the write instruction. (Block 1404). For example, the bank processing logic 303 determines the address locations of the write instruction and, as such, determines the banks of either the main storage 214 or the victim storage 218 that include the corresponding address locations. In response, the bank processing logic 303 determines whether all addresses of a memory bank (e.g., a memory bank included in either the main storage 214 or the victim storage 218) are to be rewritten. (Block 1406).

In the event the bank processing logic 303 determines all addresses of a memory bank (e.g., a memory bank included in either the main storage 214 or the victim storage 218) are to be rewritten (e.g., the control of block 1406 returns a result of YES), the bank processing logic 303 indicates to the CPU 102, or the cache controller 220, to execute the write instruction without reading the currently stored values in the memory bank. (Block 1408). For example, the bank processing logic 303 may identify that addresses A0 to A70 are to be rewritten and, thus, determine that the first memory bank (e.g., a memory bank having addresses A0 to A63) are to be rewritten. Thus, such a first memory bank can be rewritten without reading the currently stored values.

Alternatively, in the event the bank processing logic 303 determines that all addresses of a memory bank are not being rewritten (e.g., the control of block 1406 returns a result of NO), or in response to the execution of the control in block 1408, the bank processing logic 303 determines whether there are additional memory banks to analyze. (Block 1410).

For example, to execute the control of block 1410, the bank processing logic 303 determines whether all memory banks affected by the write instruction have been analyzed. In following the example above, the bank processing logic 303 determines that the memory bank including addresses A64 to A70 have not been analyzed. Thus, in the event the bank processing logic 303 determines that there is an additional memory bank to analyze (e.g., the control of block 1410 returns a result of YES), the process 1400 returns to block 1406. Alternatively, in the event the bank processing logic 303 determines that there are no additional memory banks to analyze (e.g., the control of block 1410 returns a result of NO), the bank processing logic 303 determines whether another write instruction is obtained. (Block 1412).

In examples disclosed herein, in the event the bank processing logic 303 determines there is another write instruction (e.g., the control of block 1412 returns a result of YES), the process 1400 returns to block 1402. Alternatively, in the event the bank processing logic 303 determines that there is not another write instruction (e.g., the control of block 1412 returns a result of NO), the process 1400 may wait until a threshold timeout period occurs, thus ending the process 1400.

FIG. 15 is an example flowchart representative of example machine readable instructions 1500 that may be executed by the example L1 cache 110 of FIGS. 1-5 to perform an aggressive write merge in the example main cache store queue 212 and/or the victim cache store queue 216, in conjunction with the above sections 4 and/or 15. Although the instructions of FIG. 15 are described in conjunction with the L1 cache 110 of FIGS. 1-5, the instructions may be described in conjunction with any type of storage in any type of cache. The instructions of FIG. 15 are described in conjunction with the main cache store queue 212 and the main storage 214. However, the instruction of FIG. 15 can likewise be used in conjunction with the victim cache store queue 216 and the victim storage 218.

At block 1502, the example comparator(s) 420 of the example merging circuits 403*a-c* obtains write instructions from corresponding latches 402*b-d*. As described above, each of the latches 402*b-d* include different write instructions from the CPU 102. At block 1504, the example comparator(s) 420 of the example merging circuits 403*a-c* compare the memory addresses for the write instructions from the latches 402b-d. For example, the comparator 420 of the merging circuit 403a compares the memory address for the write instructions output by the latch 402d with the write instructions output by the latch 402c. At block 1506, the example comparator(s) 420 determine if any two or more write instructions output by the latches 402b-d correspond to the same memory address. If the comparator(s) 420 determine that any two or more write instructions output by the latches 402b-d do not correspond to the same memory address (block 1506: NO), control continues to block 1520, as further described below.

If the comparator(s) 420 determine that any two or more write instructions output by the latches 402b-d corresponds to the same memory address (block 1506: YES), control continues to block 1508. For each group of write instructions corresponding to the same memory address (blocks 1508-1514), the one or more of the example merging circuit 1103a-c that receive(s) write instructions for the same memory address maintain(s) the write data for the byte(s) for the newest write instructions (e.g., the write instructions that were more recently received from the CPU 102) that overlap the write data for the same byte(s) from older write instructions (block 1510). At block 1512, the one or more of the example merging circuit 1103a that receive(s) write instructions for the same memory address update(s) the write data for byte(s) from older write instructions that do not overlap with write data from the newest write instructions. For example, if the merging circuit 1103a, storing a write instruction to write byte0 of a memory address, receives rerouted data from latch 402d, the rerouted data corresponding to a write instruction to write byte0 and byte 1 of the memory address, then the merging circuit 1103a maintains the write instruction to write to byte0 (e.g., discarding the write instruction to write byte0 from latch 402d, because the write instruction is older) and updates the write instruction to write to byte1 corresponding to the instruction from latch 402b (e.g., because the instruction does not overlap with the newest write instructions). At block 1516, the example switch(es) 422 reroute the merged write instructions the latch with the newest write instructions that also corresponds to the matching memory address (block 1508).

At block 1518, the one or more of the merging circuits 402a-c that rerouted write instructions to be merged flags the data that was rerouted. For example, the one or more merging circuits 403a-c may transmit a signal to the example arbitration manager 414 and/or the cache controller 220. In this manner, the arbitration manager 414 and/or the cache controller 220 can avoid reserving a cycle to write the data that has be rerouted into a prior latch for merging. At block 1520, the latch 402b determines if an additional write instruction has been received. If the latch 402d determines that an additional instruction has not been received (block 1520: NO), control returns to block 1520 until additional write instructions are received. If the latch 402d determines that an additional instruction has been received (block 1520: YES), control returns to block 1504.

Figure 16:
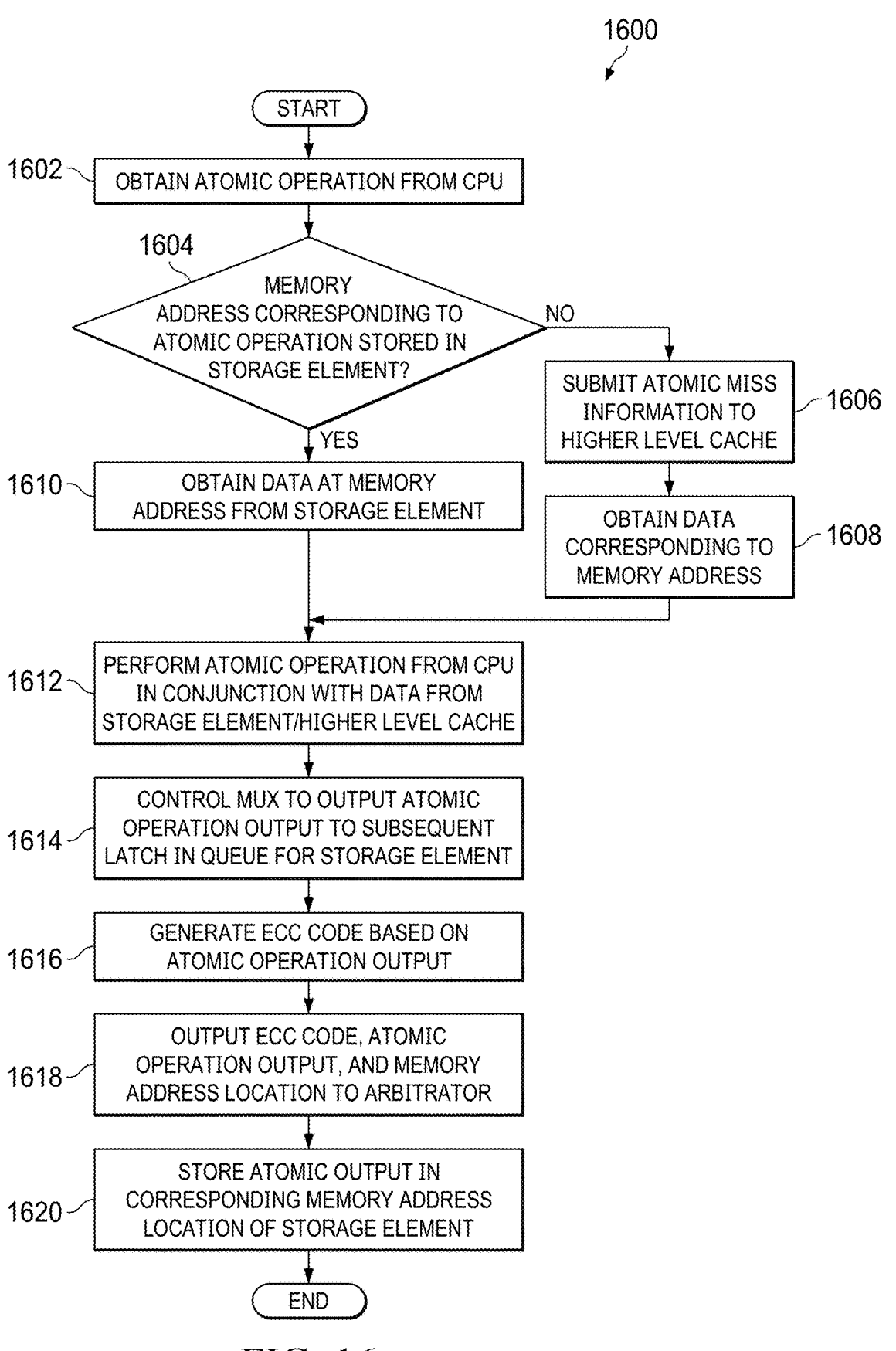

FIG. 16 is an example flowchart representative of example machine readable instructions 1600 that may be executed by the example L1 cache 110 of FIGS. 1-5 to perform an atomic operation, as described above in conjunction with the above Sections 5 and 16. Although the instructions of FIG. 16 are described in conjunction with the L1 cache 110 of FIGS. 1-5, the instructions may be described in conjunction with any type of storage in any type of cache. The instructions of FIG. 16 are described in conjunction with the main half of the L1 cache 110 (e.g., the main cache store queue 212, the main storage 214, etc.).

However, the instruction of FIG. 16 can likewise be used in conjunction with the victim side of the L1 cache 110 (e.g., the victim cache store queue 216, the victim storage 218, etc.).

At block 1602, the cache controller 220 and/or the example latch 402a obtains an atomic operation from the CPU 102. When the latch 402a obtains the atomic operation, the cache controller 220 and and/or the latch 402a sends the memory address for the atomic operation to the example tag RAM 208 to determine whether the data corresponding to the atomic operation is stored in the example main storage 214. At block 1604, the cache controller 220 interfaces with the example hit/miss logic 304 to determine if the memory address corresponding to the atomic operations is stored in the main storage 214.

If the cache controller 220 determines that the memory address corresponding to the atomic operation is not stored in the main storage 214 (block 1604: NO), cache controller 220 interfaces with the example L2 cache interface 228 to submit the atomic miss information to higher level cache (e.g., the L2 cache 112 of FIG. 1) (block 1606). In this manner, the example L2 cache 112 can return the corresponding data from the memory address corresponding to be stored in the L1 cache 110 to execute the atomic operation. The L2 cache 112 may have the data corresponding to the memory address stored locally or may obtain the data from the L3 cache 114 and/or the extended memory 110 (e.g., via the L3 cache 114). At block 1608, the example arithmetic component 404 of the main cache store queue 212 obtains the data corresponding to the memory address from the L2 cache 112 via the L2 interface 228. For example, the data may be stored in the example main storage 214, read, and input to the example arithmetic component 404.

If the cache controller 220 determines that the memory address corresponding to the atomic operation is stored in the main storage 214 (block 1604: YES), cache controller 220 causes the example arithmetic component 404 to obtain the data corresponding to the memory address of the atomic operation from the main storage 214 (block 1610). At block 1612, cache controller 220 causes the example arithmetic component 404 to perform the atomic operation from the CPU 102 in conjunction with the data from the storage and/or higher level cache that corresponds to the atomic operation. For example, while blocks 1602-1610 occur, the atomic operation is sent to the main cache store queue 212 via the latch 402a. The atomic operation includes the specifics of the operation (e.g., increment, decrement, etc.). Accordingly, the arithmetic component 404 obtains the atomic operation and the data corresponding to the memory address of the atomic operation. Thus, the arithmetic component 404 can perform the atomic operation (e.g., increment, decrement, etc.) using the obtained data (e.g., that corresponds to the memory address of the atomic operation). At block 1614, the example cache controller 220 controls the MUX 410 (e.g., via the select line) to ensure that the output of the arithmetic component 404 is output to the example latch 402d. Accordingly, the manipulated data (e.g., incremented data, decremented data, etc.) can be passed to the example ECC generation 412 to generate an ECC code for the manipulated data (block 1616).

At block 1618, the example ECC generation 412 outputs an ECC code for the manipulated data, the manipulated data, and the memory address location to the example to the example arbitration manager 414. At block 1620, the cache controller 220 causes the example arbitration manager 414 to store the atomic output (e.g., the manipulated data) in the main storage 214 at the memory address of the atomic operation.

FIG. 17 is an example flowchart representative of example machine readable instructions 1700 that may be executed by the example L1 cache 110 of FIGS. 1-5 to perform a histogram operation, in conjunction with the above Sections 5 and/or 16. Although the instructions of FIG. 17 are described in conjunction with the L1 cache 110 of FIGS. 1-5, the instructions may be described in conjunction with any type of storage in any type of cache. The instructions of FIG. 17 are described in conjunction with the main half of the L1 cache 110 (e.g., the main cache store queue 212, the main storage 214, etc.). However, the instruction of FIG. 17 can likewise be used in conjunction with the victim side of the L1 cache 110 (e.g., the victim cache store queue 216, the victim storage 218, etc.).

At block 1702, the cache controller 220 and/or the example latch 402b of the main cache store queue 212 and/or the example tag RAM 208 obtains a histogram operation from the CPU 102. As described above, the histogram operation includes determining a total number of each value stored in a section of memory (e.g., a SRAM line). At block 1704, the cache controller 220 interfaces with the example hit/miss logic 304 to determine if the memory address corresponding to the histogram operation is stored in the SRAM of the main storage 214. If the cache controller 220 determines that the memory address corresponding to the histogram operation is stored in the SRAM of the main storage 214 (block 1704: YES), control continues to block 1710.

If the cache controller 220 determines that the memory address corresponding to the histogram operation is not stored in SRAM of the main storage 214 (block 1704: NO), the cache controller 220 interfaces with the example L2 interface 228 to transmit the read miss information to higher level cache (e.g., the example L2 cache 112) (block 1706). At block 1708, the cache controller 220 utilizes the example arbitration manager 414 to obtain the read data from the higher level cache via the L2 interface 228 and stores the data corresponding to the memory address of the histogram operation in the SRAM of the main storage 214. At block 1710, the cache controller 220 and/or causes the example arithmetic component 404 to initiate a histogram vector with values to be representative of counts for values stored in the section of the SRAM of the main storage 214.

At block 1712, the cache controller 220 causes the example SRAM of the main storage 214 outputs the read value of the bins corresponding to the section of SRAM in parallel. The read values are output to the example arithmetic component 404 via the ECC logic 310. At block 1714, the cache controller 220 utilizes the example arithmetic component 404 to increment one of the elements of the histogram value based on the read values of the bins. For example, if a read value is '01,' the arithmetic component 404 increments the element that corresponds to the '01' count. At block 1722, the histogram vector is provided to the example MUX 314 via the example MUX 418 and the example latch 402e and the example MUX 314 outputs the histogram vector to the CPU 102 via the latch 322b and the CPU interface 202 (block 1722). In some examples, the histogram vector is additionally or alternatively, stored in the example main storage 214 via the ECC generator 412 and the arbitration manager 414.

Figure 18B:
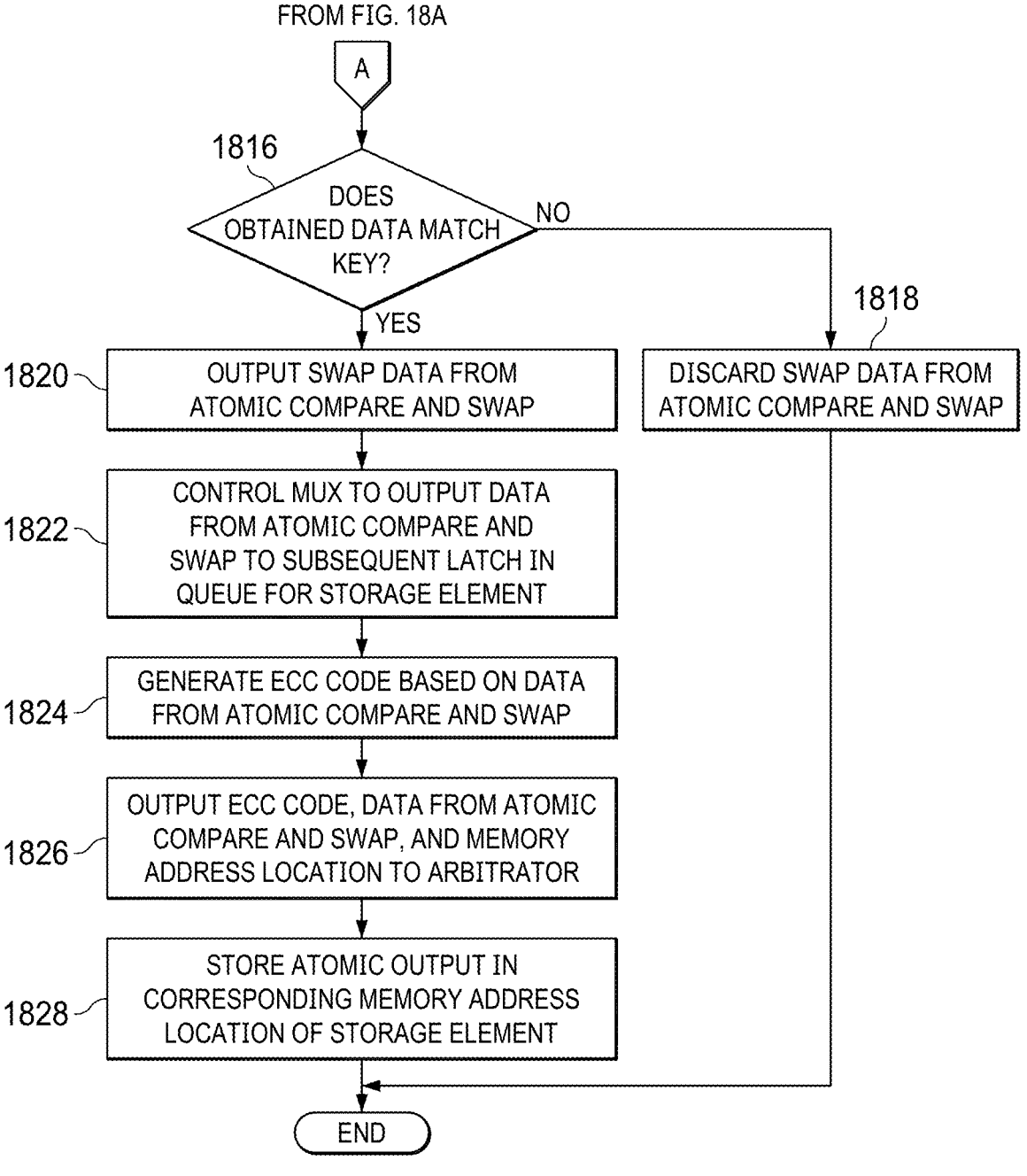

FIGS. 18A and 18B illustrate an example flowchart representative of example machine readable instructions 1800 that may be executed by the example L1 cache 110 of FIGS.

1-5 to perform an atomic compare and swap operation, in conjunction with the above Sections 6 and/or 17. However, the flowchart may be described in conjunction with any atomic operation or a histogram operation. Although the instructions of FIGS. 18A and 18B are described in conjunction with the L1 cache 110 of FIGS. 1-5, the instructions may be described in conjunction with any type of storage in any type of cache. The instructions of FIGS. 18A and 18B are described in conjunction with the main half of the L1 cache 110 (e.g., the main cache store queue 212, the main storage 214, etc.). However, the instruction of FIGS. 18A and 18B can likewise be used in conjunction with the victim side of the L1 cache 110 (e.g., the victim cache store queue 216, the victim storage 218, etc.).

At block 1802, the cache controller 220 and/or the example latch 402b of the example main cache store queue 212 obtains an atomic compare and swap operation with a key from the example CPU 102. As described above, the atomic compare and swap compares the data at a memory address to a key and performs a write to the memory address with swap data if the previously stored data at the memory address matches the key. At block 1804, the cache controller 220 interfaces with the example MESI RAM 300 to determine the state of the memory address corresponding to the atomic compare and swap operation. As described above in conjunction with FIGS. 3A-3D, the MESI RAM 300 tracks the states of the memory addresses (e.g., shared, modified, inactive, or exclusive). At block 1806, the cache controller 220 interfaces with the example MESI RAM 300 to determine if the state of the memory address is inactive (e.g., the memory addressed is not stored in the L1 cache 110) or is shared (e.g., stored in the L1 cache 110 and stored in another higher level cache).

If the example cache controller 220 determines that the state of the memory address corresponding to the atomic compare and swap is inactive of shared (block 1806: YES), the cache controller 220 causes the example L2 interface 228 to submit an atomic misinformation to higher level cache with an exclusive state request (block 1808). As described above in conjunction with FIG. 4A, if the memory address is stored in the L1 cache 110 and is shared, writing to the data can cause problems if a second core reads and/or writes the data at a different level of cache, because doing so will lead to inconsistent data for the same memory address in different caches. Accordingly, the example L2 interface 228 transmits the exclusive state request to let the higher level cache know that the L1 cache 110 will perform an operation on the cache for more than one cycle so that different writes do not occur in different caches to the same memory address.

At block 1810, the example cache controller 220 causes the example MESI RAM 300 to change the state of the corresponding memory address to exclusive. The MESI RAM 3400 may change the state after submitting the request to higher level cache or after receiving a response from the higher level cache. If the state of the memory address was inactive, the higher level cache will return the data at the memory address, which may be stored in the example main storage 214 and/or input to the example atomic compare component 406. At block 1812, the example cache controller 220 causes the example atomic compare component 406 to obtain the data corresponding to the memory address (e.g., from the example main storage 214 and/or from the higher level cache).

If the example cache controller 220 determines that the state of the memory address does not correspond to the atomic compare and swap is inactive or shared (block 1806:

NO), the example atomic compare component 406 obtains the data corresponding to the memory address from the main storage 214 (block 1814). At block 1816, the cache controller 220 causes the example atomic compare component 406 determines if the obtained data matches the key (e.g., from the atomic swap and compare operation). If the example atomic compare component 406 determines that the obtained data does not match the key (block 1816: NO), the cache controller 220 causes the atomic compare component 406 to discard the swap data to be written from the atomic compare and swap (e.g., the data that was to be stored if the obtained data matched the key) (block 1818). In some examples, atomic compare component 406 outputs the obtained data to rewrite the obtained data back into the main storage 214. If the example atomic compare component 406 determines that the obtained data matches the key (block 1816: YES), the cache controller 220 causes the example atomic compare component 406 outputs the swap data to be written to the memory address (e.g., from the atomic compare and swap operation) to the example MUX 410 (Block 1820).

At block 1822, the example cache controller 220 controls the MUX 410 (e.g., via the select line) to ensure that the output of the atomic compare component 406 is output to the example latch 402d. Accordingly, the swapped data can be passed to the example ECC generation 412 to generate an ECC code for the swapped data (block 1824).

At block 1826, the example ECC generation 412 outputs an ECC code for the swapped data, the swapped data, and the memory address location to the example to the example arbitration manager 414. At block 1828, the cache controller 220 causes the example arbitration manager 414 to store the atomic output (e.g., the manipulated data) in the main storage 214 at the memory address of the atomic operation.

FIG. 19 is an example flowchart representative of example machine readable instructions 1900 that may be executed by the example L1 cache 110 of FIGS. 1-5 to perform in-flight data forwarding and invalidation of write instructions from the CPU 102, in conjunction with the above-Section 7. Although the instructions of FIG. 19 are described in conjunction with the L1 cache 110 of FIGS. 1-5, the instructions may be described in conjunction with any type of storage in any type of cache.

At block 1902, the cache controller 220 obtains a read-miss operation from the tag RAM accesses 204, 206. For example, the main cache controller 222 of the cache controller 220 obtains the read-miss operation when the CPU 102 issues a read operation that does not include a corresponding memory address in the main storage element 214 and/or the victim storage element 214. The cache controller 220 determines a victim to evict from the main storage element 214 (block 1904). For example, the cache controller 220 creates a victim. The victim corresponds to a memory address and a memory location (e.g., cache line) of the main storage element 214 to remove data from.

The cache controller 220 issues a read-invalidate operation to the store queue 212 (block 1906). For example, the cache controller 220 sends an operation to the read port 424 of the store queue in response to receiving the memory address of the victim. The read port 424 obtains an address corresponding to victim (block 1908). For example, the cache controller 220 sends the victim address to the store queue 212 when issuing a read-invalidate operation.

The data store 416 compares the address of the victim to addresses stored in the data store 416 (block 1910). For example, the data store 416 maintains a log of the addresses associated with each value stored in any of the latches 402a,

402b, 402c, 402d, 402e, and/or any of the merging circuits 403a, 403b, and/or 403g. Additionally, the data store 416 stores the victim address corresponding to the read-invalidate operation. The data store 416 determines if any of the addresses in the data store 416 match the address of the victim (block 1912). For example, the data store 416 determines if any of the latches 402a-d include values and/or data corresponding to the victim address. In some examples, the latches 402a-d store outstanding write addresses. The outstanding write corresponds to a write operation has not been completed (e.g., the data of the write operation has not been fully written into the main storage element 214). In some examples, the store queue 212 writes data to a location (e.g., a cache line) in the main storage element 214 that an allocation policy selected to be the victim.

If the data store 416 determines that any of the addresses in the data store 416 match the address of the victim (e.g., block 1912 returns a value YES), the priority multiplexer 418 forwards the data corresponding to the matching addresses to the MUX circuit 314 (block 1914). For example, the data store 416 sends the matching address to the priority multiplexer 418. The priority multiplexer 418 selects the data and/or the values stored in the latches 402a-d that store the victim address. The priority multiplexer 418 sends the selected data to the latch 402e to be forwarded to the MUX circuit 314. The MUX circuit 314 sends the data to the victim storage element 214 and/or the L2 cache 112.

The store queue 212 updates the valid tag in the appropriate latches (e.g., 402a-d) to invalid (block 1916). For example, the latches that store data for the victim address change the valid tag to indicate that the data is invalid. In this manner, the store queue 212 will discontinue writing that data into the main storage element 214. Thus, the example read-invalidate operation 1900 corrects any errors that would occur if an outstanding write attempted to write data into a cache line that no longer held the write operation address.

Figure 20:
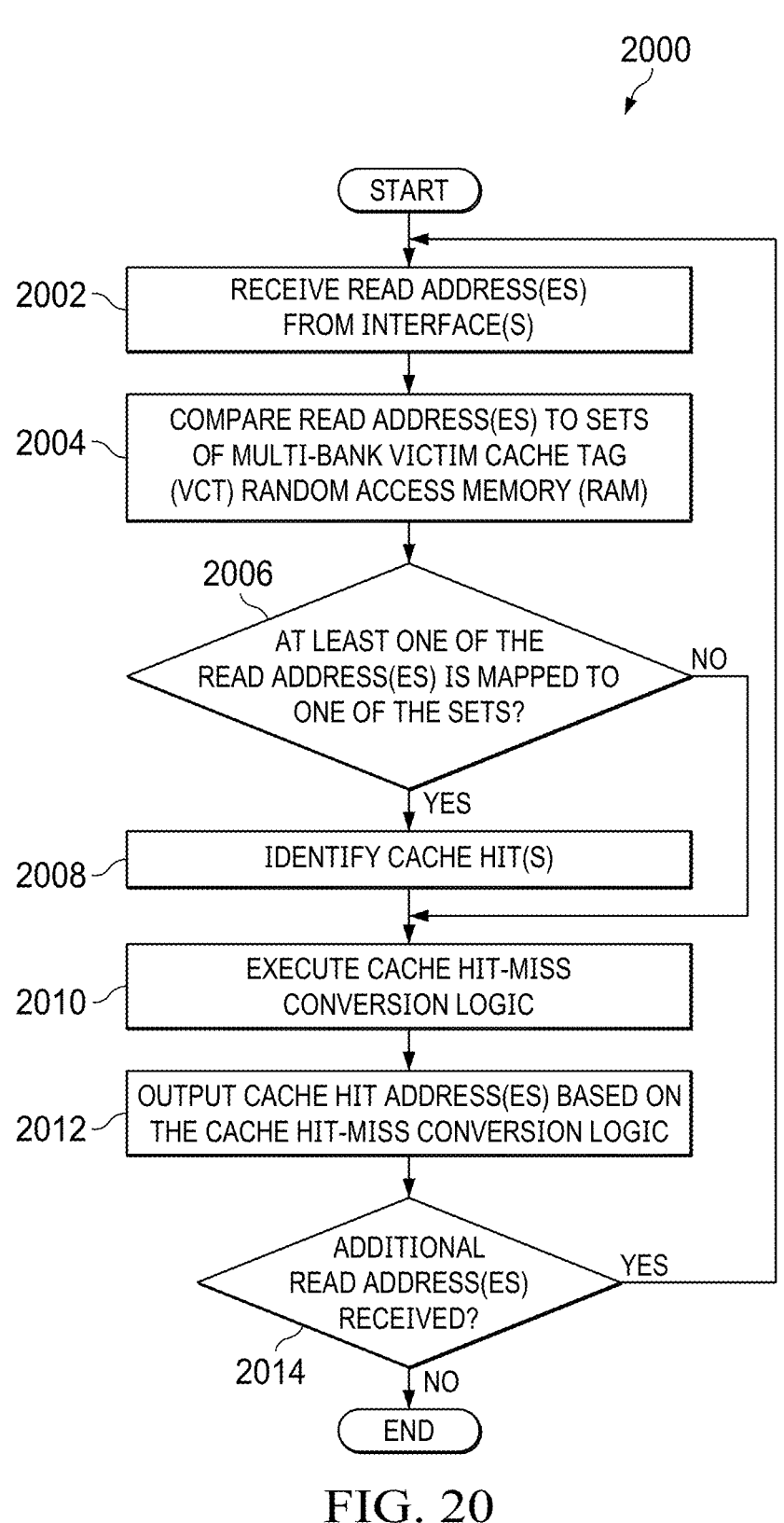

FIG. 20 is an example flowchart representative of example machine readable instructions 2000 that may be executed by the example L1 cache 110 of FIGS. 1-5 to determine whether an address is stored in a victim cache, such as the victim storage 218 of FIG. 2 as described above. Although the instructions of FIG. 20 are described in conjunction with the L1 cache 110 of FIGS. 1-5, the instructions may be described in conjunction with any type of storage in any type of cache. The instructions of FIG. 20 are described in conjunction with the victim side of the L1 cache 110 (e.g., the victim cache store queue 216, the victim storage 218, etc.). However, the instructions of FIG. 20 can likewise be used in conjunction with the main half of the L1 cache 110 (e.g., the main cache store queue 212, the main storage 214, etc.).

The machine readable instructions 2000 begin at block 2002, at which the L1 cache 110 receives read address(es) from interface(s). For example, the L1 cache 110 can receive ADP_ADDR_E2_DP0 from the scalar interface 502 of the CPU 102 of FIG. 1, SNP_ADDR_E2_DP0 from the snoop interface of FIGS. 3 and/or 5, and/or ADP_ADDR_E2_DP1 from the vector interface 502 of the CPU 102 as depicted in FIG. 8B.

At block 2004, the L1 cache 110 compares read address(es) to sets of a multi-bank victim cache tag (VCT) random access memory (RAM). For example, the first comparators 850 of FIG. 8B can compare a first read address of ADP_ADDR_E2_DP0 to respective addresses stored in the sets 846 of FIG. 8B. In other examples, the second comparators 852 of FIG. 8B can compare a second read address of ADP_ADDR_E2_DP1 to respective addresses stored in the sets 846.

At block 2006, the L1 cache 110 determines whether at least one of the read address(es) is mapped to one of the sets. For example, one of the first comparators 850 can assert a logic one in response to the read address matching the set 846 that the one of the first comparators 850 is associated with. In other examples, the second comparators 852 can generate HIT_DP1 based on the comparisons. In other examples, the one of the first comparators 850 can generate a logic low in response to the read address not matching the set 846 that the one of the first comparators 850 corresponds to.

At block 2008, the L1 cache 110 identifies cache hit(s). For example, the first comparators 850 can generate HIT_DP0 based on the comparisons. In such examples, the first comparators 850 can identify a cache hit in response to at least one bit in the HIT_DP0 bit vector being a logic one (e.g., having a bit value of 1). In some such examples, the first comparators 850 can identify a cache miss in response to none of the bits in the HIT_DP0 bit vector being a logic one. In other examples, the second comparators 852 can generate HIT_DP1 based on the comparisons. In such examples, the second comparators 852 can identify a cache hit in response to at least one bit in the HIT_DP1 bit vector being a logic one. In some such examples, the second comparators 852 can identify a cache miss in response to none of the bits in the HIT_DP1 bit vector being a logic one.

At block 2010, the L1 cache 110 executes cache hit-miss conversion logic. For example, the first address encoder logic circuit 854 can invoke at least one of the first AND gate 864A, the third comparator 870A, or the fourth comparator 872A of FIG. 8B to convert a cache hit to a cache miss or vice versa in response to example operating conditions. In other examples, the second address encoder logic circuit 856 can invoke at least one of the second AND gate 864B, the fifth comparator 870B, or the sixth comparator 872B of FIG. 8B to convert a cache hit to a cache miss or vice versa in response to example operating conditions. An example process that may be used to implement block 2010 is described below in connection with FIG. 21.

At block 2012, the L1 cache 110 outputs cache hit address(es) based on the cache hit-miss conversion logic. For example, the first address encoder logic circuit 854 can output HIT_ADDR0 in response to executing cache hit-miss conversion logic. In other examples, the second address encoder logic circuit 856 can output HIT_ADDR1 in response to executing cache hit-miss conversion logic.

At block 2014, the L1 cache 110 determines whether there additional read address(es) have been received. If, at block 2014, the L1 cache 110 determines additional read address(es) have been received, control returns to block 2002 to receive the read address(es) from the interface(s). If, at block 2014, the L1 cache 110 determines no additional read address(es) have been received, the example machine readable instructions 2000 of FIG. 20 conclude.

FIG. 21 is an example flowchart representative of example machine readable instructions 2100 that may be executed by the example L1 cache 110 of FIGS. 1-5 to execute cache hit-miss conversion logic as described above. The example machine readable instructions 2100 of FIG. 21 can be executed to implement block 2010 of FIG. 20. Although the instructions of FIG. 21 are described in conjunction with the L1 cache 110 of FIGS. 1-5, the instructions may be described in conjunction with any type of storage in any type of cache. The instructions of FIG. 21 are described in conjunction with the victim side of the L1 cache 110 (e.g., the victim cache store queue 216, the victim storage 218, etc.). However, the instructions of FIG. 21 can likewise be used in conjunction with the main half of the L1 cache 110 (e.g., the main cache store queue 212, the main storage 214, etc.).

The machine readable instructions 2100 of FIG. 21 begin at block 2102, at which the L1 cache 110 determines whether a new address from a first interface has been written to victim cache in a later pipeline stage. For example, the first decoder 860A can receive VTA_WR_SET0 at the E2 pipeline stage, which can be representative of the scalar interface 502 of FIG. 5 writing an address to the victim storage 218 at the E3 pipeline stage.

If, at block 2102, the L1 cache 110 determines that a new address from the first interface is being written to the victim cache in a later pipeline stage, control proceeds to block 2106 to compare the new address to the address of the cache hit. If, at block 2102, the L1 cache 110 determines that a new address from the first interface is not being written to the victim cache in a later pipeline stage, then, at block 2104, the L1 cache 110 determines whether a new address from a second interface has been written to victim cache in a later pipeline stage. For example, the second decoder 860B can receive VTA_WR_SET1 at the E2 pipeline stage, which can be representative of the scalar interface 502 of FIG. 5 writing an address to the victim storage 218 at the E3 pipeline stage.

If, at block 2104, the L1 cache 110 determines that a new address from the second interface is not being written to the victim cache in a later pipeline stage, control returns to block 2012 of the example machine readable instructions 2000 of FIG. 20 to output the cache hit address(es) based on the cache hit-miss conversion logic.

If, at block 2104, the L1 cache 110 determines that a new address from the second interface is being written to the victim cache in a later pipeline stage, then at block 2106, the L1 cache 110 compares the new address to the address of the cache hit. For example, the first AND gate 864A can assert a logic one in response to an address of VTAG_WR_SET0 not matching an address of HIT_DP0. In other examples, the third comparator 870A can compare an address of HIT_DP0 to an address being written to the victim storage 218 by the scalar interface 502. In yet other examples, the fourth comparator 872A can compare an address of HIT_DP0 to an address being written to the victim storage 218 by the vector interface 504.

In response to comparing the new address to address of the cache hit at block 2106, control proceeds to block 2108 to determine whether the addresses match. If, at block 2108, the L1 cache 110 determines that the addresses do not match, control returns to block 2012 of the example machine readable instructions 2000 of FIG. 20 to output the cache hit address(es) based on the cache hit-miss conversion logic.

If, at block 2108, the L1 cache 110 determines that the addresses match, then, at block 2110, the L1 cache 110 determines whether a cache hit or a cache miss is identified. For example, the first AND gate 864A, the third comparator 870A, and/or the fourth comparator 872A can determine that there is a cache hit of the address of ADP_ADDR_E2_DP0 in the victim storage 218 based on HIT_DP0 including at least one bit value of 1. In other examples, the second AND gate 864B, the fifth comparator 870B, and/or the sixth comparator 872B can determine that there is a cache hit of the address of ADP_ADDR_E2_DP1 in the victim storage 218 based on HIT_DP1 including at least one bit value of 1.

If, at block 2110, the L1 cache 110 determines that a cache hit is identified, then, at block 2112, the L1 cache 110 converts the cache hit to a cache miss. For example, the first AND gate 864A can output a logic low to convert a cache hit to a cache miss. In other examples, the second AND gate 864B can output a logic low to convert a cache hit to a cache miss. In response to converting the cache hit to a cache miss at block 2112, control returns to block 2012 of the example machine readable instructions 2000 of FIG. 20 to output the cache hit address(es) based on the cache hit-miss conversion logic.

If, at block 2110, the L1 cache 110 determines that a cache miss is identified, control proceeds to block 2114 to convert the cache miss to a cache hit in response to the new address matching a write from one(s) of the interface(s) allocating into victim cache. For example, the third comparator 870A and/or the fourth comparator 872A can assert a logic one to convert a cache miss to a cache hit in response to ADP_ADDR_E2_DP0 matching an address of a write operation from either DP0 or DP1. In other examples, the fifth comparator 870B and/or the sixth comparator 872B can assert a logic one to convert a cache miss to a cache hit in response to ADP_ADDR_E2_DP1 matching an address of a write operation from either DP0 or DP1. In response to converting the cache miss to a cache hit at block 2114, control returns to block 2012 of the example machine readable instructions 2000 of FIG. 20 to output the cache hit address(es) based on the cache hit-miss conversion logic.

Figure 22:
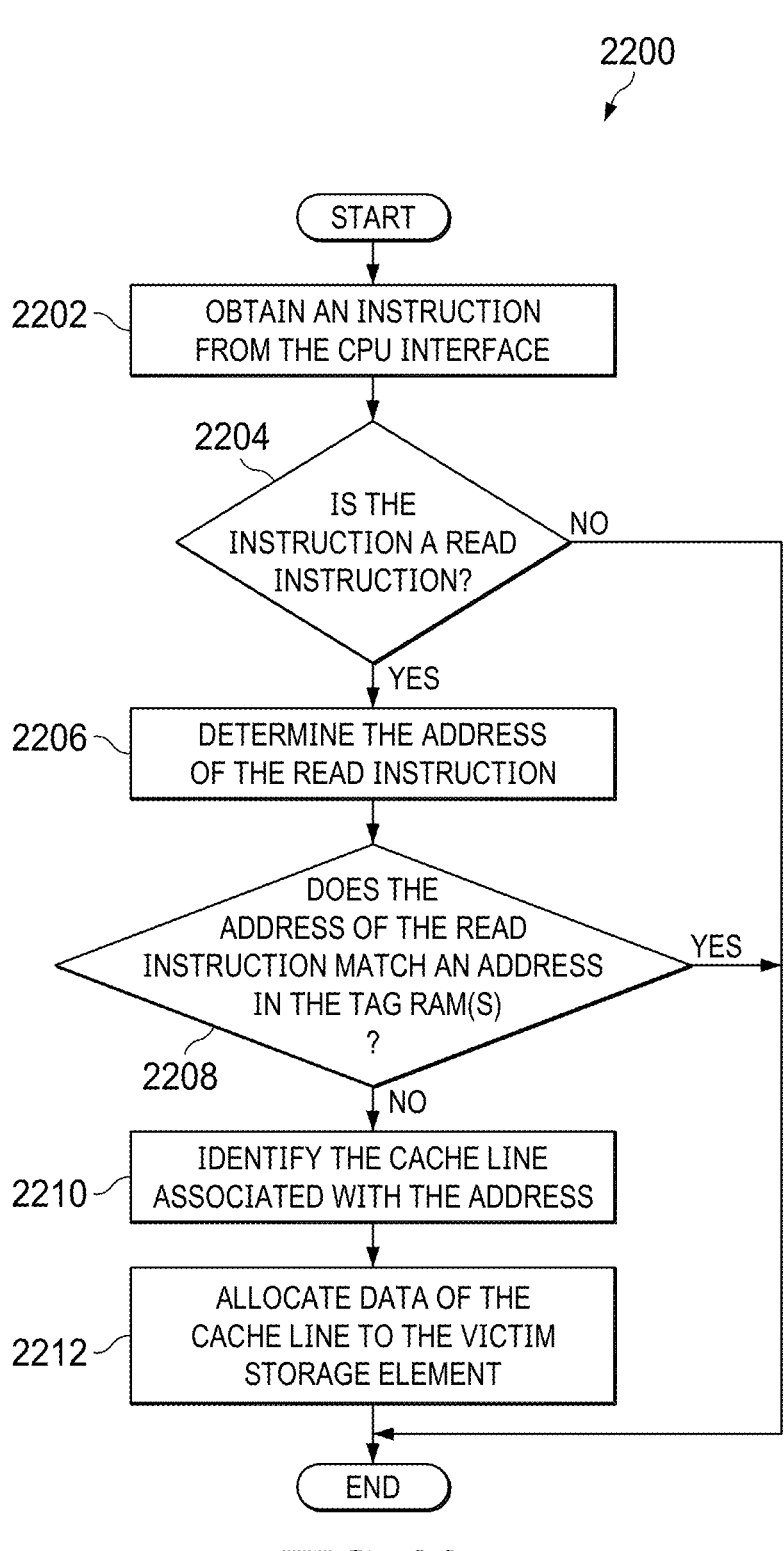

FIG. 22 is an example flowchart representative of example machine readable instructions 2200 that may be executed by the example L1 cache 110 of FIGS. 1-5 to perform data allocation in the main storage 214, in conjunction with the above description. Although the instructions of FIG. 22 are described in conjunction with the L1 cache 110 of FIGS. 1-5, the instructions may be described in conjunction with any type of storage in any type of cache.

The example main cache controller 222 (FIG. 2) obtains an instruction from the CPU interface 202 (FIG. 2). For example, the CPU interface 202 provides an instruction to the cache controller 220, the cache controller 220 propagates the instruction to the main cache controller 222.

The main cache controller 222 determines if the instruction is a read instruction (block 2204). For example, the main cache controller 222 analyzes the request in the instruction to determine if the main cache controller 222 is to read data from the main storage 214 and provide it to the CPU interface 202 or to perform a different task for the CPU 102.

If the main cache controller 222 determines the instruction is a read instruction (e.g., block 2204 returns a value YES), the main cache controller 22 determines the address of the read instruction (block 2206). For example, the main cache controller 222 determines where the data is to be read from in the main storage 214. In some examples, the main tag RAM access 204 determines the address of the read instruction.

The main cache controller 222 determines if the address of the read instruction matches an address in the tag RAMs 208, 210. For example, the cache controller 220 may obtain hit/miss results from the tag RAM access(es) 204, 206 and determine if the address is available in the main storage 214 and/or victim storage 218. The main cache controller 222 determines the read instruction is a miss (e.g., block 2208 returns a value NO), the main cache controller 223 identifies the cache line associated with the address (block 2210). For example, the main cache controller 222 is a direct mapped cache, and the address of the read instruction can only be stored in one location (e.g., at one cache line) of the main storage 214.

The main cache controller 222 allocates data of the cache line to the victim storage 218 (block 2212). For example, the main cache controller 222 allocates data from the direct mapped cache line to the victim storage 214. The main cache controller 222 allocates data regardless of the MESI state of that data. Such an allocation reduces latency of the main cache controller 222 and the overall L1 cache 110 by allocated any line in the main storage 214 to the victim storage 218.

Figure 23:
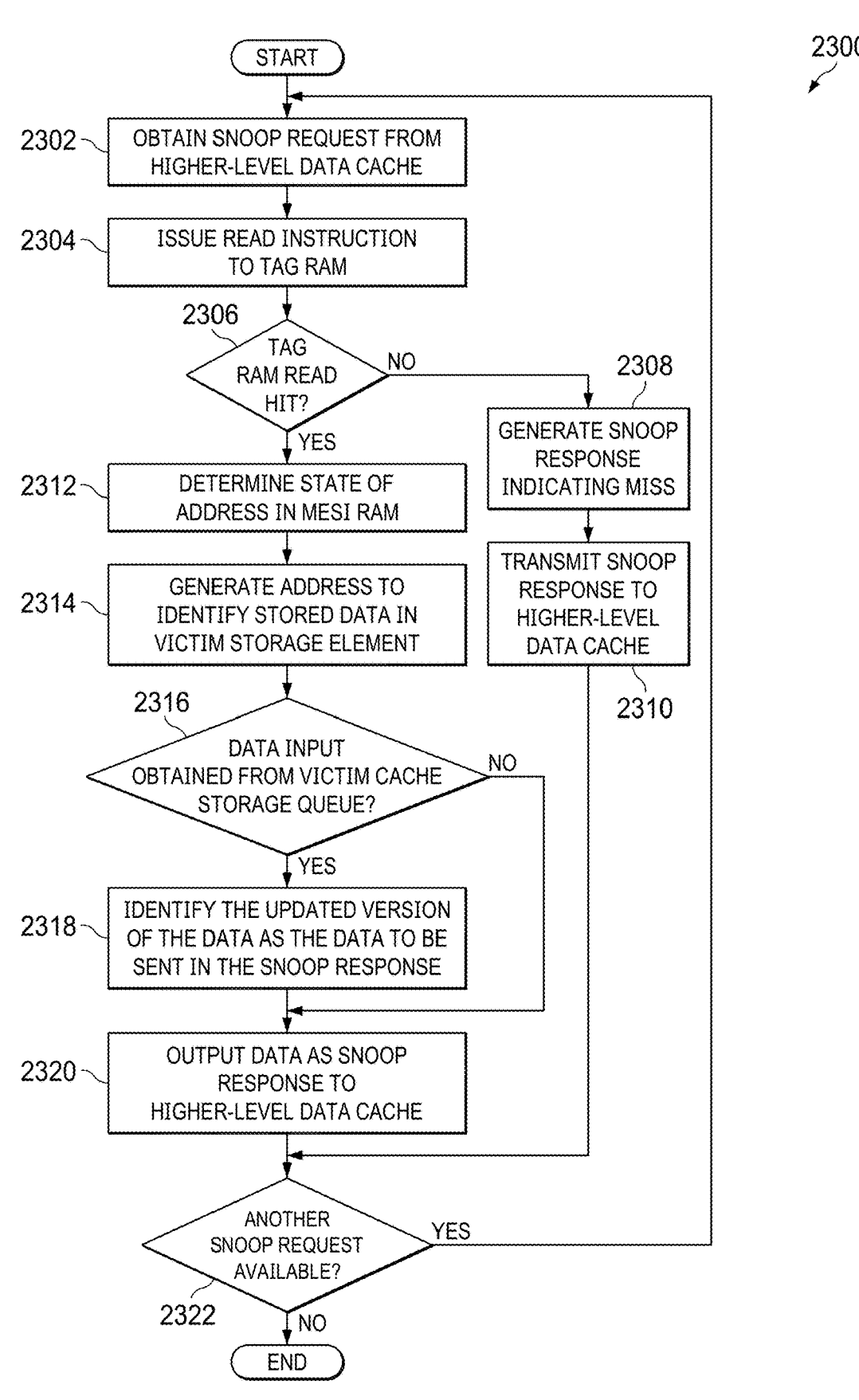

FIG. 23 is an example flowchart representative of example machine readable instructions 2300 that may be executed by the example L1 cache 110 of FIGS. 1-5 to facilitate a snoop request, in conjunction with the above Section 10. At block 2302, the snoop address 502 (e.g., the snoop interface) obtains the snoop request from a higher-level data cache (e.g., the L2 data cache 112). (Block 2302). In response, the snoop address 502 issues a read instruction to the tag RAM 210. (Block 2304). In examples disclosed herein, the read instruction is issued to the tag RAM 210 to identify whether the victim storage 218 includes the data requested via the snoop address 502.

At block 2306, the comparison logic 306c determines whether the read issued to the tag RAM 210 was a hit. (Block 2306). In the event the comparison logic 306c determines the read issued to the tag RAM 210 is not a hit (e.g., the control of block 2306 returns a result of NO), the victim storage 218 generates a snoop response indicating a miss occurred. (Block 2308). Additionally, the victim storage 218 transmits the snoop response back to the higher-level data cache (e.g., the L2 data cache 112). (Block 2310).

Alternatively, in the event the comparison logic 306 determines the read issued to the tag RAM 210 is a hit (e.g., the control of block 2306 returns a result of YES), the comparison logic 306c determines the state of the address associated with the read instruction in the MESI RAM 300. (Block 2312). At block 2312, the comparison logic 306 may also store the state of the address as identified responsive to the read instruction in the MESI RAM 300.

At block 2314, the example address encoder 326c generates an address value for use by the victim storage 218 in obtaining the data. (Block 2314). The address encoder 326c encodes an address of the tag RAM 210 to a form that is interpretable by the victim storage 218. For example, the tag RAM 210 may store 16-bit memory addresses while the victim storage 218 stores 4-bit memory addresses corresponding to the 16-bit memory addresses. Thus, the address encoder 326 may transform the 16-bit memory address into a 4-bit memory address to locate and/or enter the corresponding memory address in the victim storage 218.

At block 2316, the example response multiplexer 508 determines whether a data input is obtained from the victim cache store queue 216. (Block 2316). In the event the response multiplexer 508 determines no data has been input from the victim cache store queue 216 (e.g., the control of block 2316 returns a result of NO), the response multiplexer 508 outputs the data identified based on the address provided by the address encoder 326c as the snoop response to the higher-level data cache (e.g., the L2 data cache 112). (Block 2320).

Alternatively, in the event the response multiplexer 508 determines data has been input from the victim cache store queue 216 (e.g., the control of block 2316 returns a result of YES), the response multiplexer 508 identifies the updated version of the data as the data to be sent in the snoop response. (Block 2318). In response to the execution of the control illustrated in block 2318, the response multiplexer 508 outputs the data identified based on the address provided by the address encoder 326c as the snoop response to the higher-level data cache (e.g., the L2 data cache 112). (Block 2320).

At block 2322, the snoop address component 506 (e.g., the snoop interface) determines whether an additional snoop request is available. (Block 2322). In the event the snoop address component 506 (e.g., the snoop interface) determines an additional snoop request is available (e.g., the control of block 2322 returns a result of YES), the process 2300 returns to block 2302. Alternatively, in the event the snoop address component 506 (e.g., the snoop interface) determines an additional snoop request is not available (e.g., the control of block 2322 returns a result of NO), the process 2300 stops.

FIGS. 24, 25, 26, 27, 28, and 29A, 29B-1, and 29B-2 are example flowcharts representative of example machine readable instructions that may be executed by the example L1 cache 110 of FIGS. 1-5 to perform eviction of data in the victim storage 218, in conjunction with the above Section 11. Although the instructions of FIGS. 24, 25, 26, 27, 28, and 29A, 29B-1, and 29B-2 are described in conjunction with the L1 cache 110 of FIGS. 1-5, the instructions may be described in conjunction with any type of storage in any type of cache.

Figure 24:
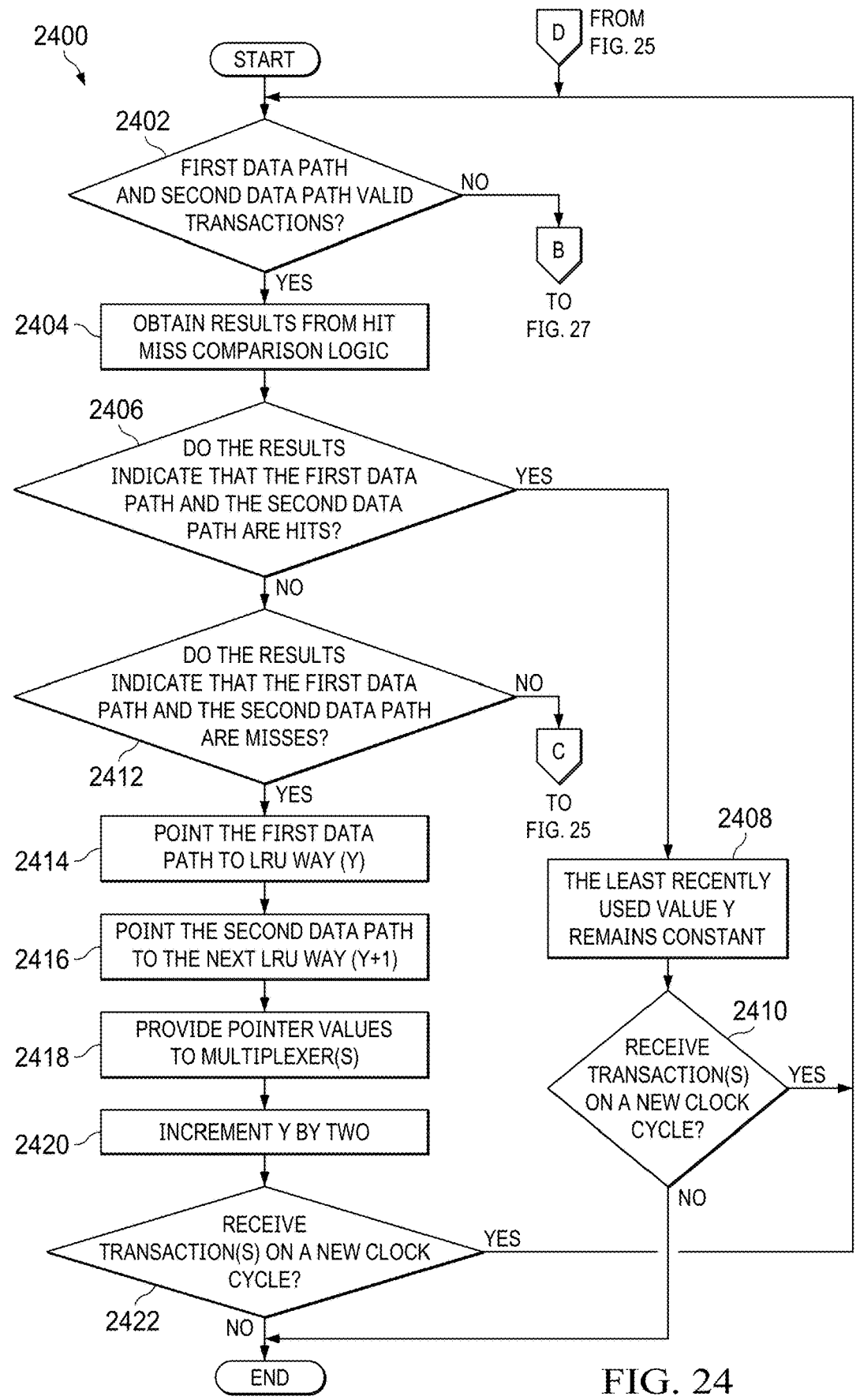
Figure 25:
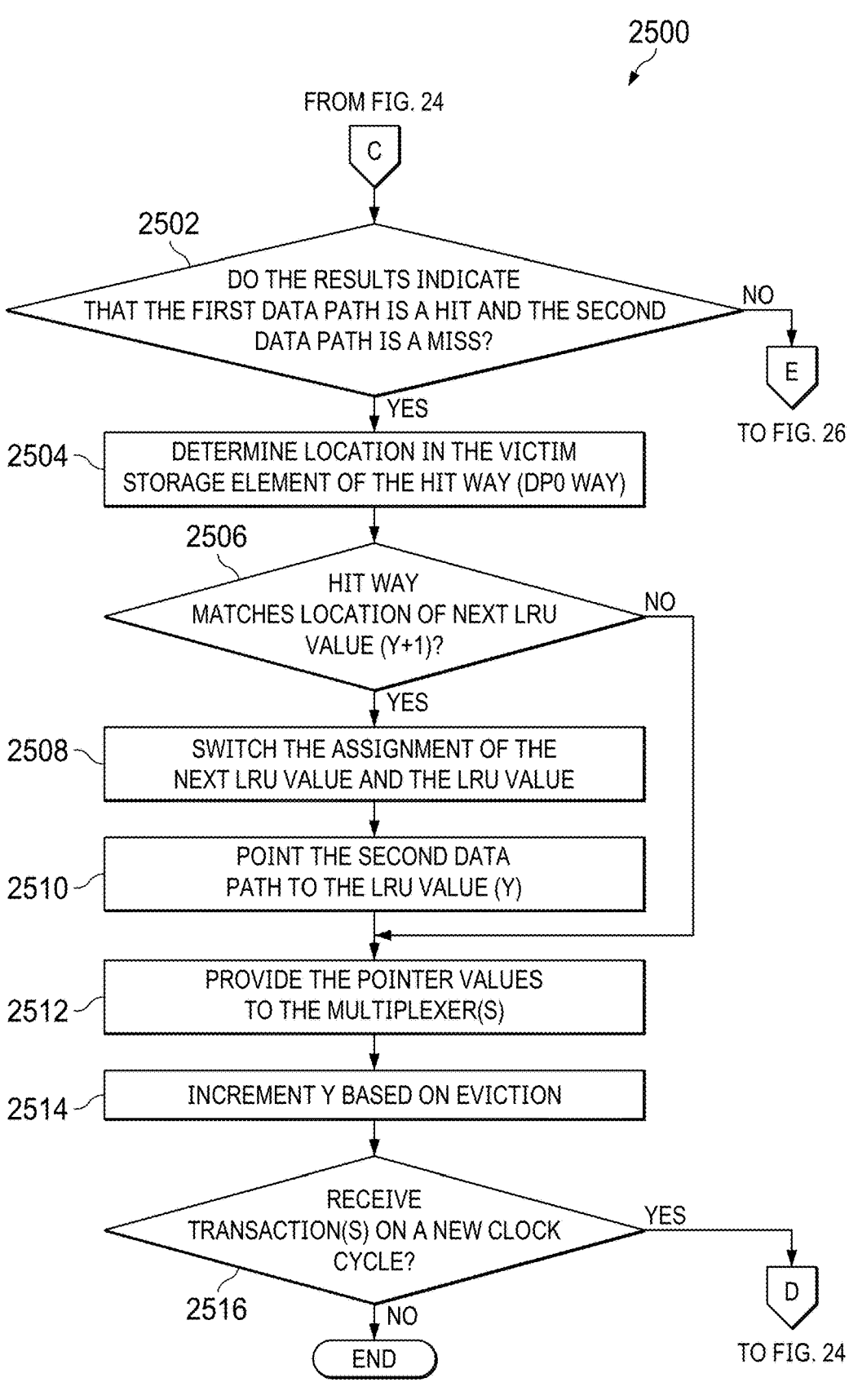
Figure 26:
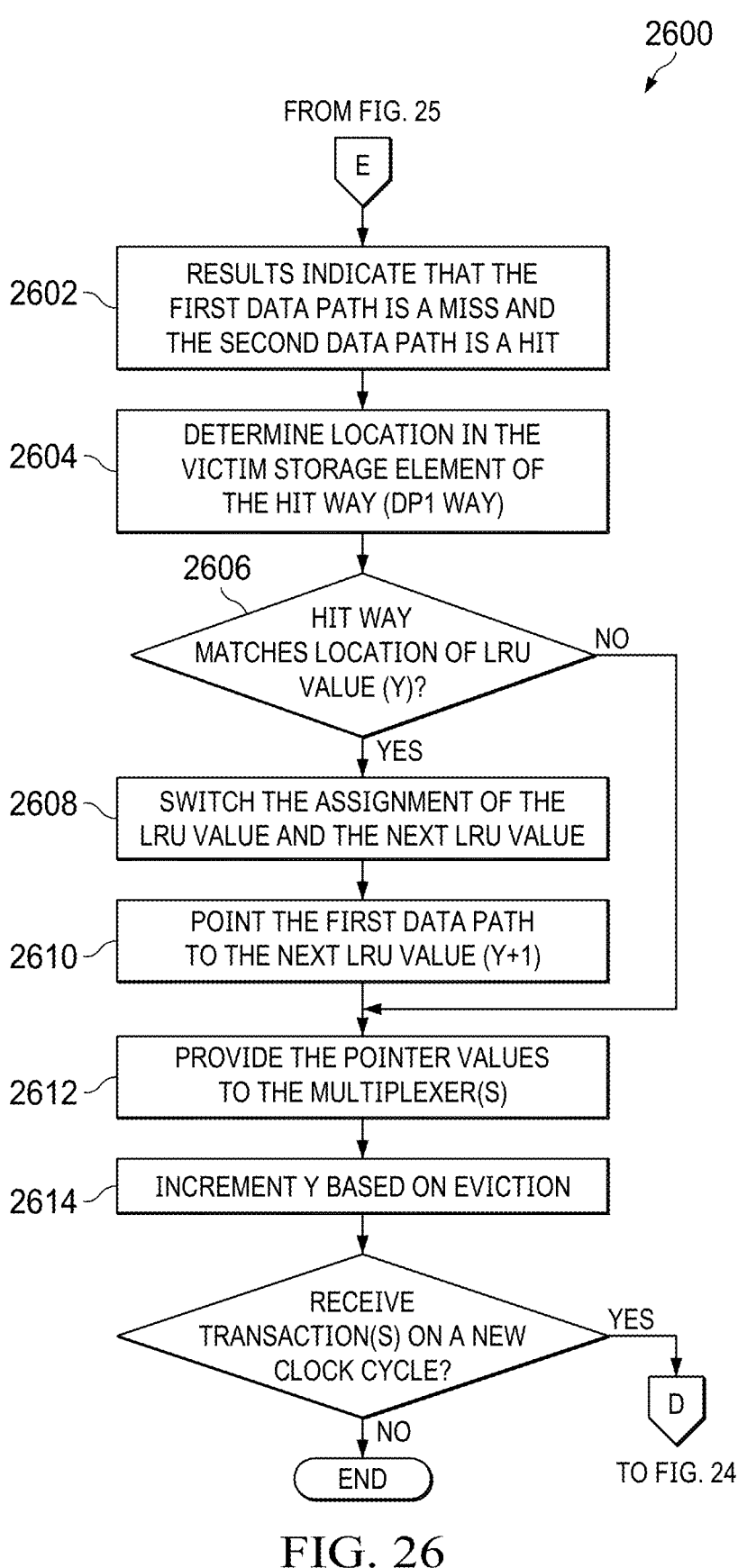
Figure 28:
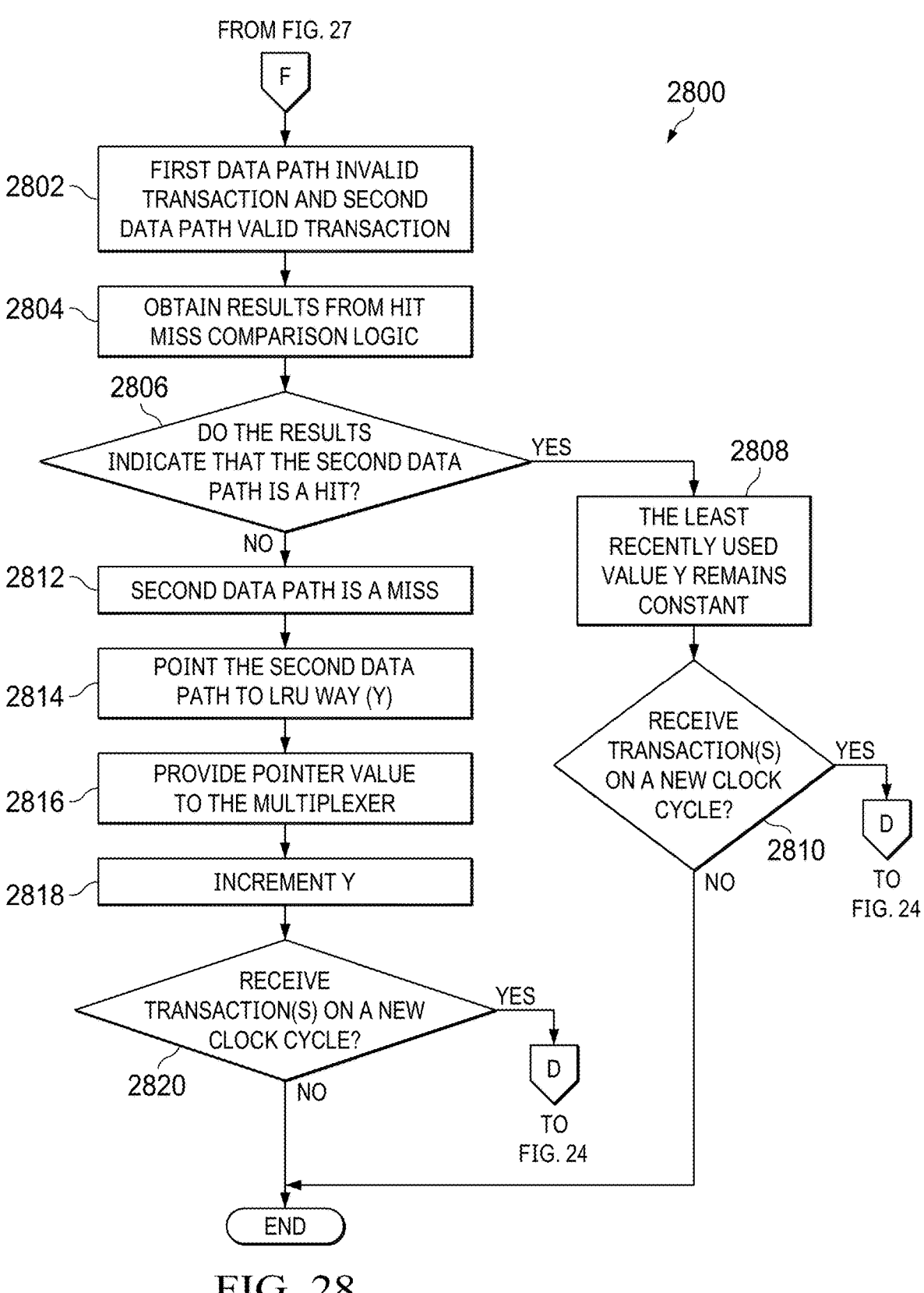

FIG. 24 illustrates an example first operation 2400 of the replacement policy component 308 (FIGS. 3 and 5) when the first and second data paths (DP0 and DP1) include valid transactions. FIG. 25 illustrates an example second operation 2500 of the replacement policy component 308 when the first and second data paths (DP0 and DP1) include valid transactions. FIG. 26 illustrates an example third operations 2600 of the replacement policy component 308 when the first and second data paths (DP0 and DP1) include valid transactions. FIG. 27 illustrates an example valid-invalid operation 2700 of the replacement policy component 308 when the first data path is a valid transaction and the second data path is an invalid transaction. FIG. 28 illustrates an example invalid-valid operation 2800 of the replacement policy component 308 when the first data path is an invalid transaction and the second data path is a valid transaction. FIG. 29A, FIG. 29B-1, and FIG. 29B-2 illustrate an incrementing operation 2900 of the replacement policy component 308 when a data path is allocating data to the victim storage.

Turning to FIG. 24, the example scalar interface 502 and the example vector interface 504 determine if the first and second data paths are valid transactions (block 2402). For example, the scalar interface 502 determines if the first data path DP0 is accessing (e.g., requesting a read or write operation) the victim storage 218 and the vector interface 504 determines if the second data path DP1 is accessing the victim storage 218. When the interfaces 502, 504 determine the first and second data paths are valid transactions (e.g., block 2402 returns a value YES), the replacement policy component 308 obtains results from the hit-miss comparison logic 306a, 306b (block 2404). For example, the replacement policy component 308 obtains results indicating whether the first data path access and the second data path access have matching addresses in the tag RAM 210 or do not.

The example replacement policy component 308 determines if the results indicate that both of the transactions of the first data path and the second data path are hits (block 2406). When the replacement policy component 308 determines DP0 and DP1 are both hits (e.g., block 2406 returns a value yes), the least recently used value Y remains constant (block 2408). For example, since neither the first data path nor the second data path needs to evict data, the LRU value does not need to change.

The example replacement policy component 308 determines if a transaction on a new clock cycle has been received (block 2410). For example, if the replacement policy component 308 obtains hit-miss results corresponding to different transactions (e.g., accesses) than the previous accesses (e.g., block 2410 returns a value YES) then control returns to block 2402. If the replacement policy component 308 does not obtain hit-miss results corresponding to different transactions (e.g., accesses) than the previous accesses (e.g., block 2410 returns a value NO) then the first operation 2400 ends.

When the replacement policy component 308 determines the results do not indicate that both of the transactions of the first data path and the second data path are hits (e.g., block 2406 returns a value NO), the replacement policy component 308 determines if the results indicate that both of the transactions of the first data path and the second data path are misses (block 2412). For example, the replacement policy component 308 determines if both results from the first hit-miss comparison logic 306a and the second hit-miss comparison logic 306b indicate neither of the accesses matched the addresses in the tag RAM 210.

If DP0 and DP1 missed (e.g., block 2412 returns a value YES), then the replacement policy component 308 points the first data path to the LRU way (Y) (block 2414). The replacement policy component 308 points the second data path to the next LRU way (Y+1) (block 2416). For example, the victim storage 218 includes n number of ways, each way has a location (e.g., slot 1, slot 2, slot n), each way is mapped to an address, and each way includes data. The replacement policy component 308 initializes a value Y to be equal to the least recently used way in the victim cache. For example, the LRU way is slot 2, thus Y is equal to slot 2. When the replacement policy component 308 points the first data path to the LRU way (block 2414), the replacement policy component 308 is assigning the location of Y in the victim storage 218 to DP0 for eviction. Similarly, when the replacement policy component 308 points the second data path to the next LRU way (block 2416), the replacement policy component 308 is assigning the location of Y+1 in the victim storage 218 to DP1 for eviction.

The example replacement policy component 308 provides the pointer values to the example multiplexers 330a, 330b (block 2418). For example, the replacement policy component 308 provides a location (Y) of the way that is to be evicted by DP0 from the victim storage 218 to the multiplexer 330a and a location (Y+1) of the way that is to be evicted by DP1 to the multiplexer 330b. In some examples, the selecting input of the multiplexer 330a and 330b selects the replacement policy component input, the address read 332a and 332b reads the input of the replacement policy component 308 and evicts the ways indicated by location Y and location Y+1.

The example replacement policy component 308 increments Y by two (block 2420). For example, the replacement policy component 308 assigns Y to a location in the victim storage 218 that is two slots away from the current value of Y (e.g., if Y=slot 1, then Y=slot 3 after incrementing). In this manner, during the next clock cycle, the replacement policy component 308 is provided with an updated and appropriate Y value. Alternatively and/or additionally, the replacement policy component 308 increments indicators for the first and second data paths by two.

The example replacement policy component 308 determines if a transaction on a new clock cycle has been received (block 2422). For example, if the replacement policy component 308 obtains hit-miss results corresponding to different transactions (e.g., accesses) than the previous accesses (e.g., block 2422 returns a value YES) then control returns to block 2402. If the replacement policy component 308 does not obtain hit-miss results corresponding to different transactions (e.g., accesses) than the previous accesses (e.g., block 2420 returns a value NO) then the first operation 2400 ends.

Turning to FIG. 25, when the replacement policy component 308 determines the results indicate that the first data path and the second data path are not both misses (e.g., block 2412 returns a value NO), the example replacement policy component 308 determines if the results indicate that the first data path is a hit and the second data path is a miss (block 2502).

If the example replacement policy component 308 determines that the first data path is a hit and the second data path is a miss (e.g., block 2502 returns a value YES), then the replacement policy component determines the location in the victim storage 218 of the hit way (DP0 Way) (block 2504). For example, the replacement policy component 308 analyzes the address of DP0 and identifies the location in the victim storage 218 that includes that address. In some examples, the replacement policy component 308 may include an updated list of the elements in the victim storage 218. In other examples, the replacement policy component 308 retrieves and/or obtains information from the tag RAM 210 regarding the locations of the addresses stored in the victim storage 218.

The example replacement policy component 308 determines if the hit way (DP0 Hit Way) matches the location of the next LRU value (Y+1) (block 2506). For example, the replacement policy component 308 may compare the location of the hit way containing the address of DP0 to the location value assigned to Y+1. If the replacement policy component 308 determines that the locations are match (e.g., block 2506 returns a value YES), then the replacement policy component 308 switches the assignment of the next LRU value and the LRU value (block 2508). For example, the second data path DP1 pointer is to be assigned to the LRU value (e.g., location Y) instead of the next LRU value (e.g., location Y+1). The replacement policy component 308 switches the assignment to avoid the second data path DP1 evicting the DP0 Hit Way. In some examples, the replacement policy component 308 decrements an indicator to indicate the LRU way of the victim storage 214 to be evicted by the second data path DPL.

The replacement policy component 308 points the second data path to the LRU way (Y) (block 2510). For example, the replacement policy component 308 assigns the value of Y (e.g., the location of the LRU way) to the second data path DP1 for eviction.

The example replacement policy component 308 provides the pointer values to the multiplexer(s) 330a, 330b (block 2512). For example, the replacement policy component 308 provides a location (Y) of the way that is to be evicted by DP1 from the victim storage 218 to the multiplexer 330b. In some examples, when the hit way does not match the location of the next LRU value (e.g., block 2506 returns a value NO), the replacement policy component 308 provides the pointer value Y+1 and the location of the hit way to the multiplexer(s) 330a, 330b. For example, the original assignment of the next LRU value to the second data path DP1 remains the same.

The example replacement policy component 308 increments Y based on eviction (block 2514). For example, if the assignments of LRU values to data paths were switched (e.g., DP1 pointer points to the LRU value Y), then the replacement policy component 308 increments Y by one. Otherwise, the replacement policy component 308 increments Y by two. In this manner, during the next clock cycle, the replacement policy component 308 is provided with an updated Y value and Y+1 value. Alternatively and/or additionally, the replacement policy component 308 increments indicators for the first and second data paths based on eviction.

The example replacement policy component 308 determines if a transaction on a new clock cycle has been received (block 2516). For example, if the replacement policy component 308 obtains hit-miss results corresponding to different transactions (e.g., accesses) than the previous accesses (e.g., block 2516 returns a value YES) then control returns to block 2402 of FIG. 24. If the replacement policy component 308 does not obtain hit-miss results corresponding to different transactions (e.g., accesses) than the previous accesses (e.g., block 2516 returns a value NO) then the second operation 2500 ends.

Turning to FIG. 26, when the replacement policy component 308 determines the results indicate that the first data path is not a hit and the second data path is not a miss (e.g., block 2602 returns a value NO), the example replacement policy component 308 determines that the results indicate that the first data path is a miss and the second data path is a hit (block 2602).

The example replacement policy component 308 determines the location in the victim storage 218 of the hit way (DP1 Way) (block 2604). For example, the replacement policy component 308 analyzes the address of DP1 and identifies the location in the victim storage 218 that includes that address.

The example replacement policy component 308 determines if the hit way (DP1 Way) matches the location of the LRU value (Y) (block 2606). For example, the replacement policy component 308 may compare the location of the hit way containing the address of DP1 to the location value assigned to Y. If the replacement policy component 308 determines that the locations match (e.g., block 2606 returns a value YES), then the replacement policy component 308 switches the assignment of the LRU value and the next LRU value (block 2608). For example, first data path DP0 pointer is to be assigned to the next LRU value (e.g., location Y+1) instead of the LRU value (e.g., location Y). The replacement policy component 308 switches the assignment to avoid the first data path DP0 evicting the DP1 Hit Way. In some examples, the replacement policy component 308 increments an indicator to indicate the next LRU way in the victim storage 214 to be evicted by the first data path DP0.

The replacement policy component 308 points the first data path to the next LRU value (Y+1) (block 2610). For example, the replacement policy component 308 assigns the value of Y+1 (e.g., the location of the next LRU way) to the first data path DP0 for eviction.

The example replacement policy component 308 provides the pointer values to the multiplexer(s) 330a, 330b (block 2612). For example, the replacement policy component 308 provides a location (Y+1) of the way that is to be evicted, by DP0, from the victim storage 218 to the multiplexer 330a. In some examples, when the hit way does not match the location of the LRU value (e.g., block 2506 returns a value NO), the replacement policy component 308 provides the pointer value Y and the location of the hit way to the multiplexer(s) 330*a*, 330*b*. For example, the original assignment of the LRU value to the first data path DP0 remains the same.

The example replacement policy component 308 increments Y based on eviction (block 2614). For example, if the assignments of LRU values to data paths were switched (e.g., DP0 pointer points to the next LRU value Y+1), then the replacement policy component 308 increments Y by two. Otherwise, the replacement policy component 308 increments Y by one. In this manner, during the next clock cycle, the replacement policy component 308 is provided with an updated Y value. Alternatively and/or additionally, the replacement policy component 308 increments indicators for the first and second data paths based on eviction.

The example replacement policy component 308 determines if a transaction on a new clock cycle has been received (block 2616). For example, if the replacement policy component 308 obtains hit-miss results corresponding to different transactions (e.g., accesses) than the previous accesses (e.g., block 2616 returns a value YES) then control returns to block 2402 of FIG. 24. If the replacement policy component 308 does not obtain hit-miss results corresponding to different transactions (e.g., accesses) than the previous accesses (e.g., block 2616 returns a value NO) then the third operation 2600 ends.

Turning to FIG. 27, when the example scalar interface 502 and the example vector interface 504 determine the first and second data paths are not valid transactions (e.g., block 2402 returns a value NO), the example scalar interface 502 and the example vector interface 504 determine if the first data path is valid and the second data path is invalid (block 2702). For example, the scalar interface 502 determines if the first data path DP0 is accessing (e.g., requesting a read or write operation) the victim storage 218 and the vector interface 504 determines if the second data path DP1 is not attempting to access the victim storage 218.

When the interfaces 502, 504 determine the first data path is a valid transaction and the second data path is an invalid transaction (e.g., block 2702 returns a value YES), the replacement policy component 308 obtains results from the hit-miss comparison logic 306*a* (block 2704). For example, the replacement policy component 308 obtains a result indicating whether the first data path access has a matching addresses in the tag RAM 210 or does not have a matching address in the tag RAM 210. The example replacement policy component 308 determines if the results indicate that first data path is a hit (block 2706). If the replacement policy component 308 determines the address of the first data path DP0 hits an address in the tag RAM 210 (e.g., block 2706 returns a value YES), the least recently used value Y remains constant (block 2708). For example, since the first data path does not need to evict data, the LRU value does not need to change.

The example replacement policy component 308 determines if a transaction on a new clock cycle has been received (block 2710). For example, if the replacement policy component 308 obtains hit-miss results corresponding to different transactions (e.g., accesses) than the previous accesses (e.g., block 2710 returns a value YES) then control returns to block 2402 of FIG. 24. If the replacement policy component 308 does not obtain hit-miss results corresponding to different transactions (e.g., accesses) than the previous accesses (e.g., block 2710 returns a value NO) then the first operation 2700 ends.

When the example replacement policy component 308 determines that the results do not indicate that first data path is a hit (e.g., block 2706 returns a value NO), then the first data path is a miss (block 2712).

The example replacement policy component 308 points the first data path to the LRU Way (Y) (block 2714). For example, the replacement policy component 308 assigns the location of Y in the victim storage 218 to DP0 for eviction.

The example replacement policy component 308 provides the pointer value to the first multiplexer 330*a* (block 2716). For example, the replacement policy component 308 provides the location the LRU way to the first multiplexer 330*a* for eviction of that way.

The example replacement policy component 308 increments Y (block 2718). For example, the replacement policy component 308 updates the LRU way to the next location (e.g., Y+1) in the victim storage 218. Alternatively and/or additionally, the replacement policy component 308 increments indicators for the first and second data paths.

The example replacement policy component 308 determines if a transaction on a new clock cycle has been received (block 2720). For example, if the replacement policy component 308 obtains hit-miss results corresponding to different transactions (e.g., accesses) than the previous accesses (e.g., block 2720 returns a value YES) then control returns to block 2402 of FIG. 24. If the replacement policy component 308 does not obtain hit-miss results corresponding to different transactions (e.g., accesses) than the previous accesses (e.g., block 2720 returns a value NO) then the first operation 2700 ends.

Turning to FIG. 28, when the example scalar interface 502 and the example vector interface 504 determine the first data path is not a valid transaction and the second data path is a valid transactions (e.g., block 2702 returns a value NO), the example scalar interface 502 and the example vector interface 504 determine the first data path is invalid and the second data path is valid (block 2802). For example, the scalar interface 502 determines that the first data path DP0 is not accessing (e.g., requesting a read or write operation) the victim storage 218 and the vector interface 504 determines if the second data path DP1 is accessing the victim storage 218.

The replacement policy component 308 obtains results from the hit-miss comparison logic 306*b* (block 2804). For example, the replacement policy component 308 obtains a result indicating whether the second data path access has a matching addresses in the tag RAM 210 or does not have a matching address in the tag RAM 210.

The example replacement policy component 308 determines if the results indicate that second data path is a hit (block 2806). If the replacement policy component 308 determines the address of the second data path DP1 hits an address in the tag RAM 210 (e.g., block 2806 returns a value YES), the least recently used value Y remains constant (block 2808). For example, since the second data path does not need to evict data, the LRU value does not need to change.

The example replacement policy component 308 determines if a transaction on a new clock cycle has been received (block 2810). For example, if the replacement policy component 308 obtains hit-miss results corresponding to different transactions (e.g., accesses) than the previous accesses (e.g., block 2810 returns a value YES) then control returns to block 2402 of FIG. 24. If the replacement policy component 308 does not obtain hit-miss results corresponding to different transactions (e.g., accesses) than the previous accesses (e.g., block 2810 returns a value NO) then the first operation 2700 ends.

When the example replacement policy component 308 determines that the results do not indicate that second data path is a hit (e.g., block 2806 returns a value NO), then the second data path is a miss (block 2812).

The example replacement policy component 308 points the second data path to the LRU Way (Y) (block 2814). For example, the replacement policy component 308 assigns the location of Y in the victim storage 218 to DP1 for eviction.

The example replacement policy component 308 provides the pointer value to the second multiplexer 330b (block 2816). For example, the replacement policy component 308 provides the location the LRU way to the second multiplexer 330b for eviction of that way.

The example replacement policy component 308 increments Y (block 2818). For example, the replacement policy component 308 updates the LRU way to the next location (e.g., Y+1) in the victim storage 218. Alternatively and/or additionally, the replacement policy component 308 increments indicators for the first and second data paths.

The example replacement policy component 308 determines if a transaction on a new clock cycle has been received (block 2820). For example, if the replacement policy component 308 obtains hit-miss results corresponding to different transactions (e.g., accesses) than the previous accesses (e.g., block 2820 returns a value YES) then control returns to block 2402 of FIG. 24. If the replacement policy component 308 does not obtain hit-miss results corresponding to different transactions (e.g., accesses) than the previous accesses (e.g., block 2820 returns a value NO) then the first operation 2800 ends.

The machine readable instructions 2400, 2500, 2600, 2700, and 2800 correspond to the first table 602 of FIG. 6.

FIG. 29A, FIG. 29B-1, and FIG. 29B-2 are example flowcharts representative of example machine readable instructions 2900 that may be executed by the L1 cache 110 of FIGS. 1-5 to perform LRU incrementing in the victim storage 214 based on the allocation status of a data path, in conjunction with the above description.

The machine readable instructions 2900 begin at block 2902, at which the replacement policy component 308 initializes the first data path allocate pointer to equal location Y. For example, the replacement policy component 308 assigns a portion of the victim storage 218 not recently used by the CPU 102, having location Y, to the LRU value. In such an example, when the first data path DP0 is to allocate, the victim storage 218 evicts data from the LRU value (e.g., location Y). The replacement policy component 308 initializes the second data path allocate pointer to equal location Y+1 (block 2904). For example, the replacement policy component 308 assigns a portion of the victim storage 218 not recently used by the CPU 102, having location Y+1, to the next LRU value. In such an example, when the second data path DP1 is to allocate, the victim storage 218 evicts data from the next LRU value (e.g., location Y+1).

The replacement policy component 308 determines the first and second data paths are valid transactions (block 2906). For example, the CPU 102 provided instructions on both data paths.

The replacement policy component 308 determines if the first data path DP0 is a hit in the victim storage 218 and the second data path DP1 is to allocate (block 2908). If the first data path DP0 hits the victim storage 218 and the second data path DP1 is allocating to the victim storage 218 (e.g., block 2908 returns a value YES), the replacement policy component 308 determines the location in the victim storage 218 of the of the hit location (DP0 Hit Way) (block 2910). For example, the replacement policy component 308 identifies where the address of the DP0 is in the victim storage 218.

The replacement policy component 308 determines if the hit location is equal to the location of the second data path allocate pointer (Y+1) (block 2912). For example, the replacement policy component 308 determines if the address of DP0 matches the location of Y+1. If the locations do match (e.g., block 2912 returns a value YES), the replacement policy component 308 updates the second data path allocate pointer to equal location Y (block 2914). For example, the replacement policy component 308 switches the assignment of the second data path allocate pointer from Y+1 to Y to avoid evicting data requested on the DP0 instruction.

The cache controller 220 performs the first transaction and the second transaction (block 2916). For example, the cache controller 220 reads/writes data of DP0 at location Y+1 and evicts data from location Y in the victim storage 218.

The replacement policy component 308 increments the first data path allocate pointer by one (block 2918). For example, since the cache controller 220 evicted data from location Y and not Y+1, the replacement policy component 308 only needs to update the LRU value to the next LRU value (Y+1).

If the hit location and the second data path allocate pointer do not match (e.g., block 2912 returns a value NO), the cache controller 220 performs the first transaction and the second transaction (block 2920). For example, the replacement policy component 308 determines that Y+1 includes data that is available to evict and thus, the second data path allocate pointer can evict data from that location while the first data path DP0 reads/writes data from the hit location.

The replacement policy component 308 increments the first data path allocate pointer by two (block 2922). For example, since the cache controller 220 evicts data from the location Y+1, the replacement policy component 308 updates the LRU value Y to a location after the evicted location (e.g., LRU value=Y+2 and the next LRU value=Y+3).

If the replacement policy component 308 determines the condition of block 2908 is not true (e.g., block 2908 returns a value NO), the replacement policy component 308 determines if the first data path is to allocate and the second data path hits (block 2924). For example, the replacement policy component 308 determines if the second data path hits a location in the victim storage 218 and if the main storage 214 is allocating data on the first data path DP0.

If the replacement policy component 308 determines the first data path is to allocate and the second data path is a hit (e.g., block 2924 returns a value YES), the replacement policy component 308 determines the location in the victim storage 218 of the hit location (DP2 Way) (block 2926). For example, the replacement policy component 308 determines where the second data path is reading/writing data from in the victim storage 218.

Figure 29A:
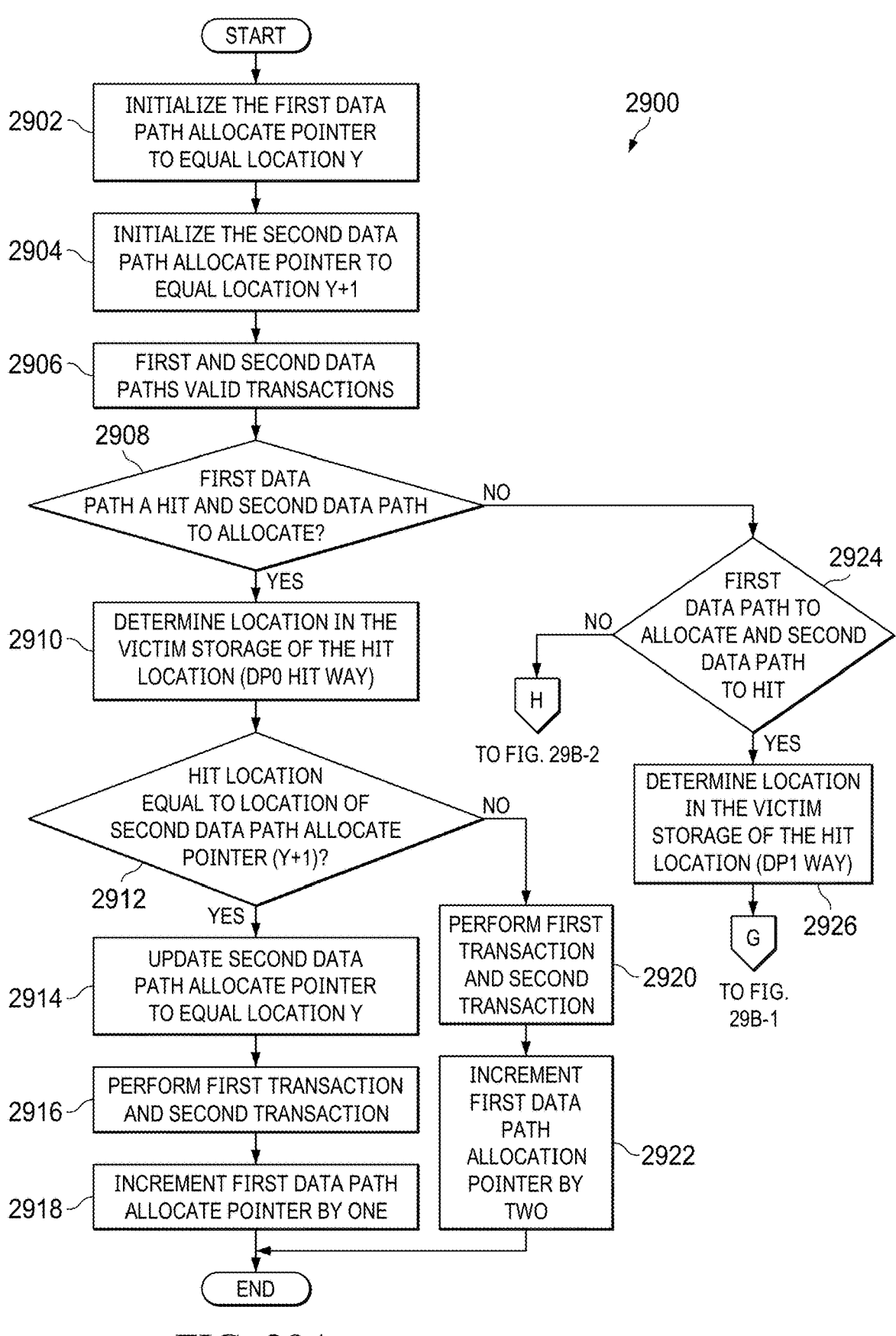
Figures 1, 2, 29B:
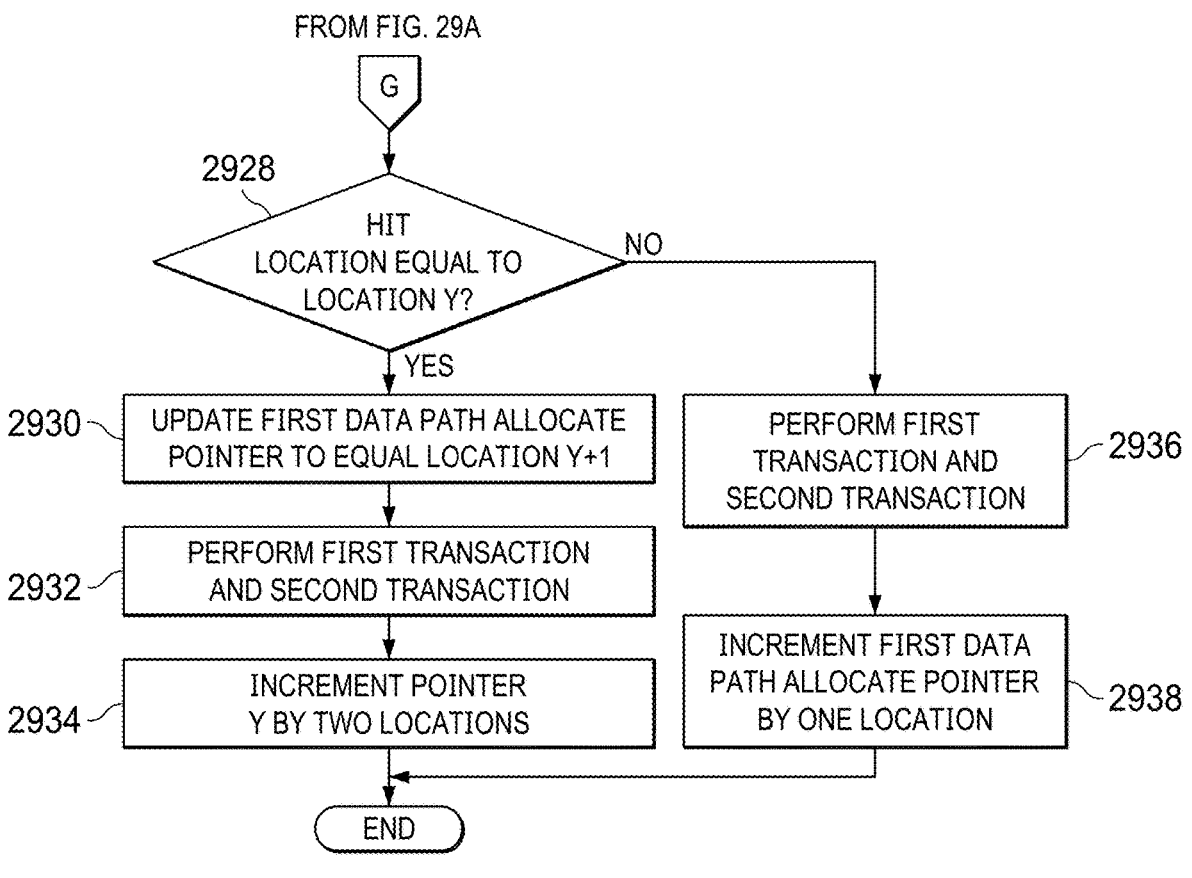

Turning to FIG. 29B-1, the replacement policy component 308 determines if the hit location is equal to the location Y (block 2928). For example, the replacement policy component 308 determines if the first data path allocate pointer points to the same location storing the hit data.

If the replacement policy component 308 determines the locations match (e.g., block 2928 returns a value YES), the replacement policy component 308 updates the first data path allocate pointer to equal location Y+1 (block 2930). For example, the replacement policy component 308 switches the assignments of the LRU value and the next LRU value to avoid the first data path evicting the hit data from the victim storage 218.

The cache controller 220 performs the first transaction and the second transaction (block 2932). For example, the cache controller 220 reads/writes data from the location Y and evicts data of the location Y+1. The replacement policy component 308 increments the pointer Y by two locations (block 2934). For example, the replacement policy component 308 updates the LRU location to a location after the most recently evicted location (e.g., in this example, the most recently evicted location is Y+1, therefore the LRU value is incremented by two to equal Y+2).

If the replacement policy component 308 determines the hit location does not match the location of the originally assigned first data path pointer (Y) (e.g., block 2928 returns a value NO), the cache controller 220 performs the first transaction and the second transaction (block 2936). For example, the replacement policy component 308 determines that Y includes data that is available to evict and thus, the first data path allocate pointer can evict data from that location while the second data path DP1 reads/writes data from the hit location.

The replacement policy component 308 increments the first data path allocate pointer by one location (block 2938). For example, since the cache controller 220 evicts data from the location Y, the replacement policy component 308 updates the LRU value Y to a location after the evicted location. In this manner, the replacement policy component 308 includes an updated LRU value and an updated next LRU value during the next clock cycle.

If the condition of block 2924 of FIG. 29A is not true (e.g., block 2924 returns a value NO when the first data path is not to allocate when the second data path is to hit), then control moves to FIG. 29B-2 where the replacement policy component 308 determines both data paths are to allocate (block 2940). For example, if two read-misses occur, the main storage 214 allocates two lines from the main storage 214 to the victim storage 218.

In this manner, the cache controller 220 performs the first transaction and the second transaction (block 2942). For example, the cache controller 220 evicts data from the LRU location (Y) utilizing the first data path DP0 and evicts data from the next LRU location (Y+1) utilizing the second data path DP1.

The replacement policy component 308 increments the first data path allocate pointer by two (block 2944). For example, the replacement policy component 308 increments the location Y by two locations since data was evicted from Y+1. In some examples, when the LRU value is incremented by a value, the next LRU value is incremented simultaneously by the same value. Therefore, the first data path allocate pointer and the second data path allocate pointer always point to an updated and accurate eviction location.

The machine readable instructions 2900 correspond to the second table 604 of FIG. 6.

Figure 30:
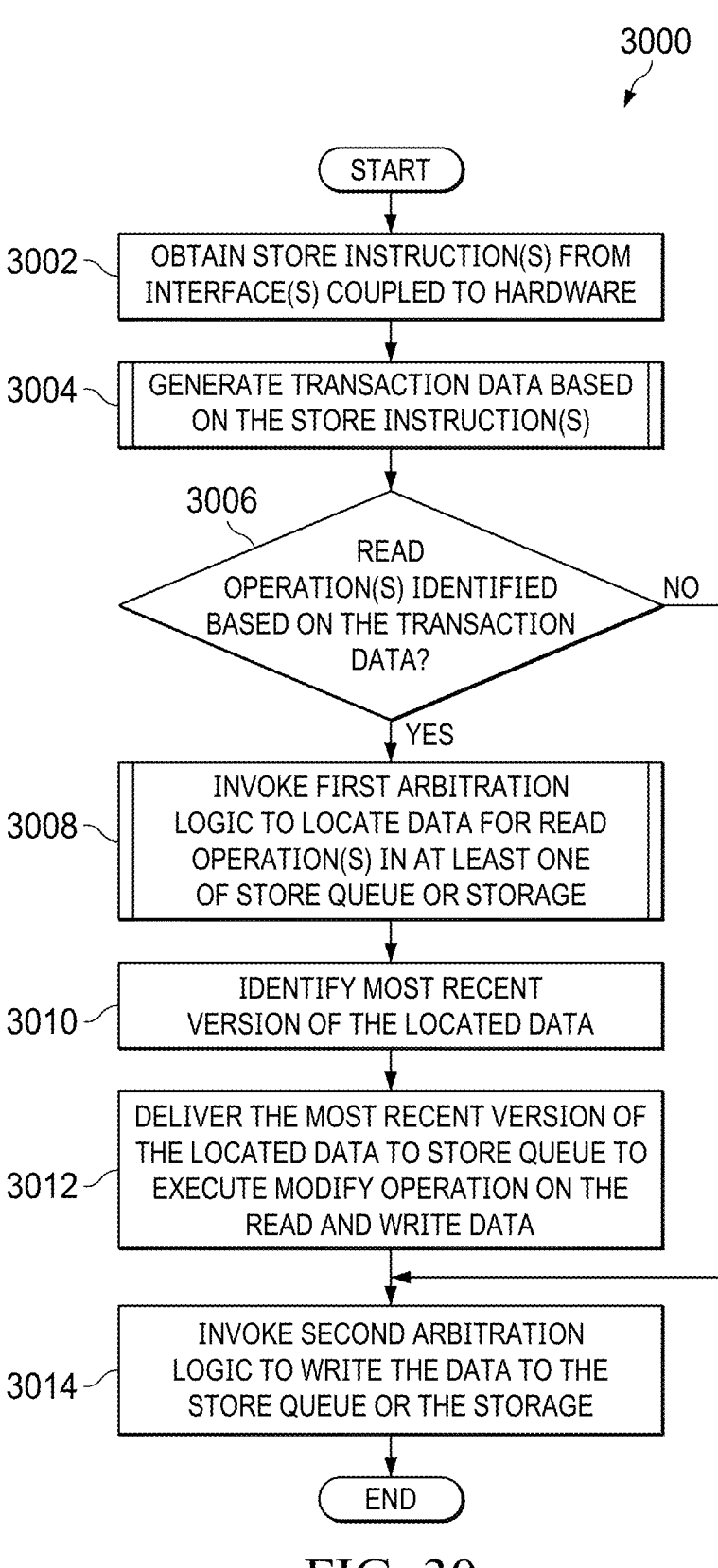

FIG. 30 is an example flowchart representative of example machine readable instructions 3000 that may be executed by the example L1 cache 110 of FIGS. 1-5 to execute arbitration logic to perform a read, modify, or write operation as described above. Although the instructions of FIG. 30 are described in conjunction with the L1 cache 110 of FIGS. 1-5, the instructions may be described in conjunction with any type of storage in any type of cache. The instructions of FIG. 30 are described in conjunction with the main half of the L1 cache 110 (e.g., the main cache store queue 212, the main storage 214, etc.). However, the instructions of FIG. 30 can likewise be used in conjunction with the victim side of the L1 cache 110 (e.g., the victim cache store queue 216, the victim storage 218, etc.).

The machine readable instructions 3000 of FIG. 30 begin at block 3002, at which the L1 cache 110 obtains store instruction(s) from interface(s) coupled to hardware. For example, the address processing components 302*a-c* of FIGS. 3A-3D can obtain the first store instruction 1018 from the scalar interface, the second store instruction 1020 from the memory interface, and/or the third store instruction 1022 from the vector interface. Alternatively, the address processing components 302*a-c* of FIGS. 3A-3D can obtain the first store instruction 1018*b* from the scalar interface, the second store instruction 1020*b* from the memory interface, and/or the third store instruction 1022*b* from the vector interface of FIG. 10B.

At block 3004, the L1 cache 110 generates transaction data based on the store instruction(s). For example, the address processing components 302*a-c* and/or the bank processing logic 303 of FIGS. 3A-3D can generate the first transaction data, the second transaction data, and/or the third transaction data of FIG. 10A. Alternatively, the address processing components 302*a-c* and/or the bank processing logic 303 of FIGS. 3A-3D can generate the first transaction data, the second transaction data, and/or the third transaction data of FIG. 10B. An example process that may be used to implement block 3004 is described below in connection with FIG. 31.

At block 3006, the L1 cache 110 determines whether read operation(s) is/are identified based on the transaction data. For example, the address processing components 302*a-c* can determine that at least one of the first store instruction 1018, the second store instruction 1020, or the third store instruction 1022 includes a request to have a read operation serviced (e.g., a value of RD_BANK_REQ[i] is indicative of a read request, a logic high signal for RD_BANK_REQ [i], etc.). In such examples, the read operation request can be determined based on the R/W data included in the store instructions 1018, 1020, 1022. Alternatively, the address processing components 302*a-c* can determine that at least one of the first store instruction 1018*b*, the second store instruction 1020*b*, or the third store instruction 1022*b* includes a request to have a read operation serviced (e.g., a value of RD_BANK_REQ[i] is indicative of a read request, a logic high signal for RD_BANK_REQ[i], etc.). In such examples, the read operation request can be determined based on the R/W data included in the store instructions 1018*b*, 1020*b*, 1022*b* of FIG. 10B.

If, at block 3006, the L1 cache 110 determines that there are no read operations identified based on the transaction data, control proceeds to block 3014 to invoke second arbitration logic to write the data to the store queue. If, at block 3006, the L1 cache 110 determines that there is at least one read operation identified based on the transaction data, then, at block 3008, the L1 cache 110 invokes first arbitration logic to locate data for the read operation(s) in at least one of a store queue or storage. For example, the address processing components 302*a-c* can invoke the first arbitration logic 1008 to locate data for the read operation(s) in at least one of the main cache store queue 212 or the main storage 214. Alternatively, the address processing components 302*a-c* can invoke the first arbitration logic 1008*b* to locate data for the read operation(s) in at least one of the victim cache store queue 216 or the victim storage 218. An example process that may be executed to implement block 3008 is described below in connection with FIG. 20.

At block 3010, the L1 cache 110 identifies the most recent version of the located data. For example, the L1 cache 110 can compare a first version of the requested data from the main cache store queue 212 to a second version of the requested data from the main storage 214 and determine that the first version is more recent than the second version based on the comparison. Alternatively, the L1 cache 110 can compare a first version of the requested data from the victim cache store queue 216 to a second version of the requested data from the victim storage 218 and determine that the first version is more recent than the second version based on the comparison.

At block 3012, the L1 cache 110 delivers the most recent version of the located data to store queue to execute a modify operation on the read and write data. For example, the main cache store queue 212 can deliver and/or otherwise transmit the first version of the requested data to the main cache store queue 212 to execute a modify operation on the requested data and the data to be written. Alternatively, the victim cache store queue 216 can deliver and/or otherwise transmit the first version of the requested data to the victim cache store queue 216 to execute a modify operation on the requested data and the data to be written.

At block 3014, the L1 cache 110 invokes the second arbitration logic to write the data to the store queue or the storage. For example, the first arbitration logic 1008 can transmit an instruction to the second arbitration logic 1010 to write the WDATA or portion(s) thereof to at least one of the main cache store queue 212 or the main storage 214. Alternatively, the first arbitration logic 1008b can transmit an instruction to the second arbitration logic 1010b to write the WDATA or portion(s) thereof to at least one of the victim cache store queue 216 or the victim storage 218 of FIG. 10B. In response to invoking the second arbitration logic to write the data to the store queue or the storage at block 3014, the example machine readable instructions 3000 of FIG. 30 conclude.

FIG. 31 is an example flowchart representative of example machine readable instructions 3100 that may be executed by the example L1 cache 110 of FIGS. 1-5 to generate transaction data based on store instruction(s) as described above. The flowchart of FIG. 31 can be an example implementation of the machine readable instructions 3004 of FIG. 30. Although the instructions of FIG. 31 are described in conjunction with the L1 cache 110 of FIGS. 1-5, the instructions may be described in conjunction with any type of storage in any type of cache. The instructions of FIG. 31 are described in conjunction with the main half of the L1 cache 110 (e.g., the main cache store queue 212, the main storage 214, etc.). However, the instructions of FIG. 31 can likewise be used in conjunction with the victim side of the L1 cache 110 (e.g., the victim cache store queue 216, the victim storage 218, etc.).

The machine readable instructions 3100 begin at block 3102, at which the L1 cache 110 extracts write data from the store instruction(s) based on a number of data storage banks. For example, the address processing components 302a-c and/or the bank processing logic 303 of FIGS. 3A-3D can extract the WDATA from the store instructions 1018, 1020, 1022 based on a quantity of data banks that the main cache store queue 212 and/or the main storage 214 are broken up into. In such examples, in response to the main cache store queue 212 having 16 data banks, the cache line can be 64 bits and, thus, WDATA can be extracted in 64 bit chunks. Alternatively, the address processing components 302a-c and/or the bank processing logic 303 of FIGS. 3A-3D can extract the WDATA from the store instructions 1018b, 1020b, 1022b of FIG. 10B based on a quantity of data banks that the victim cache store queue 216 and/or the victim storage 218 are broken up into. In such examples, in response to the victim cache store queue 216 having 16 data banks, the cache line can be 64 bits and, thus, WDATA can be extracted in 64 bit chunks.

At block 3104, the L1 cache 110 rotates the write data to generate rotated write data. For example, the address processing components 302a-c can rotate the CPU-Write Data of the first store instruction 902 of FIGS. 3A-3D to generate the rotated data 904 of FIG. 9.

At block 3106, the L1 cache 110 determines byte enable data based on the store instruction(s). For example, the address processing components 302a-c and/or the bank processing logic 303 can determine the BYTEN/BANK[i] data of FIG. 10A based on the BYTEN data included in the store instructions 1018, 1020, 1022. Alternatively, the address processing components 302a-c and/or the bank processing logic 303 can determine the BYTEN/BANK[i] data of FIG. 10B based on the BYTEN data included in the store instructions 1018b, 1020b, 1022b.

At block 3108, the L1 cache 110 determines a data access operation data size based on the store instruction(s). For example, the address processing components 302a-c and/or the bank processing logic 303 can determine the data size of data to be read, written, and/or modified based on the SIZE data included in the store instructions 1018, 1020, 1022. Alternatively, the address processing components 302a-c and/or the bank processing logic 303 can determine the data size of data to be read, written, and/or modified based on the SIZE data included in the store instructions 1018b, 1020b, 1022b.

At block 3110, the L1 cache 110 determines a data storage address based on the store instruction(s). For example, the address processing components 302a-c and/or the bank processing logic 303 can determine the MS_ADDR[i] of a corresponding bank of the main cache store queue 212 and/or the STQ_ADDR[i] address of a corresponding bank of the main storage 214 based on the ADDR data included in the store instructions 1018, 1020, 1022. Alternatively, the address processing components 302a-c and/or the bank processing logic 303 can determine the VS_ADDR[i] of a corresponding bank of the victim cache store queue 216 and/or the STQ_V_ADDR[i] address of a corresponding bank of the victim storage 218 based on the ADDR data included in the store instructions 1018b, 1020b, 1022b.

At block 3112, the L1 cache 110 maps the data access operation data size and the data storage address to a first quantity of data banks to read from. For example, the address processing components 302a-c and/or the bank processing logic 303 can map the data access operation size and the data storage address to zero or more banks of the main cache store queue 212, zero or more banks of the main storage 214, etc., to generate RD_BANK_REQ[i] of FIG. 10A. Alternatively, the address processing components 302a-c and/or the bank processing logic 303 can map the data access operation size and the data storage address to zero or more banks of the victim cache store queue 216, zero or more banks of the victim storage 218, etc., to generate RD_BANK_REQ[i] of FIG. 10B.

At block 3114, the L1 cache 110 maps the data access operation data size and the data storage address to a second quantity of data banks to write to. For example, the address processing components 302a-c and/or the bank processing logic 303 can map the data access operation size and the data storage address to zero or more banks of the main cache store queue 212, zero or more banks of the main storage 214, etc., to generate WR_BANK_REQ[i] of FIG. 10A. Alternatively, the address processing components 302*a-c* and/or the bank processing logic 303 can map the data access operation size and the data storage address to zero or more banks of the victim cache store queue 216, zero or more banks of the victim storage 218, etc., to generate WR_BANK_REQ[i] of FIG. 10B.

At block 3116, the L1 cache 110 generates transaction data based on at least one of the first quantity, the second quantity, the byte enable data, or the write data. For example, the address processing components 302*a-c* and/or the bank processing logic 303 can generate the first transaction data (TRANSACTION_DP0[i]), the second transaction data (TRANSACTION_DMA[i]), and the third transaction data (TRANSACTION_DP1[i]) of FIG. 10A. Alternatively, the address processing components 302*a-c* and/or the bank processing logic 303 can generate the first transaction data (TRANSACTION_DP0[i]), the second transaction data (TRANSACTION_DMA[i]), and the third transaction data (TRANSACTION_DP1[i]) of FIG. 10B. In response to generating the transaction data based on at least one of the first quantity, the second quantity, the byte enable data, or the write data at block 3116, control returns to block 3006 of the machine readable instructions 3000 of FIG. 30 to determine whether read operation(s) is/are identified based on the transaction data.

Figure 32:
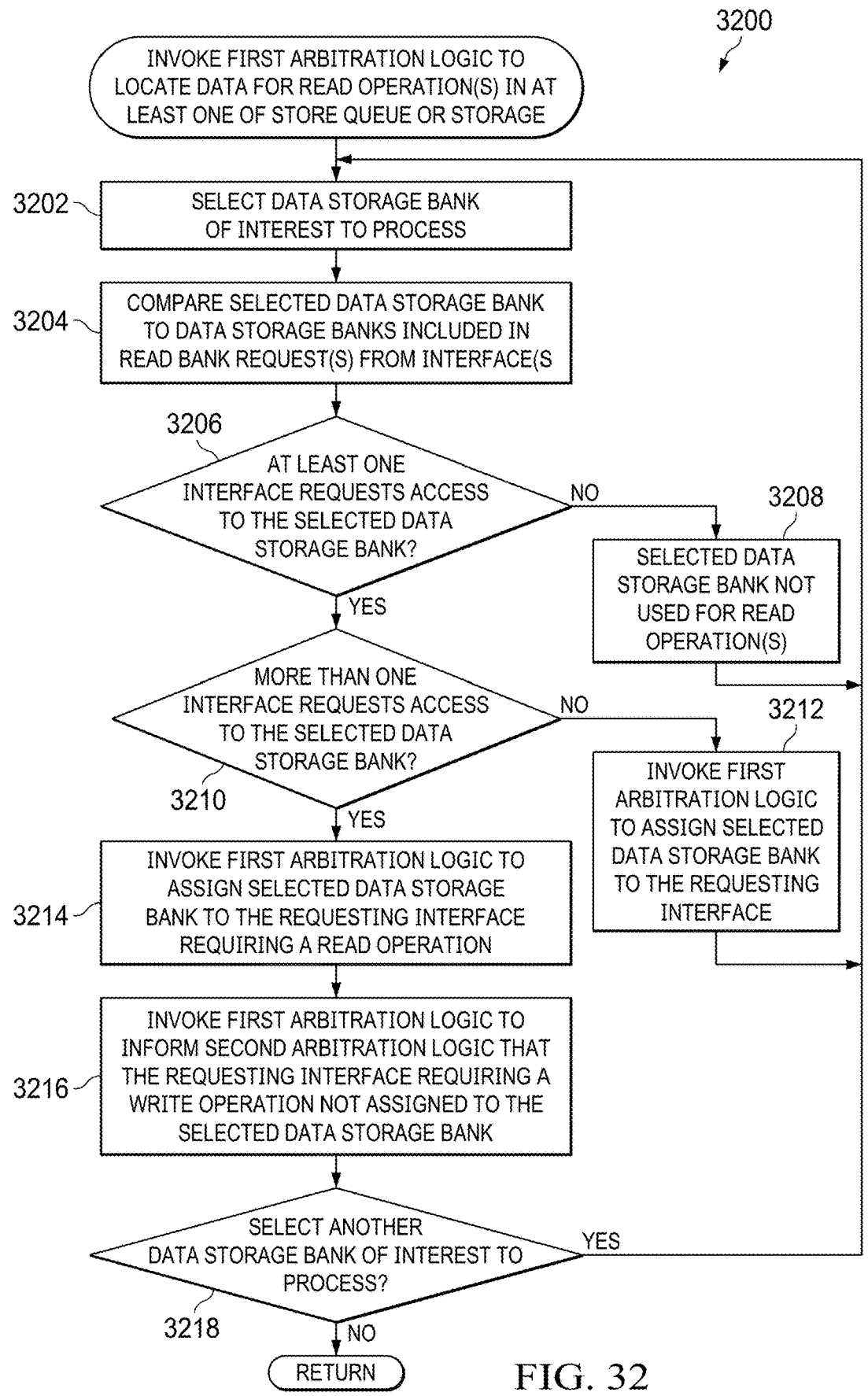

FIG. 32 is an example flowchart representative of example machine readable instructions 3200 that may be executed by the example L1 cache 110 of FIGS. 1-5 to invoke first arbitration logic to locate data for read operation(s) in at least one of a store queue or storage as described above. The flowchart of FIG. 32 can be an example implementation of the machine readable instructions 3008 of FIG. 30. Although the instructions of FIG. 32 are described in conjunction with the L1 cache 110 of FIGS. 1-5, the instructions may be described in conjunction with any type of storage in any type of cache. The instructions of FIG. 32 are described in conjunction with the main half of the L1 cache 110 (e.g., the main cache store queue 212, the main storage 214, etc.). However, the instructions of FIG. 32 can likewise be used in conjunction with the victim side of the L1 cache 110 (e.g., the victim cache store queue 216, the victim storage 218, etc.).

The machine readable instructions 3200 begin at block 3202, at which the L1 cache 110 selects a data storage bank of interest to process. For example, the address processing components 302*a-c* and/or the bank processing logic 303 of FIGS. 3A-3D can select the first bank 1002 of FIG. 10A to process. Alternatively, the address processing components 302*a-c* and/or the bank processing logic 303 of FIGS. 3A-3D can select the first bank 1002*b* of FIG. 10B to process.

At block 3204, the L1 cache 110 compares selected data storage bank to data storage banks included in read bank request(s) from interface(s). For example, the first arbitration logic 1008 can compare the bank(s) identified in respective one(s) of RD_BANK_REQ[i] from the scalar interface, the memory interface, and the vector interface to the first bank 1002 (e.g., STQ[0], MS[i], etc.). Alternatively, the first arbitration logic 1008*b* can compare the bank(s) identified in respective one(s) of RD_BANK_REQ[i] from the scalar interface, the memory interface, and the vector interface to the first bank 1002*b* (e.g., STQ_V[0], VS[i], etc.).

At block 3206, the L1 cache 110 determines whether at least one interface requests access to the selected data storage. If, at block 3206, the L1 cache 110 determines that none of the interfaces request access to the selected data bank, control proceeds to block 3208 to determine that the selected data storage bank is not used for read operation(s). In response to determining that the selected data storage bank is not used for read operation(s) at block 3208, control returns to block 3202 to select another data storage bank of interest to process.

If, at block 3206, the L1 cache 110 determines that at least one interface requests access to the selected data bank, control proceeds to block 3210 to determine whether more than one interface requests access to the selected data storage bank. If, at block 3210, the L1 cache 110 determines that only one interface requests access to the selected data storage bank, control proceeds to block 3212 to invoke first arbitration logic to assign the selected data storage bank to the requesting interface. In response to invoking the first arbitration logic to assign the selected data storage bank to the requesting interface at block 3212, control returns to block 3202 to select another data storage bank of interest to process.

If, at block 3210, the L1 cache 110 determines that more than one interface requests access to the selected data storage bank, control proceeds to block 3214 to invoke the first arbitration logic to assign the selected data storage bank to the requesting interface requiring a read operation. For example, the first arbitration logic 1008 can assign the first bank 1002 to the one of the interfaces requiring a read operation as read operations are prioritized over write operations. Alternatively, the first arbitration logic 1008*b* can assign the first bank 1002*b* to the one of the interfaces requiring a read operation as read operations are prioritized over write operations.

At block 3216, the L1 cache 110 invokes the first arbitration logic to inform second arbitration logic that the requesting interface requiring a write operation is not assigned the selected data storage bank. For example, if scalar data path is requesting a write operation and a read operation and the scalar data path is not assigned the first data bank 1002 for the read operation, the first arbitration logic 1008 can instruct the second arbitration logic 1010 to not assign the scalar data path the first data bank 1002 and, thus, stall and/or otherwise prevent execution of the write operation since the corresponding read operation is not to be completed during the clock cycle. Alternatively, if scalar data path is requesting a write operation and a read operation and the scalar data path is not assigned the first data bank 1002*b* for the read operation, the first arbitration logic 1008 can instruct the second arbitration logic 1010*b* to not assign the scalar data path the first data bank 1002*b* and, thus, stall and/or otherwise prevent execution of the write operation since the corresponding read operation is not to be completed during the clock cycle.

At block 3218, the L1 cache 110 determines whether to select another data storage bank of interest to process. For example, the address processing components 302*a-c* and/or the bank processing logic 303 can determine to select a second bank of the main cache store queue 212 and the main storage 214 to process. Alternatively, the address processing components 302*a-c* and/or the bank processing logic 303 can determine to select a second bank of the victim cache store queue 216 and the victim storage 218 to process. If, at block 3218, the L1 cache 110 determines to select another data storage bank of interest to process, control returns to block 3202 to select another data storage bank of interest to process. If, at block 3218, the L1 cache 110 determines not to select another data storage bank of interest to process, control returns to block 3010 of the machine readable instructions 3000 of FIG. 30 to identify the most recent version of the located data.

FIG. 33 is an example flowchart representative of example machine readable instructions 3300 that may be executed by the example L1 cache 110 of FIGS. 1-5 to facilitate a read-modify-write operation in the victim storage 216, in conjunction with the above Section 13. In FIG. 33, the victim cache store queue 216 obtains a write instruction transmitted by the CPU 102 (e.g., transmitted through the cache controller 220) indicating byte(s) of a word, or an entire word, to be re-written. (Block 3302). In some examples disclosed herein, the write port 1126 may obtain the write instruction transmitted by the CPU 102.

At block 3304, the victim cache store queue 216 transmits the value of the portion of the word to be rewritten to the latch 1102*b*. (Block 3304). In some examples, the latch 1102*b* transmits the value of the portion of the word to be rewritten to the latch 1102*c*.

At block 3306, the victim cache store queue 216 stores the address value associated with the location of the portion of the word to be rewritten in the pending store address data store 1116. (Block 3306). Additionally, the tag ram 210 transmits a read instruction (e.g., a read request) of the entire currently stored word to the victim storage 218. (Block 3308). At block 3310, the victim cache store queue 216 determines whether there has been a subsequent clock cycle of the CPU 102, or the cache controller 220. (Block 3310). In some examples disclosed herein, the latch 1102*c* determines whether there has been a subsequent clock cycle of the CPU 102, or the cache controller 220. In response to determining that there has not been a subsequent clock cycle of the CPU 102, or the cache controller 220, (e.g., the control of block 3310 returns a result of NO), the process waits.

Alternatively, in response to determining that there has been a subsequent cycle of the CPU 102, or the cache controller 220, (e.g., the control of block 3310 returns a result of YES), the read-modify-write merge component 1108 obtains the value of the portion of the word (e.g., the byte) stored in the latch 1102*c*. (Block 3312). Additionally, the read-modify-write merge component 1108 obtains the entire currently stored word transmitted by the ECC logic 312. (Block 3314). In this manner, the read-modify-write merge 1108 identifies the address of the byte in the currently stored word to be updated. Once the read-modify-write merge component 1108 identifies and/or otherwise obtains (a) the value (e.g., byte value, bit value, etc.) of the portion of the currently stored word to be updated from the latch 1102*c* and the (b) currently stored word from the ECC logic 312, the read-modify-write merge component 1108 writes (e.g., replaces) the portion of the currently stored word with the value of the portion of the currently stored word obtained from the latch 1102*c*. (Block 3316). For example, the read-modify-write merge component 1108 writes the value of the portion of the word to an address value corresponding to the portion of the word in the word.

At block 3318, the victim cache store queue 216 generates error detection code based on the word, the error detection code to be stored with the word. (Block 3318). In some examples disclosed herein the ECC generator 1112 generates error detection code based on the word, the error detection code to be stored with the word.

The control of block 3318 may be performed in response to an additional subsequent clock cycle of the CPU 102, or the cache controller 220.

In response, the victim cache store queue 216 determines whether an additional write instruction is obtained. (Block 3322). the event the victim cache store queue 216 determines another write instruction is obtained (e.g., the control of block 3322 returns a result of YES), the process returns to block 3302. Alternatively, in the event the victim cache store queue 216 determines another write instruction is not obtained (e.g., the control of block 3322 returns a result of NO), the process 3300 may wait until a threshold timeout period occurs, thus ending the process 3300.

Figure 34:
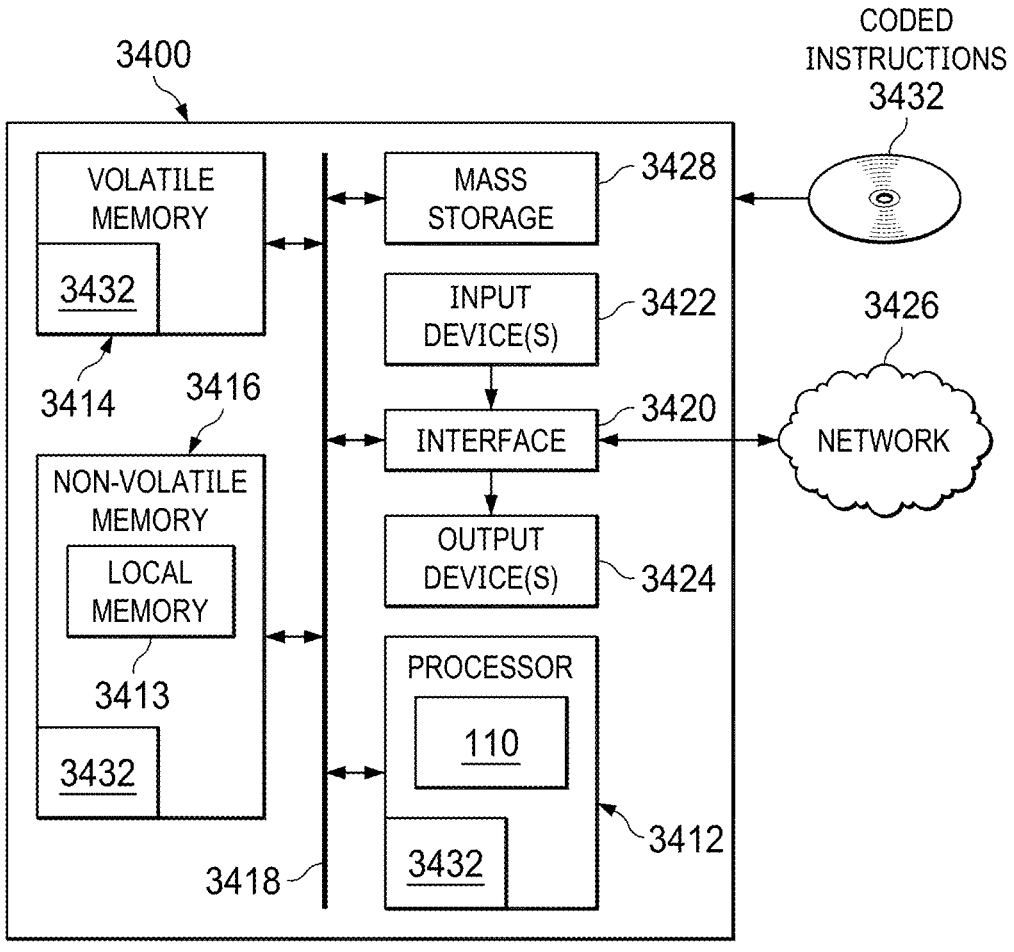
FIG. 34 is a block diagram of an example processing platform structured to execute the instructions of FIGS. 3A-3D to implement the level one cache of FIGS. 1-3D.

FIG. 34 is a block diagram of an example processor platform 3400 structured to execute the instructions of FIGS. 12-33 to implement the L1 cache 110 of FIGS. 1-5 and 10-11. The processor platform 1000 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a gaming console, or any other type of computing device.

The processor platform 3400 of the illustrated example includes a processor 3412. The processor 3412 of the illustrated example is hardware. For example, the processor 3412 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements any element of the example L1 cache 110 as shown in FIGS. 1-5 and 10-11.

The processor 3412 of the illustrated example includes a local memory 3413 (e.g., a cache). The processor 3412 of the illustrated example is in communication with a main memory including a volatile memory 3414 and a non-volatile memory 3416 via a bus 3418. The volatile memory 3414 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 3416 may be implemented by flash memory and/or any other desired type of memory device. Access to the main memory 3414, 3416 is controlled by a memory controller.

The processor platform 3400 of the illustrated example also includes an interface circuit 3420. The interface circuit 3420 may be implemented by any type of interface standard, such as an Ethernet interface, a universal serial bus (USB), a Bluetooth® interface, a near field communication (NFC) interface, and/or a PCI express interface.

In the illustrated example, one or more input devices 3422 are connected to the interface circuit 3420. The input device(s) 3422 permit(s) a user to enter data and/or commands into the processor 3412. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 3424 are also connected to the interface circuit 3420 of the illustrated example. The output devices 3424 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 3420 of the illustrated example, thus, typically includes a graphics driver card, a graphics driver chip and/or a graphics driver processor.

The interface circuit 3420 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 3426. The communication can be via, for example, an Ethernet connection, a digital subscriber line (DSL) connection, a telephone line connection, a coaxial cable system, a satellite system, a line-of-site wireless system, a cellular telephone system, etc.

The processor platform 3400 of the illustrated example also includes one or more mass storage devices 3428 for storing software and/or data. Examples of such mass storage devices 3428 include floppy disk drives, hard drive disks, compact disk drives, Blu-ray disk drives, redundant array of independent disks (RAID) systems, and digital versatile disk (DVD) drives.

The machine executable instructions 3432 of FIGS. 12-33 may be stored in the mass storage device 3428, in the volatile memory 3414, in the non-volatile memory 3416, and/or on a removable non-transitory computer readable storage medium such as a CD or DVD.

From the foregoing, it will be appreciated that example methods, apparatus and articles of manufacture have been disclosed to evict in dual datapath victim cache system. The disclosed methods, apparatus and articles of manufacture improve the efficiency of using a computing device by reducing a data cache to reduce latency of a computing system and improving computer system efficiency to reduce stress on a computer core. The disclosed methods, apparatus and articles of manufacture are accordingly directed to one or more improvement(s) in the functioning of a computer.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

The following claims are hereby incorporated into this Detailed Description by this reference, with each claim standing on its own as a separate embodiment of the present disclosure.

What is claimed is:

1. A device, comprising:
a cache memory that includes a set of entries configured into a set of ways; and
a cache controller coupled to the cache memory and configured to:
receive a first memory operation;
determine that the first memory operation is associated with data eviction;
determine, based on a pointer value, a first way of the set of ways for the data eviction;
receive a second memory operation;
determine whether the second memory operation conflicts with the data eviction; and
based on a determination that the second memory operation conflicts with the data eviction,
determine a second way of the set of ways for the data eviction; and
increment the pointer value.

2. The device of claim 1, wherein the cache controller is configured to determine that the second memory operation conflicts with the data eviction based on the second memory operation being associated with a read of data stored in the first way.

3. The device of claim 1, wherein:
the cache memory is a victim cache; and
the device further comprises a main cache coupled to the cache controller.

4. The device of claim 3, wherein the data eviction is based on data eviction from the main cache.

5. The device of claim 3, wherein the data eviction is based on a write miss in the main cache.

6. The device of claim 1, further comprising:
a first interface configured to couple to a set of processor cores and associated with a first data path; and
a second interface configured to couple to the set of processor cores and associated with a second data path,
wherein the first memory operation is received via the first data path and the second memory operation is received via the second data path.

7. The device of claim 6, further comprising:
a register configured to store the pointer value.

8. The device of claim 6, wherein the first data path is a scalar data path and the second data path is a vector data path, or vice versa.

9. The device of claim 1, wherein to increment the pointer value, the cache controller is configured to increment the pointer value twice.

10. The device of claim 1, wherein the cache controller is further configured to:
based on a determination that the second memory operation does not conflict with the data eviction,
perform the data eviction based on the first way of the set of ways; and
increment the pointer value once.

11. The device of claim 1, wherein the pointer value indicates a way based on a least recently used policy.

12. A method, comprising:
receiving, by a cache controller, a first memory operation directed to a cache memory that includes a set of entries configured into a set of ways;
determining, by the cache controller, that the first memory operation is associated with data eviction from a first way of the set of ways based on a pointer value;
receiving, by the cache controller, a second memory operation directed to the cache memory;
determining, by the cache controller, whether the second memory operation conflicts with the data eviction; and
based on determining that the second memory operation conflicts with the data eviction, determining a second way of the set of ways for the data eviction; and
incrementing the pointer value.

13. The method of claim 12, wherein the first memory operation is received via a first data path and the second memory operation is received via a second data path.

14. The method of claim 13, wherein the first data path is a scalar data path and the second data path is a vector data path, or vice versa.

15. The method of claim 12, wherein determining that the second memory operation conflicts with the data eviction comprises determining that the second memory operation conflicts with the data eviction based on determining the second memory operation is associated with a read of data stored in the first way.

16. The method of claim 12, wherein:
the cache memory is a victim cache; and
the data eviction is based on data eviction from a main cache.

17. The method of claim 12, wherein:
the cache memory is a victim cache; and
the data eviction is based on a write miss in a main cache.

18. The method of claim 12, wherein incrementing the pointer value comprises incrementing the pointer value twice.

19. The method of claim 12, further comprising:

based on determining that the second memory operation does not conflict with the data eviction, performing the data eviction from the first way; and incrementing the pointer value once.

20. The method of claim 12, wherein the pointer value indicates a way based on a least recently used policy.

\* \* \* \* \*